United States Patent [19]

Konishi et al.

[11] Patent Number: 5,603,009
[45] Date of Patent: Feb. 11, 1997

[54] SEMICONDUCTOR MEMORY DEVICE INCLUDING A DATA TRANSFER CIRCUIT FOR TRANSFERRING DATA BETWEEN A DRAM AND AN SRAM

[75] Inventors: Yasuhiro Konishi; Katsumi Dosaka; Kouji Hayano; Masaki Kumanoya; Akira Yamazaki; Hisashi Iwamoto, all of Hyogo, Japan

[73] Assignee: Mitsubishi Denki Kabushiki Kaisha, Tokyo, Japan

[21] Appl. No.: 356,046

[22] Filed: Dec. 14, 1994

Related U.S. Application Data

[63] Continuation of Ser. No. 783,028, Oct. 25, 1991, abandoned.

[30] Foreign Application Priority Data

| Dec. 25, 1990 | [JP] | Japan | 2-406040 |
| Feb. 8, 1991 | [JP] | Japan | 3-17677 |
| Apr. 16, 1991 | [JP] | Japan | 3-84248 |

[51] Int. Cl.[6] .............. G06F 13/00; G11C 11/34
[52] U.S. Cl. .............. 395/492; 365/189.05; 365/230.03; 395/431
[58] Field of Search .............. 395/425, 431, 395/432, 492, 477, 495; 365/189.05, 190, 230.03

[56] References Cited

U.S. PATENT DOCUMENTS

| 4,577,293 | 3/1986 | Matick et al. | 365/189.04 |
| 4,731,758 | 3/1988 | Lam et al. | 365/189.05 |
| 4,758,987 | 7/1988 | Sakui | 365/189.05 |
| 4,829,471 | 5/1989 | Banerjee et al. | 395/250 |
| 4,837,746 | 6/1989 | Banerjee et al. | 365/189.05 |
| 4,849,935 | 7/1989 | Miyazawa | 365/189.05 |
| 4,894,770 | 1/1990 | Ward et al. | 395/455 |
| 4,926,385 | 5/1990 | Fujishima et al. | 365/230.03 |
| 5,025,421 | 6/1991 | Cho | 365/230.05 |
| 5,226,009 | 7/1993 | Arimoto | 365/189.04 |
| 5,226,147 | 7/1993 | Fujishima et al. | 395/445 |
| 5,249,282 | 9/1993 | Segers | 395/449 |
| 5,269,009 | 12/1993 | Herzl et al. | 395/468 |
| 5,280,441 | 1/1994 | Wada et al. | 365/63 |

FOREIGN PATENT DOCUMENTS

| 4110173 | 10/1991 | Germany. |
| 60-7690 | 1/1985 | Japan. |
| 62-38590 | 2/1987 | Japan. |

(List continued on next page.)

OTHER PUBLICATIONS

1990 Symposium on VLSI Circuits, vol. 4, 1990, pp. 79–80, "A Circuit Design of Intelligent CDRAM With Automatic Write Back Capability", K. Arimoto et al.

IEEE Micro, vol. 10, No. 2, Apr. 1990, pp. 14–25, "The Cache DRAM Architecture: A DRAM with an On–Chip Cache Memory", H. Hidaka et al.

*Primary Examiner*—Glenn Gossage
*Attorney, Agent, or Firm*—Lowe, Price, LeBlanc & Becker

[57] ABSTRACT

A semiconductor memory device containing a cache includes a static random access memory (SRAM) as a cache memory, and a dynamic random access memory (DRAM) as a main memory. Collective transfer of data blocks is possible between the DRAM and the SRAM through a bi-directional data transfer gate circuit and through an internal data line. A DRAM row decoder and a DRAM column decoder are provided in the DRAM. A SRAM row decoder and an SRAM column decoder are provided in the SRAM. Addresses of the SRAM and DRAM can be independently applied. The data transfer gate includes a latch circuit for latching data from the SRAM, which serves as a high speed memory, an amplifier circuit and a gate circuit for amplifying data from the DRAM, which serves as a large capacity memory, and for transmitting the amplified data to the SRAM, and a gate circuit, responsive to a DRAM write enable signal for transmitting write data to corresponding memory cells of the DRAM. After the data of the SRAM has been latched by a latch circuit, write data is transmitted from the gate circuit to the DRAM, and the write data is transmitted to the SRAM through the amplifier circuit and the gate circuit.

8 Claims, 93 Drawing Sheets

FOREIGN PATENT DOCUMENTS

| | | |
|---|---|---|
| 62-164296 | 7/1987 | Japan . |
| 63-39057 | 2/1988 | Japan . |
| 63-81692 | 4/1988 | Japan . |
| 1-146187 | 6/1989 | Japan . |
| 1-225354 | 9/1989 | Japan . |
| 1-263993 | 10/1989 | Japan . |
| 2-87392 | 3/1990 | Japan . |

FIG.34A
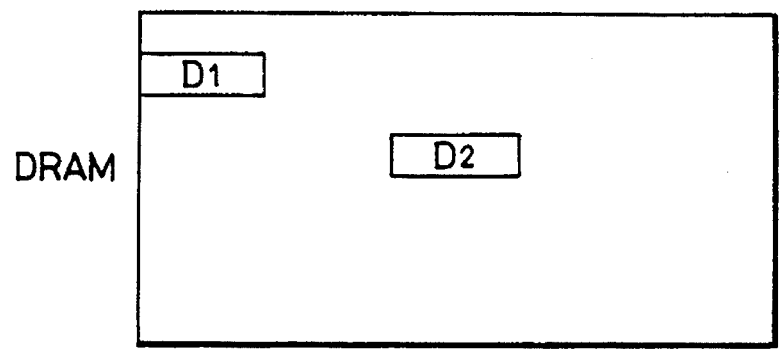
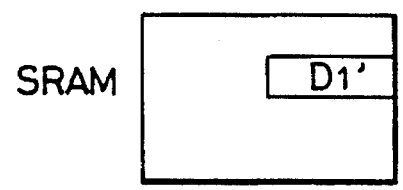
FIG.34B
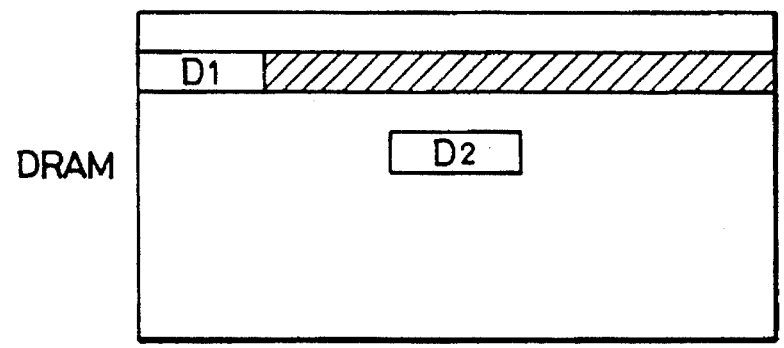
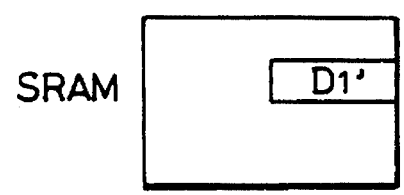

FIG. 36A
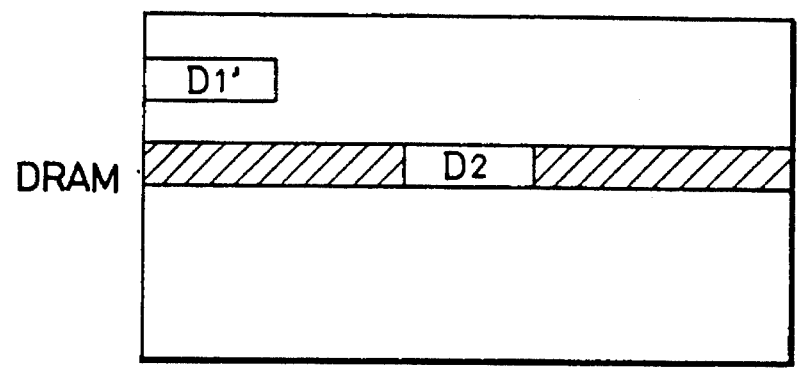
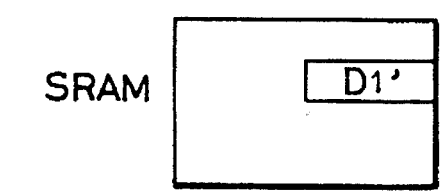
FIG. 36B
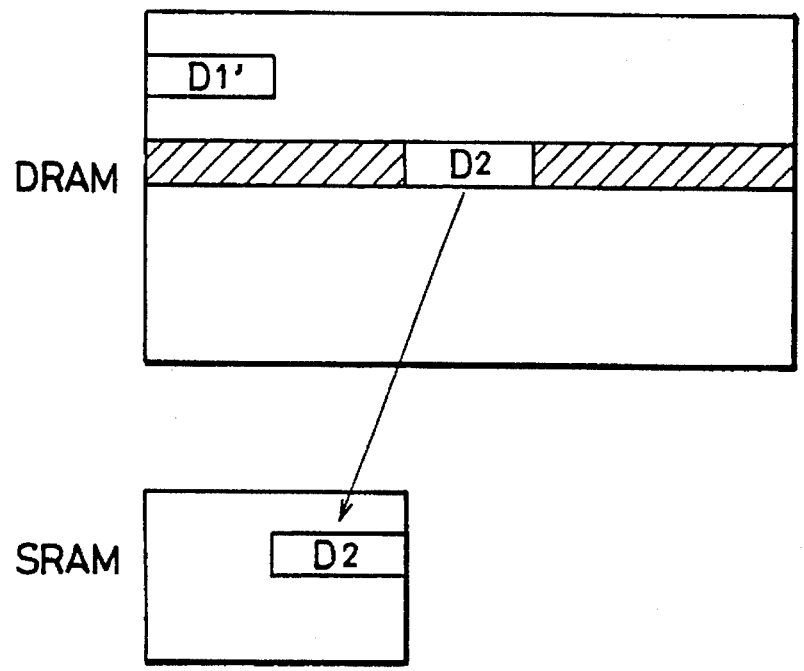

FIG. 64

| | Ar0 | Ar1 | W# |
|---|---|---|---|
| RR0 | 0 | 0 | H |
| RR1 | 1 | 0 | H |
| RR2 | 0 | 1 | H |
| RR3 | 1 | 1 | H |
| WR0 | 0 | 0 | L |
| WR1 | 1 | 0 | L |
| WR2 | 0 | 1 | L |
| WR3 | 1 | 1 | L |

FIG. 74

| OPERATION MODE | E# | CH# | CI# | CR# | W# | REF# |
|---|---|---|---|---|---|---|
| STAND-BY | H | X | X | X | X | H |
| ARRAY REFRESH | H | X | X | X | X | L |
| CPU ← CACHE | L | L | H | H | H | H |
| CPU → CACHE | L | L | H | H | L | H |
| CPU ← CACHE & ARRAY REFRESH | L | L | H | H | H | L |
| CPU → CACHE & ARRAY REFRESH | L | L | H | H | L | L |
| CPU ← ARRAY | L | X | L | H | H | H |
| CPU → ARRAY | L | X | L | H | L | H |
| CACHE ← ARRAY | L | H | H | H | H | H |
| CACHE → ARRAY | L | H | H | H | L | H |
| CPU ↔ COMMAND REGISTER | L | H | H | L | H/L | H |
| CPU ↔ COMMAND REGISTER & ARRAY REFRESH | L | H | H | L | H/L | L |

$n = (ta/tk) - 1$ $n' = (ta/2tk) - 1$

| (i) ARRAY WRITE : | 5 ⟶ 7 × n |
|---|---|
| (ii) ARRAY READ : | 6 ⟶ 7 × n' ⟶ 7 Q × (n'+1) |

SEMICONDUCTOR MEMORY DEVICE INCLUDING A DATA TRANSFER CIRCUIT FOR TRANSFERRING DATA BETWEEN A DRAM AND AN SRAM

This application is a continuation of application Ser. No. 07/783,028 filed Oct. 25, 1991, now abandoned.

BACKGROUND OF THE INVENTION

1. Field of the Invention

The present invention relates to a semiconductor memory device, and more specifically to a semiconductor memory device containing a cache in which a dynamic random access memory (DRAM) having a large storage capacity serving as a main memory and a static random access memory (SRAM) having small storage capacity serving as a cache memory are integrated on the same semiconductor chip.

2. Description of the Background Art

Operation speed of recent 16-bit or 32-bit microprocessing unit (MPU) has been so much increased as to have operation clock frequency as high as 25 MHz or higher. In a data processing system, a standard DRAM (Dynamic Random Access Memory) is often used as a main memory having large storage capacity, since cost per bit is low. Although access time in the standard DRAM has been reduced, the speed of operation of the MPU has been increased much faster than that of the standard DRAM. Consequently, in a data processing system using the standard DRAM as a main memory, increase of wait state is inevitable. The gap in speed of operation between MPU and the standard DRAM is inherent to the standard DRAM which has the following characteristics.

(1) A row address and a column address are time divisionally multiplexed and applied to the same address pin terminal. The row address is taken in the device at a falling edge of a row address strobe signal (/RAS). The column address is taken in the device at a falling edge of a column address strobe signal (/CAS). The row address strobe signal /RAS defines start of a memory cycle and activates a row selecting system. The column address strobe signal /CAS activates a column selecting system. Since a prescribed time period called "RAS-CAS delay time (tRCD) is necessary from the time the signal /RAS is set to an active state to the time the signal /CAS is set to the active state, there is a limit in reducing the access time, namely, there is a limit derived from address multiplexing.

(2) When the row address strobe signal /RAS is once raised to set the DRAM to a standby state, the row address strobe signal /RAS cannot fall to "L" again until a time period called a RAS precharge time (tTR) has lapsed. The RAS precharge time is necessary to insure precharging various signal lines in the RAM to prescribed potentials. Due to the RAS precharge time tRP, the cycle time of the DRAM cannot be reduced. In addition, when the cycle time of the DRAM is reduced, the number of charging/discharging of signal lines in the DRAM is increased, which increases current consumption.

(3) The higher speed of operation of the DRAM can be realized by circuit technique such as improvement of layout, increase of degree of integration of circuits, development in process technique and by applicational improvement such as improvement in the methods of driving. However, the speed of operation of the MPU is increased at much faster rate than DRAM. The speed of operation of semiconductor memories is hierarchical. For example, there are high speed bipolar RAMs using bipolar transistors such as ECLRAMs (Emitter Coupled Logic RAMs) and Static RAM, and comparatively low speed DRAMs using MOS transistors (insulated gate type field effect transistors). It is very difficult to expect the operation speed (cycle time) as fast as several tens ns (nano second) in a standard DRAM formed of MOS transistors.

There have been various applicational improvements to decrease the gap between speed of operations of the MPU and the standard DRAM. Such improvements mainly comprises the following two approaches.

(1) Use of high speed mode of the DRAM and interleave method (2) External provision of a high speed cache memory (SRAM).

The first approach (1) includes a method of using a high speed mode such as a static column mode or a page mode, and a method of combining the high speed mode and the interleave method. In the static mode, one word line (one row) is selected, and thereafter only the column address is changed successively, to successively access memory cells of this row. In the page mode, one word line is selected, and then column addresses are successively taken by toggling the signal /CAS to successively access memory cells connected to the selected one word line. In either of these modes, memory cells can be accessed without toggling the signal /RAS, enabling higher speed than the normal access using the signals /RAS and /CAS.

In the interleave method, a plurality of memories are provided in parallel to a data bus, and by alternately or successively accessing the plurality of memories, the access time is reduced in effect. The use of high speed mode of the DRAM and combination of the high speed mode and the interleave method have been known as methods of using the standard DRAM as a high speed DRAM in a simple and relatively effective manner.

The second approach (2) has been widely used in main frames. A high speed cache memory is expensive. However, in the field of personal computers in which high performance as well as low cost are desired, this approach is employed in some parts with a sacrifice of cost. There are three possible ways to provide the high speed cache memory. Namely, (a) the high speed cache memory is contained in the MPU itself;

(b) the high speed cache memory is provided outside the MPU; and (c) the high speed cache memory is not separately provided but the high speed mode contained in the standard DRAM is used as a cache (the high speed mode is used as a pseudo cache memory). When a cache hit occurs, the standard DRAM is accessed in the high speed mode, and at the time of a cache miss, the standard DRAM is accessed in the normal mode. The above mentioned three ways (a) to (c) have been employed in the data processing systems in some way or other.

In most MPU systems, the memories are adopted to have bank structure and interleaving is carried out on bank by bank basis in order to conceal the RAS precharge time (TRP) which is inevitable in the DRAM, in view of cost. By this method, the cycle time of the DRAM can be substantially one half that of specification value. The method of interleave is effective only when memories are sequentially accessed. When the same memory bank is to be continuously accessed, it is ineffective. Further, substantial improvement of the access time of the DRAM itself cannot be realized. The minimum unit of the memory must be at least 2 banks.

When the high speed mode such as the page mode or the static column mode is used, the access time can be reduced effectively only when the MPU successively accesses a certain page (data of a designated one row). This method is effective to some extent when the number of banks is comparatively large, for example 2 to 4, since different rows can be accessed in different banks. When the data of the memory requested by the MPU does not exist in the given page, it is called a "miss hit". Normally, a group of data are stored in adjacent addresses or sequential addresses. In the high speed mode, a row address, which is one half of the addresses, has been already designated, and therefore possibility of "miss hit" is high. When the number of banks becomes as large as 30 to 40, data of different pages can be stored in different banks, and therefore the "miss hit" rate is remarkably reduced. However, it is not practical to provide 30 to 40 banks in a data processing system. In addition, if a "miss hit" occurs, the signal (/RAS) is raised and the DRAM must be returned to the precharge cycle in order to re-select the row address, which sacrifices the characteristic of the bank structure.

In the above described second method (2), a high speed cache memory is provided between the MPU and the standard DRAM. In this case, the standard DRAM may have relatively low speed of operation. Standard DRAMs having storage capacities as large as 4M bit or 16M bits have come to be used. In a small system such as a personal computer, the main memory thereof can be formed by one or several chips of standard DRAMs. External provision of the high speed cache memory is not very effective in such a small system in which the main memory can be formed of one standard DRAM. If the standard DRAM is used as the main memory, the data transfer speed between the high speed cache memory and the main memory is limited by the number of data input/output terminals of the standard DRAM, which constitutes a bottleneck in increasing the speed of the system.

When the high speed mode is used as a pseudo cache memory, the speed of operation is lower than the high speed cache memory, and it is difficult to realize the desired system performance.

Provision of the high speed cache memory (SRAM) in the DRAM is proposed as a method of forming a relatively inexpensive and small system, which can solve the problem of sacrifice of system performance when the interleave method or the high speed operation mode is used. More specifically, a single chip memory having a hierarchical structure of a DRAM serving as a main memory and a SRAM serving as a cache memory has been conceived. The 1-chip memory having such a hierarchical structure is called a cache DRAM (CDRAM). The CDRAM will be described.

FIG. 1 shows a structure of a main portion of a conventional standard 1 megabit DRAM. As shown in FIG. 1, the DRAM comprises a memory cell array 500 including a plurality of memory cells MC arranged in a matrix of rows and columns. A row of memory cells are connected to one word line WL. A column of memory cells MC are connected to one column line CL. Normally, the column line CL is formed by a pair of bit lines. A memory cell MC is positioned at a crossing of one of the pair of bit lines and one word line WL. In a 1M DRAM, the memory cells MC are arranged in a matrix of 1024×1024 columns. Namely, the memory cell array 500 includes 1024 word lines WLs and 1024 column lines CLs (1024 pairs of bit lines).

The DRAM further comprises a row decoder 502 which decodes an externally applied row address (not shown) for selecting a corresponding row of the memory cell array 500; a sense amplifier which detects and amplifies data of the memory cell connected to the word line selected by the row decoder 502; and a column decoder which decodes an externally applied column address (not shown) for selecting a corresponding column of the memory cell array 502. In FIG. 1, the sense amplifier and the column decoder are denoted by one block 504. If the DRAM has an x1 bit structure in which input/output of data is effected bit by bit, one column line CL (bit line pair) is selected by the column decoder. If the DRAM has an x4 bit structure in which input/output of data is effected 4 bits by 4 bits, 4 column lines CL are selected by the column decoder. One sense amplifier is provided for each column line (bit line pair) CL in the block 504.

In memory access for writing data to or reading data from the memory cell MC in the DRAM, the following operation is carried out. First, a row address is applied to the row decoder 502. The row decoder 502 decodes the row address and raises the potential of one word line WL in the memory cell array 500 to "H". Data of the 1024 bits of memory cells MC connected to the selected word line WL are transmitted to a corresponding column line CL. The data on the column line CL are amplified by sense amplifiers included in the block 504. Selection of a memory cell to which the data is written or from which the data is read of the memory cells connected to the selected word line WL is carried out by a column selection signal from the column decoder included in the block 504.

In the above described high speed mode, column addresses are successively applied to the column decoder included in the block 504. In the static column mode operation, column addresses applied at every prescribed time interval are decoded as new column addresses by the column decoder, and the corresponding memory cell of the memory cells connected to the selected word line WL is selected by the column line CL. In the page mode, a new column address is applied at every toggling of the signal /CAS, and the column decoder decodes the column address to select the corresponding column line. In this manner, in the high speed mode, one row of memory cells MC connected to the selected word line WL can be accessed at high speed by setting one word line WL at a selected state and by changing the column addresses only.

FIG. 2 shows a general structure of a conventional 1M bit CDRAM. Referring to FIG. 2, the conventional CDRAM comprises, in addition to the elements of the standard DRAM shown in FIG. 1, SRAM 506 and a transfer gate 508 for transferring data between one row of the memory cell array 500 of the DRAM and the SRAM 506. The SRAM includes a cache register provided corresponding to each column line CL of the memory cell array 500 so as to enable simultaneous storage of data of one row of the DRAM memory cell array 500. Therefore, 1024 cache registers are provided. The cache register is formed by an SRAM cell. In the structure of the CDRAM shown in FIG. 2, when a signal representing a cache hit is externally applied, the SRAM 506 is accessed, enabling access to the memory at high speed. At the time of a cache miss (miss hit), the DRAM portion is accessed.

A CDRAM as described above having a DRAM of a large storage capacity and a high speed SRAM integrated on the same chip is disclosed in, for example, Japanese Patent Laid Open (Kokai) Nos. 60-7690 and 62-38590.

In the above described conventional CDRAM structure, column lines (bit line pairs) CL of the DRAM memory cell array 500 and column lines (bit line pairs) of the SRAM (cache memory) 506 are connected in one to one correspondence through a transfer gate 508. More specifically, in the above described conventional CDRAM structure, data of the memory cells connected to one word line WL in the DRAM memory cell array 500 and the data of the same number of SRAMs as one row of the memory cell array 500 are transferred bi-directionally and simultaneously, through the transfer gate 508. In this structure, the SRAM 506 is used as a cache memory and the DRAM is used as a main memory.

The so called block size of the cache is considered to be the number of bits (memory cells) the contents of which are rewritten in one data transfer in SRAM 506. Therefore, the block size is the same as the number of memory cells which are physically coupled to one word line WL of DRAM memory cell array 500. As shown in FIGS. 1 and 2, when 1024 memory cells are physically connected to one word line WL, the block size is 1024.

Generally, when the block size becomes larger, the hit ratio is increased. However, if the cache memory has the same size, the number of sets is reduced in inverse proportion to the block size, and therefore the hit ratio is decreased. For example, when the cache size is 4K bit and the block size 1024, the number of sets is 4. However, if the block size is 32, the number of sets is 128. Therefore, in the conventional CDRAM structure, the block size is made too large, and the cache hit ratio cannot be very much improved.

A structure enabling reduction in block size is disclosed in, for example, Japanese Patent Laid Open (Kokai) No. 1-146187. In this prior art, column lines (bit line pairs) of the DRAM array and the SRAM array are arranged in one to one correspondence, but they are divided into a plurality of blocks in the column direction. Selection of the block is carried out by a block decoder. At the time of a cache miss (miss hit), one block is selected by the block decoder. Data are transferred between only the selected DRAM block and the SRAM block. By this structure, the block size of the cache memory can be reduced to an appropriate size. However, there remains the following problem unsolved.

FIG. 3 shows a standard array structure of a 1M bit DRAM array. In FIG. 3, the DRAM array is divided into 8 memory blocks DMB1 to DMB8. A row decoder 502 is commonly provided for the memory blocks DMB1 to DMB8 on one side in the longitudinal direction of the memory array. For each of the memory blocks DMB1 to DMB8, (sense amplifier+column decoder) blocks 504-1 to 504-8 are provided.

Each of the memory blocks DMB1 to DMB8 has the capacity of 128K bits. In FIG. 3, one memory block DMB is shown to have 128 rows and 1024 columns, as an example. One column line CL includes a pair of bit lines BL, /BL.

As shown in FIG. 3, when the DRAM memory cell array is divided into a plurality of blocks, one bit line BL (and /BL) becomes shorter. In data reading, charges stored in a capacitor (memory cell capacitor) in the memory cell are transmitted to a corresponding bit line BL (or /BL). At this time the amount of potential change generated on the bit line BL (or /BL) is proportional to the ratio Cs/Cb of the capacitance Cs of the memory cell capacitor to the capacitance Cb of the bit line BL (or /BL). If the bit line BL (and /BL) is made shorter, the bit line capacitance Cb can be reduced. Therefore, the amount of potential change generated on the bit line can be increased.

In operation, sensing operation of the memory block (memory block DMB2 in FIG. 3) including the word line WL selected by the row decoder 502 is carried out only, and other blocks are kept in a standby state. Consequently, power consumption incidental to charging/discharging of the bit line during sensing operation can be reduced.

When the above described block dividing type CDRAM is applied to the DRAM shown in FIG. 3, a SRAM register and a block decoder must be provided for each of the memory blocks DMB1 to DMB8, which significantly increases the chip area.

Further, the bit lines of the DRAM array and the SRAM array are in one to one correspondence, as described above. When direct mapping method is employed as the method of mapping memories between the main memory and the cache memory, then the SRAM 50 is formed by 1024 cache registers arranged in one row, as shown in FIG. 2. In this case, the capacity of the SRAM cache is 1K bit.

When 4 way set associative method is employed as the mapping method, the SRAM array 506 includes 4 rows of cache registers 506a to 506d as shown in FIG. 4. One of the 4 rows of cache registers 506a to 506d is selected by the selector 510 in accordance with a way address. In this case, the capacity of the SRAM cache is 4K bits.

As described above, the method of memory cell mapping between the DRAM array and the cache memory is determined dependent on the structure in the chip. When the mapping method is to be changed, the cache size also must be changed.

In both of the CDRAM structures described above, the bit lines of the DRAM array and the SRAM array are in one to one correspondence. Therefore, the column address of the DRAM array is inevitably the same as the column address of the SRAM array. Therefore, full associative method in which memory cells of the DRAM array are mapped to an arbitrarily position of the SRAM array is impossible in principle.

Another structure of a semiconductor memory device in which the DRAM and the SRAM are integrated on the same chip is disclosed in Japanese Patent Laid Open (Kokai) No. 2-87392. In this prior art, the DRAM array and the SRAM array are connected through an internal common data bus. The internal common data bus is connected to an input/output buffer for inputting/outputting data to and from the outside of the device. The position of selection of the DRAM array and the SRAM array can be designated by separate addresses. However, in this structure of the prior art, data transfer between the DRAM array and the SRAM array is carried out by an internal common data bus, and therefore the number of bits which can be transferred at one time is limited by the number of internal data buses, which prevents high speed rewriting of the contents of the cache memory. Therefore, as in the above described structure in which the SRAM cache is provided outside the standard DRAM, the speed of data transfer between the DRAM array and the SRAM array becomes a bottleneck, preventing provision of a high speed cache memory system.

In this prior art, data are transferred between the DRAM array and the SRAM array through the internal common data bus. Therefore, an operation which is generally called "copy back mode" cannot be carried out at high speed. The "copy back mode" includes the step of transferring data of a corresponding memory cell in the SRAM array to the original memory cell position of the DRAM array at the time of cache miss, and the step of transferring the data of the DRAM memory cell to which an access is requested to a corresponding memory cell of the SRAM array. Although the internal common data bus is a bi-directional bus, the data transfer at one time is one way, namely, from SRAM to DRAM or from DRAM to SRAM. Therefore, in this structure of the prior art, a number of steps, that is, selecting a word line in the DRAM array, transferring data from the SRAM array to the DRAM array, precharging of the DRAM array (setting to the standby state), selecting of another word line of the DRAM array, and transferring data of a corresponding memory cell of the selected word line to the SRAM are necessary, and therefore "copy back" at high speed is impossible.

In this prior art, data are transferred between the DRAM array and the SRAM array through the internal common data bus. Therefore, at a time of a cache miss, access to the SRAM array to read data from the SRAM array cannot be done until data transfer from the DRAM array to the SRAM array is completed and the DRAM array is set to the standby state. Namely, at the time of a cache miss or the like, reading of data cannot be carried out at high speed.

In a general CDRAM, the DRAM must be refreshed. In the CDRAM in which access to the DRAM array and access the SRAM array cannot be done independently, the SRAM array cannot be accessed during refreshing of the DRAM array. Namely, during this period, the CPU cannot use the cache, and the performance of the cache system is not available.

In a conventional CDRAM, data output timing is determined by an external control signal (/CAS and /WE). At this time, before the establishment of output data, invalid data are output. Dependent on application, for example in a pipeline application, it is preferred that valid data only are always output. Accordingly, the conventional CDRAM has limited application, since the data output timing cannot be changed dependent on application. When it is to be applied to the pipeline processing, separate latch means and the like must be externally provided, which inevitably increases the scale of the cache system. In addition, if such a latch is externally provided and the latch operation is effected by a system clock, data output from the latch at one time must be the data of the previous cycle, in order to prevent latching of invalid data. Data accessed at present cycle cannot be read, which limits the application.

SUMMARY OF THE INVENTION

An object of present invention is to provide a semiconductor memory device containing a cache having a novel structure.

Another object of the present invention is to provide an improved semiconductor memory device containing a cache which can realize a desired mapping system easily.

A further object of the present invention is to provide an improved semiconductor memory device containing a cache in which mapping method can be changed easily without changing cache size.

A still further object of the present invention is to provide a high speed semiconductor memory device containing a cache which can meet with any mapping method having proper block size and set number.

A still further object of the present invention is to provide a semiconductor memory device containing a cache in which data can be transferred at high speed and effectively between a high speed DRAM array and a SRAM array.

A still further object of the present invention is to provide a semiconductor memory device containing a cache in which the DRAM array can be refreshed without keeping an external CPU kept in a waiting state.

A still further object of the present invention is to provide a semiconductor memory device in which data can be read at high speed even at a time of a cache miss.

A still further object of the present invention is to provide a method of data transfer in a semiconductor memory device enabling high speed copy back.

A still further object of the present invention is to provide a semiconductor memory device in which data output timing can be changed dependent on use.

A still further object of the present invention is to provide a data transfer device capable of high speed and efficient data transfer between a DRAM array and a SRAM array.

A still further object of the present invention is to provide a data transfer device in a semiconductor memory device in which writing and reading of data can be carried out at high speed even at a time of a cache miss.

A still further object of the present invention is to provide a data transfer device in a semiconductor memory device capable of high speed copy back operation.

A semiconductor memory device in accordance with the present invention includes an internal data line connected to an input/output buffer for inputting/outputting data to and from the outside of the device; a DRAM array formed of a plurality of dynamic memory cells arranged in a matrix of rows and columns; and an SRAM array formed of a plurality of static memory cells arranged in a matrix of rows and columns.

The semiconductor memory device in accordance with the present invention further includes data transfer means provided independent from said internal data line for transferring data between DRAM array; first connecting means for simultaneously selecting a plurality of memory cells from the DRAM array in response to an externally applied first address and for connecting the selected plurality of memory cells to said transfer means; and a second connecting means for simultaneously selecting a plurality of memory cells from the SRAM array in response to an externally applied second address and for connecting the selected plurality of memory cells to said transfer means. The first and second addresses are applied independent from each other.

The semiconductor memory device in accordance with the present invention further includes means for generating a control signal for activating the transfer means in response to a transfer designating signal for realizing data transfer between the selected plurality of memory cells of the SRAM array and the selected plurality of memory cells of the DRAM array.

In the semiconductor memory device in accordance with the present invention, memory cells can be independently selected in the DRAM array and in the SRAM array. Therefore, an arbitrary mapping method can be realized. In addition, data transfer between the DRAM array and the SRAM array are carried out through transfer means and by the unit of a plurality of memory cells at one time. If the memory cells selected at one time constitute one block, cache block can be transferred between the DRAM array and the SRAM array at high speed, which realizes a high cache memory.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 34A and 34B show mutual data transfer operation between the DRAM array and SRAM array when the bi-directional transfer gate shown in FIGS. 6, 27 and 31 is used.

FIGS. 36A and 36B show mutual data transfer operation between the DRAM array and the SRAM array, when bi-directional transfer gate shown in FIGS. 6, 27 and 31 is used.

FIG. 64 shows correspondence between command registers and command register selecting signals shown in FIG. 18.

FIG. 74 shows, in a table, operation modes of the CDRAM in accordance with one embodiment of the present invention.

DESCRIPTION OF THE PREFERRED EMBODIMENTS

[Array Structure]

Figure 5:
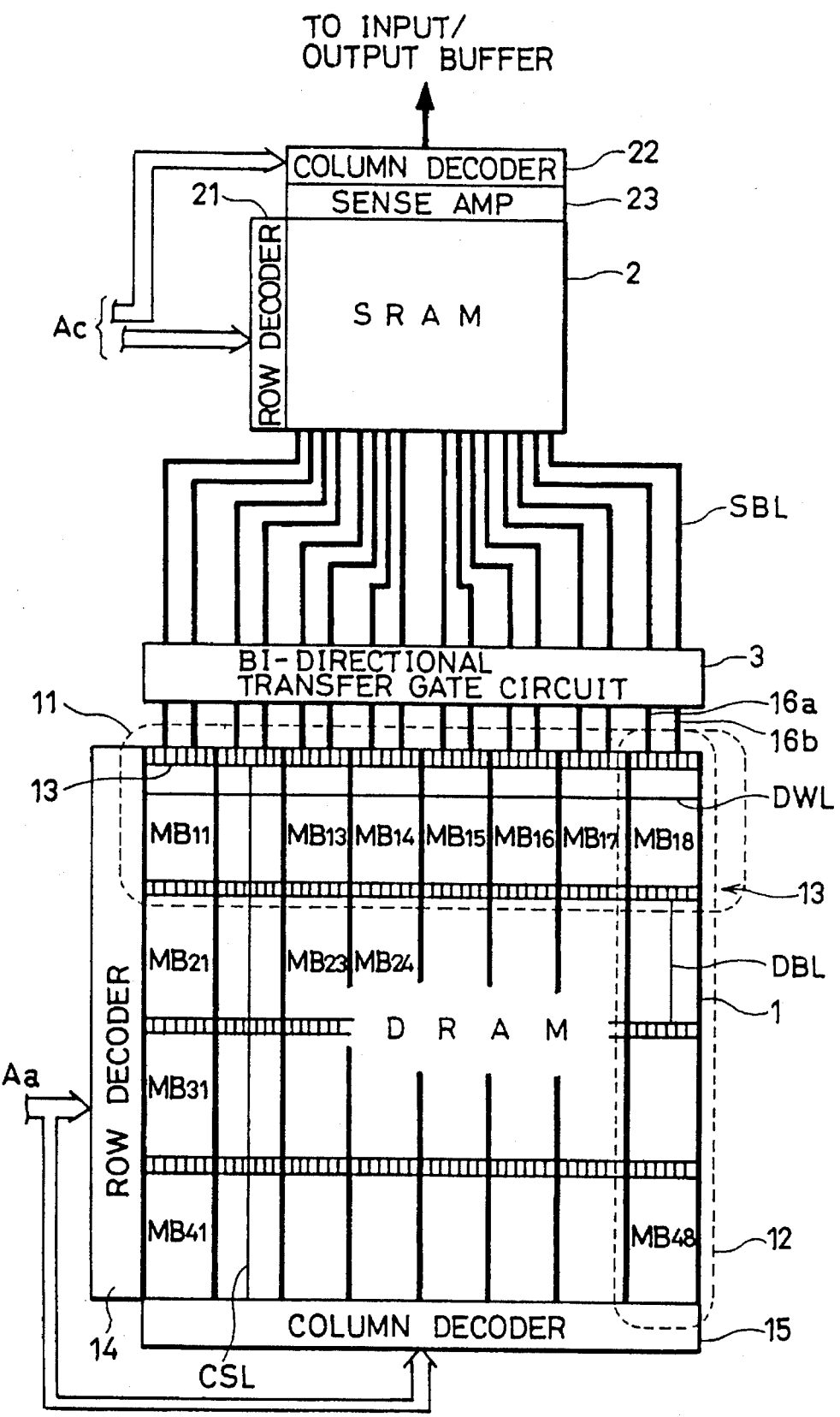
FIG. 5 shows a structure of a memory array of a semiconductor memory device containing a cache in accordance with one embodiment of the present invention.

FIG. 5 schematically shows a structure of a memory array portion of the semiconductor memory device in accordance with one embodiment of the present invention. Referring to FIG. 5, the semiconductor memory device comprises a DRAM array 1 including dynamic memory cells arranged in a matrix of rows and columns, a SRAM array 2 including static memory cells arranged in a matrix of rows and columns, and a bi-directional transfer gate circuit 3 for transferring data between DRAM array 1 and SRAM 2.

DRAM array 1 includes, assuming that it has storage capacity of 1M bit, 1024 word lines WL and 1024 pairs of bit lines BL and/BL. In FIG. 5, the bit line pair is denoted by DBL. DRAM array 1 is divided into a plurality of blocks along the row and column directions. In FIG. 5, DRAM array 1 is divided into 8 blocks MBI1 to MBI8 (I=1 to 4) along the column direction and divided into 4 blocks MB1j to MB4j (j=1 to 8) along the row direction, namely, it is divided into a total of 32 memory blocks as an example.

8 blocks MBI1 to MB18 divided in the column direction constitute one row block 11. 4 blocks MB1j MB4j divided in the row direction constitute a column block 12. The memory blocks MbI1 to MB18 included in one row block 11 shares one word line WL. The memory blocks MB1j to MB4j included in the same column block 12 shares a column selecting line CSL. A sense amplifier+IO block 13 is provided for each of the memory blocks MB11 to MB18. The structure of sense amplifier+IO block 13 will be described later. Column selecting line CSL simultaneously selects two columns (two pairs of bit lines).

The semiconductor memory device further comprises a row decoder 14 responsive to an external address for selecting a corresponding one row from DRAM array 1, and a column decoder 15 responsive to an externally applied column address for selecting one column selecting line CSL. Column blocks 12 are connected to the bi-directional transfer gate circuit 3 through two pairs of I/O lines 16a and 16b which are independent from each other.

SRAM array 2 includes 16 pairs of bit lines SBL which are connected to 16 pairs of I/O lines through the bi-directional transfer gates circuit 3, respectively. If SRAM array 2 has the capacity of 4K bit, it includes 16 pairs of bit lines and 256 word lines. Namely, in SRAM array 2, one row corresponds to 16 bits. SRAM array comprises a SRAM row decoder 21 for decoding a row address externally applied to the SRAM array for selecting one row of SRAM array 2, a SRAM column decoder 22 for decoding an externally applied column address and for selecting a corresponding column in SRAM array 2, and a sense amplifier circuit 23 for amplifying and outputting data of the memory cell selected by SRAM row decoder 21 and SRAM column decoder 22 in data reading. The SRAM bit line pair SBL selected by SRAM column decoder 22 is connected to a common data bus, and input/output of data with the outside of the device is effected through an input/output buffer (not shown). Addresses applied to DRAM row decoder 14 and DRAM column decoder 15 are independent from addresses applied to SRAM row decoder 21 and SRAM column decoder 22, which addresses are applied to mutually different address pin terminals. Data transfer operation of the semiconductor memory device shown in FIG. 5 will be briefly described with reference to FIG. 5. In the following description, it is assumed that DRAM array has the storage capacity of 1M bit, and SRAM array has the storage capacity of 4K bit.

[Data Transfer]

The operation of the DRAM portion will be described. First, in accordance with an externally applied row address, row decoder 14 carries out a row selecting operation and raises potential of one word line DWL to "H". Data are read to corresponding 1024 bit lines BL (or/BL) from memory cells connected to the selected one word line DWL.

Then, sense amplifiers (included in the block 13) of row block 11 including the selected word line DWL are activated at one time, and differentially amplify potential difference between each bit line pair. Only one of the four row blocks 11 is activated to reduce power consumption incidental to charging/discharging of the bit lines during the sensing operation. This operation, in which only the row block including the selected row is activated, is called partial activation operation method.

In accordance with an externally applied column address, DRAM column decoder 15 carries out a column selecting operation and one column selecting line CSL is set to the selected state in each column block 12. The column selecting line CSL selects two pairs of bit lines, and the two pairs of bit lines are connected to two pairs of I/O lines 16a and 16b provided corresponding to the block. Consequently, a plurality of bits (16 bits in this embodiment) of data are read to the plurality of I/O line pairs 16a and 16b from DRAM array 1.

Operation of the SRAM portion will be described. In accordance with an externally applied row address, SRAM row decoder 21 carries out row selecting operation and selects one word line from SRAM array 2. As described above, 16 bits of memory cells are connected to one SRAM word line. Therefore, by the selection of one word line, 16 static memory cells (SRAM cells) are connected to 16 pairs of bit lines SBL.

After 16 bits data have been transmitted to I/O line pairs 16a and 16b for DRAM array 1, bi-directional transfer gate circuit 3 is turned ON, and 16 pairs of I/O lines 16a and 16b are connected to 16 pairs of bit lines SBL of the SRAM. Consequently, data which have been transmitted to 16 pairs of I/O lines 16a and 16b are written to the 16 bits of memory cells which have been selected in SRAM array 2.

A sense amplifier circuit 23 and column decoder 22 provided in the SRAM are used to exchange data between the memory cells in SRAM array 2 and an input/output buffer for inputting/outputting external data.

It is possible to set addresses for selecting SRAM cells in SRAM array 2 completely independent from addresses for selecting dynamic memory cells (DRAM cells) in DRAM array 1 (these addresses are input through different address pins). Therefore, it is possible for the 16 bits of memory cells selected in DRAM array 1 to exchange data with memory cells at an arbitrary position (row) of SRAM array 2. Therefore, all of the direct mapping method, set associative method and full associative method can be realized without changing the structure and array arrangement.

The principal of simultaneous transfer of 16 bits of data from the DRAM to the SRAM has been described. Simultaneous transfer of 16 bits of data from SRAM array 2 to DRAM array 1 is carried out in the same manner, except that the direction of data flow through the bi-directional transfer gate circuit 3 is inverted. The structure and operation of the semiconductor memory device containing a cache in accordance with the present invention will be described in detail.

[Details of Array Structure]

Figure 1:
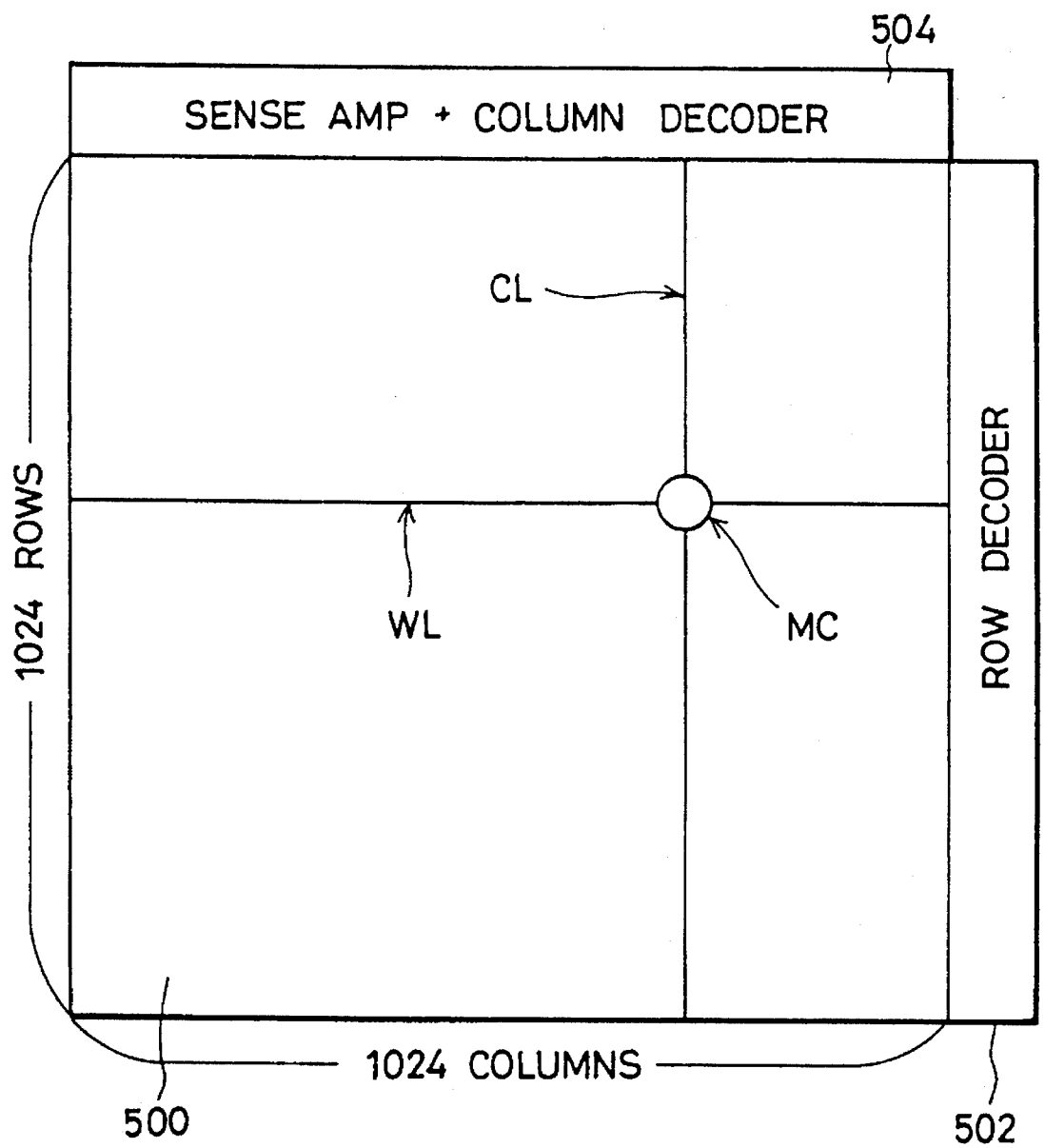
FIG. 1 shows an array structure of a conventional 1M bit DRAM.
Figure 2:
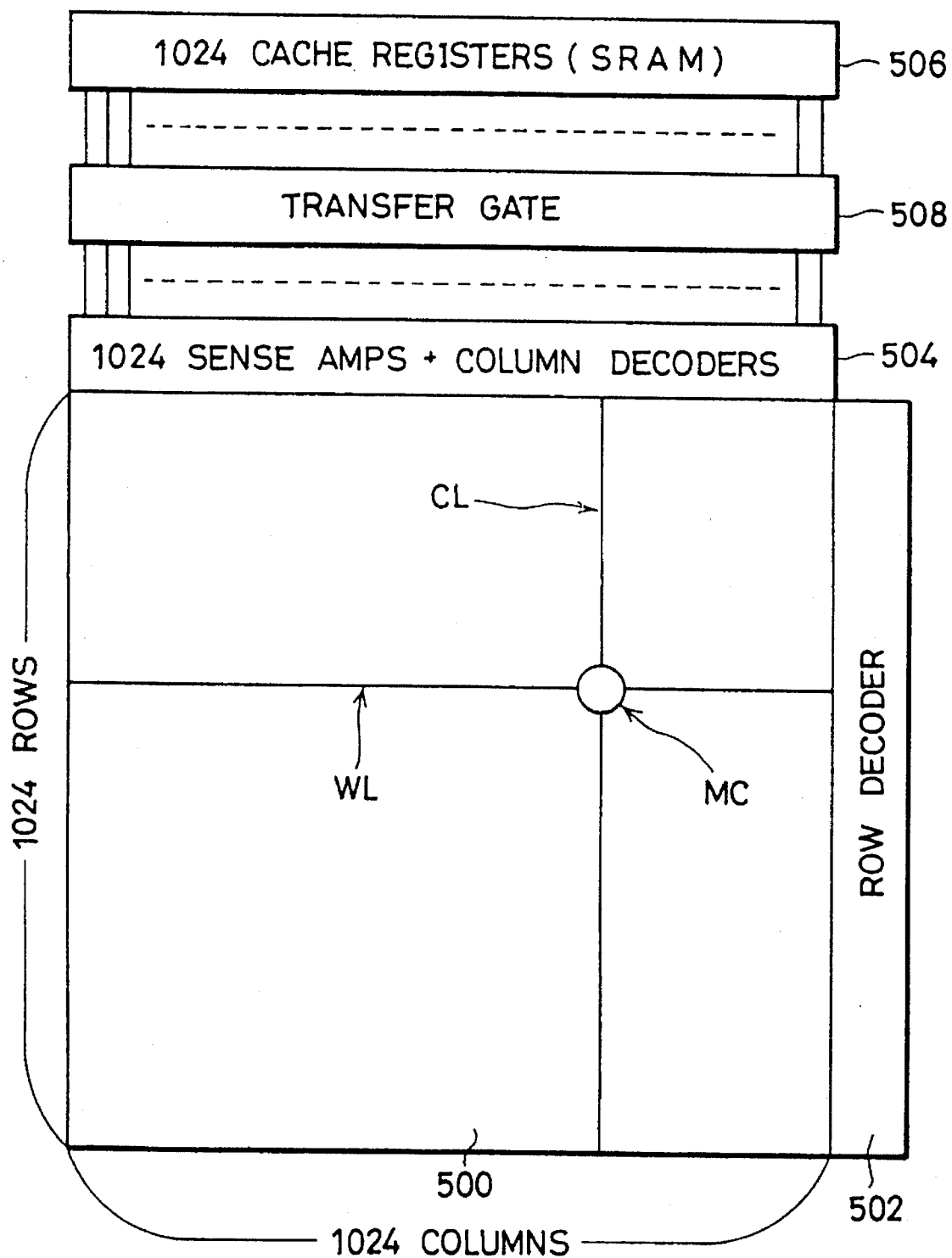
FIG. 2 shows an array arrangement of a conventional semiconductor memory device containing a cache.
Figure 3:
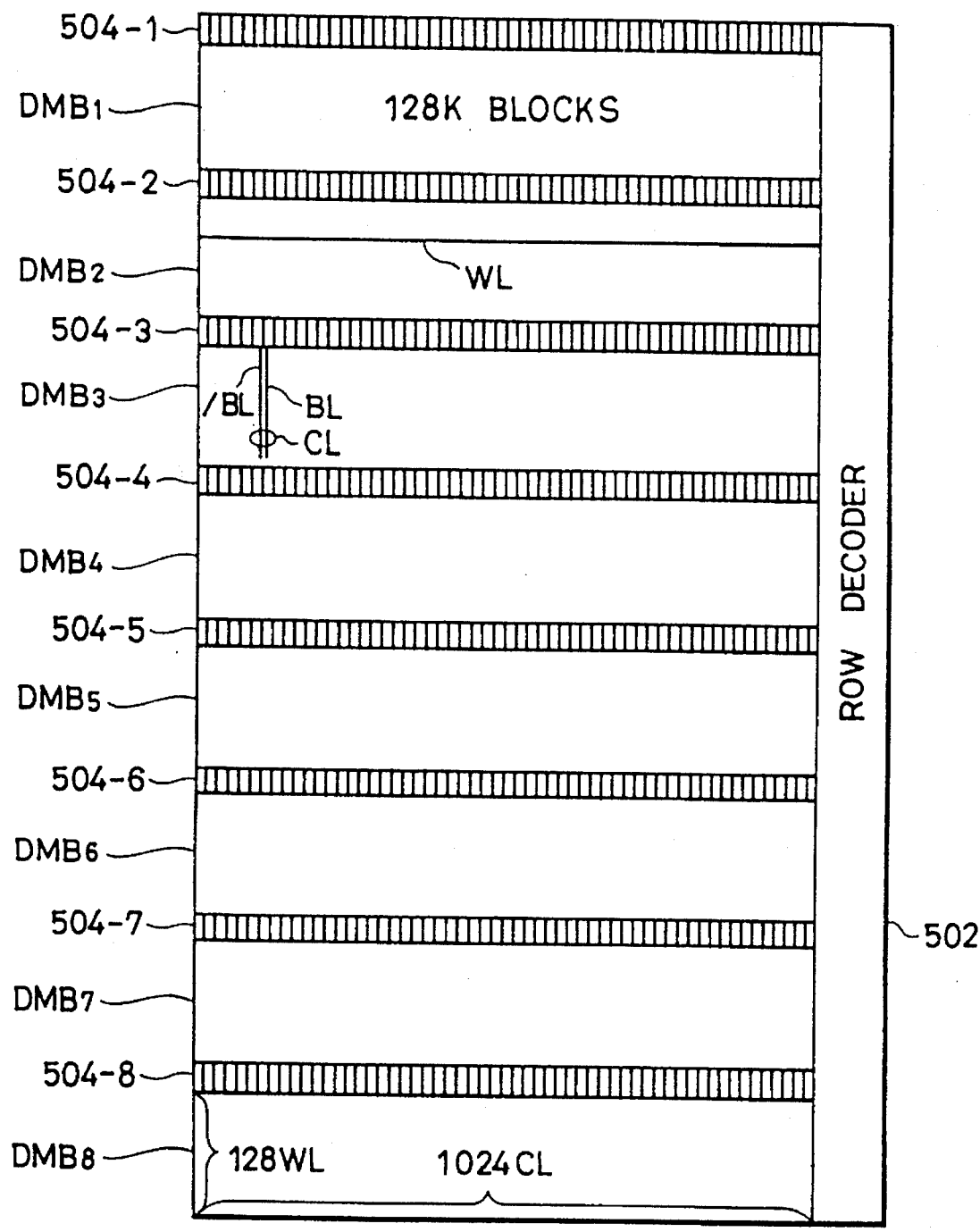
FIG. 3 shows a specific arrangement of a conventional 1M bit DRAM as an example.
Figure 4:
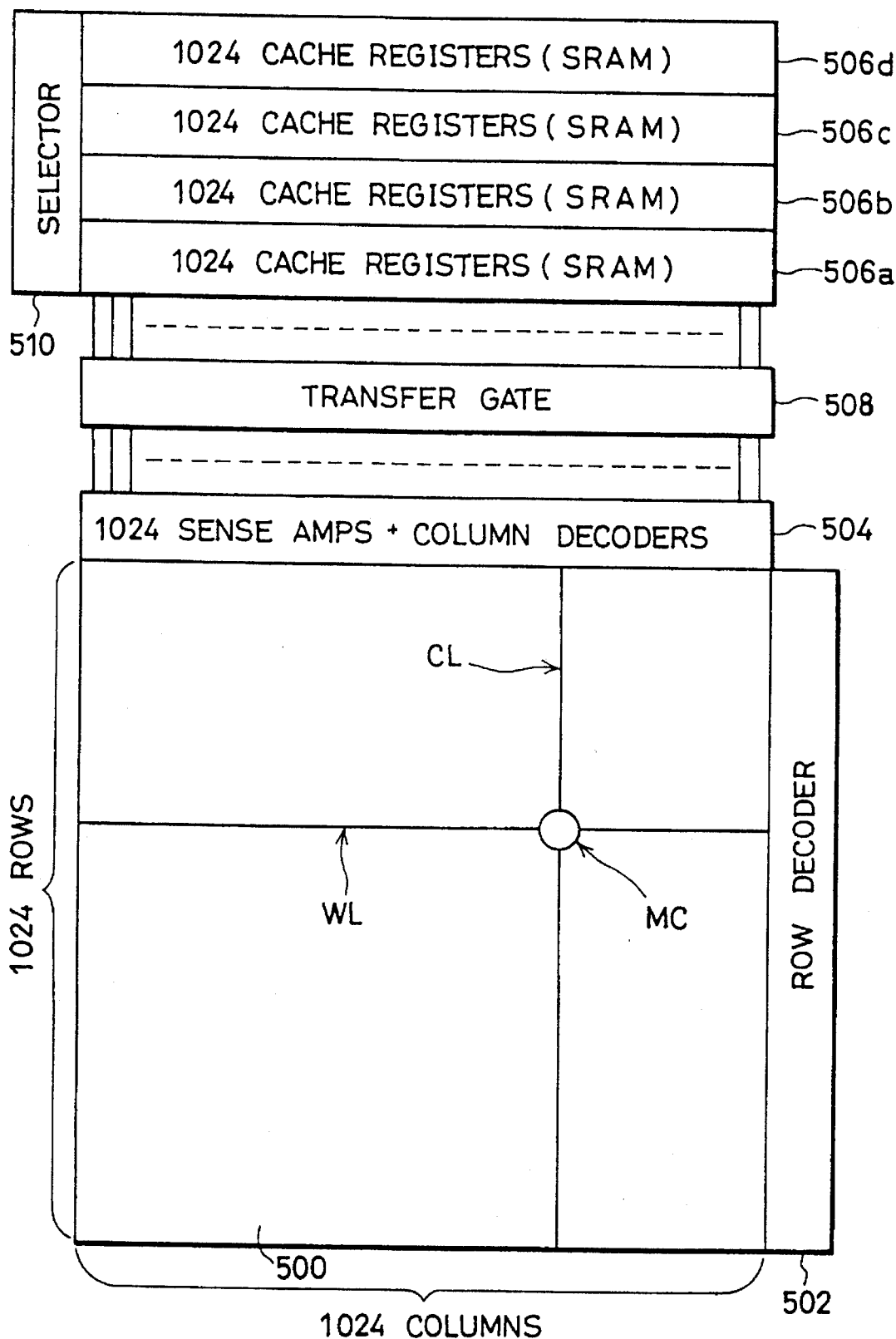
FIG. 4 shows an array arrangement for realizing 4 way set associative method in a conventional semiconductor memory device containing a cache.
Figure 6:
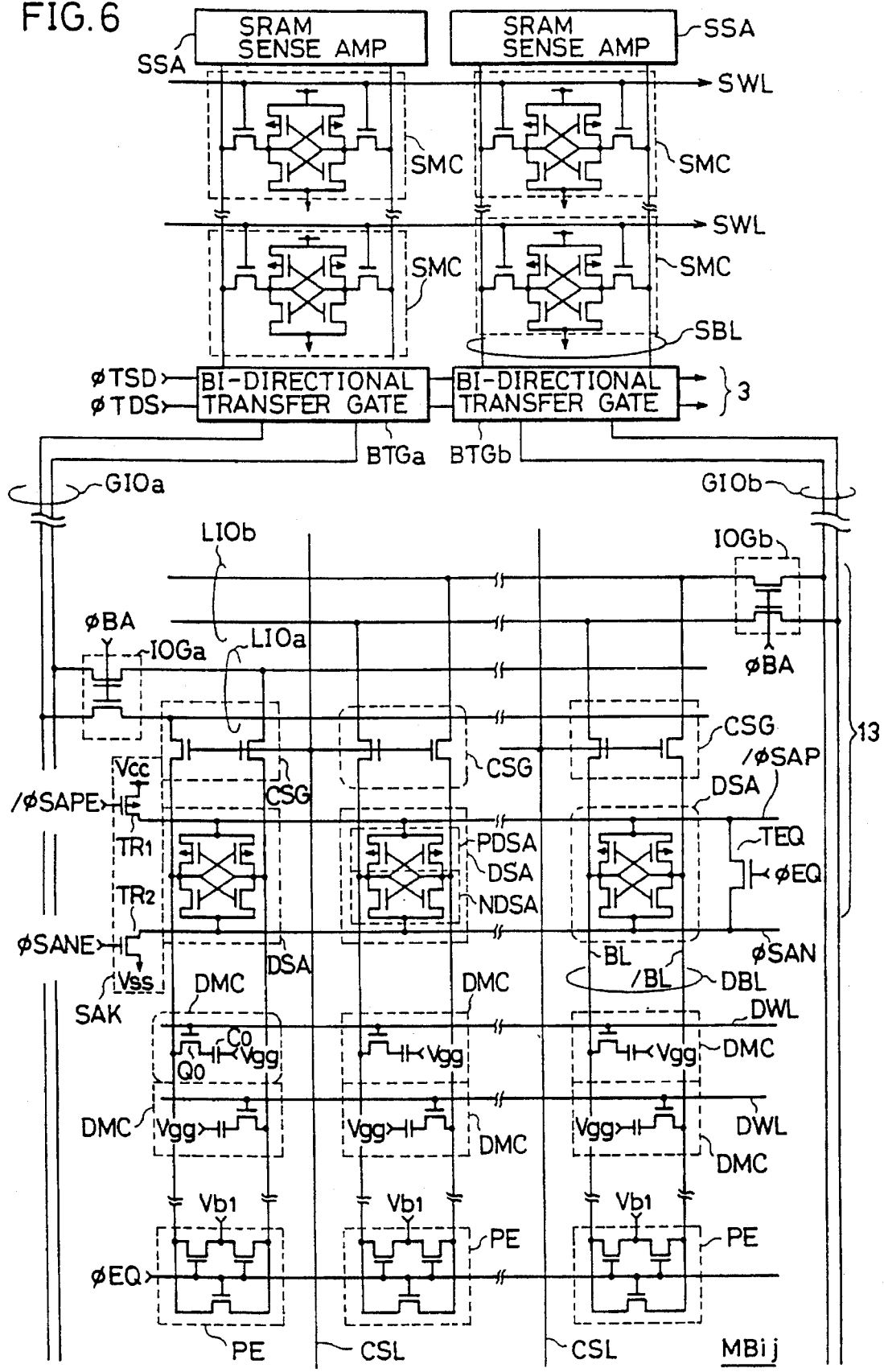
FIG. 6 shows a detailed structure of portions related to one memory block of the semiconductor memory device shown in FIG. 5.

FIG. 6 shows a specific structure of a main portion of the semiconductor memory device shown in FIG. 5. FIG. 6 shows, as a representative, a portion related to data transfer of one memory block MBij of DRAM array shown in FIG. 1. Referring to FIG. 6, DRAM memory block MBij includes a plurality of DRAM cells DMCs arranged in rows and columns. DRAM cell DMC includes one transistor Q0 and one capacitor C0. A constant potential Vgg is applied to one electrode (cell plate) of memory capacitor C0.

The memory block MBij further includes DRAM word lines DWL to each of which one row of DRAM cells DMCs are connected, and DRAM bit line pairs DBL to each of which a column of DRAM cells DMCs are connected. The DRAM bit line pair DBL includes two bit lines BL and /BL. Signals complementary to each other are transmitted to bit lines BL and /BL. A DRAM cell DMC is arranged at an intersection of a DRAM word line DWL and a DRAM bit line pair DBL.

A DRAM sense amplifier DSA for detecting and amplifying potential difference on corresponding bit line pair is provided for each of the DRAM bit line pairs DBL. Operation of DRAM sense amplifier DSA is controlled by a sense amplifier activating circuit SAK which generates sense amplifier driving signals φSAN and /φSAP in response to sense amplifier activating signals φSANE and/φSAPE. DRAM sense amplifier DSA includes a first sense amplifier portion PDSA having p channel MOS transistors cross coupled for raising a bit line potential which is higher to operational supply potential Vcc level in response to the signal /φSAP, and a second sense amplifier portion NDSA having n channel MOS transistors cross coupled for discharging potential of a bit line which is lower to, for example, the potential. Vss of the ground potential level, in response to the signal φSAN.

The sense amplifier activating circuit SAK includes a sense amplifier activating transistor TR1 which is turned on in response to sense amplifier activating signal/φSAPE for activating the first sense amplifier portion of DRAM sense amplifier DSA, and a sense amplifier activating transistor TR2 which is turned on in response to sense amplifier activating signal φSANE for activating the second sense amplifier portion of DRAM sense amplifier DSA. Transistor TR1 is formed by a P channel MOS transistor, while the transistor TR2 is formed by an n channel MOS transistor. When it is turned on, transistor TR1 transmits a driving signal/φSAP of the operational supply potential Vcc level to one supply node of each sense amplifier DSA. When it is turned on, transistor TR2 transmits a signal φSAN of the potential Vss level to the other supply node of DRAM sense amplifier DSA.

Between a signal line/φSAP and the signal line φSAN to which signals /φSAP and φSAN are output from sense amplifier activating circuit SAK, an equalize transistor TEQ is provided for equalizing both signal lines in response to an equalize designating signal φEQ. Therefore, in the standby state, sense amplifier driving signal lines /φSAP and φSAN are precharged to an intermediate potential of (Vcc+Vss). Signal lines and signals transmitted thereto are represented by the same reference characters.

For each of the DRAM bit line pairs DBL, a precharge/equalize circuit PE which is activated in response to a precharge equalize signal φEQ for precharging and equalizing bit lines of the corresponding bit line pair to a prescribed precharge potential Vb1 is provided.

DRAM memory block MBij further comprises a column selecting gate CSG provided for each of the DRAM bit line pairs DBL and turned on in response to a signal potential on column selecting line CSL for connecting the corresponding DRAM bit line pair DBL to a local I/O line pair LIO. A column selecting line CSL is commonly provided for two pairs of DRAM bit lines, and therefore, two DRAM bit line pairs DBL are selected simultaneously. In order to receive data from the simultaneously selected two pairs of DRAM bit lines, two pairs of local I/O lines, that is, LIOa and LIOb are provided.

Memory block MBij further comprises IO gates IOGa and IOGb responsive to a block activating signal φBA for connecting the local I/O line pairs LIOa and LIOb to global I/O line pairs GIOa and GIOb, respectively. Column selecting line CSL extends in the row direction over one column block shown in FIG. 1, and global I/O line pair GIOa and GIOb also extend in the row direction over one column block. Local I/O line pair LIOa and LIOb extend only in the column direction in one memory block.

I/O lines 16a and 16b in FIG. 5 correspond to local I/O line pair LIOa and LIOb, LIO gates IOGa and IOGb, and global I/O line pairs GIOa and GIOb, respectively.

SRAM comprises SRAM word lines SWL to each of which one row of SRAM cells SMCs are connected, SRAM bit line pairs SBL to each of which a column of SRAM cells SMCs are connected, and SRAM sense amplifiers SSA provided corresponding to the SRAM bit line pairs SBL for detecting and amplifying potential difference between the corresponding bit line pair. Bi-directional transfer gate 3 comprises bi-directional transfer gates BTGa and BTGb provided between SRAM bit line pair SBL and global I/O line pair GIO. Both of bi-directional transfer gates BTGa and BTGb transfer data between SRAM bit line pair SBL and global I/O line pairs GIOa and GIOb in response to data transfer designating signals φTSD and φTDS. Data transfer designating signal φTSD designates data transfer from SRAM portion to DRAM portion, while data transfer designating signal φTDS designates data transfer from DRAM portion to SRAM portion.

Figure 7:
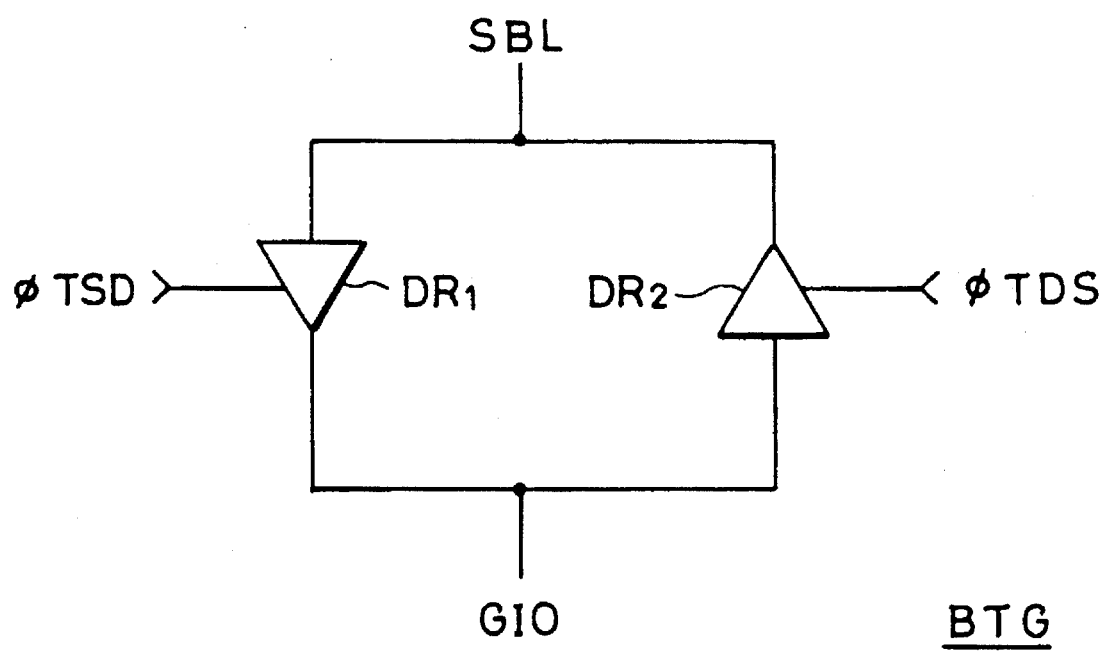
FIG. 7 Shows one example of a bi-directional transfer gate structure shown in FIG. 6.

FIG. 7 shows one example of a structure of bi-directional transfer gate BTG. Referring to FIG. 7, bi-directional transfer gate BTG (BTGa or BTGb) comprises a drive circuit DR1 which is activated in response to data transfer designating signal φTSD for transmitting data on SRAM bit line pair SBL to global I/O line pair GIO, and a drive circuit DR2 which is activated in response to data transfer designating signal φTDS for transmitting data on global I/O line pair GIO to SRAM bit line pair SBL. Drive circuits DR1 and DR2 are set to an output high impedance state when data transfer designating signals φTSD and φTDS are inactive.

[Data Transfer Operation (I)]

Figure 8:
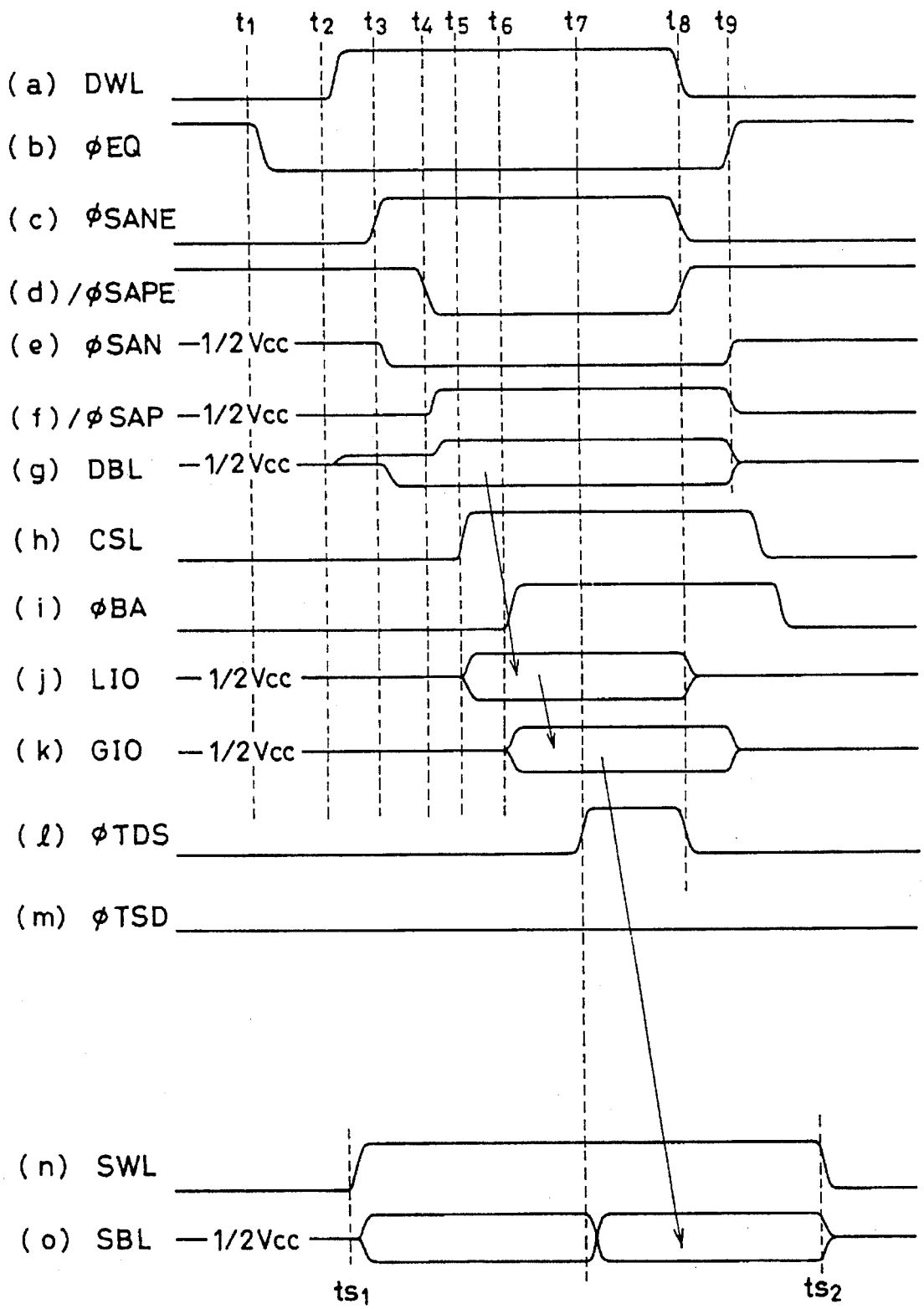
FIG. 8 is a diagram of signal waveforms showing the data transfer operation from the DRAM array to the SRAM in the semiconductor memory device shown in FIG. 5.

FIG. 8 is a diagram of signal waveforms showing operation when data are transferred from DRAM array to SRAM array. Data transfer operation from DRAM array to SRAM array will be described with reference to FIGS. 6 to 8.

While precharge designating signal φEQ is at an active state "H" before time T1, sense amplifier driving signal lines φSAN, /φSAP, local I/O line pair LIO and global I/O line pair GIO are maintained at a precharge potential of Vcc/2. At this time, precharge equalize circuit PE is activated to precharge DRAM bit line pair DBL to the precharge potential of Vcc/2 (=Vb1) and equalizes potentials of the bit lines BL, /BL.

When precharge designating signal φEQ falls at t1, precharge equalize circuit PE and equalize transistor TEQ are rendered inactive. Consequently, equalizing operation of the sense amplifier driving signal lines φSAN and/φSAP is completed, equalize/precharge operation of DRAM bit line pair DBL is stopped, and DRAM bit line pair DBL and sense amplifier driving signal lines φSAN and/φSAP are set to a floating state of the intermediate potential Vcc/2 (where Vss=0 V).

Thereafter, in accordance with an externally applied address, row selecting operation is effected by row decoder 14 (see FIG. 5), one word line DWL is selected in DRAM array 1 (see FIG. 5) at t2, and potential of the selected word line DWL rises to "H". One row of memory cells connected to the selected word line DWL are connected to corresponding DRAM bit line pair DBL (DRAM bit line BL or /BL), and potential of respective DRAM bit lines changes dependent on data of the memory cell connected thereto. FIG. 8 shows potential change of a DRAM bit line pair DBL when a memory cell storing the potential "H" is selected.

At time t3, sense amplifier activating signal φSANE rises from ground potential Vss to the operational supply potential Vcc level, and transistor TR2 in sense amplifier activating circuit SAK is turned on. Consequently, the second sense amplifier portion in DRAM sense amplifier DSA is activated, and a bit line of lower potential of the DRAM bit line pair DBL is discharged to the level of the ground potential GND.

At time t4, sense amplifier activating signal/φSAPE falls from the potential Vcc to the ground potential GND level, and transistor TR1 in sense amplifier activating circuit SAK is turned on. Consequently, the first sense amplifier portion PDSA of DRAM sense amplifier DSA is activated, and the bit line of higher potential of the DRAM bit line pair DBL is charged to the level of the operational supply potential Vcc.

At time t5, in accordance with a column selecting signal from DRAM column decoder 15 (see FIG. 5), one column selecting line CSL is selected, and potential of the selected column selecting line CSL rises to "H". Consequently, two pairs of DRAM bit line pairs DBL are connected to local I/O line pairs (LIOa and LIOb) through the column selecting gate CSG. Consequently, potential on the selected DRAM bit line pair DBL is transmitted to local I/O line pair LIO, and potential of local I/O line pair changes from the precharge potential Vcc/2.

At time t6, block activating signal φBA rises to "H" only for the selected row block, and I/O gate IOG is turned on. Consequently, signal potential on local I/O line pair LIO is transmitted to global I/O line pair GIO. "Selected row block" means a row block including the selected word line DWL. Designation of the selected row block is effected by decoding, for example, upper 2 bits of the row address used for selecting the DRAM word line. By such partial activation operation, current consumption can be reduced.

In SRAM, row selecting operation is done by SRAM row decoder 21 (see FIG. 5) at time ts1, one SRAM word line SWL is selected in SRAM array, and potential of the selected SRAM word line SWL rises to "H". Row selecting operation in DRAM and row selecting operation in SRAM are carried out in non-synchronous manner. Data of SRAM cells connected to the SRAM word line SWL are transmitted to corresponding SRAM bit line pair SBL. Consequently, potential of SRAM bit line pair SBL changes from the precharge potential Vcc/2 to potential corresponding to the information stored in the corresponding SRAM cell.

At time t7, data transfer designating signal φTDS attains to and is maintained at "H" for a prescribed time period. Before t7, data of DRAM cell has been already transmitted to the global I/O line pair GIO, and SRAM cells have been connected to SRAM bit line pair SBL. In response to data transfer designating signal φTDS, bi-directional. transfer gate BTG is activated and it transmits signal potential on global I/O line pair GIO to the corresponding SRAM bit line pair SBL. Consequently, data are transmitted from DRAM cell to SRAM cell.

Time relation between ts1, t1 and t6 is arbitrary, provided that the time t7 at which data transfer designating signal φTDS is activated is after t6 at which block activating signal φBA rises and after ts1 at which SRAM word line SWL is selected. In this cycle, data transfer designating signal φTSD designating transfer from SRAM to DRAM is kept at inactive state, that is, "L".

At time t8, potential of the selected DRAM word line DWL falls to "L", at time ts2, potential of the selected SRAM word line SWL falls to "L", and various signals are returned to the initial state. Thus, the data transfer cycle from DRAM to SRAM is completed.

As described above, DRAM column decoder 15 (see FIG. 5) selects one column selecting line CSL in each column block 12. One column selecting line CSL selects two pairs of DRAM bit lines DBL. Data transfer from DRAM to SRAM is carried out column block by column block in parallel. Therefore, in the embodiment shown in the figure, 16 bits of data are transferred simultaneously. This relation is realized in a structure having 8 column blocks and in which two pairs of DRAM bit lines are selected in each column block. The number of bits of the data transferred at one time changes dependent on the number of DRAM bit line pairs selected at one time or dependent on the number of column blocks. Therefore, appropriate block size can be set.

Figure 9:
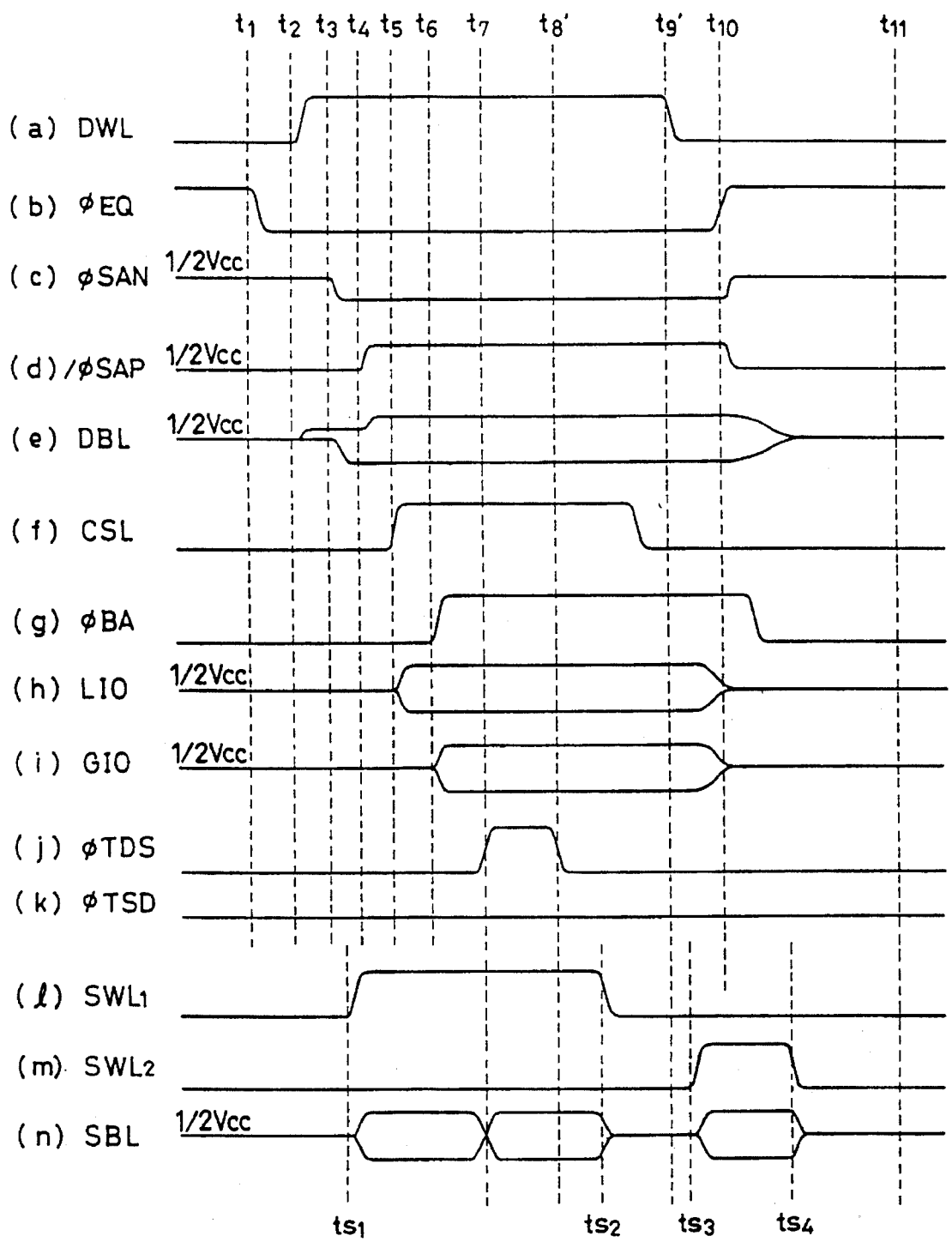
FIG. 9 is a diagram of signal waveforms showing data transfer operation from the DRAM array to the SRAM array and an access operation to the SRAM after the data transfer in the semiconductor memory device shown in FIG. 5.

As shown in FIG. 8, when DRAM word line driving signal DWL falls to "L" of the inactive state approximately at the time t8, data transfer designating signal φTDS falls to "L" in response. At this time t8, local I/O line pair LIO is disconnected from SRAM bit line pair SBL, and DRAM array and SRAM are electrically separated. After the time t8, DRAM portion and SRAM portion can operate independent from each other. Therefore, as shown in FIG. 9, when data transfer designating signal φTDS is made inactive at time t8', the word line driving signal DWL in DRAM array is still maintained at the active state, that is, "H". At this time, the DRAM cannot be newly accessed externally, but SRAM array portion can be externally accessed.

More specifically, as shown in FIG. 9, when data transfer designating signal φTDS falls to "L" at time t8' and even if DRAM array is active at that time, SRAM array can be newly accessed after the lapse of a prescribed time period from time ts2 at which it is set to the standby state. Therefore, after the time t8', SRAM portion can be accessed regardless of the state of DRAM. For example, at time t8', data at a cache miss can be read from SRAM array.

Further, before the DRAM is returned to the standby state, SRAM can be accessed by newly setting an external address. The reason for this is that RAS precharging operation necessary for a DRAM is not necessary for the SRAM and the SRAM can be accessed at high speed after the return to the standby state.

Referring to FIG. 9, DRAM word line driving signal DWL falls to "L" at time t9'. When equalize signal φEQ is activated at time t10, equalize and precharge operations of DRAM bit line pair DBL is started. At this time, equalizing operation of sense amplifier driving signal lines φSAN and/φSAP is also carried out. DRAM together with peripheral circuits thereof are returned to the standby state at a time t11 after several ten nsec from time t9'. The DRAM array cannot be accessed until a prescribed RAS precharge time period has lapsed. However, in SRAM array, at time ts3 after several nsec from time ts2 at which the SRAM word line SWL1 is set to the non-selected state, it is possible to select another SRAM word line SWL2 in accordance with an external address and to access (read data from or write data to) memory cells connected to the selected SRAM word line SWL2.

Time interval between ts2 at which data transfer designating signal φTDS falls to the inactive state "L" to ts3 at which SRAM word line SWL2 can be activated is set at an appropriate value by external specification. Since access to the SRAM is made possible before DRAM is returned to the standby state, a semiconductor memory device which operates at high speed, especially a semiconductor memory device containing a cache can be provided.

Since it is not necessary to carry out column selecting operation after the sensing operation of the sense amplifier and latch operation in the DRAM, a very short time period is enough as the selecting period of the word line SWL2 in SRAM. At time ts4, access to the SRAM is completed. In a normal SRAM, the time period from ts3 to ts4 is about 10 ns at the most. Access to the SRAM is completed during the standby state of the DRAM. The structure enabling access to the SRAM before the DRAM array is returned to the standby state is realized by the semiconductor memory device of the present invention in which SRAM and DRAM can be accessed by designating addresses, which addresses are independent from each other.

Figure 10:
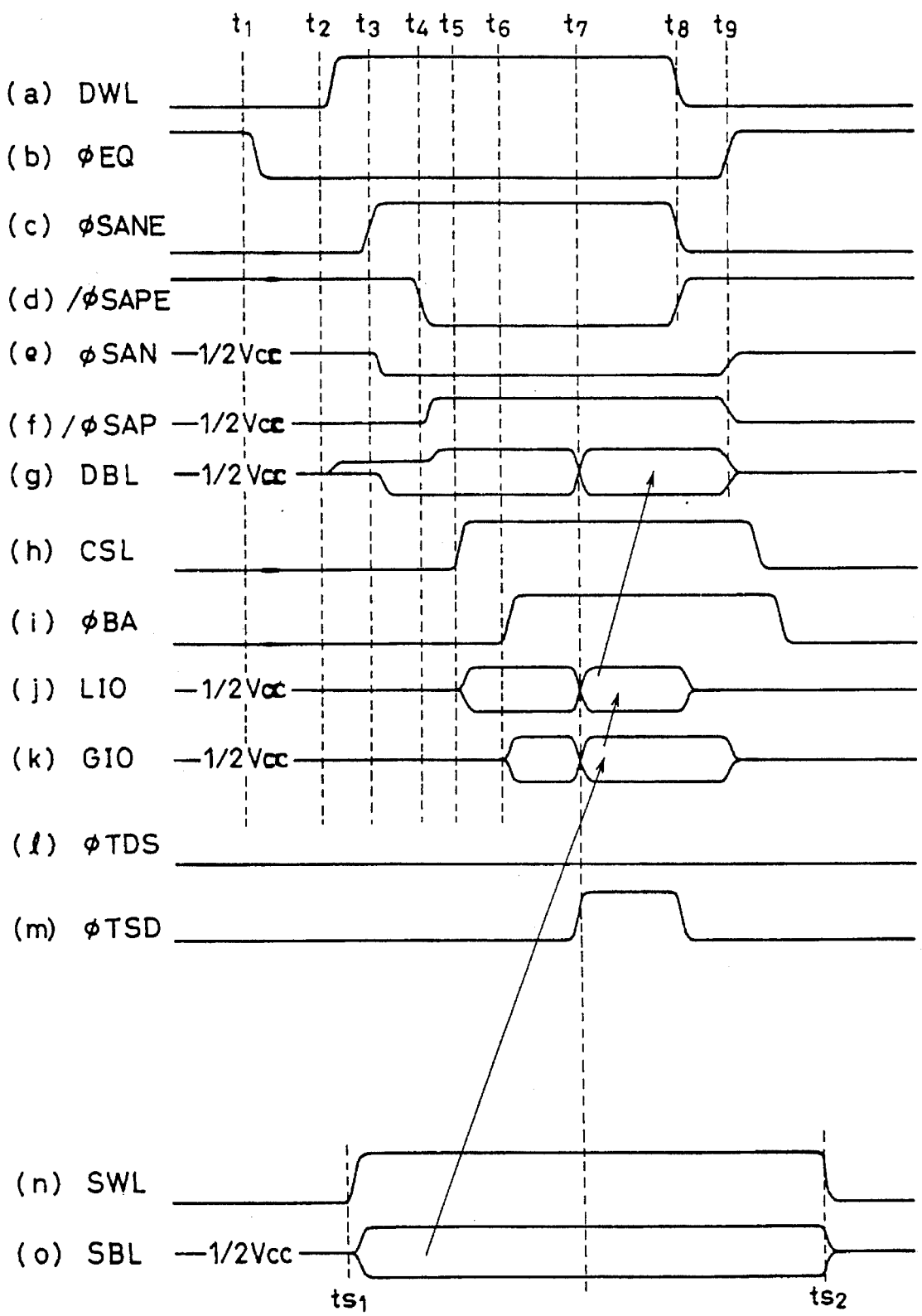
FIG. 10 is a diagram of signal waveforms showing a data transfer operation from the SRAM array to the DRAM array in the semiconductor memory device of FIG. 5.

FIG. 10 is a diagram of signal waveforms showing operations in data transfer from SRAM to DRAM. The data transfer operation from SRAM to DRAM will be described with reference to FIGS. 6 and 10. The operation in the DRAM portion from t1 to t6 is the same as that in data transfer from the DRAM to SRAM shown in FIG. 8. As to the operation of the SRAM portion, potential of SRAM word line SWL rises to "H" at time ts1, as in the signal waveform of FIG. 8.

After the time ts1 and t6, that is, after DRAM bit line pair DBL is connected to global I/O line pair GI0 and SRAM cells (SMCs) are connected to SRAM bit line pair SBL, data transfer designating signal φTSD is activated and rises to "H" for a prescribed time period after t7. In response, bi-directional transfer gate BTG is activated and transmits signals on SRAM bit line pair SBL to DRAM bit line pair DBL through global I/O line pair GI0 (GIOa, GIOb) and through local I/O line pair LIO (LIOa, LIOb). Consequently, data of the DRAM cells connected to the selected DRAM bit line pair DBL are rewritten. Namely, data in the SRAM cells are transferred to the DRAM cells. In the data transfer cycle from SRAM array to DRAM array, data transfer designating signal φTDS is maintained at inactive state, that is, "L".

In this manner, by successively setting the signals φTSD and φTDS active, data transfer (copy back) from SRAM to DRAM and from DRAM to SRAM can be easily carried out regardless of the type of mapping.

[Specific Structure of Array Layout]

Figure 11:
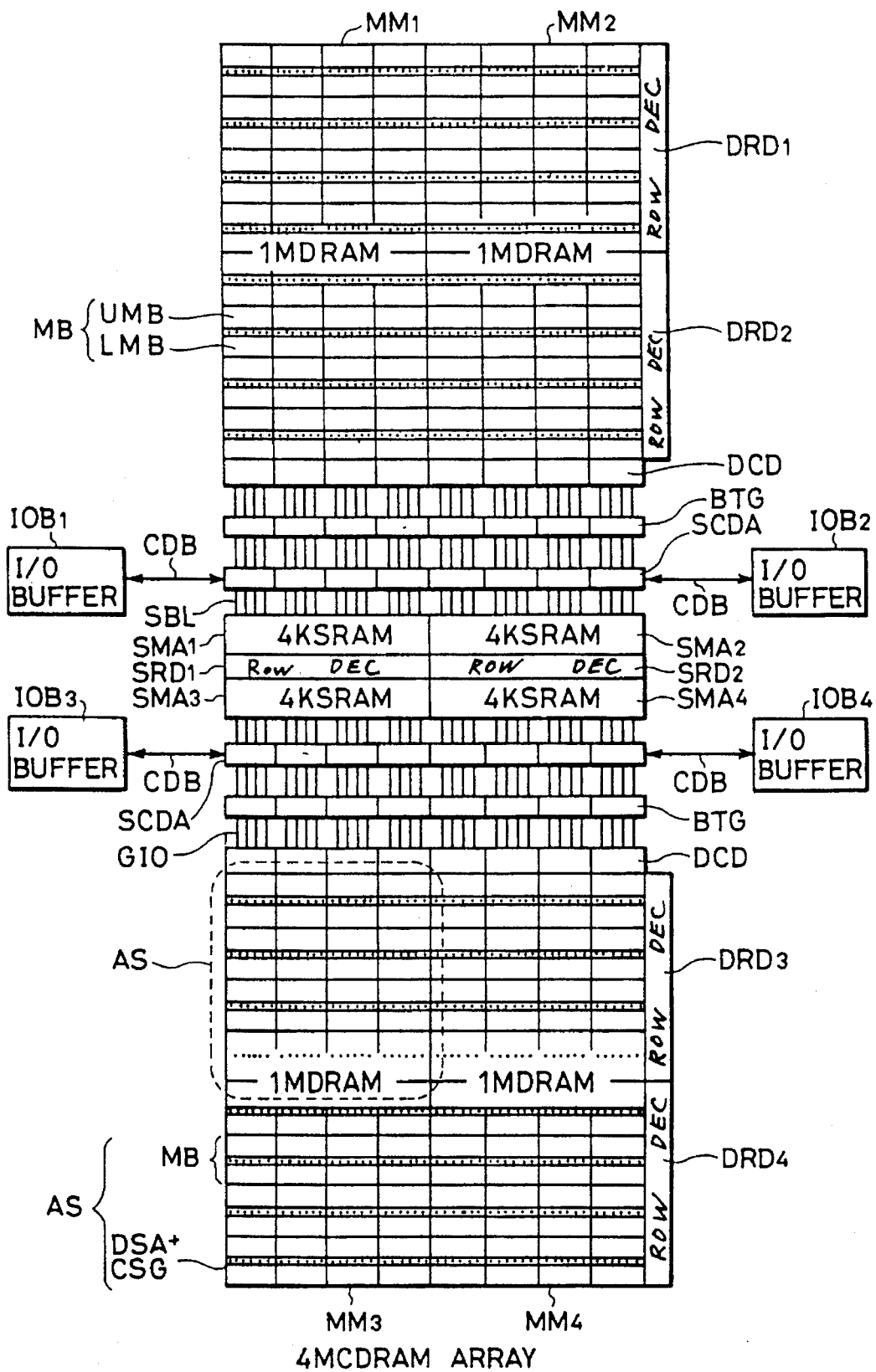
FIG. 11 shows a whole structure of a semiconductor memory device containing a cache in accordance with another embodiment of the present invention.

FIG. 11 shows a layout of an array in a semiconductor memory device in accordance with another embodiment of the present invention. A CDRAM shown in FIG. 11 includes a 4M bit DRAM array and a 16K bit SRAM array. More specifically, the CDRAM of FIG. 11 includes 4 CDRAMs shown in FIG. 5. Referring to FIG. 11, the CDRAM includes four memory mats MM1, MM2, MM3 and MM4 each having the storage capacity of 1M bit. Each of the DRAM memory mats MM1 to MM4 includes a memory cell arrangement of 1024 rows (word lines) by 512 columns (bit line pairs). Each of the DRAM memory mats MM1 to MM4 is divided into 32 memory blocks MBs each having a structure of 128 columns (bit line pais)×256 rows (word lines).

One memory mat MM is divided into 4 memory blocks in the row direction, and into 8 blocks in the column direction. As shown in FIG. 11, a 1M bit memory mat is divided into 8 in the column direction and 4 in the row direction, different from the arrangement of the DRAM of FIG. 5, in order to house the device in a rectangular package, as will be described later. Sense amplifiers DSA for DRAMs and column selecting gates CSG are arranged corresponding to respective bit line pairs DBL at the central portion in the column direction of the memory blocks MB. A memory block MB is divided into an upper memory block UMB and a lower memory block LMB with the sense amplifier DSA and column selecting gate CSG positioned at the center. In operation, either the upper memory block UMB or the lower memory block LMB is connected to the sense amplifier DSA and to the column selecting gate CSG. Whether the upper memory block UMB or lower memory block LMB is to be connected to sense amplifier DSA and column selecting gate CSG is determined by an address. Such a structure in which one memory block MB is divided into upper and lower two memory blocks UMB and LMB and one of the two blocks is connected to sense amplifier DSA and to column selecting gate CSG is commonly used in DRAMs having shared sense amplifier structure having the storage capacity larger than 4M bit.

One memory mat MM includes two activation sections AS. One word line is selected in one activation section. Different from the structure shown in FIG. 5, one word line is divided into two and allotted to respective activation sections in the structure of FIG. 11. Namely, selection of one word line in one memory mat MM is equivalent to selection of one word line in each activation section AS.

The semiconductor device (CDRAM) further comprises 4 DRAM row decoders DRD1, DRD2, DRD3 and DRD4 for selecting one word line from each of four DRAM memory mats MM1 to MM4. Therefore, in the CDRAM shown in FIG. 11, 4 word lines are selected at one time. DRAM row decoder DRD1 selects one row from corresponding activation sections AS of the memory mats MM1 and MM2. DRAM row decoder DRD2 selects one row from lower activation sections AS of memory mats MM1 and MM2. DRAM row decoders DRD3 and DRD4 select one row from upper activation sections AS of DRAM memory mats MM3 and MM4 and from lower activation sections AS of this memory mat, respectively.

The CDRAM further comprises DRAM column decoders DCD for selecting two columns (bit line pairs) from each of the column blocks of memory mats MM1 to MM4 of the DRAM. Column selection signal from the DRAM column decoder DCD is transmitted to a column selection line CSL shown in FIG. 5. A column selection line CSL extends to be shared by the upper and lower activation sections AS. Therefore, in the structure shown in FIG. 11, 4 columns are selected from one column block (in FIG. 11, a block including 8 memory blocks MBs divided in the column direction), by the column selection signal from DRAM column decoder DCD.

Columns selected by column decoder DCD are connected to corresponding global I/O line pairs GIO. Two pairs of global I/O lines GIO extend in the column direction in each column block in one activation section. Connection between the global I/O line pair GIO and local I/O line pair LIO in each column block will be described in detail later.

CDRAM shown in FIG. 11 further includes SRAM array blocks SMA1 SMA4 each formed of SRAM cells having the capacity of 4K bit. Row decoders SRD1 and SRD2 for SRAM are provided at a middle portion between 2 SRAM array blocks to be shared by two SRAM array blocks. SRAM row decoder SRD1 is commonly used by SRAM array blocks SMA1 and SMA3. SRAM row decoder SRD2 is commonly used by SRAM array blocks SMA2 and SMA4. Details of the structure of SRAM array block SMA will be described in detail later.

The CDRAM includes 4 input/output buffer circuits IOB1, IOB2, IOB3 and IOB4 for carrying out input/output of data 4 bits by 4 bits. Input/output buffer circuits IOB1 to IOB4 are connected to blocks SCDA of sense amplifiers and column decoders for SRAM, through common data buses (internal data buses), respectively. In the structure shown in FIG. 11, input/output of data are shown to be carried out through the sense amplifier and column decoder block SCDA for the SRAM. However, input/output of data may be carried out through the portion of bi-directional transfer gates BTG.

In operation, one word line is selected in each activation section. Only the row block including the selected word line is activated. Other row blocks are maintained at the precharge state. In the selected row block, only a small block UMB (or LMB) including the selected word line is connected to the sense amplifier DSA and column selecting gate CSG for DRAM, and the other small memory block LMB (or UMB) in the selected block is separated from sense amplifier DSA and column selecting gate CSG for DRAM. Therefore, as a whole, activation (charge/discharge) of 1/8 bit line is effected. By this partial activation operation, power consumption incidental to charging/discharging of the bit line can be reduced. In addition, by dividing one memory block MB into an upper memory block UMB and a lower memory block LMB and by arranging a sense amplifier DSA at the center, the bit line can be made shorter, the ratio Cb/Cs of bit line capacitance Cb to memory capacitor capacitance Cs can be reduced, and sufficient reading voltage can be obtained at high speed.

In each activation section AS, sensing operation in 4 small blocks UMB (or LMB) in the row direction is carried out. In each activation section AS, two pairs of bit lines are selected in one column block by a column selection signal from DRAM column decoder DCD. Global I/O line pair GIO extends in the column direction to be shared by column blocks in each activation section AS. Two pairs of bit lines are selected from each column block in each activation section AS and connected to corresponding two pairs of global I/O lines GIO. 4 pairs of global I/O lines GIO are connected to one bi-directional transfer gate BTG. 4 bi-directional transfer gates BTG are provided for one memory mat MM. Therefore, 16 pairs of global I/O lines GIO can be connected to SRAM bit line pairs SBL of the corresponding SRAM array from one memory mat MM. Layout of the global I/O lines will be described.

Figure 12:
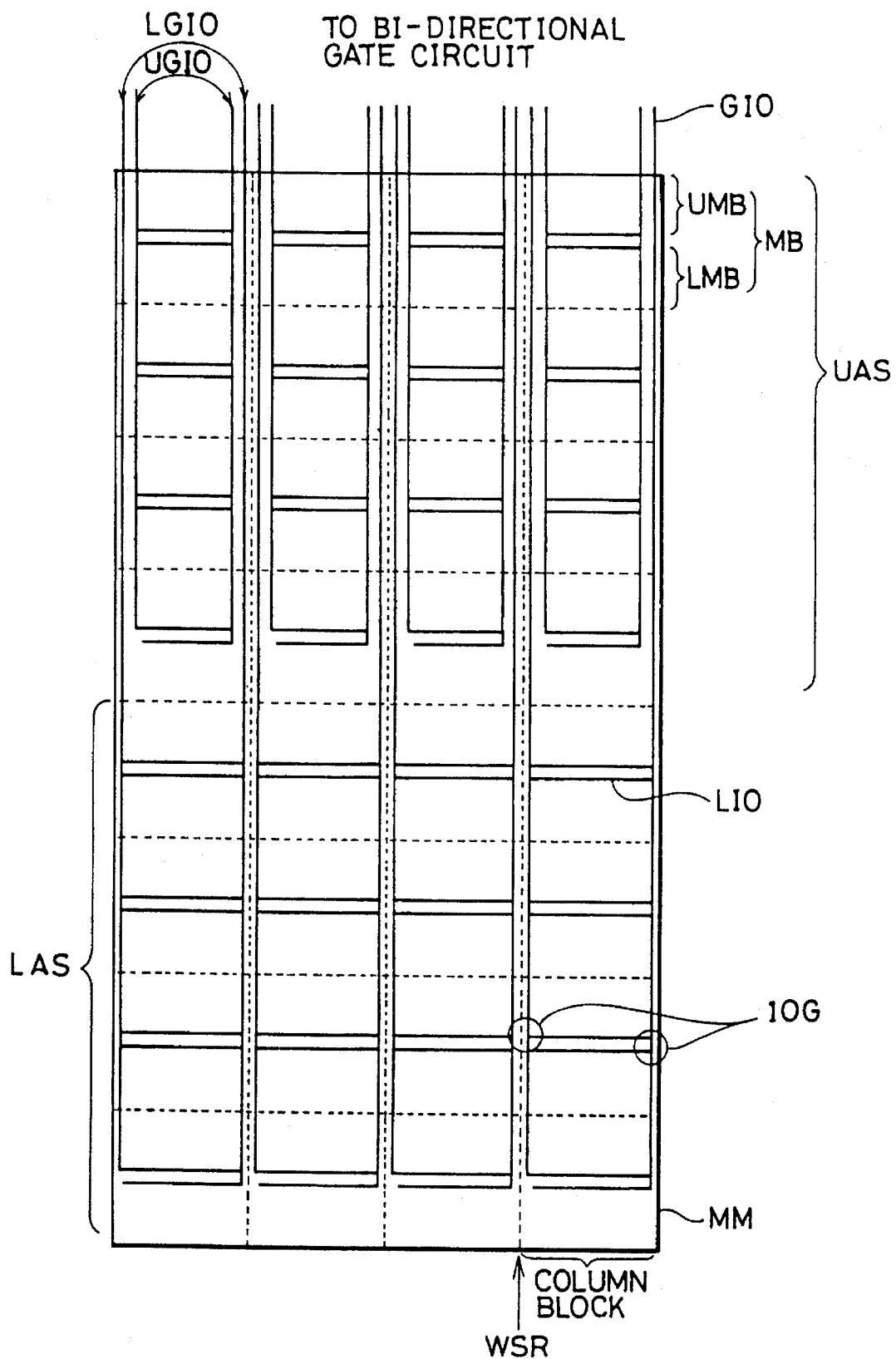
FIG. 12 shows an arrangement of a global I/O line and a local I/O line in the semiconductor memory device shown in FIG. 11.

FIG. 12 shows arrangement of global I/O lines for one memory mat. Referring to FIG. 12, the global I/O line pair GIO includes an upper global I/O line pair UGIO provided for an upper activation section UAS and a lower global I/O line pair LGIO provided for a lower activation section LAS. The upper global I/O line pair UGIO and the lower global I/O line pair LGIO are arranged in parallel. Lower global I/O line pair GIO passes through upper activation section UAS but is not connected to local I/O line pair LIO in the upper activation section UAS. Global I/O line pair GIO and local I/O line pair LIO are connected through an IO gate IOG which is a block selecting switch. Only an IO gate IOG provided in the row block including the selected word line is turned on by a block selecting signal φBA and connects the corresponding local I/O line pair LIO to the corresponding global I/O line pair GIO.

Since DRAM sense amplifier DSA and column selecting gate CSG are arranged at the central portion in the column direction of the memory block MB, local I/O line pair LIO is arranged along the row direction at the central portion in the column direction of memory block MB.

A word line shunt region WSR is provided in the column direction between adjacent column blocks. A word line shunt region WSR is used to provide a contact between a word line formed of polysilicon having relatively high resistance and an aluminum interconnection having low resistance. The word line shunt region will be described briefly.

Figure 13:
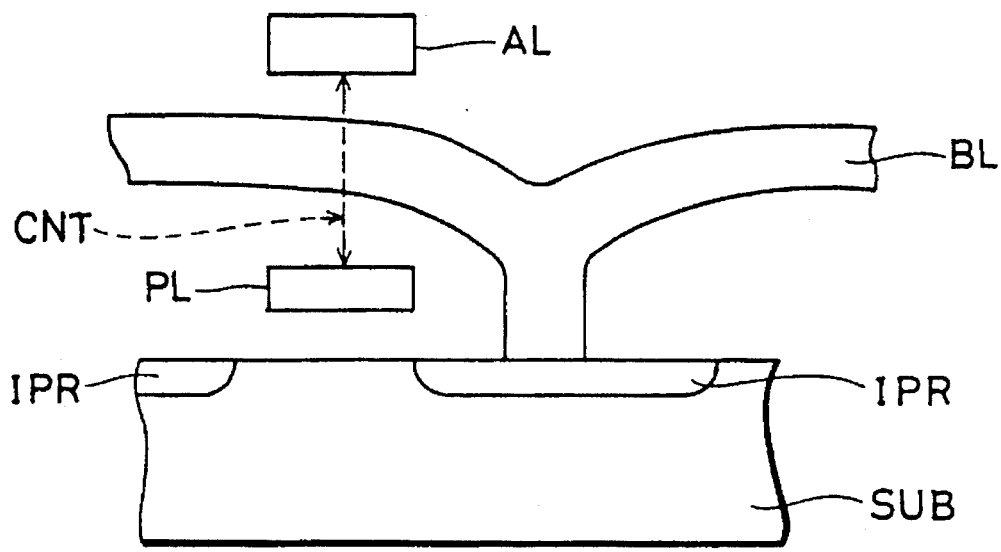
FIG. 13 is a cross sectional view of a memory cell transistor portion included in the DRAM cell.

FIG. 13 schematically shows a cross sectional structure of a selecting transistor Q0 (see FIG. 6) included in a DRAM cell. Referring to FIG. 13, the selecting transistor Q0 includes impurity regions IPR formed at a surface of a semiconductor substrate SUB, a bit line BL connected to one impurity region IPR, and a polysilicon layer PL formed on the surface of the semiconductor substrate between the two impurity regions IPR. When a word line driving signal DWL (the signal line and the signal transmitted thereon are represented by the same reference character) is transmitted to the polysilicon layer PL, a channel is formed at the surface of the semiconductor substrate between the impurity regions IPR, and the selecting transistor Q0 is turned on. Polysilicon has relatively high resistance. If word line DWL has high resistance, a signal delay is generated due to the resistance of polysilicon. In order to lower the resistance of the word line DWL, an aluminum interconnection AL having low resistance is provide in parallel to the polysilicon layer PL. By periodically connecting the aluminum interconnection AL and the polysilicon layer PL at prescribed intervals, the resistance of the word line DWL can be reduced. Aluminum interconnection AL is formed above the bit line BL. Therefore, a region for providing contact between polysilicon layer PL and aluminum interconnection AL must be provided at a region where there is no bit line BL (/BL), that is, a region were memory cell is not arranged. For this purpose, a word line shunt region is provided between column blocks. The manner of connection is shown in FIG. 14.

Figure 14:
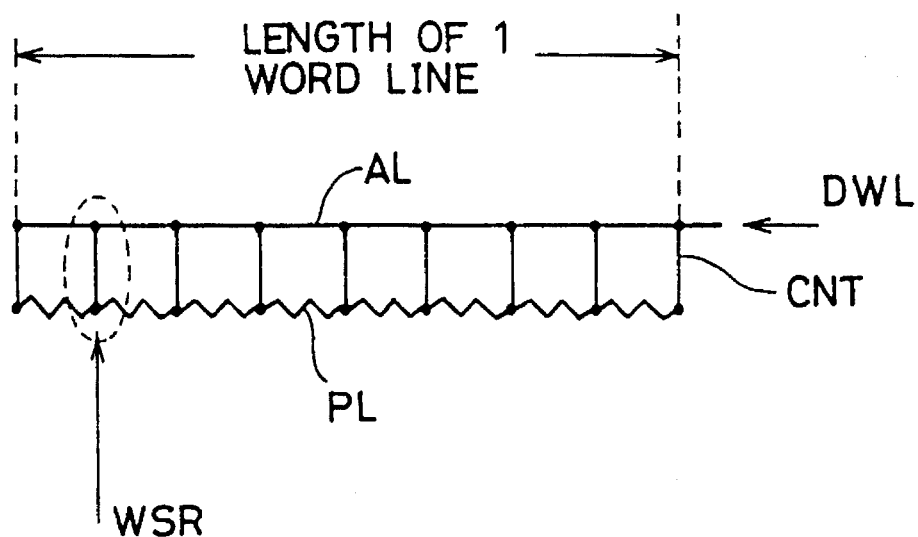
FIG. 14 shows a relation between a word line shunt region and a polysilicon word line lined with aluminum.

Referring to FIG. 14, aluminum interconnection AL having low resistance is provided in parallel to polysilicon layer PL having relatively high resistance serving as a word line. Word line driving signal DWL is transmitted to aluminum interconnection AL. Aluminum interconnection AL and polysilicon layer PL are periodically connected to each other by a contact layer CNT in word line shunt region WSR. By periodically providing contacts between aluminum interconnection AL and polysilicon layer PL through contact region CNT, the resistance of polysilicon layer PL can be effectively reduced. Therefore, even if a word line is very long, the word line driving signal WL can be transmitted to the terminal end of the word line at high speed.

Figure 15:
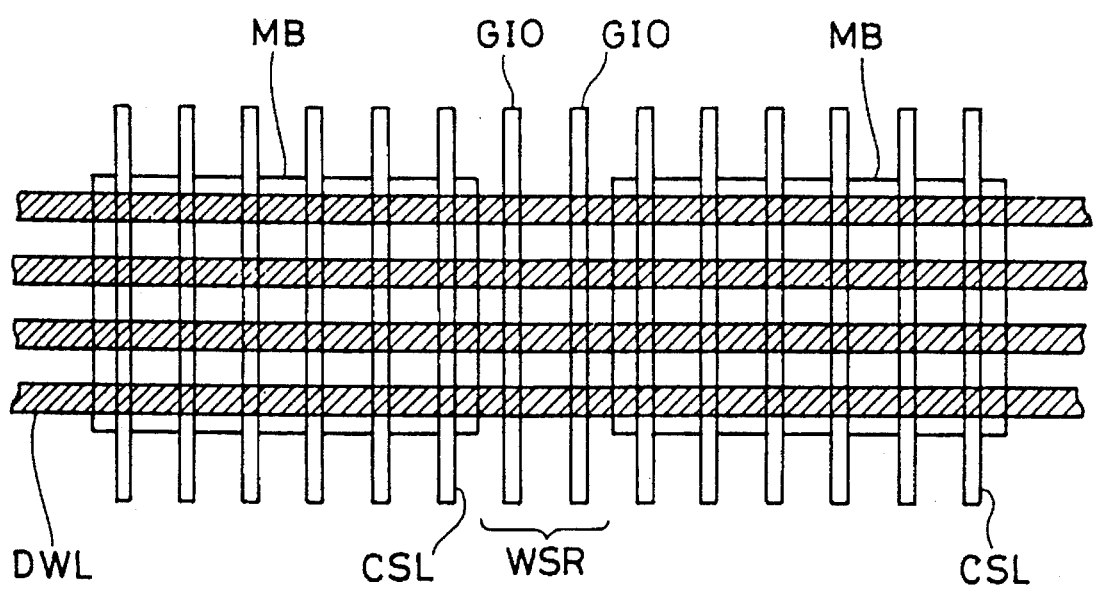
FIG. 15 is a plan view showing a layout of the global I/O line, column selecting lines and DRAM word lines in the semiconductor memory device in accordance with the present invention.

FIG. 15 schematically shows a layout of global I/O lines and column selecting lines CSL. In FIG. 15, layout of these lines for two memory blocks MB only is shown. In FIG. 15, global I/O line pair GIO is arranged in word line shunt region WSR. DRAM word lines DWL are arranged in a direction orthogonally crossing the global I/O line pair GIO. In FIG. 15, aluminum interconnection AL and polysilicon layer are arranged in parallel to each other, and in this plan view, they are overlapped with each other. Therefore, they are shown as the same word lines DWL. Column selecting lines CSL for transmitting column selection signal from DRAM column decoder are arranged in a direction orthogonally crossing DRAM word lines DWL.

Although the bit line pairs DBL of DRAM are not shown in this layout, the bit line pairs are arranged in parallel to column selecting lines CSL. Aluminum interconnection AL (see FIG. 14) for DRAM word lines DWL is formed by a first layer aluminum interconnection. Column selecting lines CSl are formed by a second layer aluminum interconnection. Global I/O lines are formed by the same aluminum interconnection as the column selecting lines CSL. By providing global I/O line pair GIO in word line shunt region WSR, chip area is not increased even if I/O lines for connecting DRAM array and bi-directional transfer gates are adapted to have hierarchical structure of local I/O lines and global I/O lines.

Figure 16:
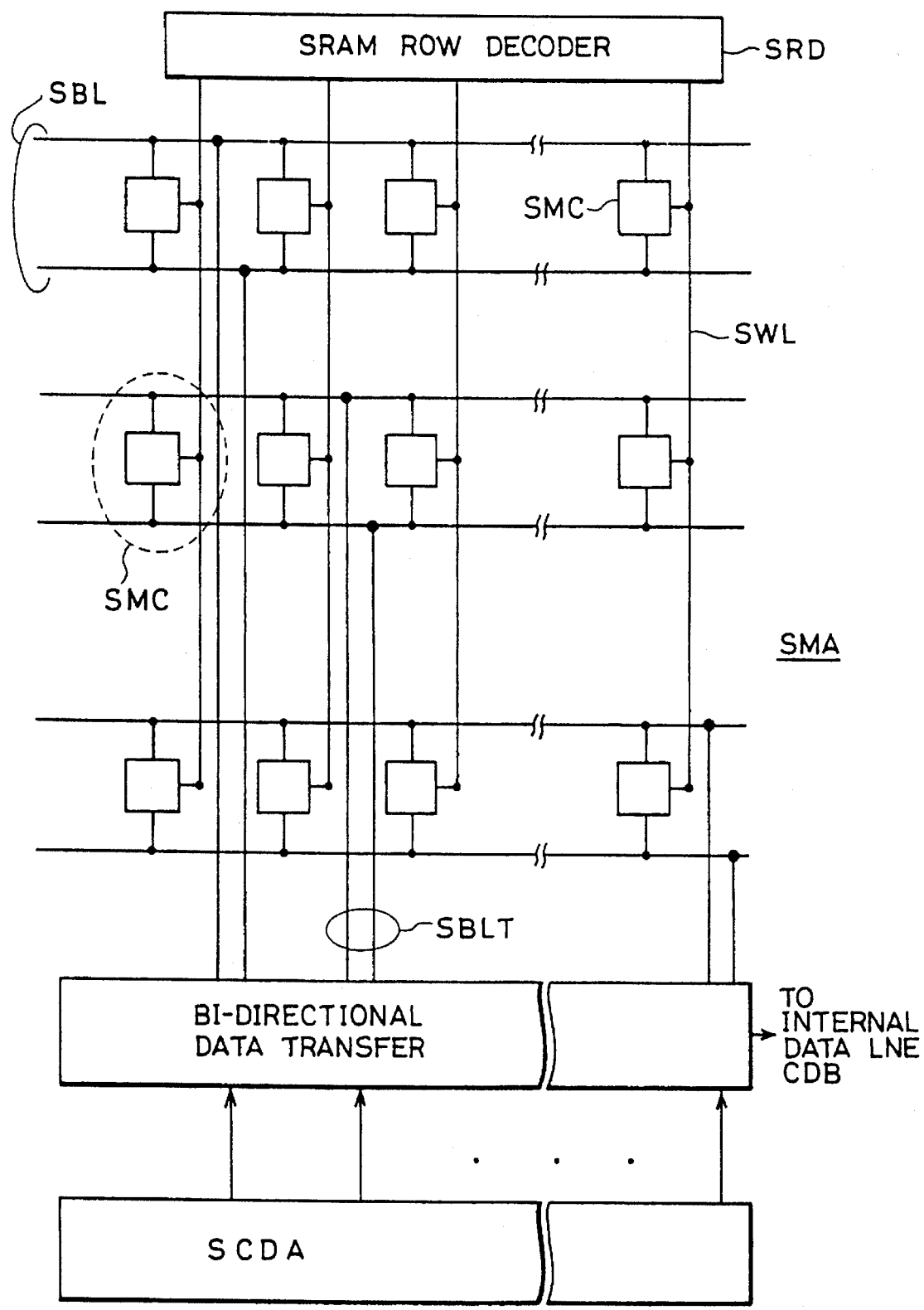
FIG. 16 shows a structure of one block of the SRAM array shown in FIG. 11.

FIG. 16 schematically shows a structure of SRAM array block SMA shown in FIG. 11. Referring to FIG. 16, a SRAM array block SMA includes 16 pairs of bit lines SBL and 256 SRAM word lines SWL. SRAM cells SMC are arranged at crossings of SRAM bit line pairs SBL and SRAM word lines SWL. As shown in FIG. 11, in order to have the SRAM array block SMA accordant with a rectangular chip layout, SRAM bit line pairs SBL are arranged in the row direction of DRAM array and SRAM word lines SWL are arranged in column direction of DRAM array. SRAM word lines SWL are connected to SRAM row decoder SRD.

SRAM bit line pairs SBL must be connected to global I/O line pair GIO through bi-directional transfer gate BTG. Therefore, SRAM bit line pairs SBL must be connected to bi-directional transfer gate BTG on the lower side as viewed in FIG. 16 (or upper side of FIG. 16: determined by the arrangement of the memory array). For this purpose, in the structure shown in FIG. 16, SRAM bit line taking lines SBLT are arranged in parallel to SRAM word lines SWL. The number of SRAM bit line taking lines SBLT is the same as the number of bit line pairs SBL of the SRAM array block SMA, and the taking lines are connected to corresponding SRAM bit line pairs SBL. If SRAM bit line taking lines SBLT are formed by the same interconnection layer as SRAM word lines SWL, SRAM bit line taking lines SBLT can be implemented easily without additionally providing interconnection layer formed by additional step of manufacturing. The SRAM row decoder SRD decodes a row address for SRAM to select one of the 256 SRAM word lines SWL. 16 bits of SRAM cells SMC connected to the selected SRAM word line SWL are connected to corresponding SRAM bit line pair SBL and to SRAM bit line taking line SBLT. In data transfer, the bit line taking lines SBLT are connected to global I/O line pair GIO through bi-directional transfer gate BTG.

By employing such a layout as shown in FIGS. 12 and 16, a structure as shown in FIG. 11 can be realized, in which DRAM arrays are arranged divided into upper and lower portions as viewed in the figure, SRAM arrays are collectively arranged between the upper and lower DRAM array blocks, and input/output buffer circuits IOB1 to IOB4 are provided near SRAM arrays formed at the central portion of the semiconductor memory device (chip). Such structure having SRAM arrays collectively formed at the central portion of the chip and input/output of data are effected near the central portion of the chip is advantageous for CDRAM as will be described in the following.

High speed access to the cache register is the first and most important characteristic of CDRAM. Arrangement of the SRAM array serving as the cache register near the input/output buffer for inputting/outputting data to and from the outside of the device results in shorter signal lines, which enables high speed input/output of data, and thus meets the demand of high speed accessing.

By collectively arranging SRAM arrays at the central portion, address lines for selecting SRAM cells can be made shorter. If an address line is made shorter, interconnection resistance and parasitic resistance of the address line can be reduced, SRAM cells can be selected at high speed, and therefore it is suitable for high speed accessing to the cache register.

In the architecture shown in FIG. 11, interconnections connecting the DRAM array and SRAM array may be longer, lowering speed of data transfer between the DRAM array and SRAM array. However, data transfer is carried out between DRAM array and SRAM array only when a cache miss (miss hit) occurs. In that case, access speed as low as that of the standard DRAM is sufficient, and it is not very much desired to increase this access speed. Therefore, this is not a problem in practical use.

[Pin Arrangement]

Figure 17:
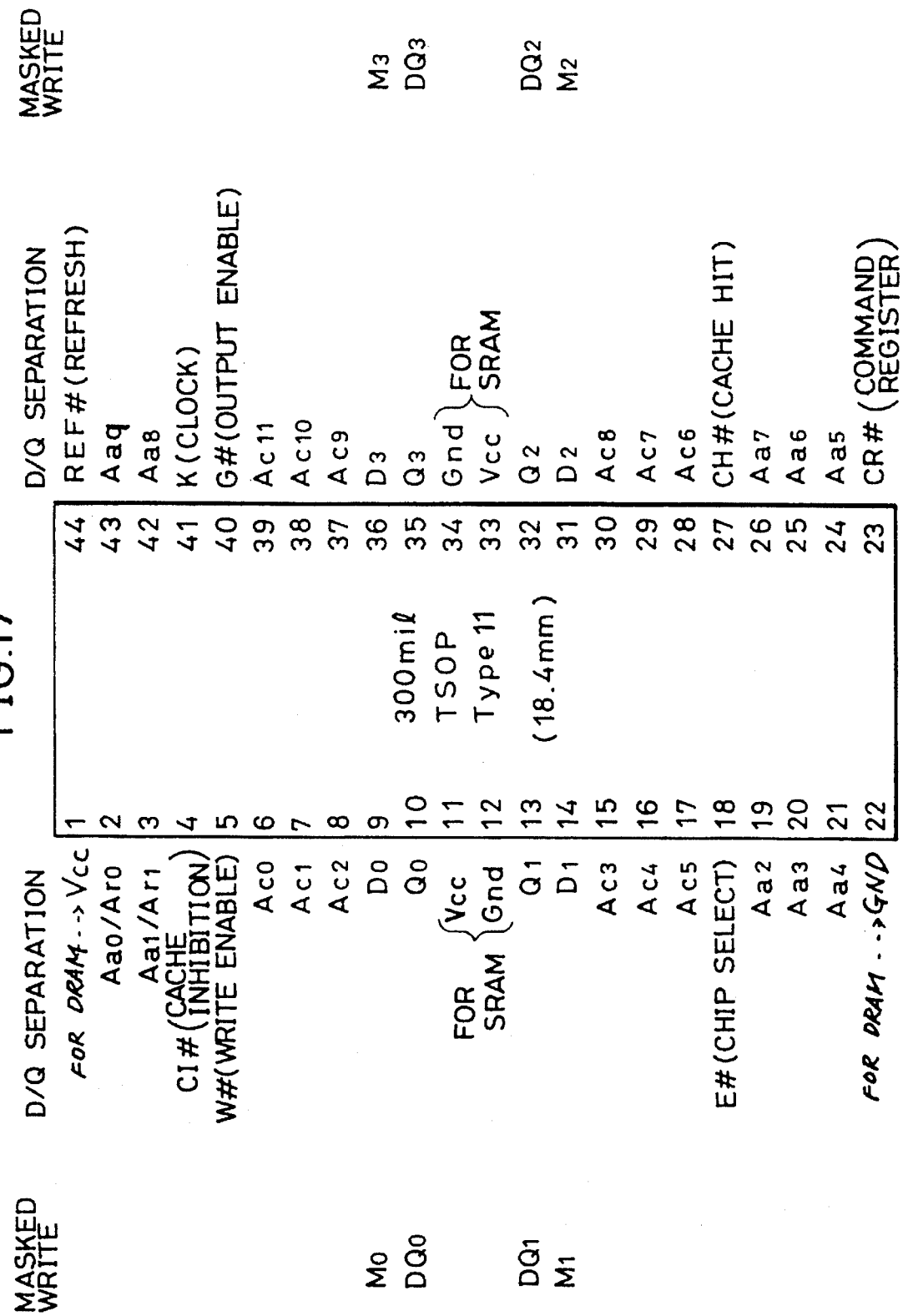
FIG. 17 shows one example of pin arrangement of a package containing the semiconductor memory device of FIG. 11.

FIG. 17 shows one example of pin arrangement of a package housing the CDRAM in accordance with the present invention. The CDRAM is housed in a 300 mil TSOP (Thin Small Outline Package) of type II with lead pitch of 0.8 mm, chip length of 18.4 mm and 44 pins. The CDRAM has two data input/output modes, that is, D/Q separation and masked write. D/Q separation is a mode of inputting/outputting write data D and output data Q through separate pins. Masked writing is an operation mode in which write data D and read data Q are output through the same pin terminal, and writing of external data can be masked.

In order to effectively supply the supply voltage to CDRAM and to facilitate layout of power supply interconnection, three pins are provided for each of the supply potential Vcc and Gnd. More specifically, external supply potential Vcc is supplied to pins of the pin numbers 1, 11 and 33. The supply potential Vcc supplied to the pins 1, 11 and 33 may have the same voltage values as the operational supply potential Vcc. Alternatively, the external supply potential Vcc supplied to the pins 1, 11 and 33 may be lowered in the device to supply the operational supply potential. The ground potential Gnd is supplied to the pins of the numbers 12, 22 and 34.

Power pins of pin numbers 11, 12, 33 and 34 disposed at the center portion of the package are used for supplying Vcc potential and GND potential to the SRAM. Power pins of pin numbers 1 and 22 disposed at opposite ends of the package are used for supplying Vcc potential and GND potential to the DRAM. With such pin arrangement, current flow and current dissipation can be dispersed for SRAM and for DRAM, which prevents current dissipation in the SRAM from adversely affecting or fluctuating the DRAM operating power supply potential, resulting in stable operation of CDRAM.

Addresses Ac0 to Ac11 for SRAM are applied to the pins having the numbers 6 to 8, 15 to 17, 28 to 30 and 37 to 39. Addresses Aa0 Aa9 for DRAM are applied to pin terminals having the numbers 2, 3, 19 to 21, 24 to 26 and 42 and 43. Command addresses Ar0 and Ar1 for designating a special mode, which will be described later, are also applied to the pins of the pin numbers 2 and 3. A cache inhibiting signal CI# indicating cache access inhibition is applied to a pin terminal of the number 4. When the cache inhibition signal CI# is set to "L", access to the SRAM array is inhibited, and direct access (array access) to the DRAM array is allowed. A write enable signal W# indicating data writing mode is applied to the pin 5. A chip select signal E# indicating that this chip is selected, is applied to a pin of the number 18.

A command register designating signal CR# for designating the special mode is applied to a pin of the pin number 23. When the command register designating signal CR# is "L", command addresses Ar0 and Ar1 applied to the pins of the numbers 2 and 3 are rendered valid, enabling setting of the special mode.

A cache hit signal CH# indicating a cache hit is applied to a pin of the pin number 27. If the cache hit signal CH# is "L", access to the cache (SRAM) is possible. An output enable signal G# indicating an output mode is applied to a pin of the number 40. A clock signal K is applied to the pin of the number 41. A refresh designating signal REF# designating refreshing of the DRAM array is applied to a pin 44. When the refresh designating signal REF# attains to "L", automatic refreshing of the DRAM array inside is carried out in the cycle.

Different data are applied to the pins of the numbers 9, 10, 13, 14, 31, 32, 35 and 36 dependent on the two different operation modes, that is, D/Q separation and masked write. The operation modes of D/Q separation and masked write are set by a command register (which will be described later).

In masked write mode, pins of the numbers 10, 13, 32 and 35 are used as common data input/output terminals for commonly carrying out data input/output. Pins of the numbers 9, 14, 31, 35 and 36 receive masked write designating data M0, M1, M2 and M3 for indicating which data applied to which input/output pins should be masked, respectively.

In D/Q separation mode, pins of the numbers 9, 14, 31 and 36 are used as pins for inputting write data D0, D1, D2 and D3. Pins of the numbers 10, 13, 32 and 35 are used as data output pins for outputting read data Q0, Q1, Q2 and Q3.

As to SRAM addresses Ac0 to Ac11, row and column addresses are simultaneously applied in non-multiplexed manner. As to the DRAM addressees (array addresses) Aa0 to Aa9, the row addresses and column addresses are applied multiplexed. In the pin arrangement shown in FIG. 17, row address strobe signal/RAS and column address strobe signal /CAS which are normally used in a standard DRAM are not used. In the CDRAM in accordance with the present invention, input of control signals and data are carried out in response to a rising edge of an external clock K.

Figure 18:
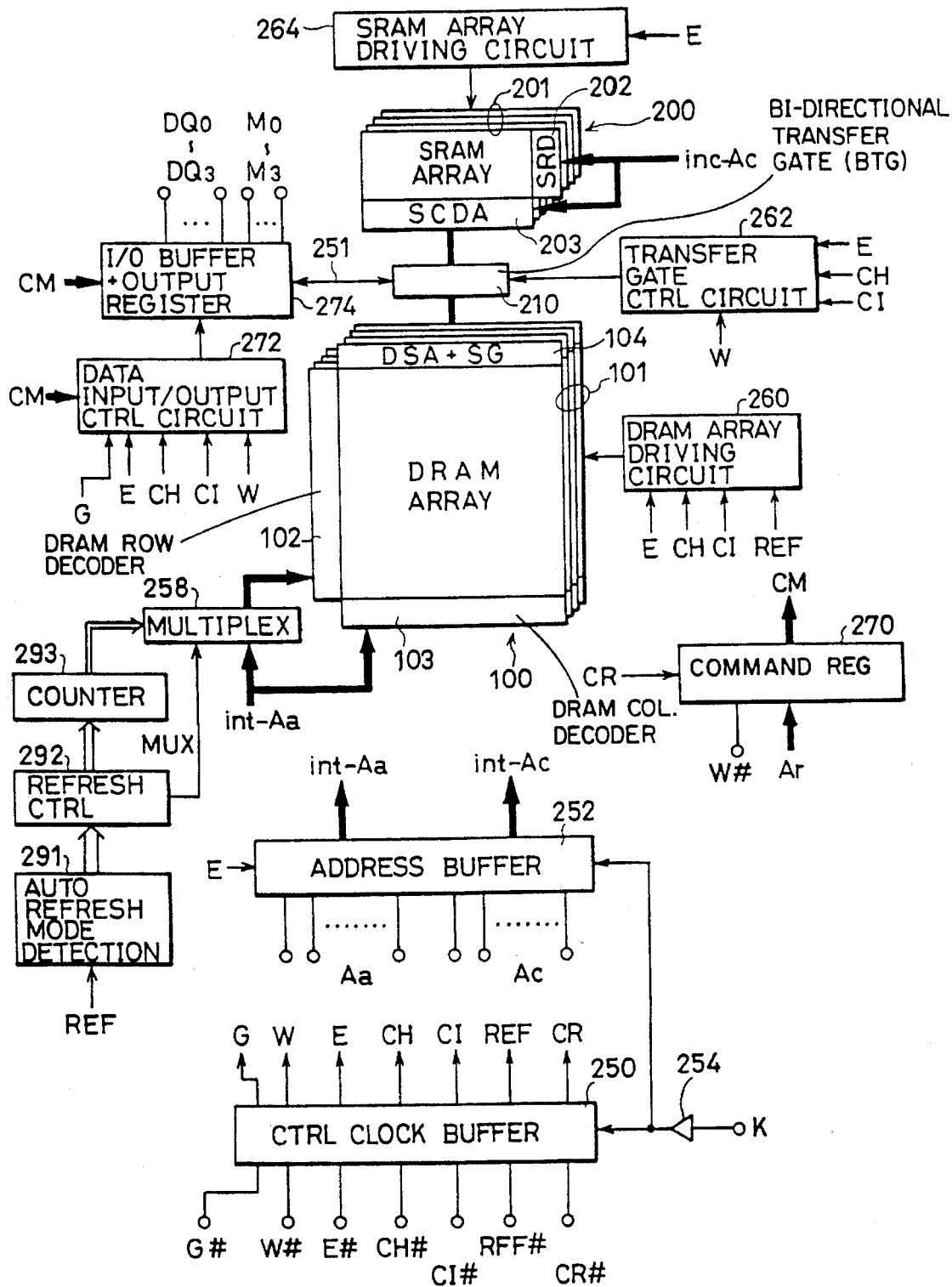
FIG. 18 is a block diagram showing functionally the whole structure of the semiconductor memory device shown in FIG. 11.

FIG. 18 is a block diagram showing internal structure of the CDRAM chip housed in a package of FIG. 17. The block arrangement shown in FIG. 18 is for the purpose of functionally showing the internal structure of the CDRAM, and it should be noted that the structure shown in this figure is not the same as the actual layout.

[Structure of a 4M CDRAM]

Referring to FIG. 18, a CDRAM includes a DRAM 100 and a SRAM 200. DRAM 100 comprises a 4M bit DRAM array 101; a DRAM row decoder block 102 for decoding an applied internal row address for the DRAM and for selecting 4 rows from DRAM array 101; a DRAM column decoder block 103 for decoding applied internal column address for DRAM and for selecting one column from each of the selected 4 rows in a normal operation mode (array access); and a block 104 including DRAM sense amplifiers DSA for detecting and amplifying data of the memory cells connected to the selected rows, and selecting gates SG responsive to a column selecting signal from block 103 for selecting 16 bits of DRAM array 101 in a data transfer mode and for selecting 4 bits of memory cells in an array access mode.

SRAM 200 comprises an SRAM array 201 having the capacity of 16K bits; a SRAM row decoder block 202 for decoding an internal row address for the SRAM and for selecting 4 rows from SRAM array 201; and a column decoder/sense amplifier block 203 including SRAM column decoders and SRAM sense amplifiers for decoding the internal column address for the SRAM, selecting 1 bit from each of the selected 4 rows and connect the same to an internal data bus, and for detecting and amplifying information of the selected SRAM cells in data reading. A bi-directional transfer gate circuit 210 is provided between DRAM 100 and SRAM 200. Referring to FIG. 18, the gate circuit 210 may be connected to an output (input) of the column decoder/sense amplifier block 203, as in the arrangement of FIG. 11. However, in FIG. 18, data input/output to and from DRAM 100 are carried out through the common data bus 251 in the array access mode, and therefore the common data bus 251 is shown as coupled to bi-directional transfer gate circuit 210. The common data bus 251 includes write data bus lines DBW, *DBW, which will be described later.

The CDRAM in accordance with the present invention further comprises a control clock buffer 250 receiving externally applied control signals G#, W#, E#, CH#, CI#, REF# and CR# to generate internal control signals G, W, E, CH, CI, REF and CR; an address buffer 252 for generating internal address int-Aa for the DRAM and an internal address int-Ac for the SRAM; and a clock buffer 254 for buffering an externally applied clock signal K. Control clock buffer 250 takes an applied control signal and generates an internal control signal in response to a rise of an internal clock from clock buffer 254. An output from clock buffer 254 is also applied to address buffer 252. Address buffer 252 takes an externally applied addresses Aa and Ac which are applied when the internal chip enable signal E is active at a rising edge of the clock K from the clock buffer 254 and generates internal addresses int-Aa and int-Ac.

The CDRAM in accordance with the present invention further comprises a counter circuit 293 which is activated in response to internal refresh designating signal REF for generating a refresh address of the DRAM array; and an address multiplex circuit 258 for applying either a refresh address from counter circuit 293 or an internal row address from address buffer 252 to DRAM row decoder block 102 in response to a switching signal MUX from a refresh control circuit 292 which is driven in response to an internal refresh designating signal REF. Refresh control circuit 292 is driven in response to a refresh request from an automatic refresh mode detecting circuit 291. The refresh operation will be described later.

The CDRAM further comprises a DRAM array driving circuit 260 responsive to the internal control signals E, CH, CI and REF for generating various control signals for driving DRAM 100; a transfer gate controlling circuit 262 responsive to the internal control signals E, CH, W and CI for generating signals for controlling transfer operation of bi-directional transfer gate controlling circuit 210; and a SRAM array driving circuit 264 responsive to internal chip select signal E for generating various control signals for driving SRAM 200.

The CDRAM in accordance with the present invention further comprises a command register 270 which is activated in response to an internal control signal CR for generating a command CM for designating operation mode of the CDRAM in response to external write enable signal W# and to command addresses Ar (Ar0 and Ar1); a data input/output control circuit 272 for controlling data input/output in accordance with the internal control signals G, E, CH, CI and W and to the special mode command CM; an input/output circuit 274 formed of an input/output buffer and an output register for inputting/outputting data between common data bus 251 and the outside of the device. An output register is provided in the input/output circuit 274 for realizing a latch output mode and a register output mode, which are the special modes of the CDRAM (which will be described later). Data input/output control circuit 272 sets input/output timing of data in accordance with the mode designated by the special mode command CM as well as the manner of input/output of data. In FIG. 18, manners of data input/output pins in masked write mode is shown as an example.

Figure 19:
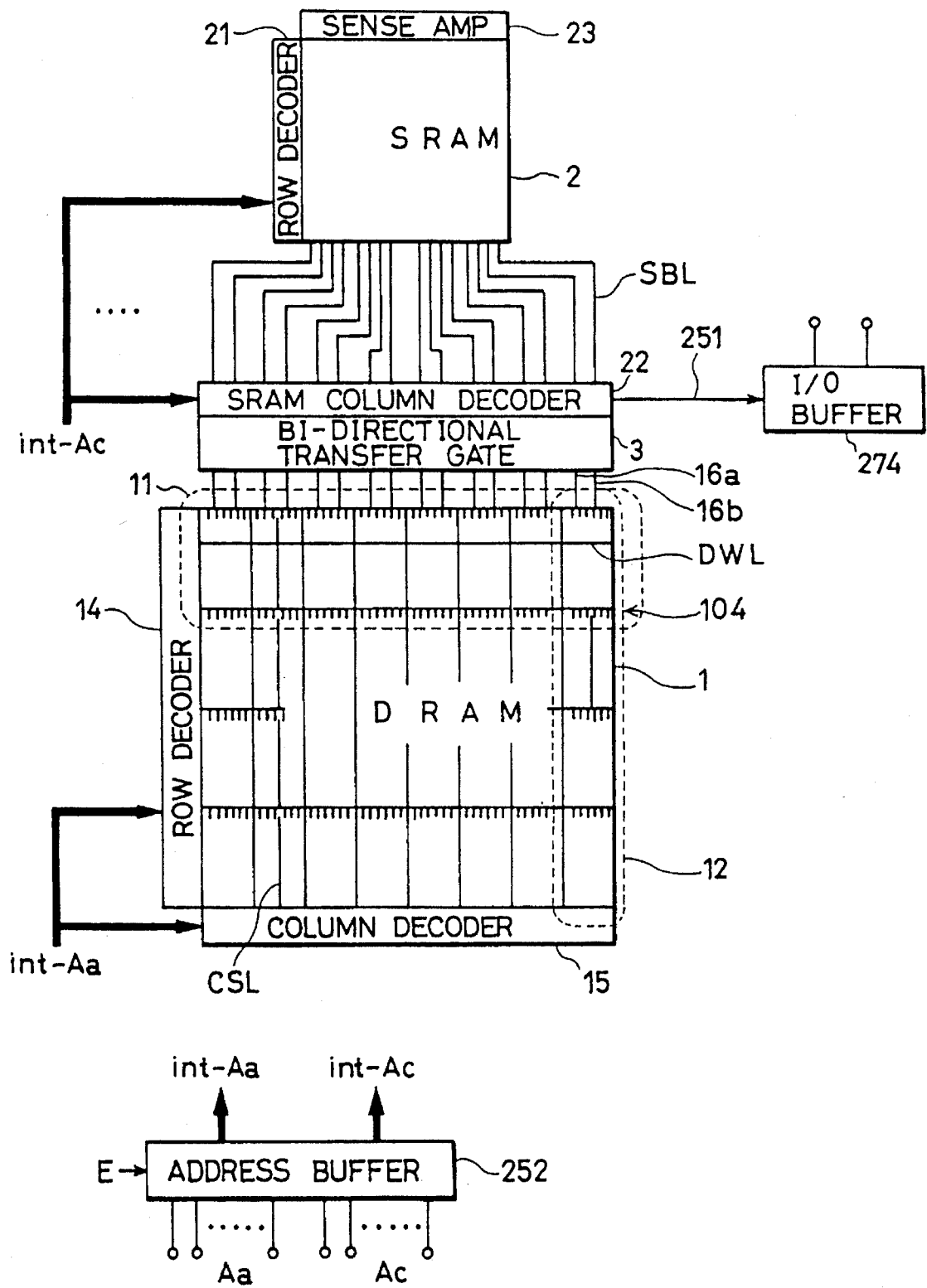
FIG. 19 shows an example of a structure of a memory array portion of the semiconductor memory device shown in FIG. 18.

FIG. 19 shows a layout of the semiconductor memory device shown in FIG. 18. In the structure shown in FIG. 19, internal data transmitting line 251 is connected to SRAM bit line pair SBL by SRAM column decoder 22, different from the layout of FIG. 5. Data of the selected column of DRAM array 1 transmitted through bi-directional transfer gate circuit 3 by the column selecting signal from the DRAM column decoder 15 is further selected and connected to internal data transmitting line 251. In this structure, internal address int-Ac applied to the row decoder 21 and column decoder 22 of SRAM and internal address int-Aa applied to row decoder 14 and column decoder 15 of DRAM are applied through independent paths. Therefore, by this structure, addresses of memory cells in SRAM array 2 and DRAM array 1 can be independently designated.

In the structure shown in FIG. 19, a SRAM column decoder 22 is provided between bi-directional transfer gate circuit 3 and SRAM array 2. SRAM column decoder 22 may be provided between bi-directional transfer gate circuit 3 and DRAM array 1. Alternatively, a corresponding I/O line pair of DRAM array may be selected from I/O line pairs 16a, 16b of DRAM array 1 by an output from DRAM column decoder 15 to connected the same to internal common data bus 251, and SRAM bit line pair SBL may be connected to internal data transmitting line 251 by SRAM column decoder 22.

[Connection Between BTG and Internal Data Line I]

Figure 20:
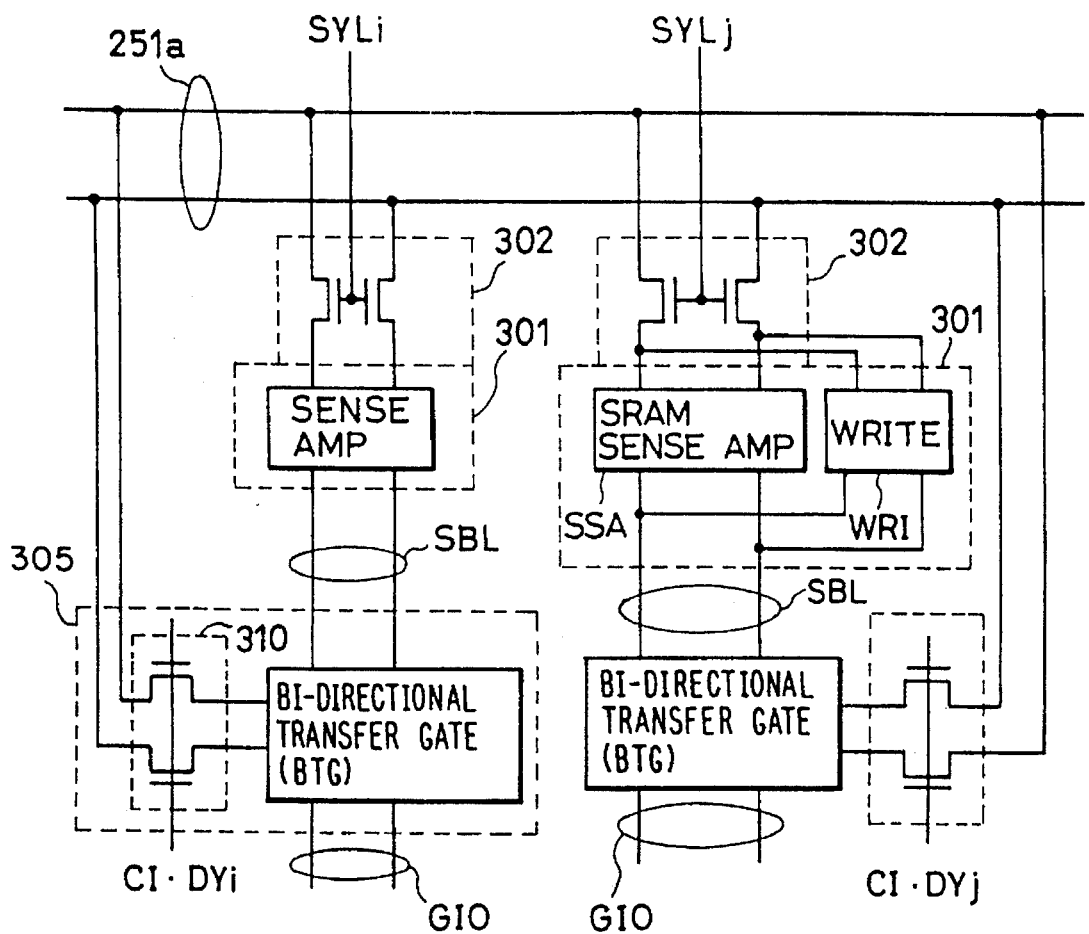
FIG. 20 shows an example of connection between the internal data line and the DRAM array enabling array access to the DRAM array in the semiconductor memory device in accordance with the present invention.

FIG. 20 shows one example of manner of connection of bi-directional transfer gate circuit 210 and internal common data line 251 shown in FIG. 18. Referring to FIG. 20, a SRAM input/output gate 301 comprises SRAM sense amplifier SSA and write circuit WRI which is activated in data writing to SRAM array for transmitting data on internal data line 251a to a corresponding SRAM bit line pair SBL. SRAM bit line pair SBL is connected through SRAM sense amplifier SSA and SRAM column selecting gate 302 to internal data line 251a. A SRAM column selecting signal SYL from SRAM column decoder block 203 is applied to SRAM selecting gate 302. Consequently, a pair of SRAM column bit line pair SBL only is connected to internal data line 251a. Internal data line 251 shown in FIG. 18 transfers 4 bits of data, and only an internal data line corresponding to 1 bit is shown in FIG. 20.

Referring to FIG. 20, the CDRAM further comprises an access switching circuit 310 responsive to a logical product signal between cache inhibiting signal CI and DRAM column selecting signal DY for connecting global I/O line pair GIO to internal data line 251a for enabling array access. Access switching circuit 310 and bi-directional transfer gate BTG are included in transfer gate circuit block 305.

The column selecting signal DYI of DRAM is generated by decoding, for example, lower 4 bits of a column address. More specifically, 16 pairs of global I/O lines GIO are provided for one DRAM memory mat (having the capacity of 1M bits). For array accessing, only one pair must be selected therefrom. Therefore, column selecting signal DYi is generated by decoding lower 4 bits of column address for DRAM. The access switching circuit 310 simply connects global I/O line pair GIO to internal data line 251a, and connection to corresponding signal lines are carried out in bi-directional transfer gate BTG. A structure in which global I/O line pair GIO is connected to internal data line 251a through SRAM sense amplifier SSA may be used to realize array accessing, without providing such an access switching circuit 310. At this time, column selecting signal applied to SRAM selecting gate 302 is a selecting signal based on column address to the DRAM. This is realized by a circuit multiplexing the column selecting signal by the signal CI. This multiplex circuit applies column selecting signal for DRAM to SRAM selecting gate, when the signal CI is active.

In the SRAM, a SRAM sense amplifier SSA is provided for each SRAM bit line pair SBL. However, one SRAM sense amplifier may be provided for the SRAM bit line pairs of 1 block, as in a normal SRAM. However, when the SRAM sense amplifier is provided for each SRAM bit line SBL, output of data can be more surely carried out at high speed. If the SRAM sense amplifier SSA has the same structure as the DRAM sense amplifier, it is not necessary to provide writing circuit WRI. Other specific structures of the transfer gate circuit blocks 305 will be described in detail later.

[Input/Output Circuit]

Figure 21:
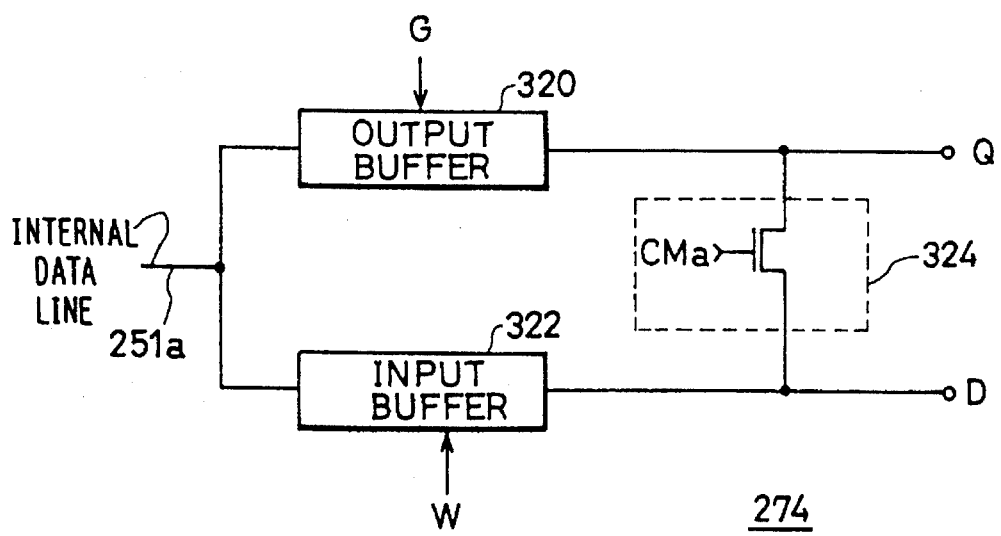
FIG. 21 shows one example of a structure of a data input/output circuit portion for realizing D/Q separation mode and a mask write mode in the semiconductor memory device in accordance with the present invention.

FIG. 21 shows a structure for realizing D/Q separation in input/output circuit 274. Referring to FIG. 21, input/output circuit 274 comprises an output buffer 320 which is activated in response to an internal output enable signal G for generating output data Q from data on internal data line 251a; an input buffer 322 which is activated in response to an internal write designating signal W for generating internal write data from external write data D and transmitting the same to internal data line 251; and a switch circuit 324 responsive to a D/Q separation designating bit CMa from command register 270 (see FIG. 18) for short-circuiting an output from output buffer 320 and an input of input buffer 322. D/Q separation designating bit CMa is included in a special mode designating command CM generated from command register 270. If the switch circuit 324 is rendered conductive, input/output of data are carried out through the same pin. If the switch circuit 324 is off, input/output of data are carried out through separate pins. Structure related to data input/output of 1 bit only is shown in FIG. 21 as a representative.

[Input/Output Circuit II]

Figure 22:
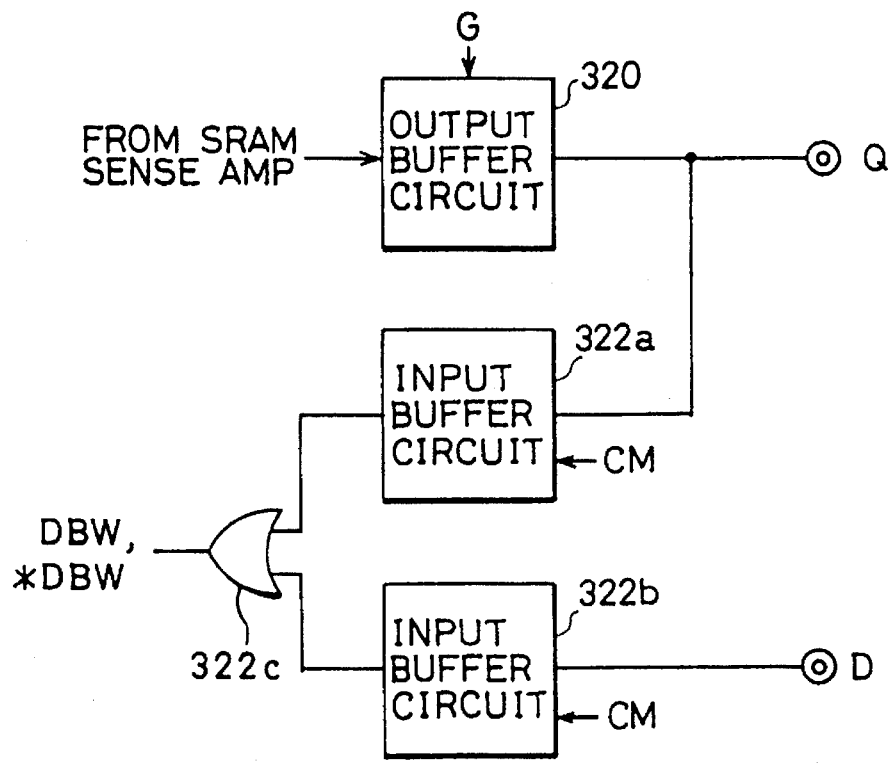
FIG. 22 shows another example of a structure of the data input/output circuit portion shown in FIG. 21.

FIG. 22 shows connection between data input/output circuit and other portions. Referring to FIG. 22, output buffer circuit 320 receives selected memory cell data of DRAM array or SRAM sense amplifier to transmit the same to an external output pin Q. A first input buffer circuit 322a is connected to external pin terminal Q, and a second input buffer circuit 322b is connected to an external data input pin terminal D. Outputs of the first and second input buffer circuits 322a and 322b are transmitted through an OR circuit 322c to internal data buses DBW, *DBW (251a). Enabling/disabling of the first and second input buffer circuits 322a and 322b are carried out in response to designation bit CM from command register (see FIG. 18). If the command register designates D/Q separation mode, the first input buffer circuit 322a is disabled, and input buffer circuit 322b is enabled. If the designation bit CM designates masked write mode common to D/Q, the first input buffer circuit 322a is enabled and the second input buffer circuit 322b is disabled.

In the structure shown in FIG. 22, data from SRAM sense amplifier are transmitted to output buffer circuit 320, since this figure shows a case in which data of selected memory cells of the DRAM array are transmitted to internal data bus through column lines (bit lines) of SRAM array and through sense amplifiers of the SRAM. More specifically, this figure shows an example of the structure of FIG. 20 without the gate 310, in which column selecting signals SYLi and SYLj applied to gate 302 are commonly used as the DRAM column decoder outputs DYi and DYj. This structure will be described later.

[Input/Output Circuit III]

Figure 23:
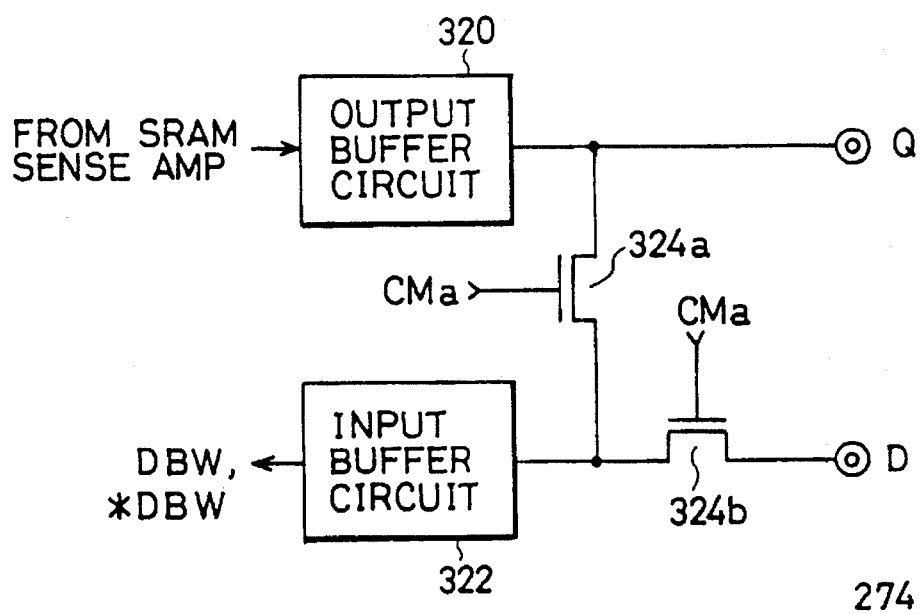
FIG. 23 shows a further example of a structure of the data input/output circuit portion shown in FIG. 21.

FIG. 23 shows a further structure of the input/output circuit. Referring to FIG. 23, a transistor 324a which is turned on in response to the designation bit CMa is provided between output buffer circuit 320 and input buffer circuit 322. A transistor gate 324b which is turned on in response to a complementary designation bit/CMa is provided between input buffer circuit 322 and a data input pin terminal D. In this structure, when designation bit CMa designates D/Q separation mode, the transistor gate 324a is turned off, and the transistor gate 324b is turned on. Conversely, if the designation bit CMa designates masked write mode common to D/Q, the transistor gate 324a is turned on and the transistor gate 324b is turned off.

By this structure, input buffer circuit 322 can be selectively connected to data output pin terminal Q or to data input pin terminal D, whereby D/Q separation mode and D/Q common mode can be set.

[Allotance of Internal Address I]

Figure 24:
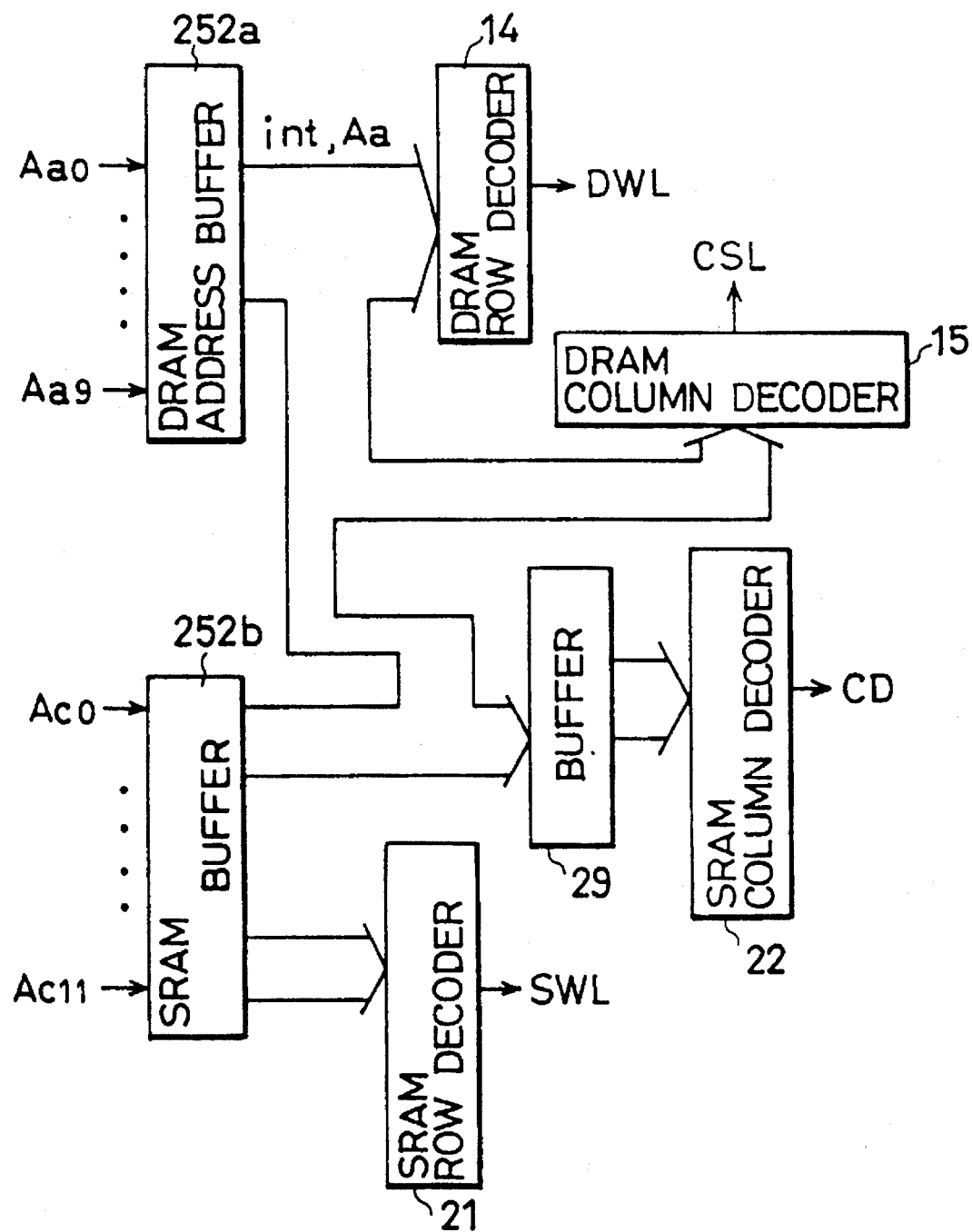
FIG. 24 shows relation between addresses for the DRAM and addresses for the SRAM in the semiconductor memory device in accordance with the present invention.

FIG. 24 shows one example of connection of addresses to DRAM and SRAM. In the structure shown in FIG. 24, access to the DRAM array is carried out through bi-directional transfer gate circuit or line pairs SBL to the SRAM array. In this structure, column selection signal CD from SRAM column decoder 22 is commonly used as a column selecting signal for the DRAM array and the column selecting signal for the SRAM array. In FIG. 24, DRAM address buffer 252a receives external DRAM addresses Aa0 to Aa9 and generates internal address int.Aa. DRAM row decoder 14 decodes internal row address from internal address int.Aa, and generates a word line driving signal DWL for selecting a word line from DRAM array. DRAM column decoder 15 receives a portion of internal column address from DRAM address buffer 252a, and generates a signal CSL for selecting a column selecting line from DRAM array. A portion of the remaining internal column address from DRAM address buffer 252a is applied to a buffer 29. Buffer 29 receives internal column address from SRAM buffer 252b and transmits the same to SRAM column decoder 22. When DRAM array is accessed, internal column address is not generated from SRAM buffer 252b, as will be described in detail later. At that time, the buffer 29 receives internal column address from DRAM address buffer 252a and transmits the same to SRAM column decoder 22.

SRAM row decoder 21 receives internal row address from SRAM buffer 252b, and generates a SRAM word line driving signal SWL for selecting one row from SRAM array. In accordance with the structure shown in FIG. 24, in the data input/output structure of FIG. 20, the column selecting signals DYi and DYj are equivalent to SRAM column selecting signals SYLi and SYLj.

[Allotance of Internal Address II]

Figure 25:
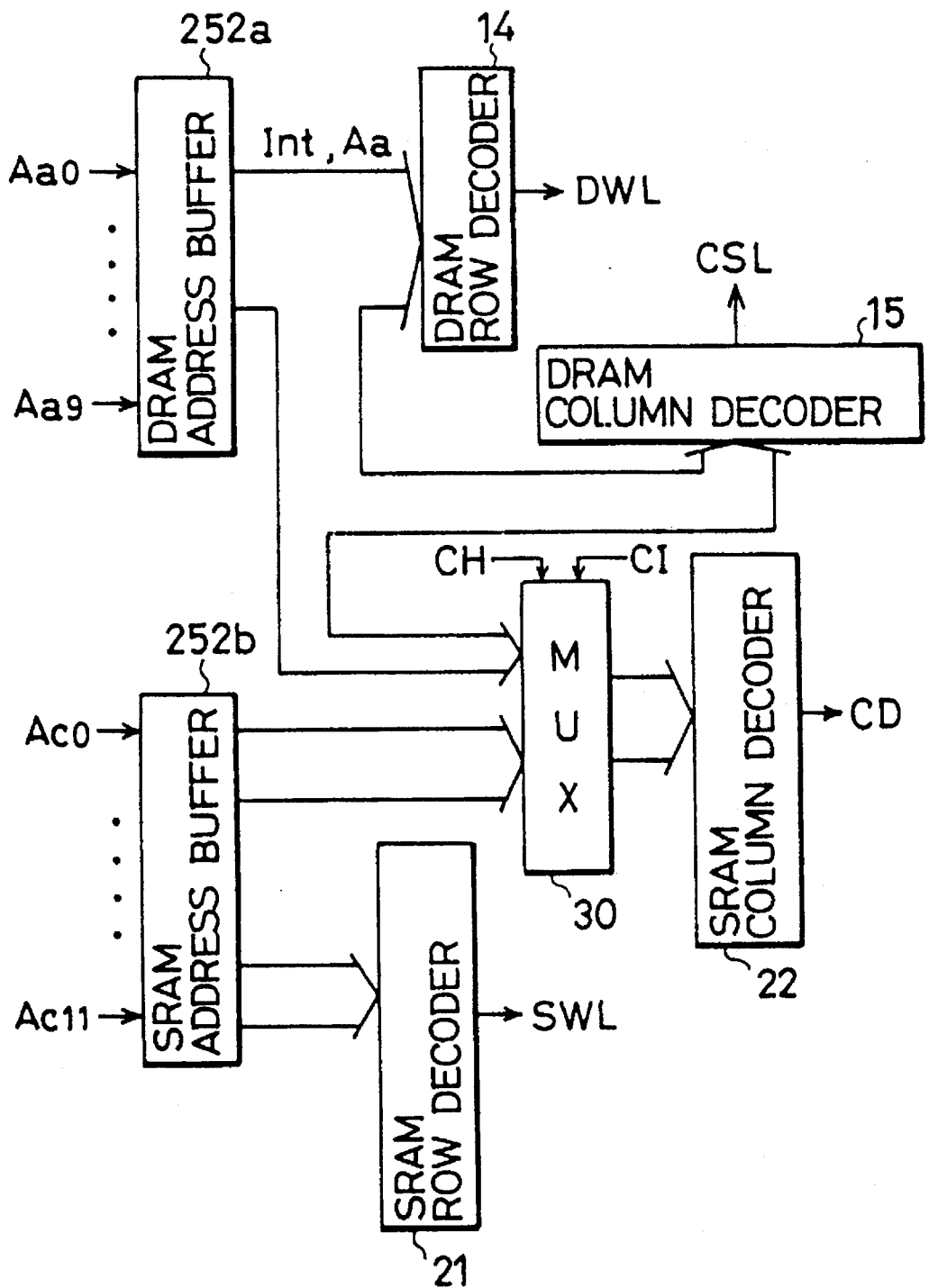
FIG. 25 shows another relation between column addresses of the DRAM and column addresses of the SRAM.

FIG. 25 shows another example of a structure of address input/output portion. In the structure shown in FIG. 25, instead of the buffer 29, a multiplexer 30 responsive to a cache hit designating signal CH and to a DRAM access designating signal CI for passing either an internal column address from DRAM address buffer 252a or internal column address from SRAM address buffer 252b is provided. The cache signal CH and the DRAM array access designating signal CI will be described in detail later. Only an outline will be described. When a cache hit designating signal CH is generated, access to SRAM array is permitted, and writing/reading of data by accessing to DRAM is inhibited. When DRAM array access designating signal CI is generated, writing/reading of data by access to memory cells in DRAM array is permitted. Therefore, when the signal CH is generated, multiplexer 30 selects internal column address from SRAM address buffer 252b and transmits the same to SRAM column decoder 22. When DRAM array access designating signal CI is generated, multiplexer 30 selects internal column address from DRAM address buffer 252a to transmit the same to SRAM column decoder 22.

In the structure shown in FIG. 25 also, SRAM column decoder 22 is used for both column selections from DRAM array and from SRAM array.

The structure for allotting addresses shown in FIGS. 24 and 25 are mere examples. Structures for independently decoding internal column address of DRAM array and decoding internal column address of SRAM array may be employed.

[Connection Between SRAM Bit Lines and Internal Data Lines II]

Figure 26:
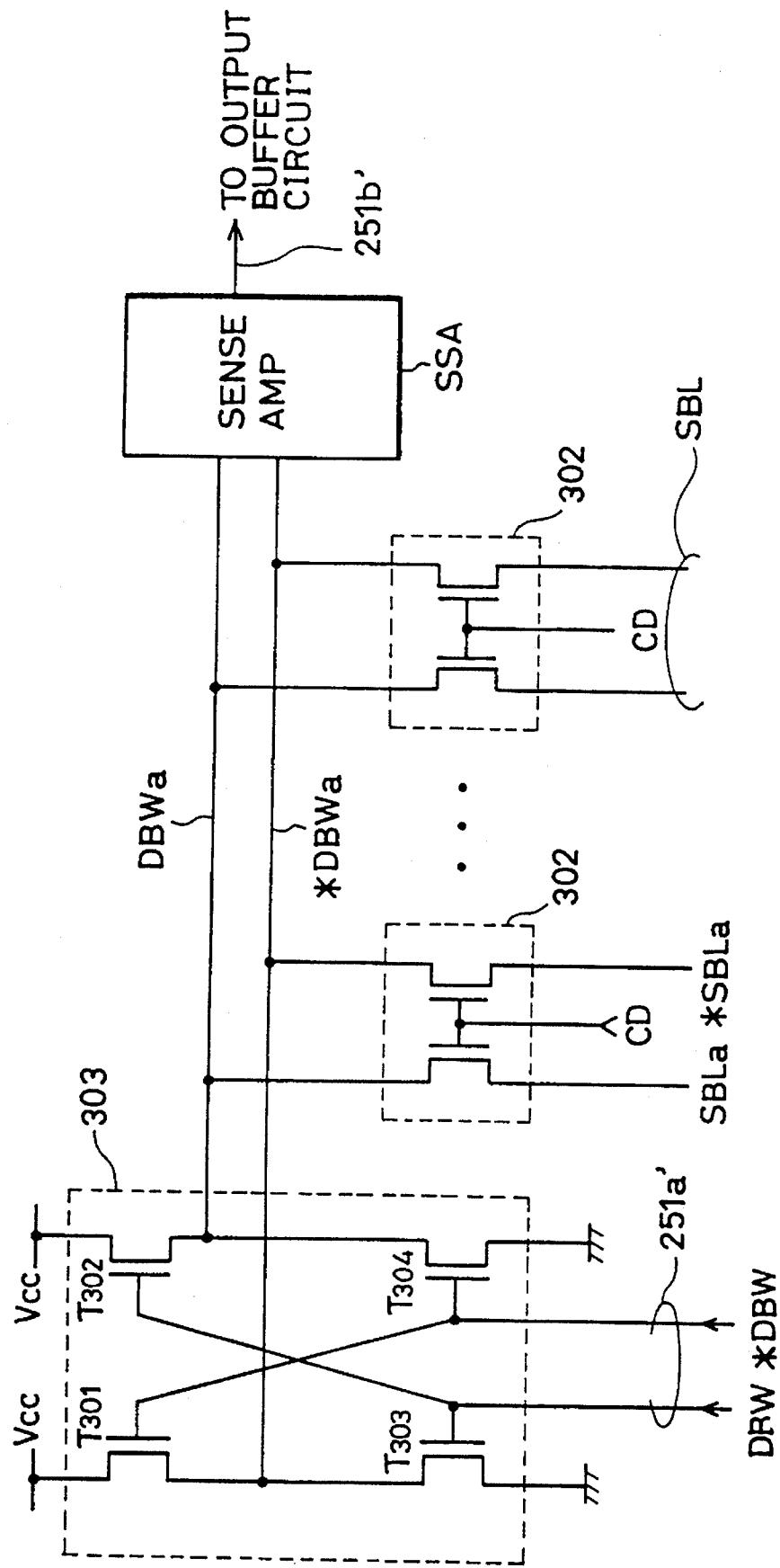
FIG. 26 shows connection between the internal data line and the SRAM bit line pair in the semiconductor memory device shown in FIG. 11.

FIG. 26 shows a further example of the connection between SRAM array and internal data transmitting line pair. In the structure shown in FIG. 20, a SRAM sense amplifier SSA is provided for each SRAM bit line pair SBL. In the structure shown in FIG. 26, one SRAM sense amplifier SSA is provided for a plurality of SRAM bit line pairs SBLa, *SBLa. A selecting gate circuit 302 is provided for each SRAM bit line pair SBLa, *SBLa. A column selecting signal CD is supplied to selecting gate circuit 302. The column selecting signal CD is generated from SRAM column decoder shown in FIGS. 24 and 25. Internal data line pair includes an internal write data line 251a' for transmitting write data, and a read data transmitting line 251b' for transmitting read data to an output buffer circuit. The internal write data transmitting line 251a' includes a complementary data line pair DBW, *DBW. Complementary data from an input buffer circuit are transmitted to internal data lines DBW and *DBW. The internal write data line 251a' is connected to a write circuit 303. The write circuit 303 includes cross coupled n channel MOS transistors T301, T302, T303 and T304. Gates of transistors T302 and T303 are connected to the internal data line DBW. Gates of transistors T301 and T304 are connected to internal data line *DBW. Complementary write data from write circuit 303 are transmitted to respective transmitting gate circuits 302 through data lines DBWa, *DBWa. Transistors T301 and T302 transmit supply potential Vcc when they are on. Transistors T303 and T304 transmit ground potential Vss when they are on.

For example, let us assume that data "H" are transmitted to internal data line DBW. At this time, "L" data are transmitted to internal data line *DBW. At this time, the transistors T302 and T303 are turned on. Consequently, "H" data are transmitted to internal data line DBWa through transistor T302 from writing circuit 303, and "L" data are transmitted to the other internal data line *DBWa through transistor T303.

In data reading, "L" data are transmitted to both of the internal write data lines DBW and *DBW from the input buffer circuit, and accordingly, an output from the write circuit 303 is set to a high impedance state. At this time, sense amplifier SSA is activated, and data transmitted to internal data lines DBWa and *DBWa through selected selecting gate circuit 302 are amplified by the sense amplifier SSA and transmitted to output buffer circuit through internal read data transmitting line 251'.

As shown in FIG. 26, by separately providing write data transmitting line 251a' and read data transmitting line 251b' as the internal data line 251, design of input/output circuit layout is made easier than a structure in which writing/reading of data are carried out through a common internal data bus.

[Data Transfer Between DRAM and SRAM II]

In the structure of the bi-directional data transfer circuit shown in FIG. 7, either drive circuit DR1 or DR2 is driven in accordance with the transfer designating signals φTDS and φTSD. In that case, data transfer from SRAM array to DRAM array and data transfer from DRAM array to SRAM array cannot be simultaneously carried out. Therefore, sometimes it is impossible to transfer data between SRAM array and DRAM array at high speed.

Figure 27:
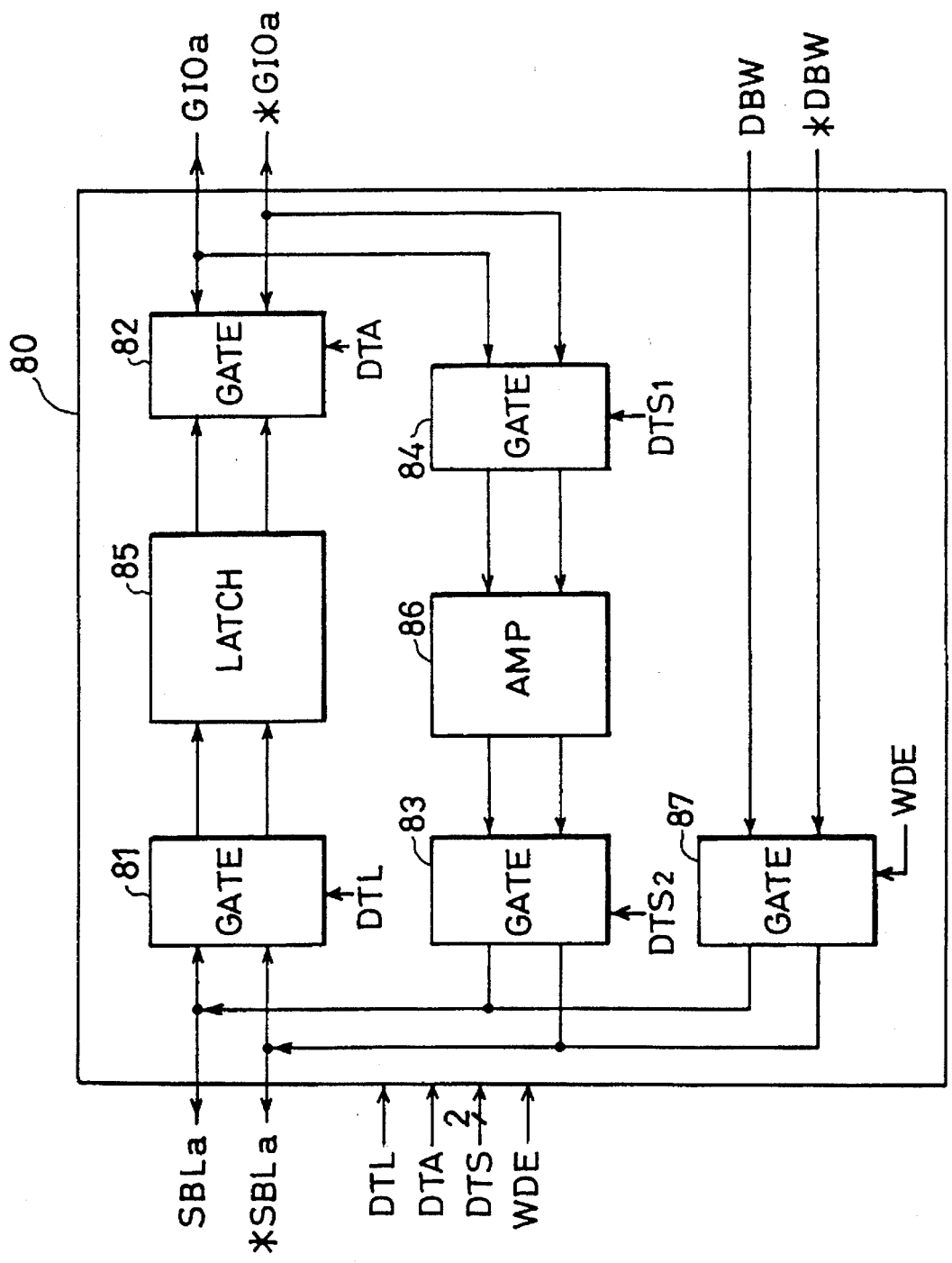
FIG. 27 schematically shows another structure of the bi-directional transfer gate shown in FIG. 6.

FIG. 27 shows another example of a structure of the bi-directional data transfer gate. Referring to FIG. 27, a bi-directional transfer gate circuit 80 corresponds to a transfer gate BTG included in bi-directional transfer gate circuit 3 shown in FIG. 5. A unit bi-directional data transfer circuit 80 includes a first latch 85 for amplifying and holding data transmitted from the SRAM array through a gate 81, and an amplifier 86 for receiving data transferred from the DRAM array through a gate 84 and for amplifying the same. The amplifier circuit 86 also has a data retaining function. The gate 81 transmits data on SRAM bit line pairs SBL, *SBL to latch 85 in response to a transfer control signal DTL. Gate 82 transmits latch data in latch 85 to global I/O lines GIOa, *GIOa in response to a transfer control signal DTA. Gate 83 transmits data amplified by amplifier 86 to SRAM bit line pairs SBLa and *SBLa in response to a transfer control signal DTS2 (control signal DTS). Gate 84 transmits data on global I/O lines GIOa and *GIOa to amplifier 86 in response to a transfer control signal DTS1 (control signal DTS). The control signal WDE is generated when an access to the DRAM array is requested, and it transmits data on internal data bus (write data line pair) DBW and *DBW to an input portion of gate 81. Transfer control signals DTL and DTA are generated successively when data of the SRAM bit line pairs SBLa and *SBLa are transmitted to global I/O line pair GIOa and *GIOa of the DRAM array. Control signals DTS1 and DTS2 are generated when data are transferred from DRAM array to SRAM array. The control signals DTS1 and DTS2 are substantially the same control signals, which are generated at approximately the same timing. The control signals DTL, DTA, DTS1 and DTS2 are generated in the same manner as the above described control signals φTDS and φTSD. These control signals are generated from the bi-directional data transfer control circuit, as will be described later.

Figure 28:
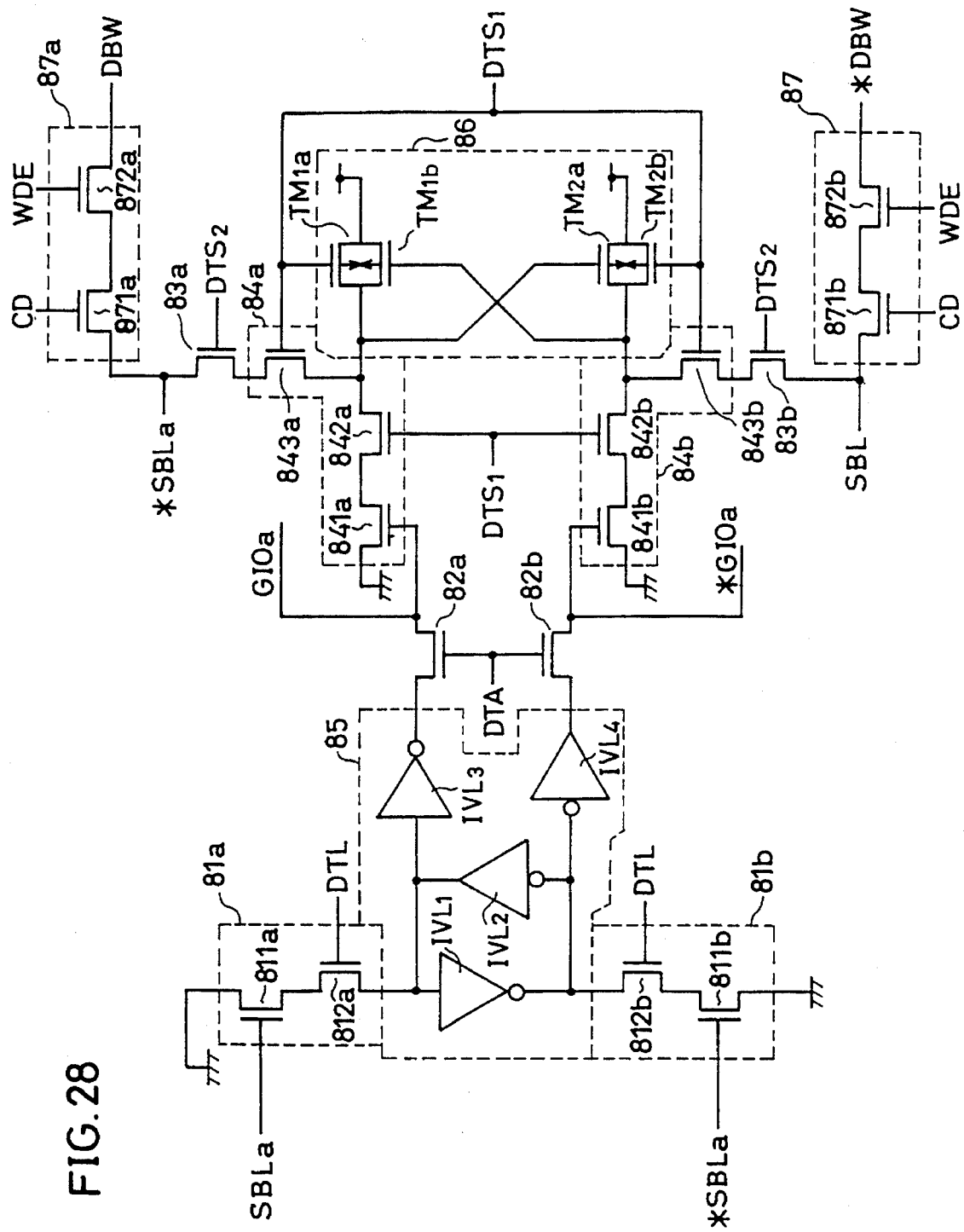
FIG. 28 shows a detailed structure of the bi-directional transfer gate shown in FIG. 27.

FIG. 28 shows one example of a specific structure of unit bi-directional transfer gate circuit 80 shown in FIG. 27. Referring to FIG. 28, the gate 81 includes a gate circuit 81a coupled to the SRAM bit line SBLa, and a gate circuit 81b coupled to a complementary SRAM bit line *SBLa. Gate circuit 81a includes an n channel MOS transistor 811a having its gate connected to SRAM bit line SBLa, and an n channel MOS transistor 812a receiving transfer control signal DTL at its gate. Gate circuit 81b includes an n channel MOS transistor 811b having its gate coupled to SRAM bit line *SBLa, and an n channel MOS transistor 812b receiving transfer control signal DTL at its gate. One conduction terminal of each of the transistors 811a and 811b is connected to the ground potential Vss. Gate circuits 81a and 81b invert data on the corresponding SRAM bit lines SBLa and *SBLa and transmit the inverted data to latch circuit 85 in response to the control signal DTL.

Latch circuit 85 includes an inverter latch for latching data in the gate circuits 81a and 81b. The inverter latch is formed of inverter circuits IVL1 and IVL2. Latch circuit 85 further includes inverter circuits IVL3 and IVL4 which invert and transmit an inverter output. Inverter circuit IVL3 inverts data from gate circuit 81a. Inverter circuit IVL4 inverts an output from gate circuit 81b. Gate 82 includes n channel MOS transistors 82a and 82b which are turned on in response to transfer control signal DTA for transmitting an output from latch circuit 85 to global I/O lines GIOa and *GIOa and to the input of gate 84.

A gate 84a includes an n channel MOS transistor 841a receiving data on the global I/O line GIO and an output from gate 82a at its gate; an n channel MOS transistor 842a which is turned on in response to data transfer control signal DTS1 for transmitting an output from transistor 841a to the input of amplifier 86; and an n channel MOS transistor 843a which is turned on in response to transfer control signal DTS1 for transmitting one output from transistor 842a and amplifier 86.

Similar to the gate circuit 84a, gate circuit 84b includes an n channel MOS transistor 841b receiving data on global I/O line *GIOa and an output from gate 82b; an n channel MOS transistor 842b for transmitting an output from transistor 841b to the input of amplifier 86; and an n channel MOS transistor 843b which is turned on in response to transfer control signal DTS1 for transmitting an output from transistor 842b.

Amplifier 86 includes p channel MOS transistors TM1a and TM1b connected in parallel to each other, and p channel MOS transistors TM2a and TM2b which are connected parallel to each other. Transfer control signal DTS1 is applied to the gate of the transistor TM1a, and the gate of the transistor TM1b is connected to one conduction terminal of transistor TM2a and of TM2b. The gate of the transistor TM2a is connected to one conduction terminal of transistor TM1a and of TM1b. Transfer control signal DTS1 is applied to the gate of transistor TM2b. Other conduction terminal of each of the transistors TM1a, TM1b, TM2a and TM2b is connected to the supply potential (Vcc).

Gate 83 includes an n channel MOS transistor 83a which is turned on in response to transfer control signal DTS2 for transmitting data from transistor 843a to SRAM bit line *SBLa and to gate 87a. Gate 83 further includes an n channel MOS transistor 83b which is turned on in response to transfer control signal DTS2 for transmitting an output from transistor 843b to SRAM bit line SBLa and to gate circuit 87b.

Gate 87 comprises a gate circuit 87a for connecting a data line DBW to SRAM bit line *SBLa, and a gate circuit 87b for connecting a data line *DBW to the SRAM bit line SBLa. Gate circuit 87a includes a MOS transistor 871a which is turned on in response to an output CD of the DRAM column decoder (which may be in common with the output from SRAM column decoder), and an n channel MOS transistor 872a which is turned on in response to an access designating signal WDE to the DRAM array for connecting the internal data line DBW to transistor 871a. Gate circuit 87b includes MOS transistor 871b which is turned on in response to the output CD of the SRAM column decoder, and an n channel MOS transistor 872b which is turned on in response to the DRAM array access designating signal WDE for connecting the internal data line *DBW to transistor 871b.

The control signal WDE is generated when the DRAM array of the semiconductor memory device is externally accessed (especially when data is written), as will be described later. Access designation to the DRAM array is generated in response to external control signals (CI#, W#; described later). Internal data lines DBW and *DBW are data lines for transmitting write data, and they are connected to an input circuit (which will be described later) included in the input/output circuit. The operation of the bi-directional data transfer gate shown in FIGS. 27 and 28 will be described with reference to FIGS. 29 and 30 which are diagrams of signal waveforms.

Figure 29:
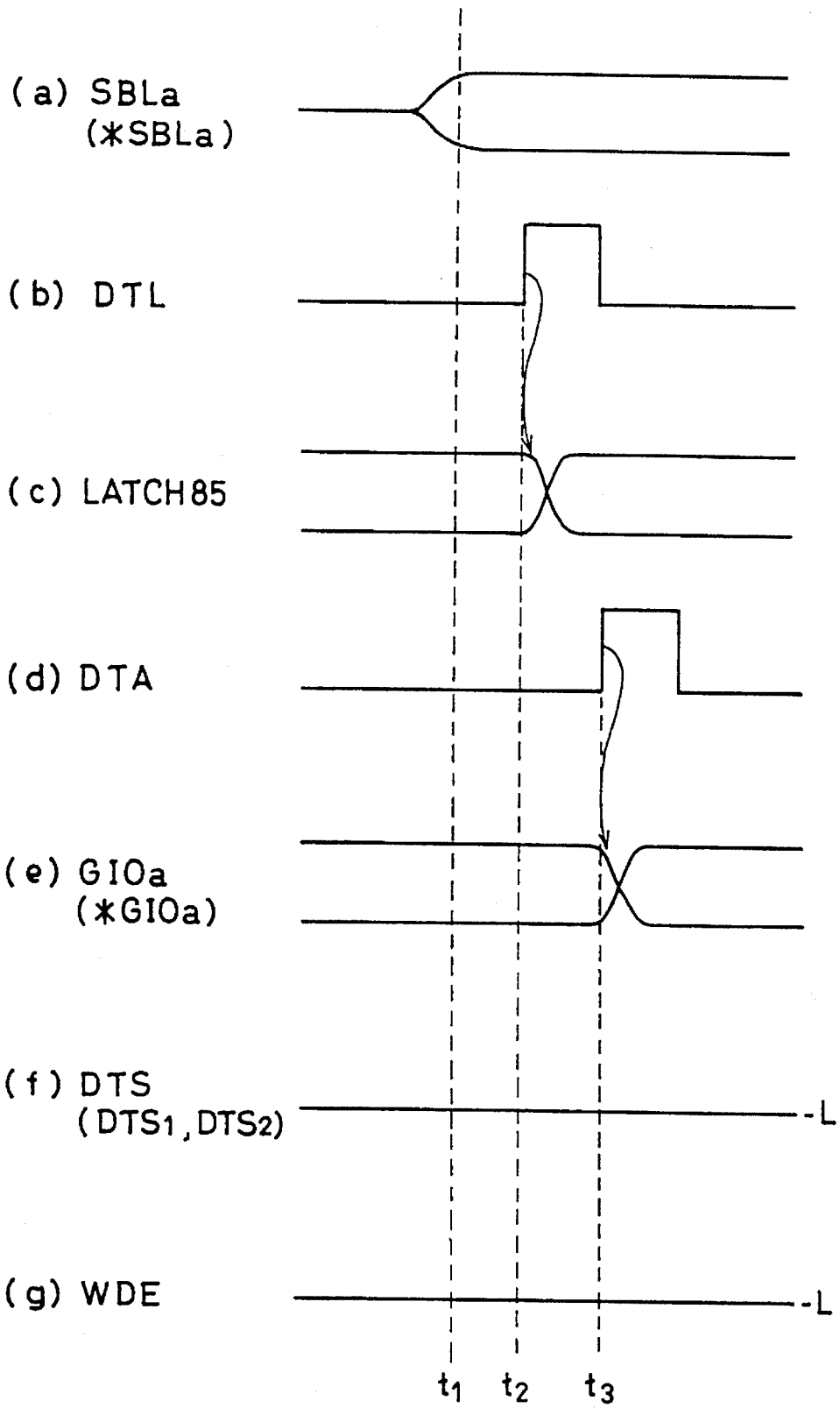
FIG. 29 is a diagram of signal waveforms showing operation in data transfer from the SRAM array to the DRAM array by the bi-directional transfer gate shown in FIGS. 27 and 28

First, referring to FIG. 29, data transfer operation from SRAM array to DRAM array will be described.

First, at time t1, a word line is selected in the SRAM array, and data on SRAM bit line pair SBL is established corresponding to the data of the memory cell connected thereto.

Thereafter, in response to a designation of data transfer from the SRAM array to the DRAM array, at time t2, a data transfer designating signal DTL is generated. In response, transistors 812a and 812b shown in FIG. 28 are turned on, and data on the SRAM bit lines SBLa and *SBLa are inverted and transmitted to latch 85. Latch 85 latches the data by inverter latches IVL1 and IVL2. The latched data is inverted by the inverter circuits IVL3 and IVL4 and transmitted to gate circuits 82a and 82b. Therefore, when the data transfer designating signal DTL is generated at time t2, the latch data in latch 85 has a value corresponding to the content of the corresponding SRAM bit lines SBLa and *SBLa.

When latch data in latch 85 is established, a transfer control signal DTA is generated at time t3. In response thereto, gate circuits 82a and 82b are turned on, and latch data in latch 85 are transmitted to global I/O lines GIOa and *GIOa, respectively. At this time, data transfer from the DRAM array to the SRAM array is not carried out, and therefore the control signal DTS (DTS1, DTS2) and DRAM access designating signal WDE are at the inactive state, that is, "L". Therefore, the transistors 842a and 842b and gate circuits 83a and 83b are all off. The amplifier 86 is also at an inoperative state.

Data transfer operation from DRAM array to SRAM array will be described with reference to FIG. 30.

Figure 30:
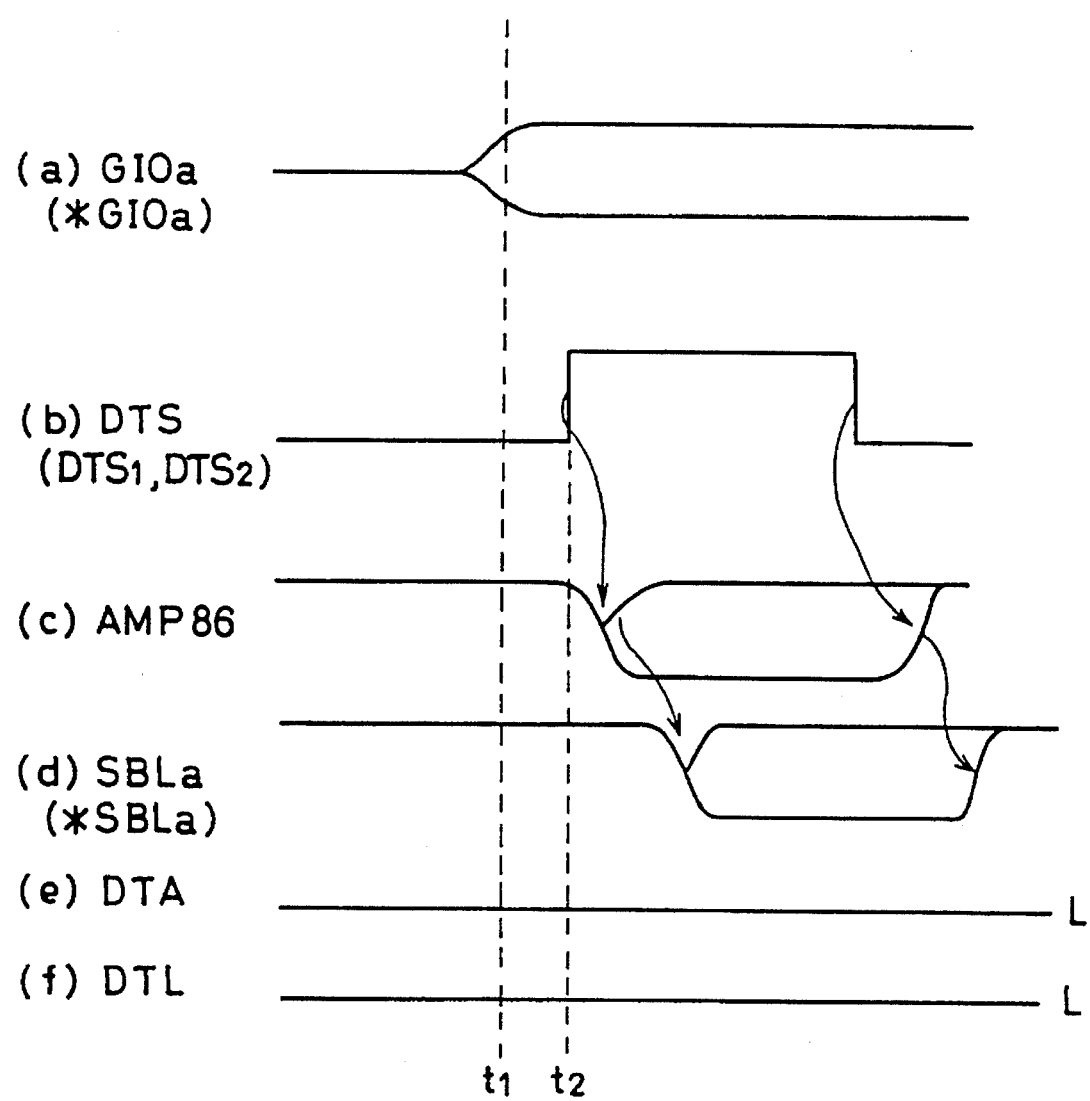
FIG. 30 is a diagram of signal waveforms showing data transfer operation from the DRAM array to the SRAM array by the bi-directional transfer gate shown in FIGS. 27 and 28.

Before the time t1 shown in FIG. 30, word line selecting operation in the DRAM array is carried out, and data of the selected memory cell is transmitted to the global I/O line pair GIO and is established at time t1.

Thereafter, at time t2, control signal DTS (DTS1 and DTS2) for designating data transfer from DRAM array to SRAM array is generated. In response, the transistors 842a, 842b, 83a and 83b are turned on, and gates 84 and 83 are rendered conductive. In amplifier 86, when control signal DTS (DTS1) is at "L", transistors TM1a and TM2b are on, maintaining potential of one node of the transistors 842a and 842b at "H". When control signal DTS is generated at time t2, transistors Tm1a and TM2b are turned off. On/off states of the transistors Tm1a and TM2b are changed dependent on the data transmitted from global I/O lines GIOa and *GIOa of the. DRAM array through the transistors 842a and 842b. If the control signal DTS is not generated, input/output node of amplifier 86 is charged to the supply potential Vcc. When data to global I/O line GIOa is at "H", transistor 841a is on and transistor 841b is off. When transfer control signal DTS1 is generated at this state, transistors 842a and 842b are turned on, and transistors Tm1a and TM2b are turned off. Consequently, potential of input/output nodes of transistors TM1b and Tm1a are discharged to the ground potential Vss through transistors 842a and 841a. Meanwhile, since the transistor 841b is off, input/output nodes of the transistors TM2a and TM2b are maintained at "H", as the transistor TM2a is turned on. Consequently, data on the global I/O line GIOa is inverted and transmitted to SRAM bit line *SBLa through transistors 843a and 83a, and data on global I/O line *GIOa is inverted and transmitted to SRAM bit line SBLa through transistors 843b and 83b.

At this time, since data transfer from the SRAM array to DRAM array is not carried out, the control signals DTA and DTL are at "L". The transfer control signal DTS is equivalent to transfer control signal ϕTDS shown in FIGS. 7, 8, 9 and 10.

By the structure shown in FIGS. 27 and 28, data on SRAM bit lines SBLa and *SBLa are transmitted to global I/O lines GIOa and *GIOa through gate 81, latch 85 and gate 82. Data on global I/O lines GIOa and *GIOa are transmitted to SRAM bit lines SBLa and *SBLa through gate 84, amplifier 86 and gate 83. Therefore, in this structure, data transfer paths are different from each other, and due to the functions of the latch 85 and of the amplifier 86, data transfer from the SRAM array to the DRAM array can be carried out in overlapped manner with the data transfer from the DRAM array to the SRAM array, whereby high speed data transfer between these arrays can be realized. Especially, by this structure, write data can be transmitted from gates 87a and 87b through data lines DBW, *DBW, gate 81, latch 85 and gate 82, to the global I/O lines GIOa and *GIOa. Therefore, by using common write data lines DBW and *DBW, selective writing to DRAM array and SRAM array can be carried out. Writing can be done to both arrays and to either one of the arrays. Designation of data writing to the DRAM array is done by the signal WDE.

By using the structure shown in FIGS. 27 and 28, even if data writing to the DRAM array is done through SRAM bit lines SBL and *SBL, it is not necessary to add an access designating signal to DRAM array as a conditional signal to the word line selecting signal in the SRAM array, and it is not necessary to add a DRAM array access designating signal as a conditional signal to a signal for connecting data of the selected memory cell in the high speed SRAM array to write data buses DBW and *DBW. Therefore, writing of data to the SRAM array can be carried out at high speed, and data can be written to DRAM array at high speed.

[Data Transfer Between DRAM and SRAM III]

Figure 31:
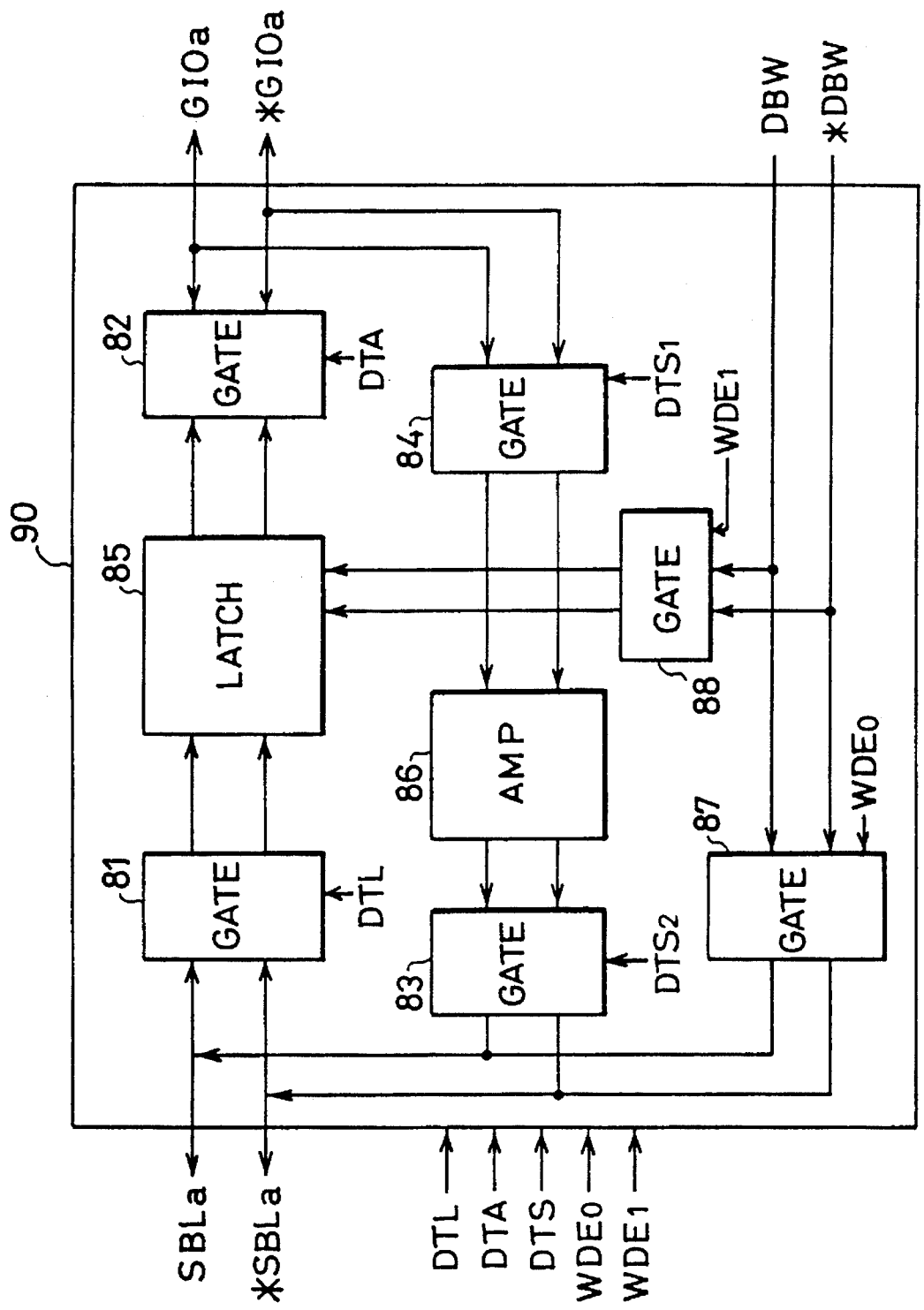
FIG. 31 shows a further example of a structure of the bi-directional transfer gate shown in FIG. 6.

FIG. 31 shows a further example of the structure of the bi-directional transfer gate circuit. A unit bi-directional transfer gate circuit 90 shown in FIG. 31 includes a gate 88 for transmitting data on internal write data buses DBW and *DBW to latch 85 in response to transfer control signal WDE1, in addition to the structure of FIG. 27. Control signals WDE0 and WDE1 correspond to control signal WDE shown in FIG. 27, and a column decoder output of the DRAM is used as a condition. Namely, control signal WDE0 applied to gate 87 is not generated when data is to be written to DRAM array, and gate 87 is turned off. At this time, only the control signal WDE1 is generated, gate 88 is turned on, and data on write data transmitting lines DBW and *DBW are transmitted to latch 85. In this manner, by selectively generating the write control signal WDE0 or WDE1 dependent on whether data are to be written to both of the SRAM array and DRAM array or only to the DRAM array, data can be written at high speed more efficiently to the DRAM having large storage capacity.

[Data Transfer Between DRAM and SRAM IV]

Figure 32:
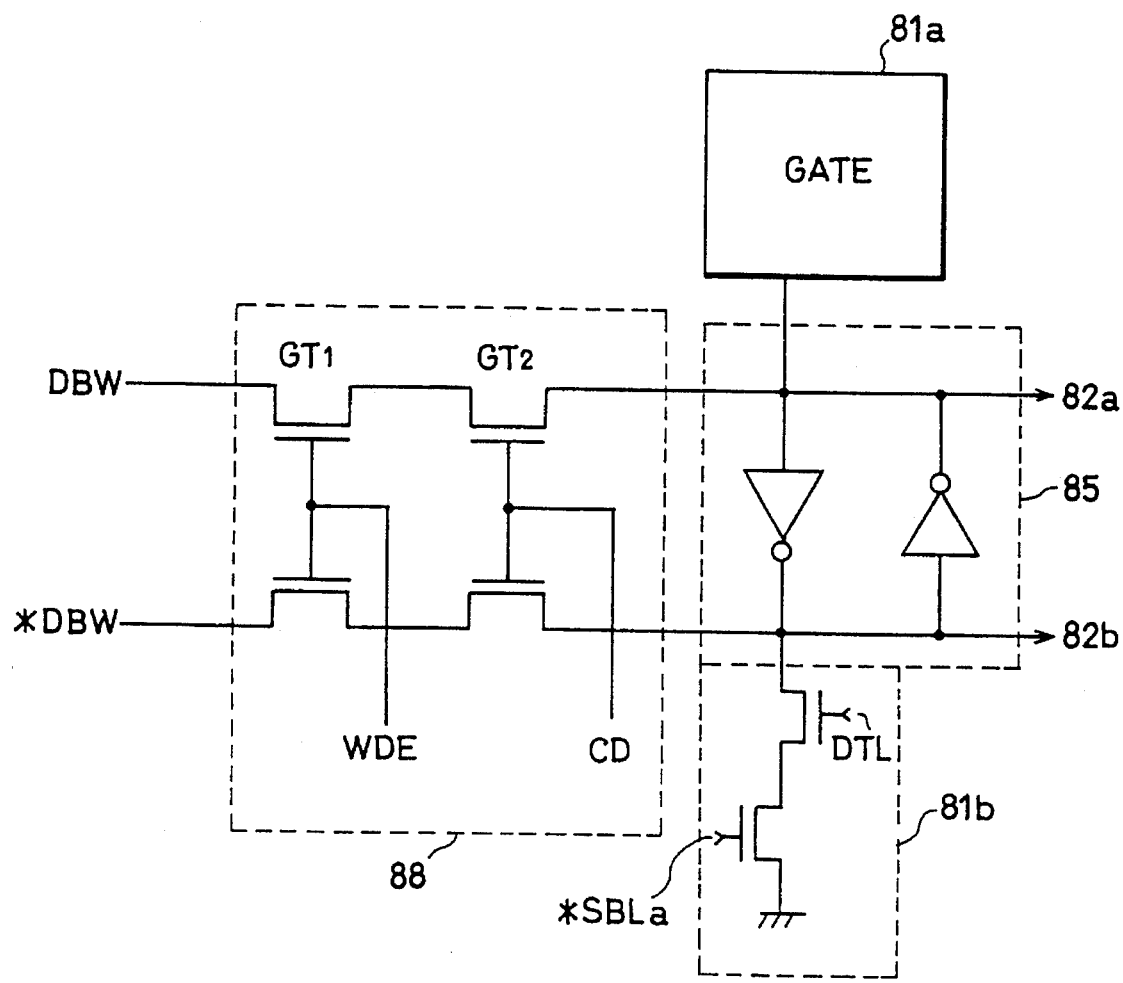
FIG. 32 shows a still further example of the structure of the bi-directional transfer gate shown in FIG. 6.

FIG. 32 shows a further example of the bi-directional transfer gate circuit. In this structure, gate 88 comprises a gate GT1 which is turned on in response to a data write designating signal WDE to the DRAM array, and a gate GT2 which is turned on in response to an output CD (an output for selecting a column in the DRAM array) of the column decoder. In this structure, write data lines DBW and *DBW are directly connected to latch 85 by gate 88. The structures of other circuit blocks are the same as those of the bi-directional transfer gate circuit shown in FIG. 31. In this structure, transfer control signals WDE0 and WDE1 (which are substantially identical) are conditioned by the column decoder output as a result (an AND is provided), and the operation of gate 88 is controlled by the signals.

Figure 33:
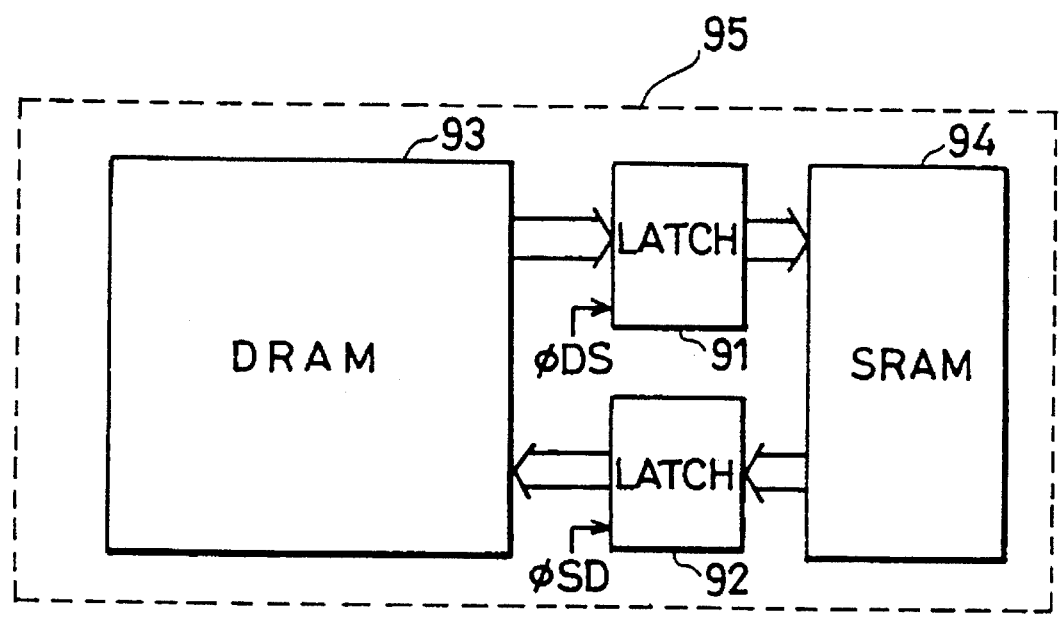
FIG. 33 schematically shows an example of application of the bi-directional transfer gate shown in FIGS. 27 and 28 to another structure.

The bi-directional transfer gate circuit shown in FIGS. 27, 31 and 32 carries out data transfer between SRAM bit lines SBL and *SBL and global I/O lines GIOa and *GIOa. However, the structure of the bi-directional transfer gate can be applied to a general semiconductor memory device as shown in FIG. 33. Referring to FIG. 33, a semiconductor memory device 95 includes a memory of a large capacity (generally a DRAM array) 93 and a high speed memory (generally an SRAM array) 94. If the structure shown in FIG. 27, 31 or 32 is used when data transfer such as "copy back" is to be carried out between the memories 93 and 94, data transfer paths can be set independent from each other by providing a first latch 91 and a second latch 92, and data transfer from the memory 93 having large capacity formed of a DRAM to the high speed memory 94 formed of SRAM can be carried out while data transfer in the inverse direction is being carried out. The independent data transfer path means that data transfer from the large capacity memory 93 to latch 91 can be carried out independent from data transfer from the high speed memory 94 to latch 92, and that data transfer from latch 91 to high speed memory 94 formed of a SRAM can be independently carried out in parallel to the data transfer from latch 92 to the large capacity memory 93 formed of a DRAM. Therefore, there is no problem even if data transfer in the memory 93 and in the memory 94 is carried out through a common bus. By activating latches 91 and 92 at overlapped timings or by activating the latches simultaneously as shown in FIG. 33, data transfer can be carried out at high speed.

[Data Transfer Between DRAM and SRAM V]

Data transfer is carried out between the DRAM and SRAM at the time of "cache miss". At the time of a "cache miss", "copy back" operation for transferring data from SRAM array to the DRAM array, and "block transfer" operation for transferring data from the DRAM array to the SRAM array are carried out.

FIGS. 34(A) to 36(B) schematically show copy back and block transfer operations carried out at the time of cache miss described above. The normal copy back and block transfer operations will be described.

Referring to FIG. 34(A), let us assume that data D2 to which access is requested by the CPU is not stored at a corresponding position of the SRAM. Data D1' is stored at the corresponding position of the SRAM, that is, the cache. When the cache miss of the SRAM is generated, the DRAM is still at a precharge state.

Referring to FIG. 34(b), in response to a cache miss designating signal, a word line (shown by hatched portion) including the region to which data D1' is to be stored is selected in the DRAM. This is an array active state. In the SRAM, the region of the data D1' has been selected.

Figure 35A:
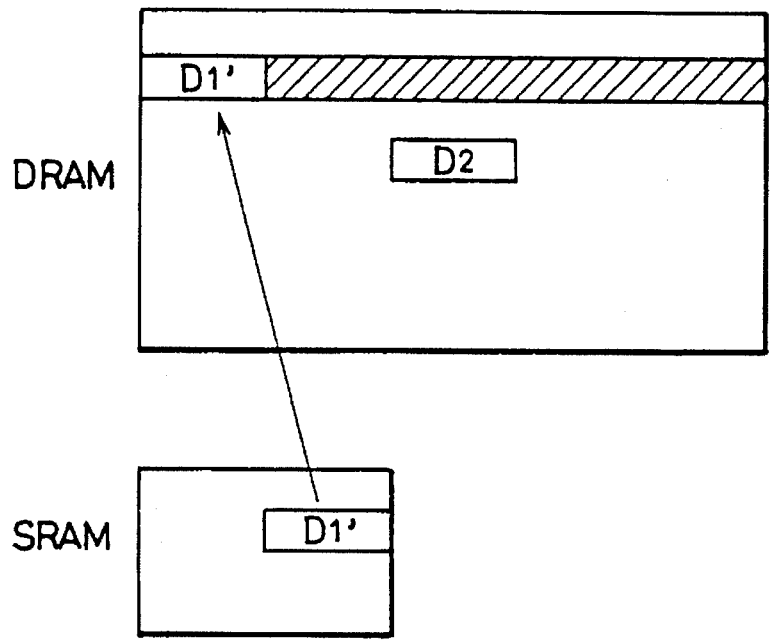
FIGS. 35A and 35B show mutual data transfer operation between the DRAM array and the SRAM array, when the bi-directional transfer gate shown in FIGS. 6, 27 and 31 is used.

Referring to FIG. 35(A), transfer designating signal φTSD is generated, and data D1' of the SRAM is transmitted to the corresponding region of the selected word line of the DRAM. Consequently, data D1' is stored in the data region D1 of the DRAM.

Figure 35B:
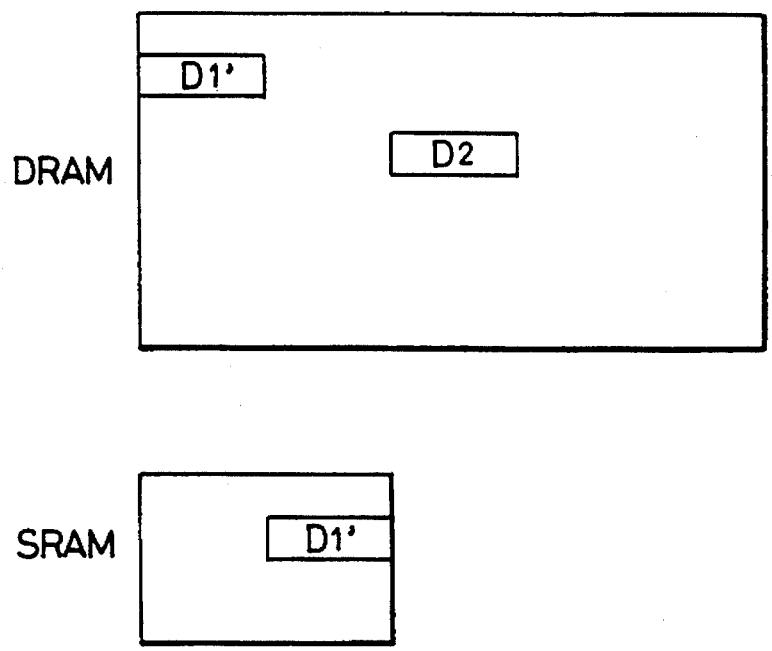

Referring to FIG. 35(B), after the completion of transfer of data D' to the data region D1 of the DRAM, the DRAM array is returned to the precharge state.

Referring to FIG. 36(A), a word line (shown by a hatching) including data D2 to which access is requested by CPU is selected in the DRAM.

Referring to FIG. 36(B), data D2 included in the selected word line is transmitted to the corresponding region of the SRAM array in response to data transfer designating signal φTDS. Consequently, data D1 of the SRAM array is rewritten by data D2. The copy back operation corresponds to the FIGS. 34(A) to 35(B), and the block transfer mode corresponds to FIG. 35(B) to FIG. 36(B). The step shown in FIG. 35(B) is included in both cycles, since the precharge period of the DRAM is included in both cycles, when these two operations are carried out successively.

The data transfer method is typically carried out by the circuit of FIG. 7. However, the precharge period of the DRAM array is interposed, and data transfer is always one way. Therefore, data transfer between the SRAM array and the DRAM array cannot be carried out at high speed. When the bi-directional transfer gate such as shown in FIGS. 27, 28 or 31 is used, data transfer between the DRAM array and the SRAM array can be carried out in overlapped manner. Data transfer operation of a semiconductor memory device which enables higher speed of data transfer and meets the demand of high speed operation will be described in the following.

[Data Transfer Between DRAM and SRAM VI]

Figure 37:
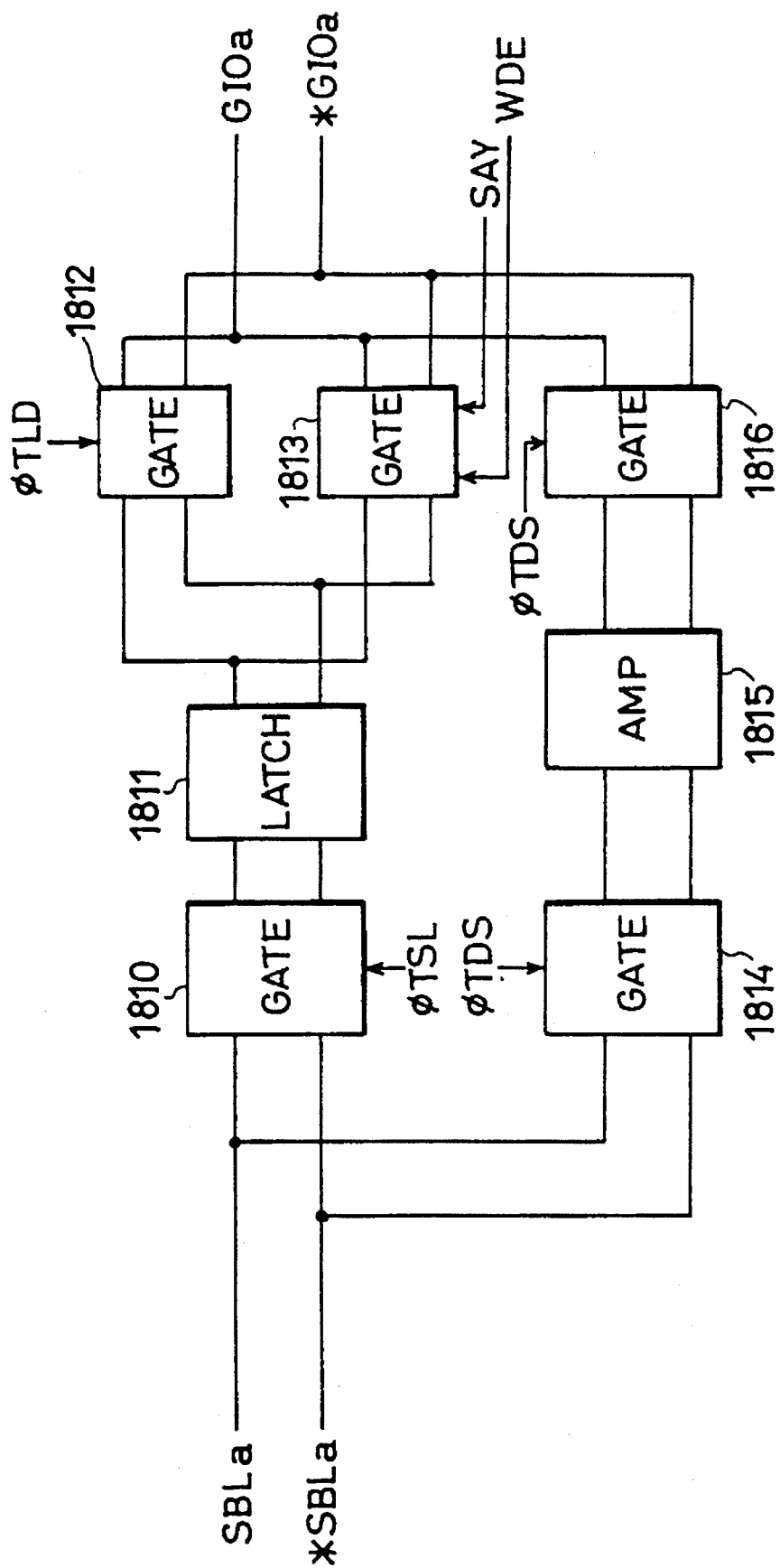
FIG. 37 shows a further example of the structure of the bi-directional transfer gate.

FIG. 37 is a block diagram showing a further circuit structure for bi-directional data transfer. Referring to FIG. 37, the bi-directional transfer gate circuit comprises a gate circuit 1810 responsive to transfer control signal φTSL for connecting SRAM bit line pair SBLa, *SBLa to a latch circuit 1811; a gate 1812 responsive to transfer control signal φTLD for connecting latch data of the latch circuit 1811 to global to I/O lines GIOa, *GIOa; and a gate 1813 responsive to DRAM write enable signal AWDE and to SRAM column decoder output SAY for connecting an output from latch 1811 to global I/O lines GIOa, *GIOa. The SRAM column decoder output SAY selects one of the simultaneously selected 16 bits in the DRAM. Therefore, a structure in which column address in the DRAM is commonly applied to the SRAM column decoder is shown as the SRAM column decoder output SAY, for example (see FIGS. 25, 26).

The bi-directional data transfer circuit further comprises a gate 1816 which is turned on in response to transfer control signal φTDS for connecting global I/O lines GIOa and *GIOa to an amplifier 1815, and a gate 1814 responsive to transfer control signal φTDS for transmitting an output from amplifier 1815 to SRAM bit line pair SBLa and *SBLa. The bi-directional data transfer circuit includes the gate 1813 which transmits, when data is to be written to DRAM array, the data not through the bit line pair SBLa and *SBLa of the SRAM but directly to global I/O lines GIOa and *GIOa. Consequently, data can be transmitted at high speed to DRAM array. Gate 1812 is used for collectively transferring data of 64 bits (in the case of 4 MCDRAM) which are simultaneously selected between SRAM array and DRAM, in response to transfer control signal φTLD.

Figure 38:
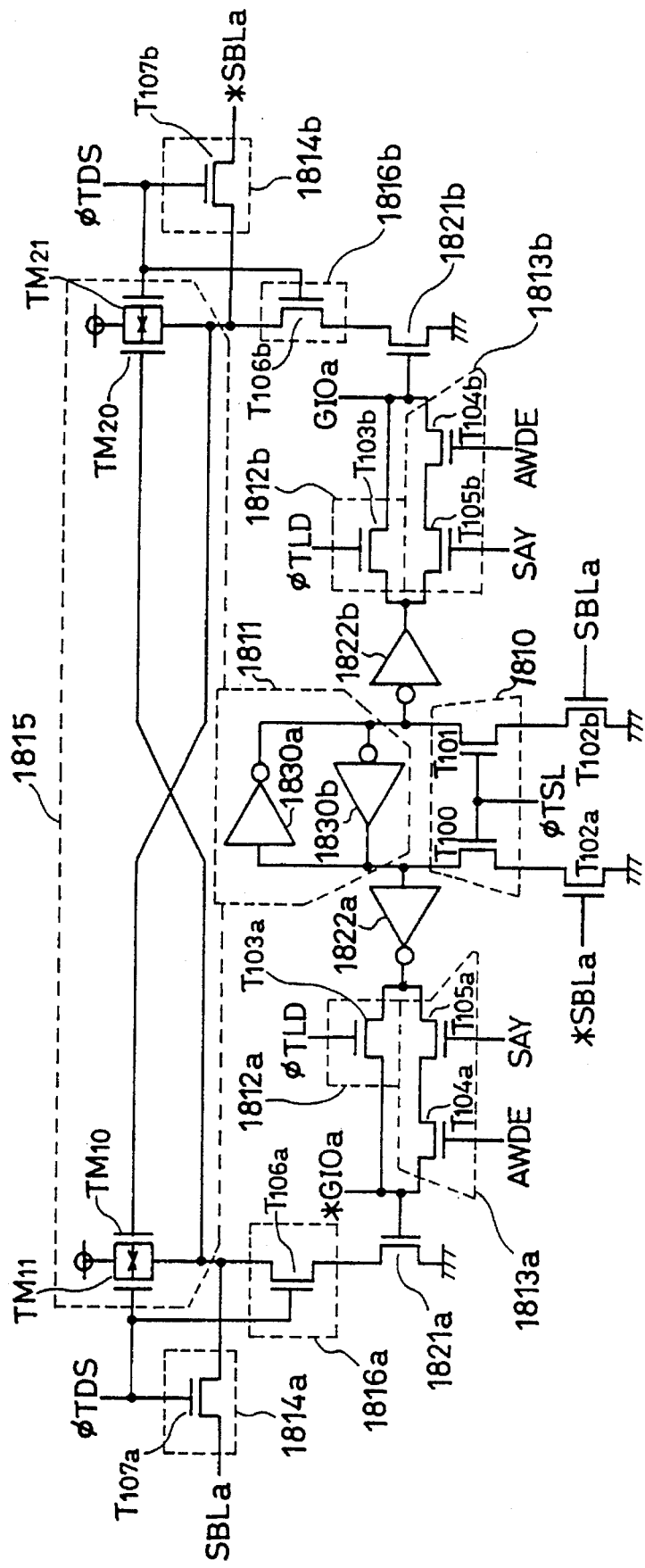
FIG. 38 shows an example of a specific structure of the bi-directional transfer gate shown in FIG. 37.

FIG. 38 shows an example of a specific structure of the bi-directional data transfer circuit shown in FIG. 37. Referring to FIG. 38, gate 1810 includes a pair of transistors T100 and 101 which are turned on in response to a control transfer signal φTSL. Gate 1810 (transistors T100, T101 is connected to transistors T102*b* and T102*a* for transferring data of SRAM bit lines SBLa and *SBLa, respectively. Transistors T102*a* and T102*b* invert and amplify data on SRAM bit lines SBLa and *SBLa for transmitting the same.

Latch 1811 includes an inverter latch circuit formed of inverters 1830*a* and 1830*b*. Latch data of the latch 1811 are transmitted to gates 1812*a*, 1812*b* and 1813*a* and 1813*b* through inverter circuits 1822*a* and 1822*b*. Gate 1812 includes a transistor T103*a* which is turned on in response to control signal φTLD for transmitting an output from inverter circuit 1812*a* to global I/O line *GIOa. Gate circuit 1812*b* include a transistor T103*b* which is turned on in response to transfer control signal φTLD.

Transistor T103*b* transmits an output from inverter circuit 1812*b* to global I/O line GIOa in response to transfer control signal φTLD.

Gate 1813 includes gate circuits 1813*a* and 1813*b*. Gate circuit 1813*a* includes a transistor T104*a* which is turned on in response to DRAM write enable signal AWDE, and a transistor T105*b* which is turned on in response to SRAM column decoder output SAY. Gate circuit 1813*a* transmits an output from inverter circuit 1822*a* to global I/O line *GIOa, when control signal AWDE and decoder output SAY are both "H". Gate circuits 1813*b* includes a transistor T105*b* which is turned on in response to SRAM column decoder output SAY, and a transistor T104*b* which is turned on in response to DRAM write enable signal AWDE. Gate circuits 1813*b* transmits an output from inverter circuit 1822*b* to global I/O line GIOa, when decoder output SAY and write enable signal AWDE are both active.

Gate 1816 includes gate circuits 1816*a* and 1816*b*. Gate circuit 1816*a* includes a transistor T106*a* which is turned on in response to transfer control signal φTDS. Transistor T106*a* is connected to global I/O line *GIOa through an inverting and amplifying transistor 1821*a*, and to an amplifier 1815. Gate circuit 1816*b* includes a transistor T106*b* which is turned on in response to transfer control signal φTDS. Transistor T106*b* is connected to global I/O line GIOa through an inverting and amplifying transistor 1821*b*.

Amplifier 1815 includes p channel MOS transistors TM11, TM10 and TM20 and TM21. Transistors TM11 and TM10 are connected parallel to each other. Transistors TM20 and TM21 are connected in parallel. The transistor TM11 receives transfer control signal φTDS at its gate. Transistor TM10 receives an output from transistor T106*b* (gate circuit 1016*b*) at its gate. Transistor TM20 receives an output of transistor T106*a* (gate circuit 1816*a*) at its gate. Transistors TM10, TM11 and TM20 and TM21 transmit supply potential Vcc when they are turned on.

Gate 1814 includes gate circuits 1814*a* and 1814*b*. Gate circuit 1814*a* includes a transistor T107*a* which is turned on in response to transfer control signal φTDS. Transistor T107*a* transmits an output of amplifier 1815 to SRAM bit line SBL. Gate circuit 1814*b* includes a transistor T107*b* which is turned on in response to control signal φTDS for transmitting an output of amplifier 1815 to SRAM bit line *SBLa. Operation of the bi-directional data transfer circuit shown in FIGS. 37 and 38 will be described with reference to FIGS. 39 and 40 which are diagrams of waveforms.

Figure 39:
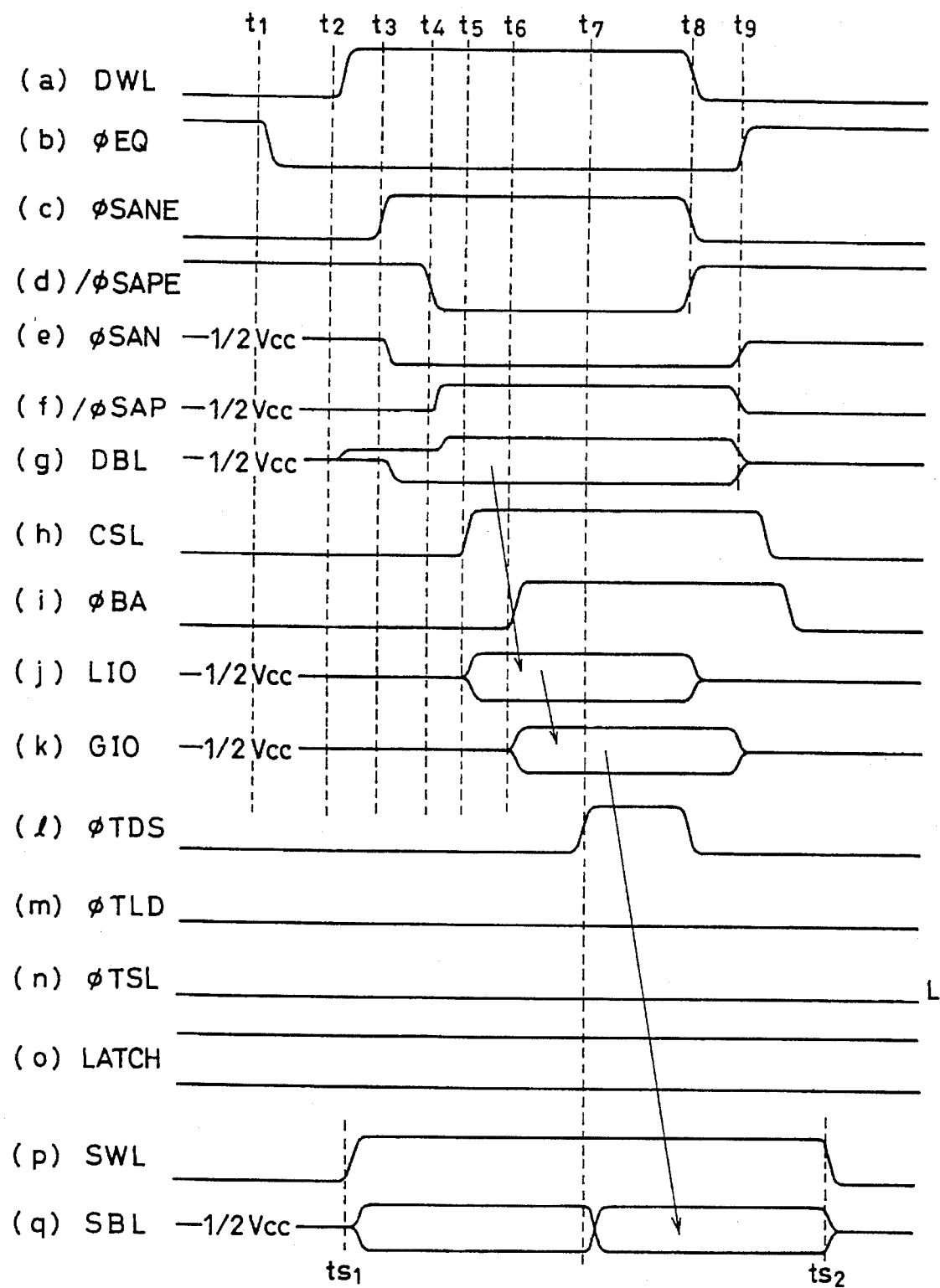
FIG. 39 is a diagram of signal waveforms showing data transfer operation from the DRAM array to the SRAM array by using the bi-directional transfer gate shown in FIGS. 37 and 38.

Referring to FIG. 39, data transfer operation from DRAM array to SRAM array will be described. In this case, an array active cycle is carried out in accordance with an array access (cache inhibition) signal CI, in which a word line DWL is selected in DRAM array, memory cell data connected to the selected word line DWL are detected and amplified, a column selecting line CSL is selected, data are transmitted to local I/O lines, and local I/O lines and global G/O lines are connected in accordance with a block selecting signal φBA.

Meanwhile, in SRAM array, an SRAM word line SWL is selected, and memory cells connected to the selected word line SWL are transmitted to SRAM bit line pair SBL. At time t7 when data on the global I/O line GI0 and on SRAM bit line pair SBL are established, a data transfer control signal φTDS is generated. At this time, control signals φTLD and φTSL are both maintained at "L".

When control signal φTDS attains to "H", gate circuits 1814*a* and 1814*b* are rendered conductive, and gate circuits 1816*a* and 1816*b* are rendered conductive. Consequently, data on the global I/O line GIOa is inverted by transistor 1821*b* and then transmitted through gate circuits 1816*b* and 1814*b* to SRAM bit line *SBLA. Meanwhile, data on global I/O line *GIOa is inverted by transistor 1821*a* and then transmitted through gate circuits 1816*a* and 1814*a* to SRAM bit line SBLa.

After the completion of data transfer, DRAM array is set to equalize/precharge state to be in the standby state at time t9, and SRAM array is set to precharge/equalize state at time ts2. Data transfer timings shown in FIG. 39 are approximately the same as those shown in FIG. 8. Transfer control signals φTLD and φTSL correspond to transfer control signal φTSD.

Figure 40:
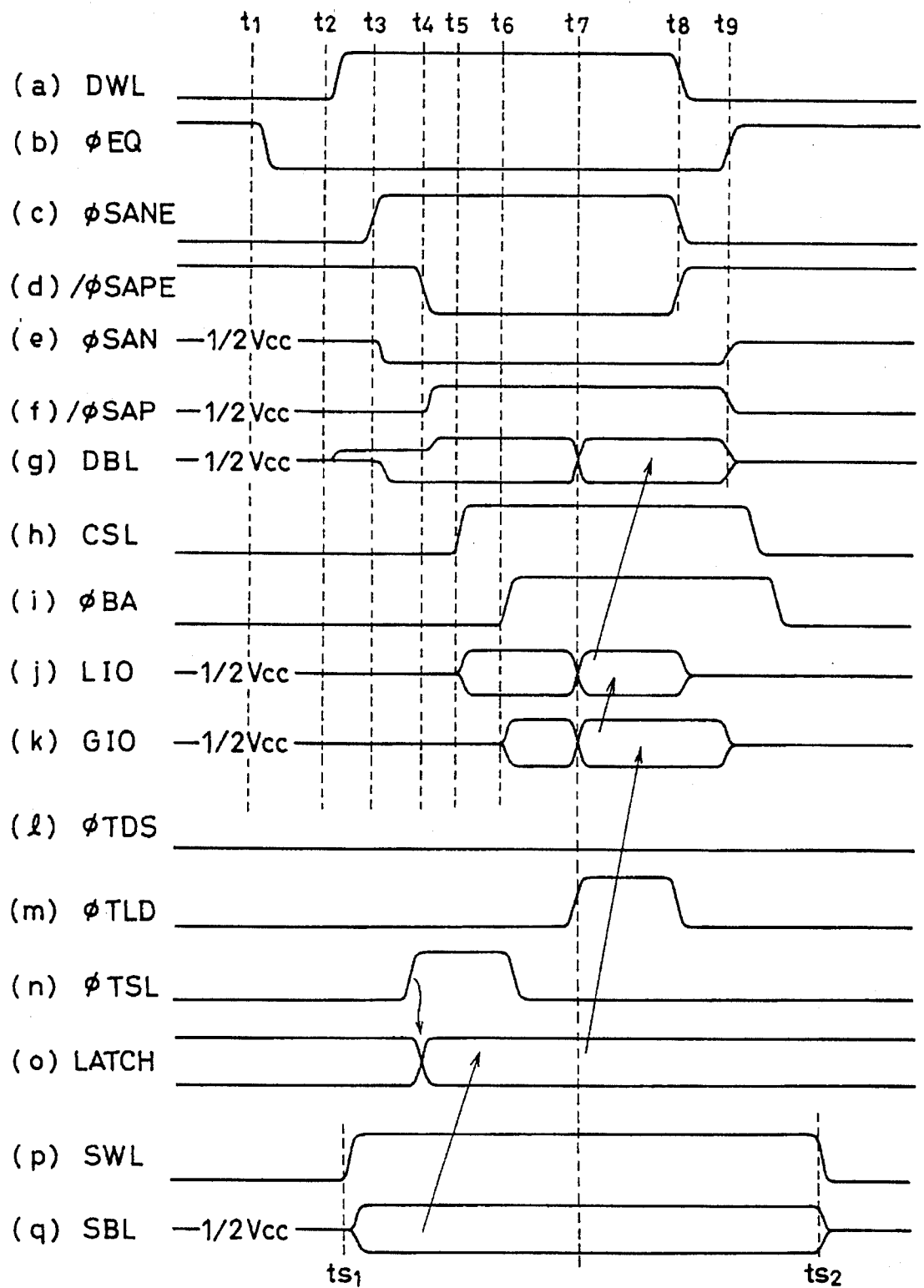
FIG. 40 is a diagram of signal waveforms showing data transfer operation from the SRAM array to the DRAM array by using the bi-directional transfer gate shown in FIGS. 37 and 38.

Referring to FIG. 40, data transfer operation from SRAM to DRAM array will be described. In this case, approximately the same operation as the data transfer operation shown in FIG. 10 is carried out. However, since control signals φTLD and φTSL are generated, the manner of data transfer is little different. In the data transfer shown in FIG. 40, a potential of a selected word line SWL rise to "H" in SRAM, data on SRAM bit line pair SBL are established and transfer control signal φTSL is generated. In response to transfer control signal φTSL, gate 1810 is turned on, data from transistors T102*a* and T102*b* to SRAM bit lines SBLa and *SBLa are inverted and transmitted to latch 1811. Consequently, latch data in latch 1811 correspond to the memory cells selected in SRAM.

Thereafter, at time t7, data transfer control signal φTLD is generated approximately at the same timing as the data transfer control signal φTSD shown in FIG. 10. Consequently, gate 1812 is turned on, data latched in latch 1811 are inverted by inverter circuits 1821*a* and 1821*b*, and transmitted to global I/lines *GIOa and GIOa. Data on global I/O lines GIOa and *GIOa are transmitted through local I/O line pair LIO to DRAM bit line pair DBL. Thus data transfer from SRAM array to DRAM array is completed. When data are to be directly written to DRAM array, data transfer control signals φTLD, φTDS and φTSL are not generated. Data are written through a gate circuit selected by SRAM column decoder output SAY by gate circuits 1813*a* and 1813*b*.

As shown in FIGS. 37 and 38, by providing a latch 1811 and an amplifier 1815 to carry out data transfer through separate paths, data transfer between DRAM array and SRAM array can be carried out at higher speed. Such operation mode will be described in the following.

[High Speed Transfer Mode (I)]

Figure 41:
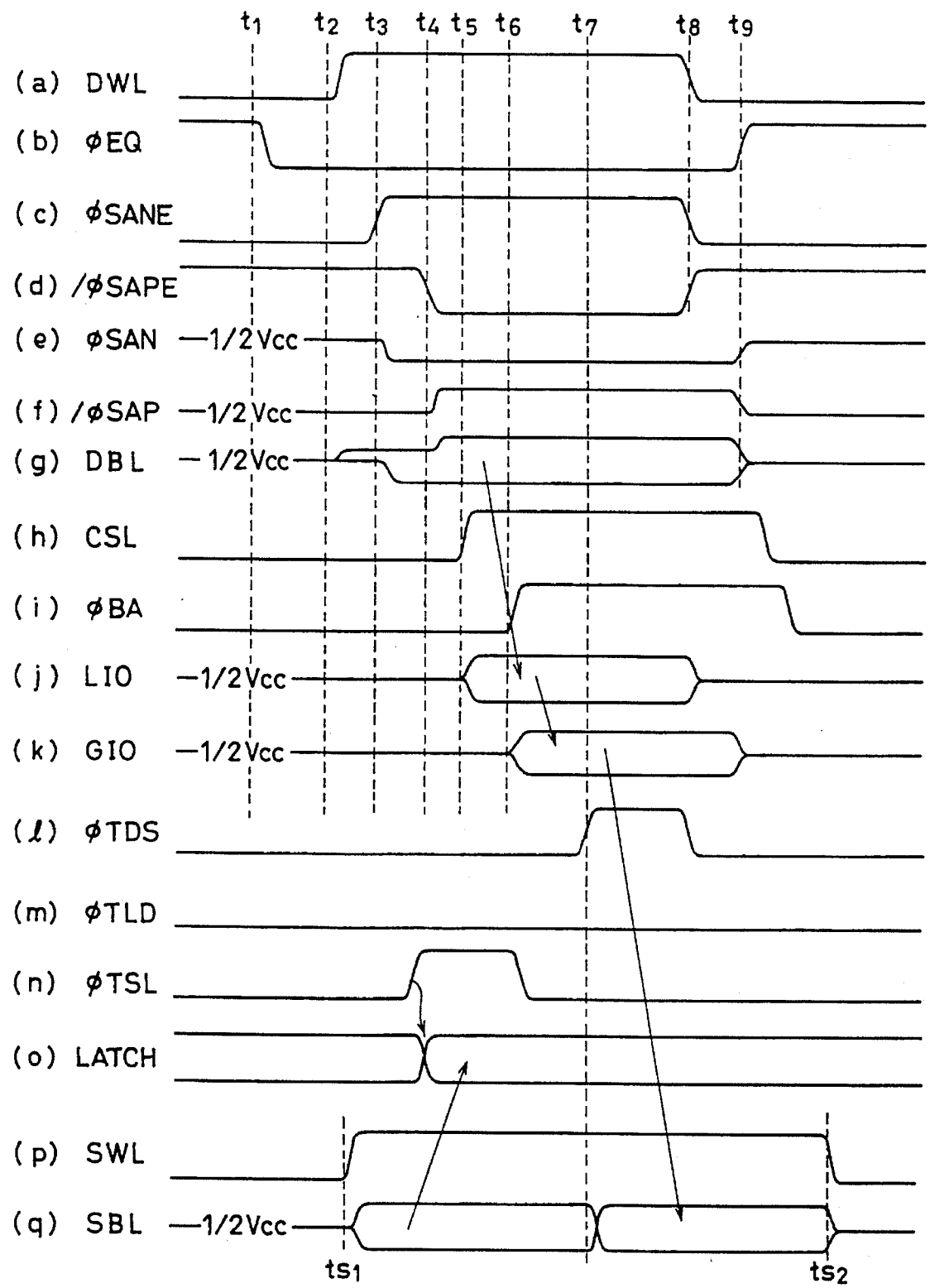
FIG. 41 is a diagram of signal waveforms showing the data transfer operation from the DRAM array to the SRAM array when high speed copy back operation is effected by using the bi-directional transfer gate shown in FIGS. 37 and 38.
Figure 42:
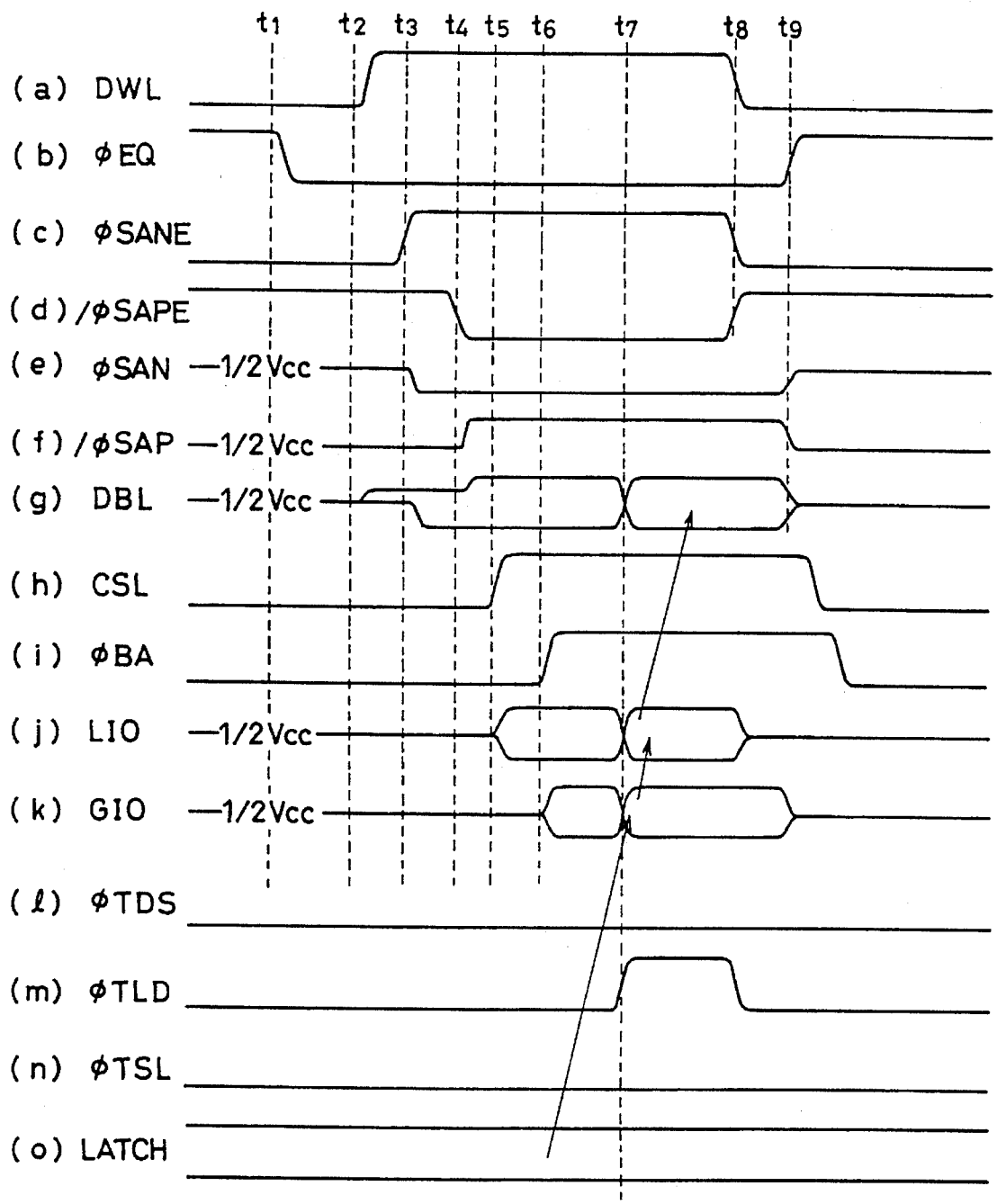
FIG. 42 is a diagram of signal waveforms showing the data transfer operation from the SRAM array to the DRAM array in the high speed copy back operation.
Figure 43A:
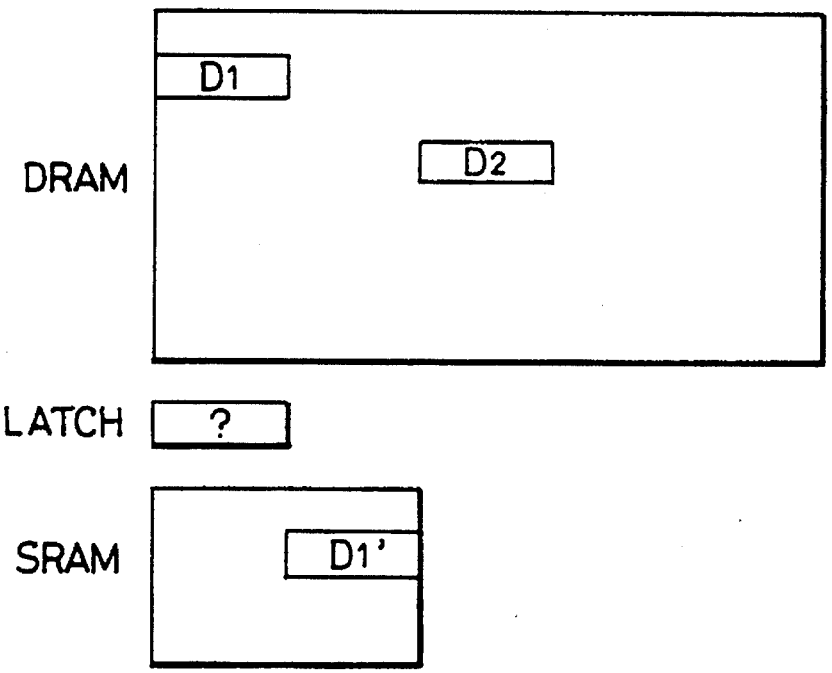
FIGS. 43A and 43B are schematic diagrams for describing the high speed copy back mode operation.
Figure 43B:
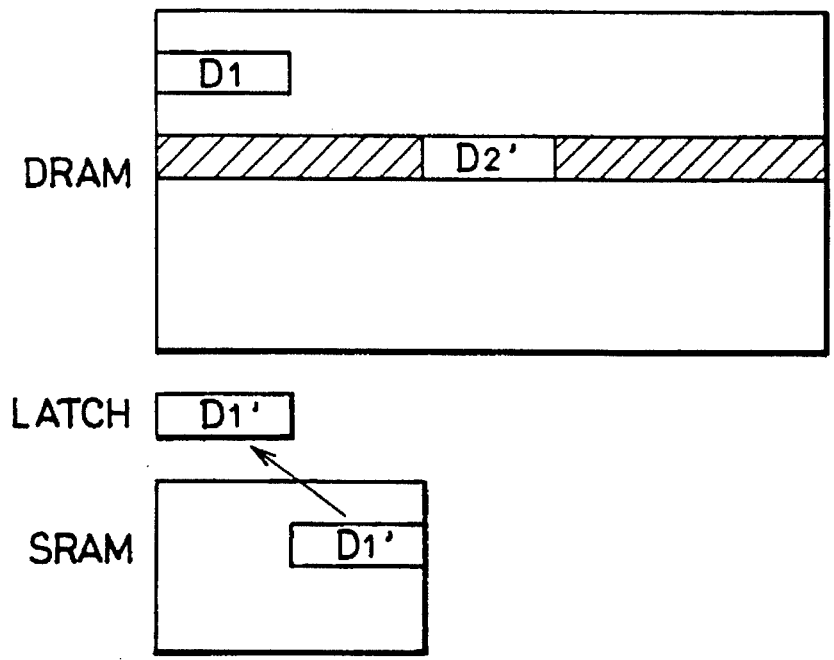
Figure 44A:
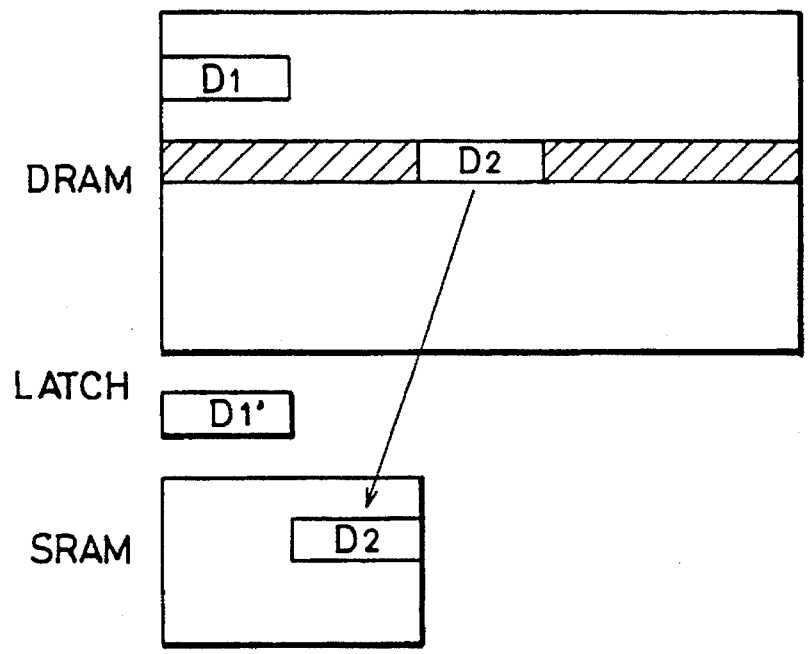
FIGS. 44A and 44B are schematic diagrams for describing the high speed copy back mode operation.
Figure 44B:
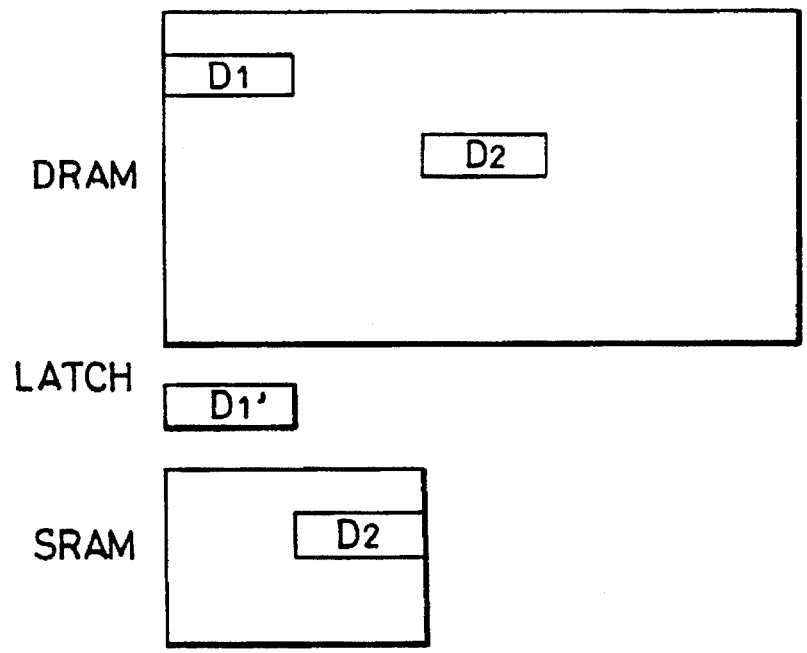

FIGS. 41 and 42 are diagrams of signal waveforms showing data transfer operation in high speed copy back mode. "High speed copy back" mode includes copy back mode for transferring data from SRAM array to DRAM array, and block transfer mode for carrying block transfer from DRAM array to SRAM array. Referring to FIG. 41, data transfer operation from DRAM to SRAM will be described.

In this operation mode, when data of the selected memory cells are established in SRAM at time ts1, transfer control signal φTSL is generated. Consequently, data from SRAM bit line pair SBL are latched in latch 1811 through gate 1810.

In parallel to the above described operation, in DRAM array, a DRAM word line DWL is selected and DRAM column selecting line CSL is selected. At time t7 after the completion of data latch in latch 1811, data transfer control signal φTDS is generated. Consequently, gates 1814 and 1816 are turned on, data on global I/O line pair GIO are transmitted to SRAM bit line pair SBL through amplifier 1815. At this time data, which are to be transferred from SRAM to DRAM array has already been latched in latch 1811. As shown in FIG. 39, by providing latch 1811 and amplifier 1815 in separate systems, data can be transferred from DRAM array to SRAM array in parallel to data transfer from SRAM array to latch.

Timing of generation of transfer control signal φTSL may be arbitrarily selected after time ts1. The timing of generating transfer control signal φTDS is after the completion of latch operation in latch 1811 and after establishment of data on global I/O line GIO. By this structure, after the control signal φTDS is generated and data on SRAM bit line pair SBL are established, data of the SRAM can be immediately read, enabling access to SRAM array at higher speed.

Thereafter, transfer of data latched in latch 1811 to DRAM array is carried out.

Referring to FIG. 42, after the completion of data transfer to SRAM array, word line selecting operation is carried out in accordance with another DRAM address. At time t7, when data on global I/O line pair GIO are established, data transfer control signal φTLD is generated, gate 1812 is turned on, and data latched in latch 1811 are transmitted to global I/O line pair GIO. Data transmitted to global I/O line pair GIO is transmitted to DRAM bit line pair DBL through local I/O line pair LIO.

When data are transferred from the SRAM array to DRAM array shown in FIG. 42, only the data latched in latch 1811 are transmitted to DRAM array. Therefore, at this time, SRAM array can be accessed in parallel to the data transfer from SRAM array to DRAM array, and therefore a semiconductor memory device having higher speed of operation can be provided. The high speed copy back mode operation shown in FIGS. 41 and 42 is schematically shown in FIGS. 43A to 45B. The high speed copy back mode will be described in more detail with reference to FIGS. 43 to 45. Let us assume that data D1' is stored in a region accessed in SRAM array, and data D2 which is requested is not stored. At this time, SRAM array is accessed, and DRAM is at a precharge state of standby (see FIG. 43(A)).

When such a cache miss occurs, at first data D1' is transferred to a latch in SRAM. Parallel to the data transfer to the latch, a word line (hatched portion) including the data D2 is carried out in the DRAM (FIG. 43(B)).

Thereafter, data D2 included in the selected word line of DRAM is transmitted to that region of the SRAM at which the data D1' has been stored. At this time, data D1' is latched in latch (FIG. 44(A)).

After the data transfer from DRAM to SRAM, DRAM is once set to the precharge state for selecting the word line including data D1 again. The region for storing data D1 means a region in which data D1', which has been stored in the SRAM, is to be stored (FIG. 44(B)).

Figure 45A:
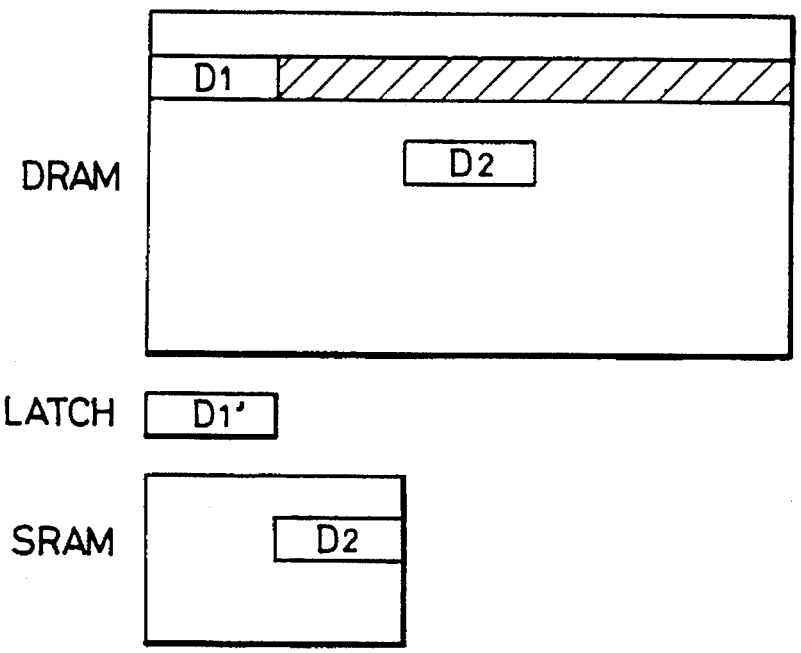
FIGS. 45A and 45B are schematic diagrams for describing the high speed copy back operation.
Figure 45B:
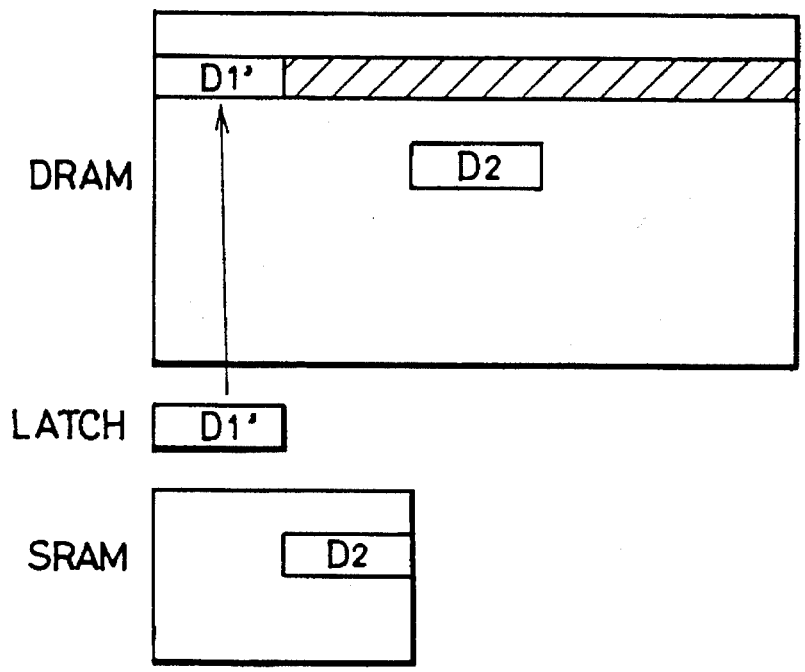

After completion of precharging in DRAM, a word line (hatched region) including data D1 is selected (FIG. 45(A)).

Thereafter, data D1' which has been latched in the data region D1 of the selected word line of the DRAM is transferred. Consequently, data D1 in DRAM is rewritten by the data D1' (FIG. 45(B)).

The manner of applying external address to the SRAM is the same as in the above described cache miss, and to the DRAM, address from the CPU is applied at first, and then address from a tag memory is applied.

When the high speed copy back mode shown in FIGS. 43A to 45B is compared with the data transfer operation shown in FIGS. 34A to 36B, in DRAM, only one precharge period is required at the high speed copying, and therefore data transfer between SRAM and DRAM can be carried out at high speed. In a conventional cycle including copy back and block transfer mode, SRAM can be accessed only after the block transfer. However, in the high speed copy back mode, data transfer is carried out from DRAM to SRAM in the first data transfer cycle, and therefore block transfer is carried out at first. Therefore, SRAM can be directly accessed, and hence a semiconductor memory device containing a cache having higher speed of operation can be provided.

Data transfer between SRAM array and the DRAM array at a cache miss in a semiconductor memory device containing a cache has been described as an example of the high speed copy back mode. However, exchange of data at high speed can be also made possible in transferring data between two memory cell arrays such as a normal SRAM array and a DRAM array as shown in FIG. 33, and therefore efficiency in data transfer can be significantly improved.

[High Speed Transfer (II)]

Figure 46:
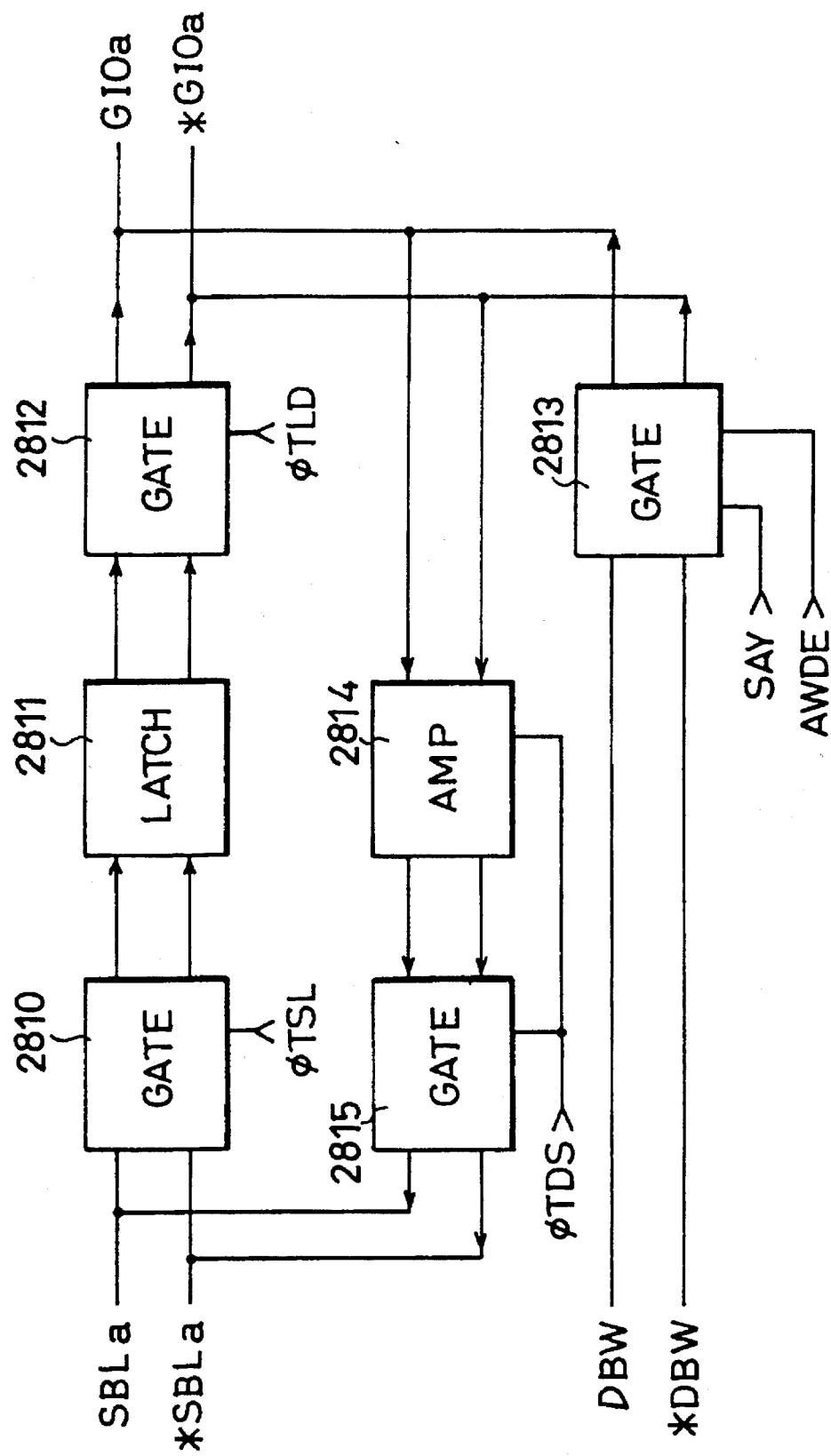
FIG. 46 is a block diagram schematically showing another structure of the data transfer device.

FIG. 46 is a block diagram schematically showing another structure of a data transfer device. A circuit portion for transferring data of 1 bit between SRAM array and DRAM array in the data transfer device is shown in FIG. 46. The data transfer device includes 16×4 of the bi-directional transfer gate circuits shown in FIG. 46. In the following, the data transfer device shown in FIG. 46 is referred to as a bi-directional transfer gate circuit for transferring data of 1 bit.

Referring to FIG. 46, the bi-directional transfer gate circuit includes a gate circuit 2810 responsive to transfer control signal φTSL for connecting SRAM bit line pair SBLa and *SBLa to a latch circuit 2811; a gate circuit 2812 responsive to transfer control signal φTLD for transmitting data latched in latch circuit 2811 to global I/O lines GIOa and *GIOa; and a gate circuit 2813 responsive to DRAM write enable signal AWDE and to SRAM column decoder output SAY for transferring data on write data bus lines DBW and *DBW to global I/O lines GIOa and *GIOa. An output SAY of SRAM column decoder selects 1 bit out of 16 bits which has been simultaneously selected in DRAM array block. Therefore, a structure in which lower 4 bits of a column address signal in DRAM array are applied to SRAM column decoder is shown as an example.

The bi-directional transfer gate circuit further includes an amplifier circuit 2814 which is activated in response to transfer control signal φTDS for activating data on global I/O lines GIOa and *GIOa; and a gate circuit 2815 responsive to transfer control signal φTDS for transferring data amplified by the amplifier circuit 2814 to SRAM bit line pair SBLa and *SBLa.

Gate circuit 2810 and latch circuit 2811 constitute first transfer means, gate circuit 2815 and amplifier circuit 2814 constitute second transfer means, and gate circuit 2812 and gate circuit 2813 constitute a third transfer means.

DRAM write enable signal AWDE is generated upon occurrence of a cache miss in an array access cycle when the CPU requests data writing. More specifically, it is generated from a transfer gate control circuit 262, which will be described later, when a chip select signal E# attains "L", cache hit signal CH# is "H" and write enable signal W# is "L" at a rising edge of a clock signal K. When data is to be written to DRAM array by gate circuit 2813, write data can be directly transmitted to global I/O lines GIOa and *GIOa, not through SRAM bit line pair SBLa and *SBLa. Consequently, data can be written at higher speed. Gate circuit 2812 is used for adjusting timing, when 64 bit (in the case of 4M bit DRAM) of data are to be simultaneously transferred from SRAM array to DRAM array in response to transfer control signal φTLD. Similarly, gate circuit 2815 is used for adjusting timing when 64 bits of data are to be simultaneously transferred from DRAM array to SRAM array.

Figure 47:
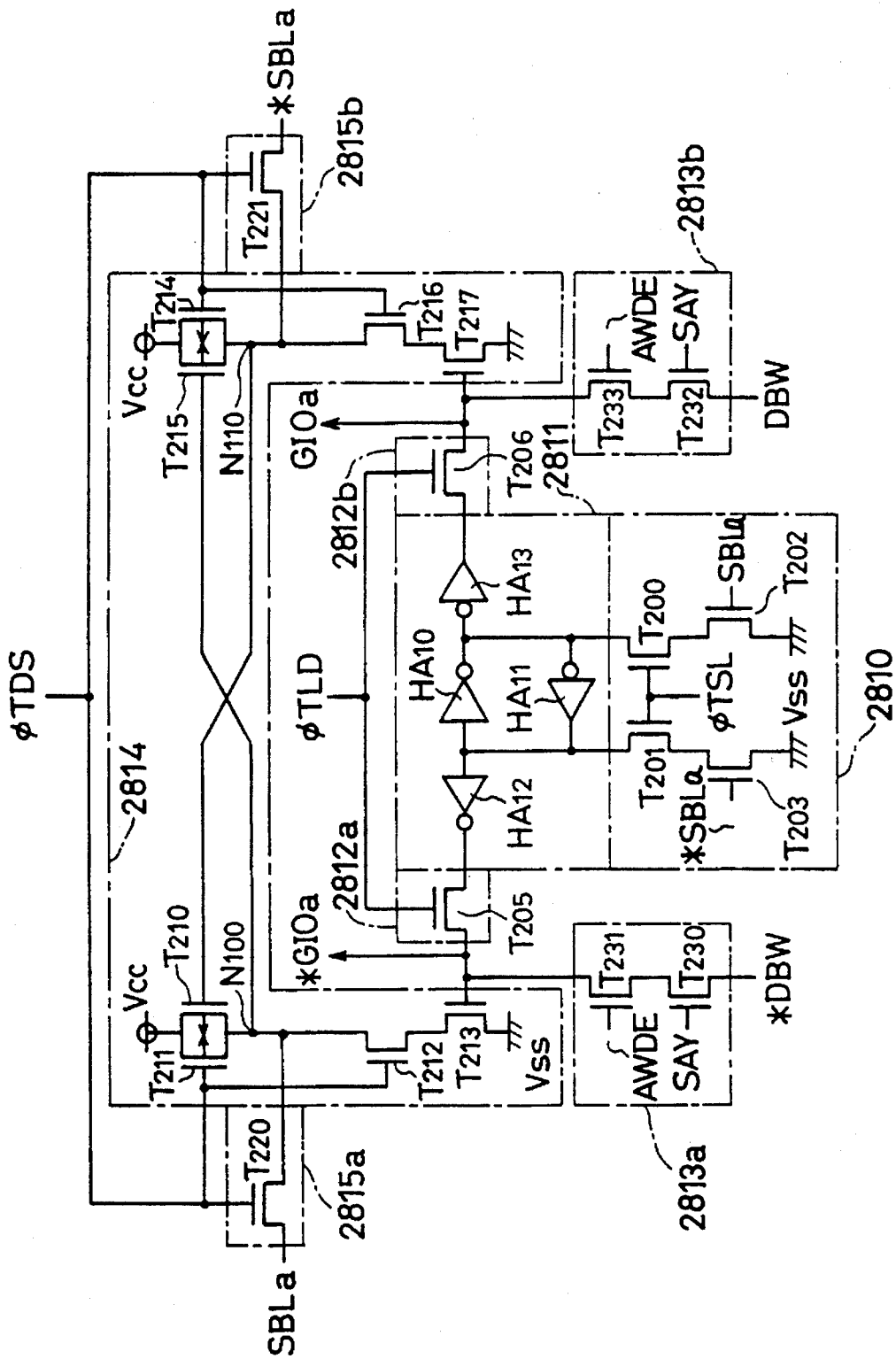
FIG. 47 shows a detailed structure of the data transfer device shown in FIG. 46.

FIG. 47 shows an example of a specific structure of the bi-directional transfer gate circuit.

Gate circuit 2810 includes N channel MOS transistors T202 and T203 for amplifying signal potential on SRAM bit line pair SBLa and *SBLa, and N channel MOS transistors T200 and T201 which are rendered conductive in response to transfer control signal φTSL for transmitting data amplified by transistors T202 and T203 to a latch circuit 2811. Transistor T202 has its gate connected to SRAM bit line SBLa, one conduction terminal connected to the ground potential Vss and the other conduction terminal connected to one conduction terminal of transistor T200. Transistor T203 has its gate connected to SRAM bit line pair *SBLa, one conduction terminal connected to the ground potential Vss and the other conduction terminal connected to one conduction terminal of transistor T201.

Latch circuit 2811 includes inverter circuits HA10 and HA11 having their inputs connected to the outputs of each other. Inverter circuits HA10 and HA11 constitute an inverter latch. Latch circuit 2811 further includes inverter circuits HA12 and HA13 for inverting latched data of the inverter latch (inverter circuits HA10 and HA11).

Gate circuit 2812 includes a gate circuit 2812b for transmitting data to global I/O line GIOa, and a gate circuit 2812a for transmitting data to global I/O line *GIOa. Gate circuit 2812a is formed by an n channel MOS transistor T205 and gate circuit 2812b is formed by an n channel MOS transistor T206. Transfer control signal φTLD is applied to the gates of the transistors T205 and T206.

Amplifier circuit 2814 includes an n channel MOS transistor T213 for amplifying potential on global I/O line *GIOa, an n channel MOS transistor T212 which is turned on in response to transfer control signal φTDS for transmitting data amplified by transistor T213 to node N100, a p channel MOS transistor T211 responsive to transfer control signal TDS for precharging node N110 to a supply potential Vcc, and a p channel MOS transistor T210 which is connected in parallel to transistor T211 between power supply Vcc and a node N100.

Amplifier circuit 2814 further includes an n channel MOS transistor T217 for amplifying signal potential on global I/O line GIOa, an n channel MOS transistor T216 which is turned on in response to transfer control signal φTDS for transmitting signal potential on global I/O line GIOa amplified by transistor T217 to node N110, a p channel MOS transistor T214 responsive to transfer control signal φTDS for precharging node N110 to supply potential Vcc, and a p channel MOS transistor T215 which is connected in parallel to transistor T214 between power supply Vcc and node N110.

Transistor T210 has its gate connected to node N110, and transistor T215 has its gate connected to node N100. Transistors T210 and T215 constitute a differential amplifying circuit.

Gate circuit 2815 includes a gate circuit 2815a for transferring data to SRAM bit line SBL, and a gate circuit 2815b for transferring data to SRAM bit line *SBLa. Gate circuit 2815a includes an n channel MOS transistor T220 which is turned on in response to transfer control signal φTDS for transmitting signal potential on node N100 to SRAM bit line SBLa. Gate circuit 2815b includes an n channel MOS transistor T221 which is turned on in response to a transfer control signal φTDS for transmitting signal potential on node N110 to SRAM bit line *SBLa.

Gate circuit 2813 includes a gate circuit 2813a for transmitting signal potential on internal data bus line *DBW to global I/O line *GIOa and a gate circuit 2813b for transmitting signal potential on internal data bus line DBW to global I/O line GIOa. Gate circuit 2813a includes an n channel MOS transistor T230 which is turned on in response to an output SAY from SRAM column decoder, and an n channel MOS transistor T231 which is turned on in response to DRAM write enable signal AWDE. Transistors T231 and T230 are connected in series between internal write data bus line *DBW and global I/O line *GIOa.

Gate circuit 2813b includes an n channel MOS transistor T232 which is turned on in response to output SAY of SRAM column decoder, and an n channel MOS transistor T233 which is turned on in response to DRAM write enable signal AWDE. Transistors T232 and T233 are connected in series between internal data bus line DBW and global I/O line GIOa. The operation of the bi-directional transfer gate circuit will be described in the following.

Figure 48:
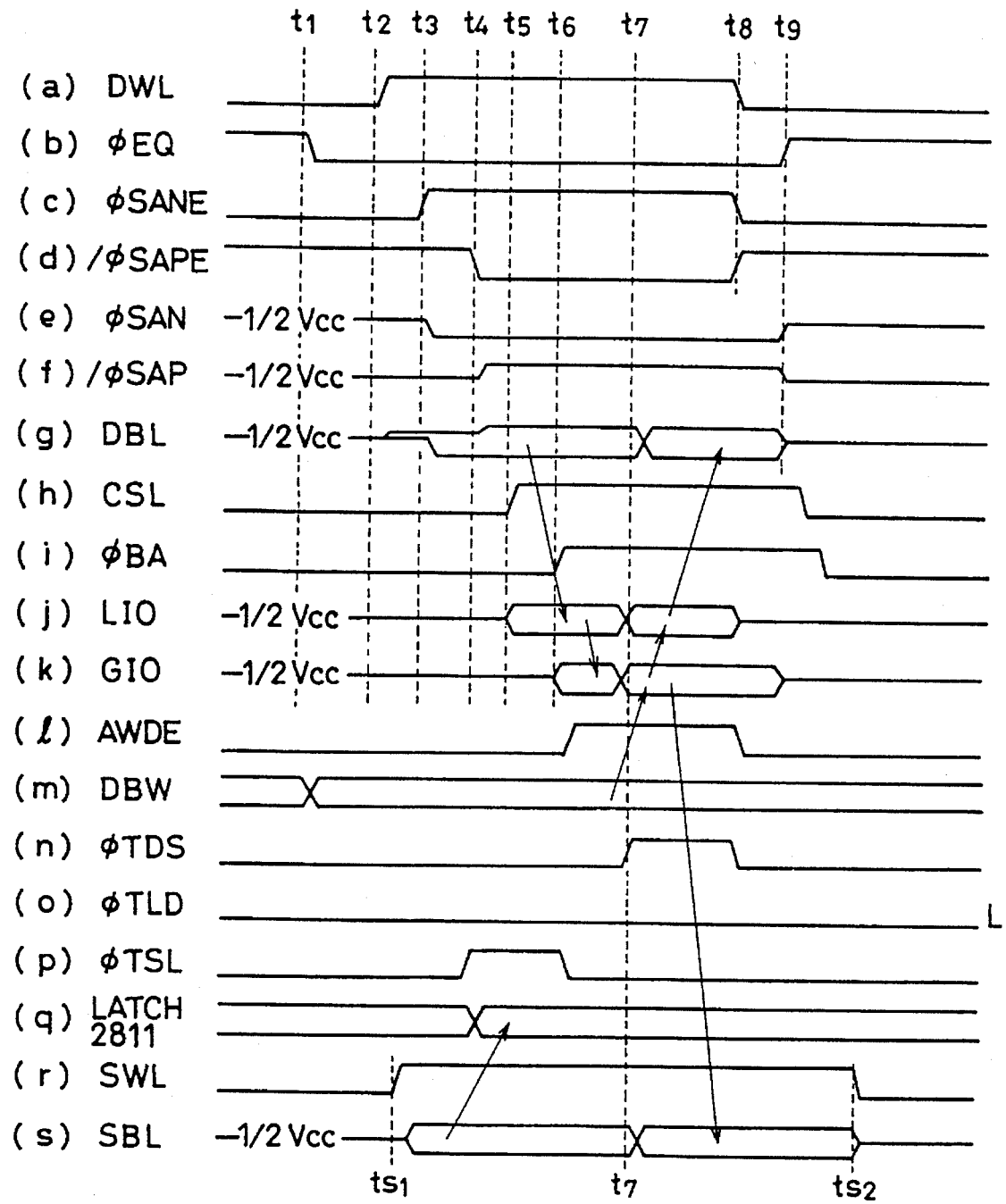
FIG. 48 is a diagram of signal waveforms showing data transfer operation from the DRAM to the SRAM by the data transfer apparatus shown in FIGS. 46 and 47.

Referring to FIG. 48, data transfer operation in a cache miss writing operation will be described. In a cache miss writing, chip select signal E# and write enable signal W# both attain to "L" and cache hit signal CH# attains to "H" at a rising edge of clock signal K as will be described in detail later. In response, DRAM and SRAM are both activated. An address applied to SRAM and DRAM at this time is applied from CPU.

At time t1, precharge cycle is completed in DRAM, and a memory cycle is started. In response, equalize signal φEQ falls to an inactive state "L". By the time a DRAM word line DWL is set to a selected state in DRAM, signal potential on internal data bus line DBW has been established to a value corresponding to write data. When a DRAM word line DWL is selected and signal potential on DRAM bit line pair DBL is changed at time t2, sense amplifier activating signals φSAN and/φSAP are activated at times t3 and t4, and signal potential on each DRAM bit line pair attains to a value corresponding to the read memory cell data.

In SRAM, a SRAM word line SWL is selected at time ts1. Data of memory cells connected to the selected word line SWL are transmitted to a corresponding SRAM bit line SBLa (*SBLa). When signal potential on SRAM bit line SBLa (*SBLa) is established, transfer control signal φTSL rises to "H", gate circuit 2810 is opened, and signal potential on SRAM bit lines SBLa and *SBLa are transmitted to latch circuit 2811. More specifically, in the circuit structure shown in FIG. 47, transistors T200 and T201 are turned on, one of transistors T202 and T203 is turned on and the other is turned off, and the potential "L" is transmitted through the transistor (T202 or T203) which is on to latch circuit 2811. Latch circuit 2811 latches the applied signal potential "L" at a corresponding node. In DRAM, in parallel to the data latch operation of the latch circuit 2811, column selecting line CSL is selected (time t5), and in response, potential on local I/O line pair LIO is established. Then, by the block selecting signal φBA, potential on local I/O line pair LIO is transmitted to global I/O line pair GIO (t6).

When signal potential on global I/O line pair GIO is established, DRAM write enable signal AWDE rises to "H". At this time, output signal SAY from SRAM column decoder is set to an active state, and gate circuit 2813 provided for one global I/O line out of 16 bits is opened. Consequently, write data appeared on data bus lines DBW and *DBW are transmitted to global I/O lines GIOa and *GIOa through gate circuits 2813b and 2813a.

When signal potential on global I/O line pair GIO has reached a value corresponding to write data at time t7, transfer control signal φTDS rises to "H" at time t7'. In response, transistors T211 and T214 are turned off, precharging of nodes N100 and N110 is stopped, and transistors T210 and T215 differentially amplify signal potential on global I/O lines GIOa and *GIOa which have been transmitted through transistors T212 and T216. Consequently, signal potential on nodes N100 and N110 attains to the potential which is the inversion of the signal potential on global I/O lines *GIOa and GIOa. For example, let us assume that signal potential on global I/O line GIOa is "H" and that the signal potential on global I/O line *GIOa is "L". At this time, transistor T217 is turned on, transistor T213 is turned off, potential at node N110 attains to "L" and potential at node N100 attains to "H". The potential "L" at node N110 turns transistor T210 on, and potential "H" at node N100 turns transistor T215 off. By the transistors T210 and T215, signal potentials on nodes N100 and N110 are differentially amplified and latched.

In parallel to the amplifying operation in amplifying circuit 2814, gate circuits 2815a and 2815b are rendered conductive in response to a rise to "H" of transfer control signal φTDS, signal potential on node N100 is transmitted to SRAM bit line SBLa, and signal potential on node N110 is transmitted to SRAM bit line *SBLa. At this time, since transfer control signal φTLD is fixed at "L", gate circuits 2812a and 2812b are closed, and data latched in latch circuit 2811 is not transmitted to global I/O line GIOa and *GIOa.

In DRAM array, write data transmitted to global I/O line pair GIO is transmitted to DRAM bit line pair DBL through local I/O line pair LIO.

At time t8, memory cycle of DRAM is completed, and precharge period is started. At time t9, a standby state for waiting the next cycle is started.

In SRAM, potential on SRAM word line SWL falls to "L" at time ts2, and thus one cycle is finished. As described above, in a cache miss writing operation, by writing write data to a corresponding memory cell of the DRAM array and by transmitting the data changed by the external write data to the SRAM array, writing of data to the memory cell in SRAM is completed when one data transfer cycle is completed, and therefore even at a cache miss, data can be written at a high speed.

The above described data transfer operation (hereinafter referred to as a high speed copy back mode) is schematically shown in FIGS. 49A to 50B. Data transfer operation in high speed copy back mode at a cache miss writing operation will be described with reference to FIGS. 49A to 50B.

Let us assume that CPU generates a request for rewriting data D2 by D. At this time, at that region of the SRAM to which access is requested by the CPU, data D1' has been stored, and data D2 is stored in DRAM array (FIG.49(A)).

When such a cache miss writing occurs, first, in SRAM, data D1' is transferred to a latch (latch circuit 2811). In parallel to this transferring operation, in DRAM, a word line (hatched portion) including data D2 is selected in accordance with an access from CPU, and write data D is transmitted to the region storing data D2 connected to the selected word line (FIG. 49(B)). Consequently, data D2 in DRAM is replaced by D2'.

Thereafter, data D2' rewritten by the external write data D is transferred to that region of the SRAM to which access is requested by the CPU. Therefore, the region of the SRAM which has stored data D1' is rewritten by data D2' (FIG. 50(A)). Therefore, data rewritten by data D2 is stored in that region of the SRAM to which access is requested by the CPU. After the completion of this transfer, DRAM is set to the precharge state. At this state, SRAM can be accessed (see FIG. 50(B)).

Thereafter, transfer of data D1 stored in the latch to region D1 of DRAM is carried out. Transfer operation of the data D1' latched in latch 2811 to DRAM array will be described with reference to FIG. 51.

Figure 51:
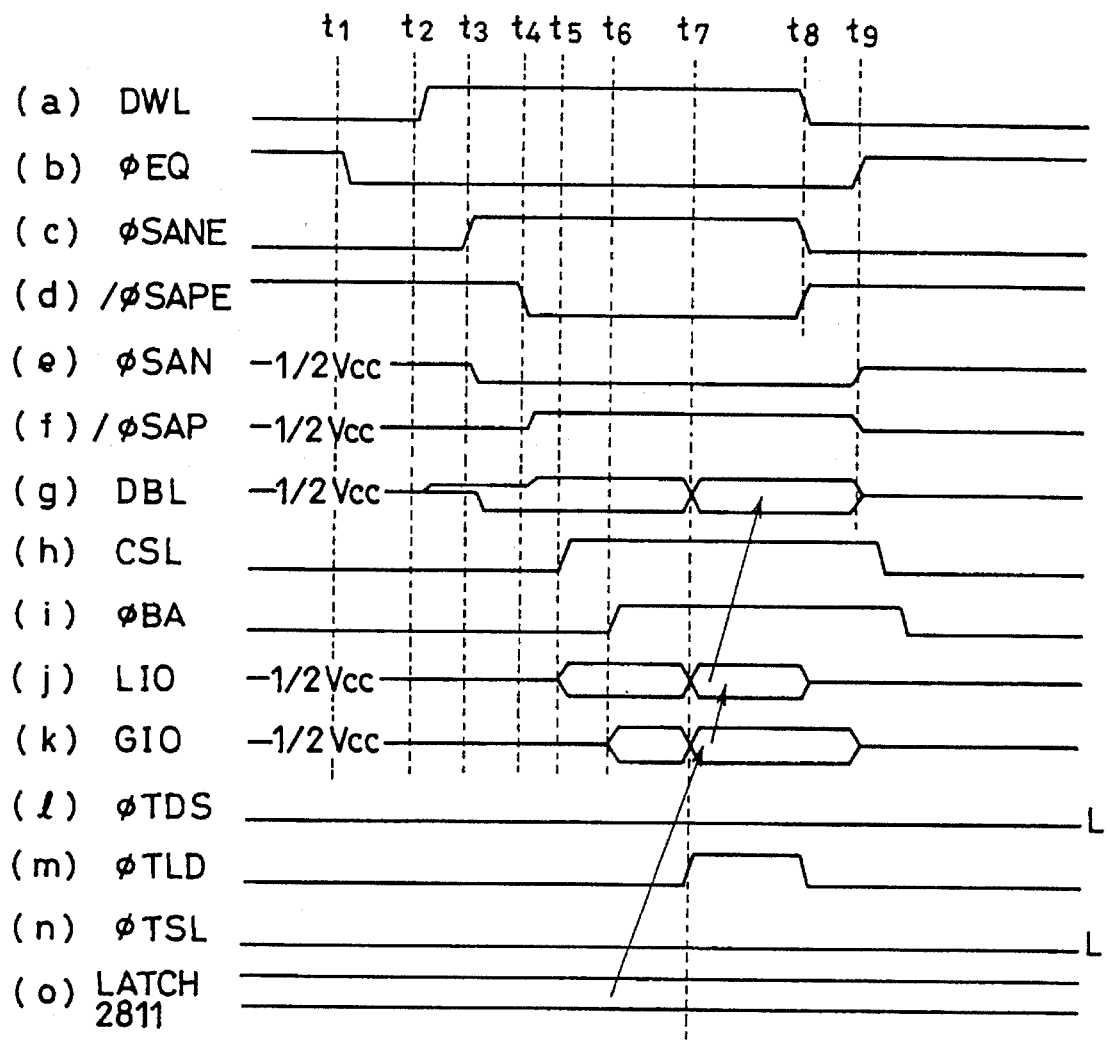
FIG. 51 is a diagram of signal waveforms showing the data transfer operation from the SRAM to the DRAM by the data transfer device shown in FIGS. 46 and 47.

FIG. 51 is a diagram of signal waveforms showing data transfer operation from SRAM to DRAM. Referring to FIG. 51, at time t1, an array access request is made, and an address for designating a region in which data D1' is to be stored is applied (for example, output from a tag memory). From t1 to t6, selection of a DRAM word line DWL, detection and amplification of memory cell data connected to the selected word line are carried out in the same manner as shown in FIG. 48, and data on local I/O line and on global I/O line are established.

At time t7, transfer control signal φTLD is generated, and gate circuit 2812 shown in FIG. 46 is opened. Namely, referring to FIG. 47, transistors T205 and T206 are turned on, and data latched in latch circuit 2811 is transmitted to global I/O line GIOa and *GIOa. Data transmitted to global I/O lines GIOa (*GIOa) is transmitted to DRAM bit line DBL (*DBL) selected by a column selecting line CSL through a local I/O line LIOa (*LIOa). The transfer operation of data D1 from SRAM to DRAM is completed.

During transfer operation of data latched in latch circuit 2811 to DRAM (copy back operation), SRAM can be arbitrarily accessed. More specifically, address applied to DRAM at this time is independent from an address applied to SRAM. (Since simultaneous transfer of 16 bits×4 bits of data is carried out in DRAM at the copy back transfer), selecting operation can be done by SRAM column decoder in accordance with a SRAM address signal Ac. At this time, since transfer control signal φTDS is at "L" and transfer control signal φTSL is also at "L", gate circuits 2815 and 2810 are both closed, and therefore, DRAM array is separated from SRAM array. SRAM array can be independently accessed without any influence of data transfer operation to the DRAM array.

Figure 52A:
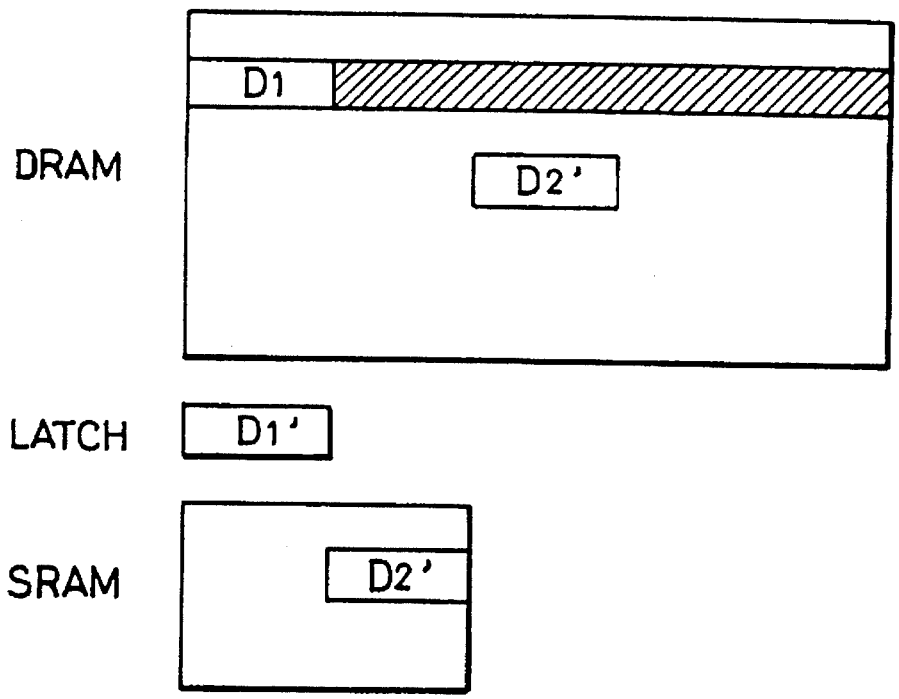
FIGS. 52A and 52B schematically show the data transfer operation shown in FIG. 51.
Figure 52B:
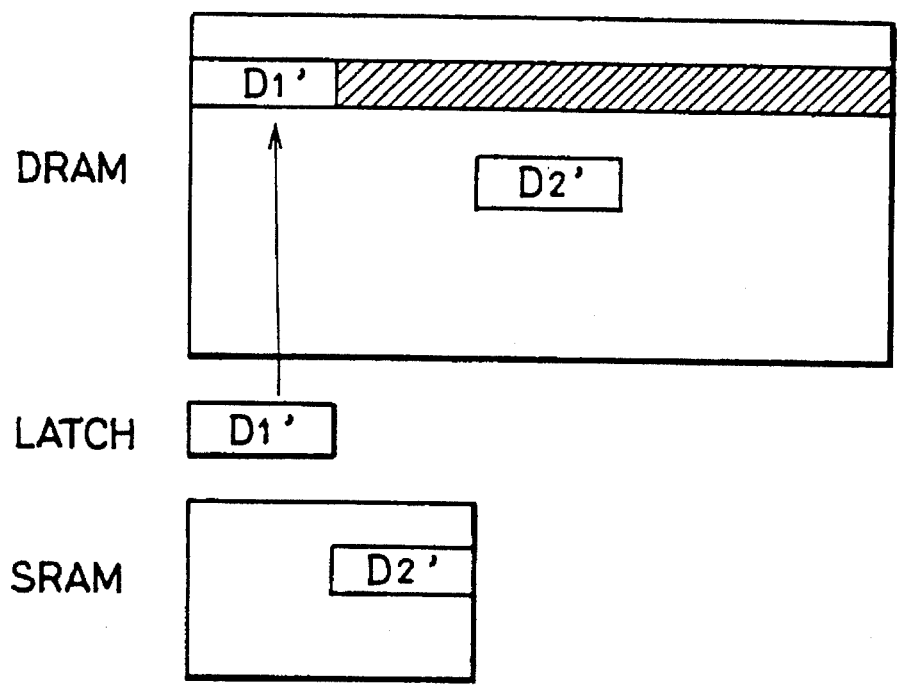

FIGS. 52A and 52B schematically show data transfer operation from latch circuit to DRAM. Referring to FIG. 52(A), data D1' is stored in the latch. In the DRAM, a word line (hatched portion) including a region for storing data D1 is selected in accordance with an external address (applied from a tag memory or the like).

Thereafter, data D1' latched in the latch is transferred to the region D1 included in the selected word line, and data in this region is changed to D1'. Consequently, data transfer from the latch to the DRAM is completed.

Figure 53:
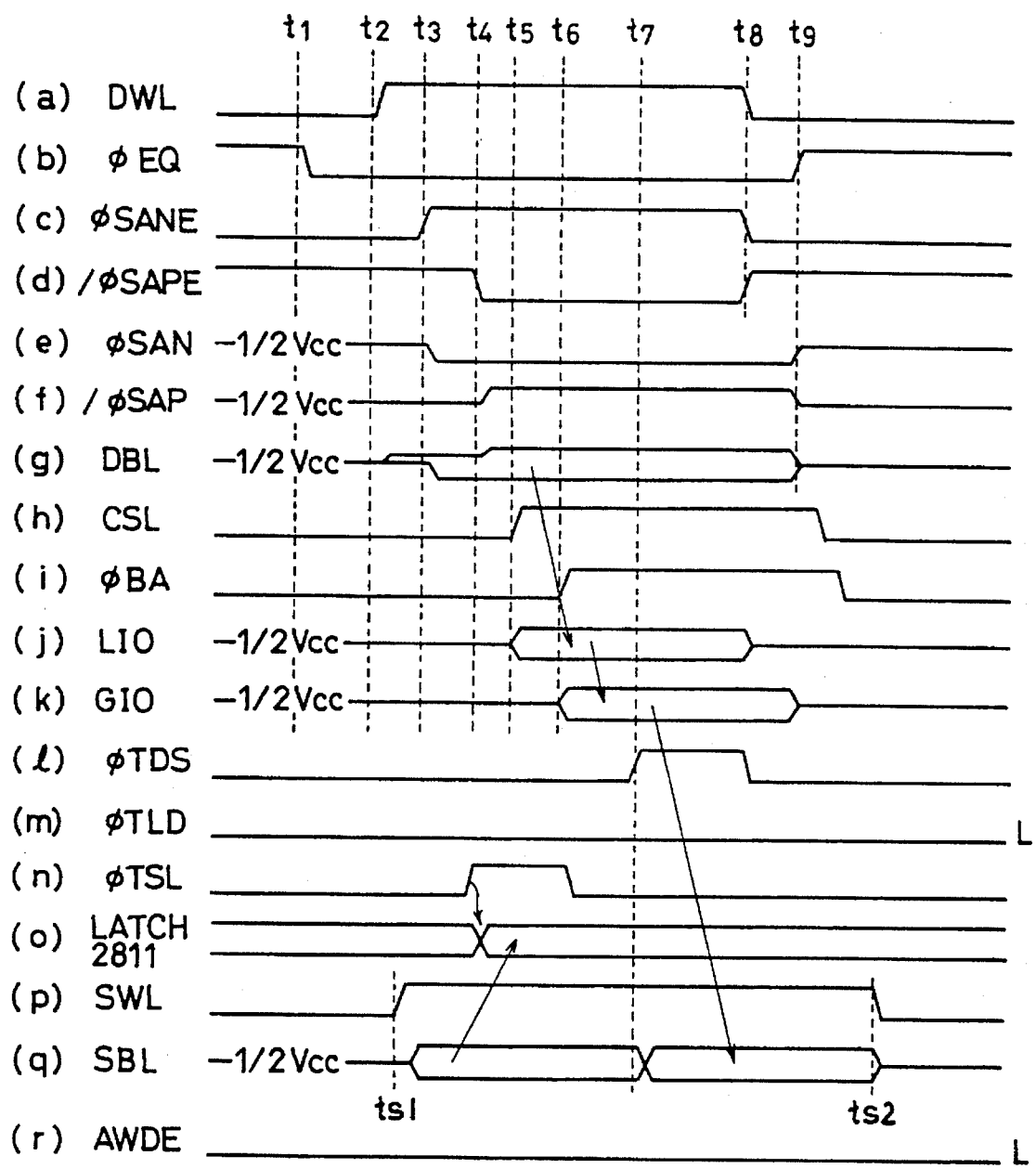
FIG. 53 is a diagram of signal waveforms showing data transfer operation (at cache miss read) from the DRAM to the SRAM by the data transfer device shown in FIGS. 46 and 47.
Figure 54A:
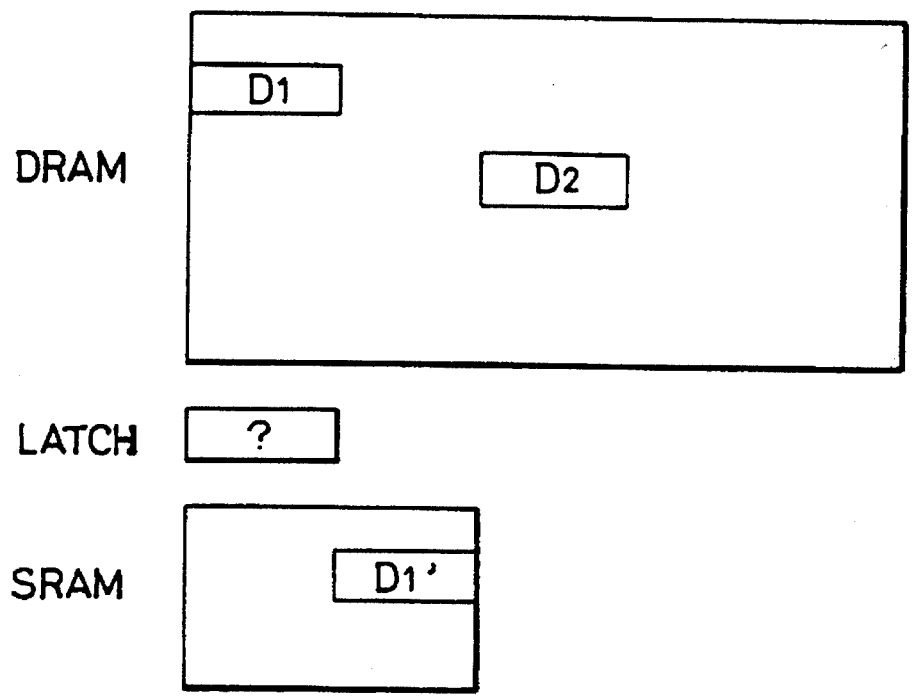
FIGS. 54A, 54B, 55A, 55B, 56A and 56B schematically show the data transfer operation shown in FIG. 53.
Figure 54B:
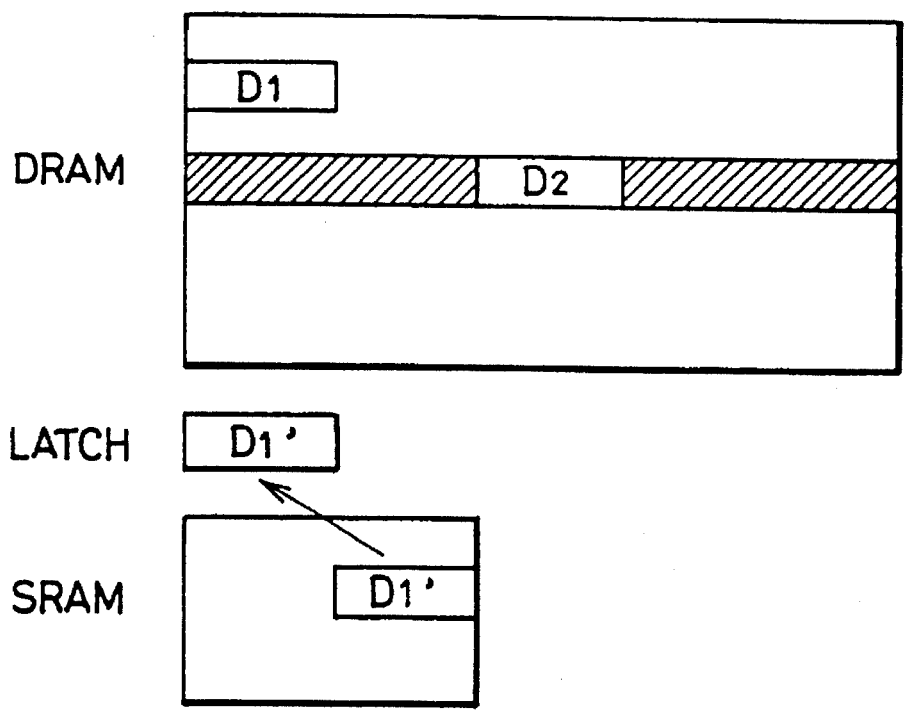
Figure 55A:
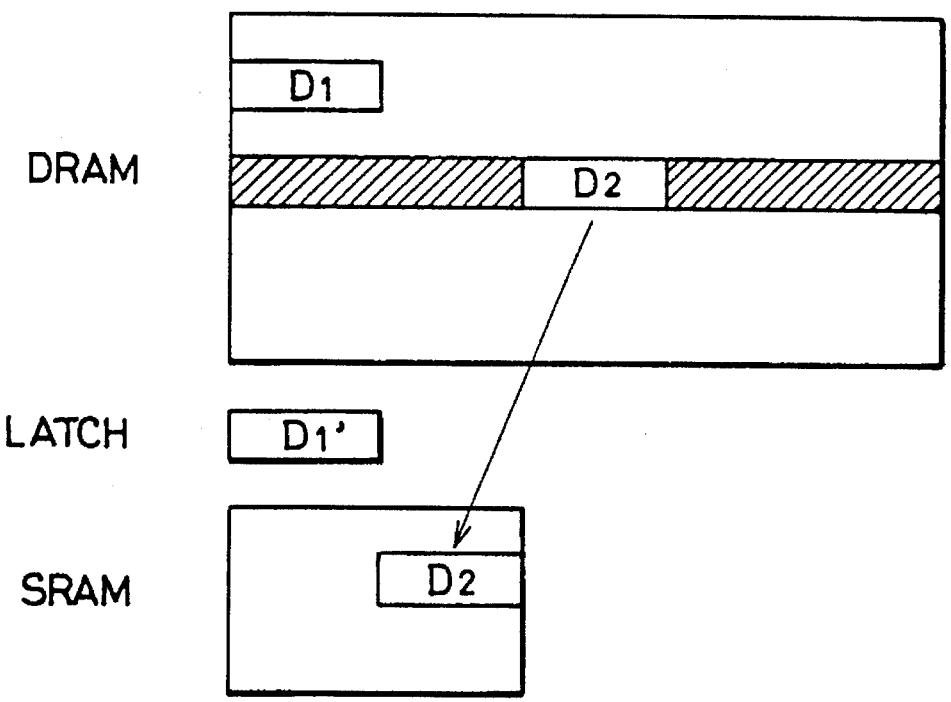
Figure 55B:
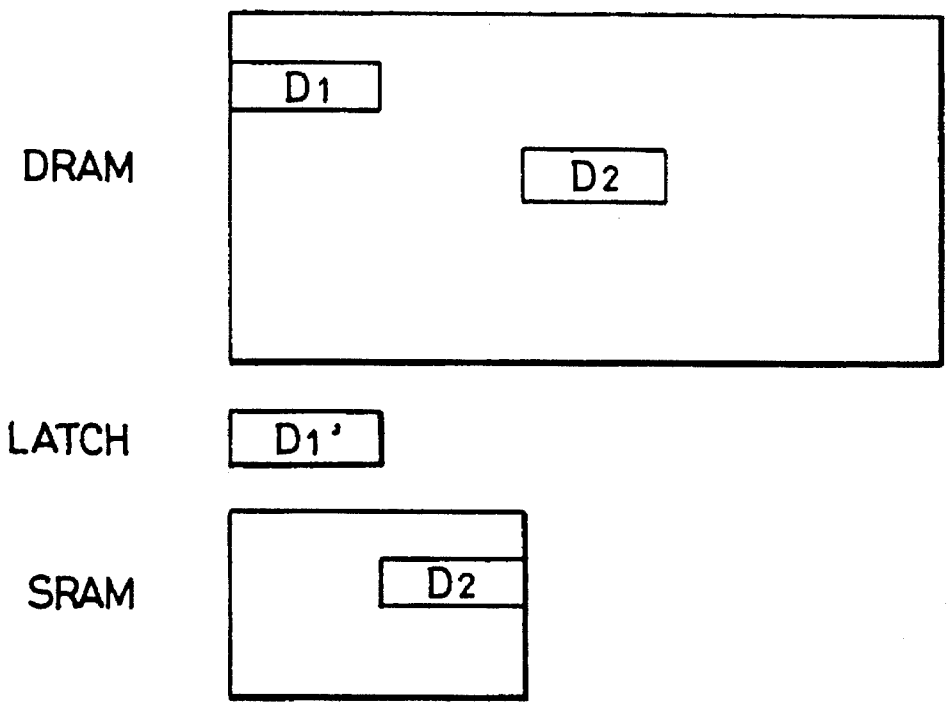

The operation at a cache miss reading will be described. The operation in the cache miss reading is the same as the operation of the cache miss writing described above, except that the DRAM write enable signal AWDE is at "L" and the gate circuit 2813 is closed. In this operation, as shown in the diagram of waveforms of FIG. 53, word lines SWL and DWL are selected in the SRAM array and the DRAM array. Data of the SRAM array is latched by latch circuit 2811, and data from the DRAM array is transmitted to SRAM bit line SBLa (*SBLa) at time t7. After the data transfer to SRAM at t7, precharging operation is not necessary in SRAM. Therefore, the transferred data can be immediately read. Namely, at a time of a cache miss, data writing operation and data reading operation can be executed in the same cycle time. Data transfer operation from latch circuit 2811 to DRAM is the same as the operation at the time of cache miss writing described above (see FIGS. 51 and 52).

Data transfer in cache miss reading will be described with reference to FIGS. 54A to 56B. Let us assume that data D1' is stored in that region of the SRAM array which is designated by an address from the CPU, and that CPU requests data D2. At this time, DRAM and SRAM are at the standby state (FIG. 54(A)).

If such a cache miss occurs, first a SRAM word line is selected in SRAM, and data D1' is transferred to the latch (latch circuit 2811). In parallel to the latching operation, a word line (hatched portion) including data D2 is selected in the DRAM in accordance with an address from the CPU (FIG. 54(B)).

Thereafter, data D2 included in the selected word line of the DRAM is transferred to the region of the SRAM in which the data D1' has been stored, through amplifier circuit 2814 and gate circuit 2815. The latch circuit 2811 keeps the data D1' latched. In the SRAM, data D2 which has been transferred from DRAM can be immediately read (FIG. 55(A)).

After the data transfer from DRAM to SRAM, the DRAM is temporarily set to a precharge state, so as to replace data D1 by data D1'. The region storing the data D1 is that region in which the data D1' which has been stored in the SRAM is to be stored (FIG. 55(B)).

Figure 56A:
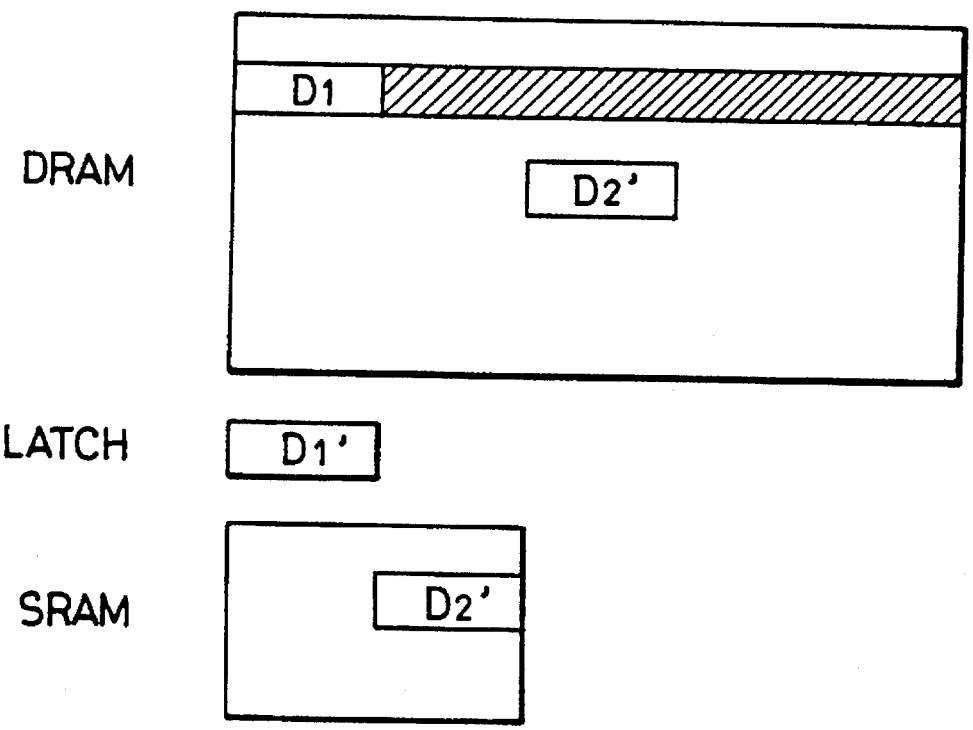
Figure 56B:
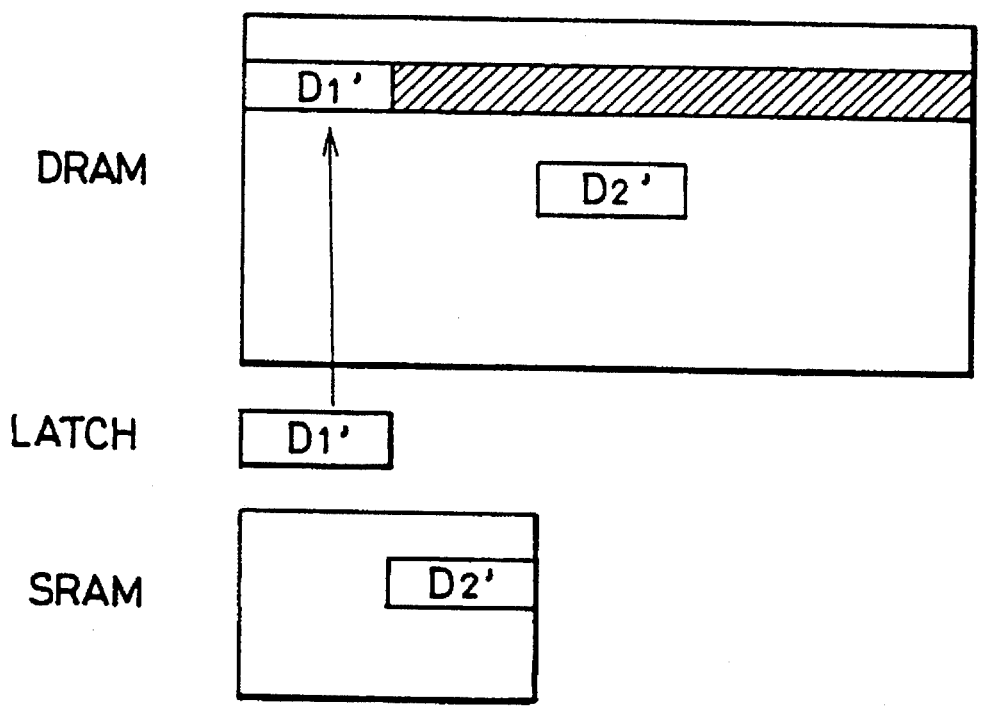

After the completion of precharging in the DRAM, a word line (hatched portion) including data D1 is selected (FIG. 56(A)). In the word line selecting cycle (array active cycle), the SRAM can be externally accessed.

To the region storing data D1 included in the selected word line of the DRAM, the data D1' which has been latched in the latch (latch circuit 2811) is transferred. Consequently, data D1 in the DRAM is rewritten by the data D1' which has been stored in the SRAM (FIG. 56(B)).

The externally applied address means, in the DRAM, an address from the CPU when a word line is selected in data transfer to SRAM. It means an address from, for example, an external tag memory, when a word line is selected for receiving data from the latch circuit.

[High Speed Transfer Mode (III)]

Figure 57:
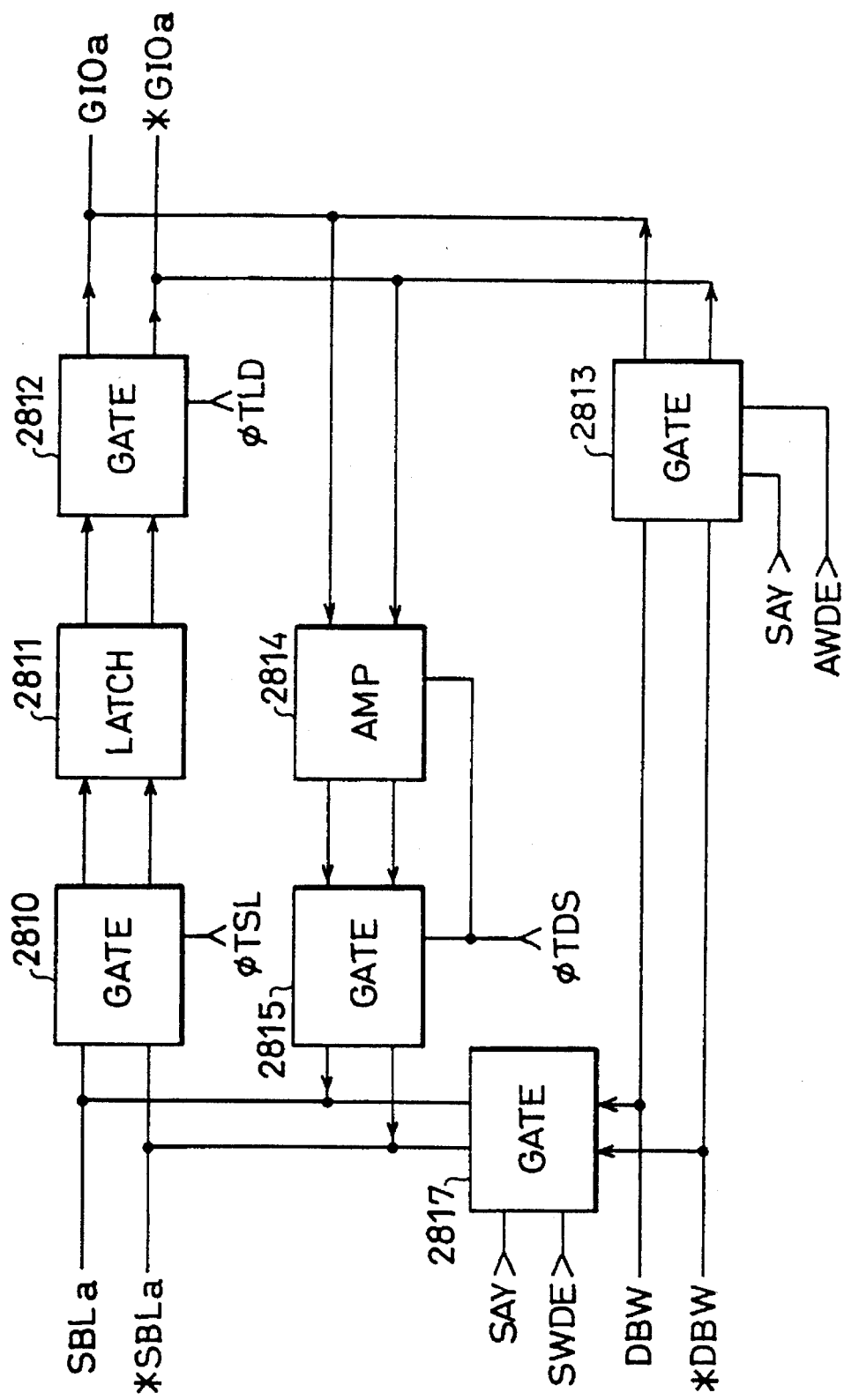
FIG. 57 is a block diagram showing a still further structure of the data transfer device.

FIG. 57 schematically shows a further structure of a bi-directional data transfer device. FIG. 57 shows a bi-directional transfer gate circuit related to transfer of 1 bit of data in the bi-directional data transfer device, as does FIG. 46. In FIG. 57, same or corresponding portions are denoted by the same reference numerals as in FIG. 46.

Referring to FIG. 57, the bi-directional transfer gate circuit includes, in addition to the structure of the bi-directional data transfer circuit shown in FIG. 46, a gate circuit 2817 which is provided between SRAM bit line pair SBLa, *SBLa and internal write data transmitting lines DBW, *DBW. Gate circuit 2817 is opened in response to an output SAY of SRAM column decoder and to SRAM write enable signal SWDE. SRAM write enable signal SWDE is generated at data writing to SRAM, and it is generated when the write enable signal W# is at an active state, that is, "L", either at a cache hit or at a cache miss.

Figure 58:
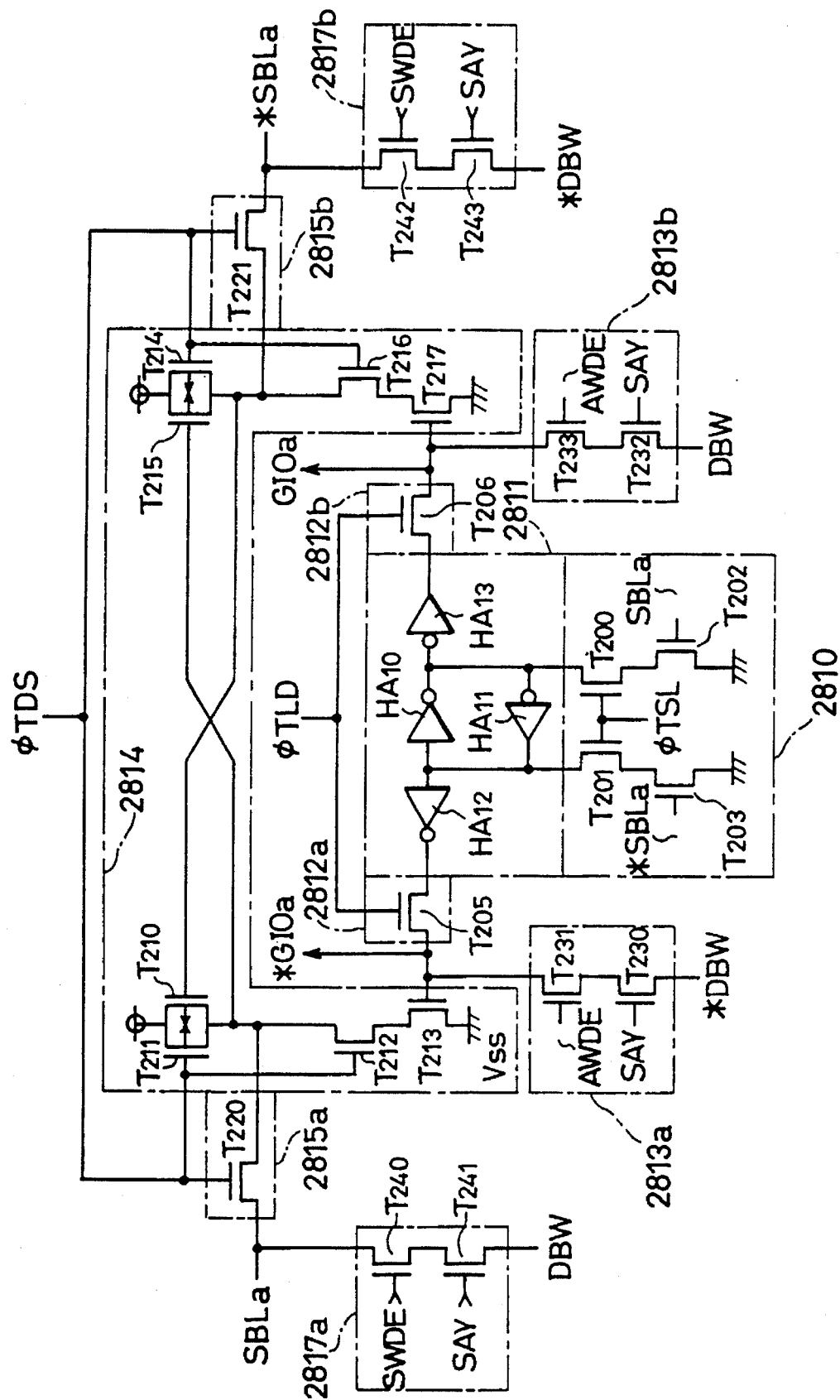
FIG. 58 shows a detail structure of the data transfer device shown in FIG. 57.
Figure 59:
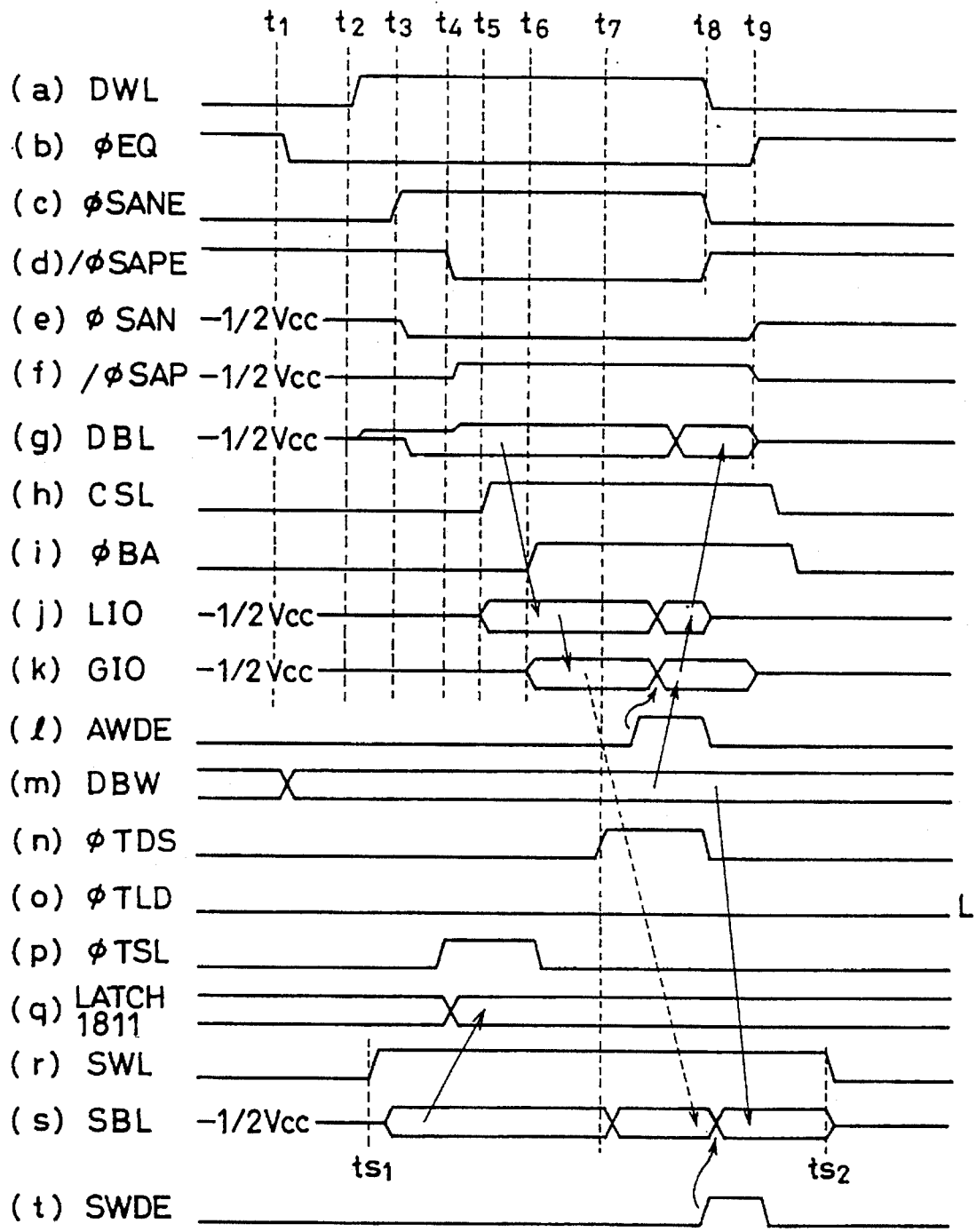
FIG. 59 is a diagram of signal waveforms showing data transfer operation from the DRAM to the SRAM by the data transfer gate shown in FIGS. 57 and 58.

FIG. 58 shows an example of a specific structure of the bi-directional transfer gate circuit shown in FIG. 57. Referring to FIG. 58, the bi-directional transfer gate circuit includes a gate circuit 2817a for transmitting write data on internal write data bus line DBW to SRAM bit line SBLa, and a gate circuit 2817b for transmitting write data on write data bus line *DBW to SRAM bit line *SBLa. Gate circuit 2817a includes an n channel MOS transistor T241 which is turned on in response to the output SAY from SRAM column decoder, and an n channel MOS transistor T240 which is turned on in response to SRAM write enable signal SWDE. Gate circuit 2817b includes an n channel MOS transistor T243 which is turned on in response to the output SAY of the SRAM column decoder, and an n channel MOS transistor T242 which is turned on in response to the SRAM write enable signal SWDE. Both of the gate circuits 2817a and 2817b transmit data on internal data bus lines DBW and *DBW to SRAM bit lines SBLa and *SBLa when the SRAM column decoder output SAY and SRAM write enable signal SWDE are at the active state, that is, "H". Other structures are the same as those shown in FIG. 47. Data transfer from DRAM to SRAM in cache miss writing will be described with reference to FIG. 59, which is a diagram of signal waveforms.

The operation to the time t7 is the same as that of the bi-directional transfer gate circuit shown in FIGS. 46 and 47. Data from the SRAM has been latched in the latch circuit 2811, and memory cell data from the DRAM array has been transmitted to global I/O line GIOa (*GIOa).

When transfer control signal φTDS rises to "H" at time t7, amplifier circuit 2814 and gate circuit 2815 (2815a, 2815b) operate to amplify signal potentials on the global I/O lines GIOa and *GIOa and transmit the same to SRAM bit line pair SBLa and *SBLa. In parallel to this transfer operation, DRAM write enable signal AWDE rises to "H", gate circuit 2813 (2813a, 2813b) is opened, and write data on write data lines DBW and *DBW are transmitted to global I/O lines GIOa and *GIOa. Consequently, write data is written to the memory cell selected in the DRAM array.

In response to the data transfer operation from the DRAM to the SRAM in response to transfer control signal φTDS, SRAM write enable signal SWDE rises to "H", gate circuit 2817 (2817a, 2817b) is opened, and write data on the write data bus lines DBW and *DBW are transmitted to SRAM bit lines SBLa and *SBLa. Consequently, signal potentials on the SRAM bit lines SBLa and *SBLa are established at signal potentials corresponding to the value of the write data.

The DRAM write enable signal AWDE and SRAM write enable signal SWDE may be generated at any time after the generation of transfer control signal φTDS and after the start of data transfer operation from DRAM to SRAM.

In the structure of the bi-directional transfer gate circuit shown in FIGS. 57 and 58, write data on the internal write data bus line is directly transmitted to SRAM bit lines SBLa and *SBLa through the gate circuit 2817. Therefore, when data in the SRAM is to be written by transferring write data from internal data bus lines DBW and *DBW to DRAM, and by transmitting write data from DRAM to the SRAM, and if the access time to DRAM is relatively short, it is possible that the write data may not be transmitted to the SRAM, since there is not always sufficient time for transmitting write data through such path. In that case, a structure in which data is directly transmitted from internal write data bus lines DBW and *DBW to the SRAM bit lines SBLa and *SBLa through gate circuit 2817 enables the sure tranmission of write data to the SRAM.

Figure 60A:
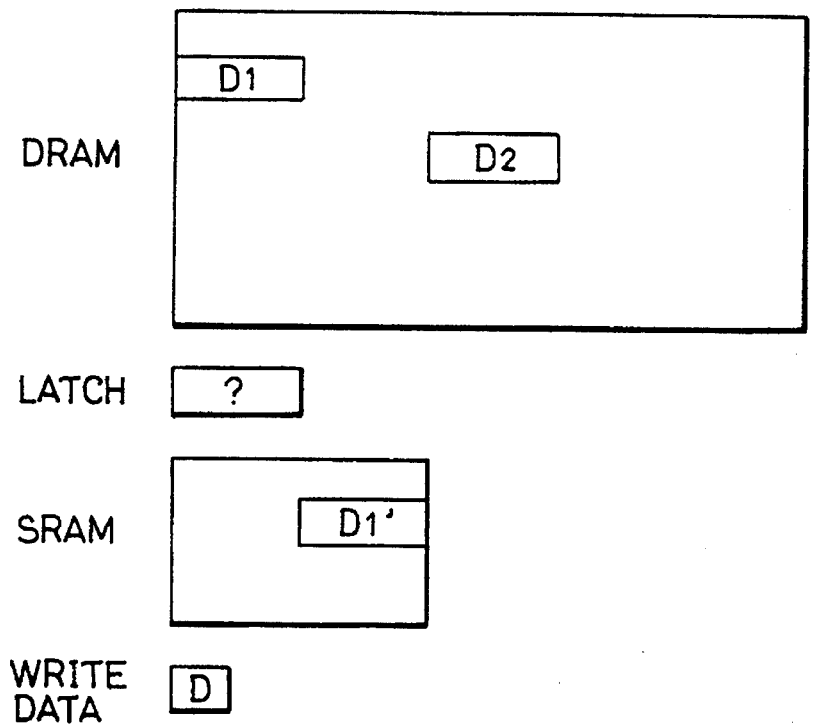
FIGS. 60A, 60B, 61A and 61B schematically show the data transfer operation shown in FIG. 59.
Figure 61A:
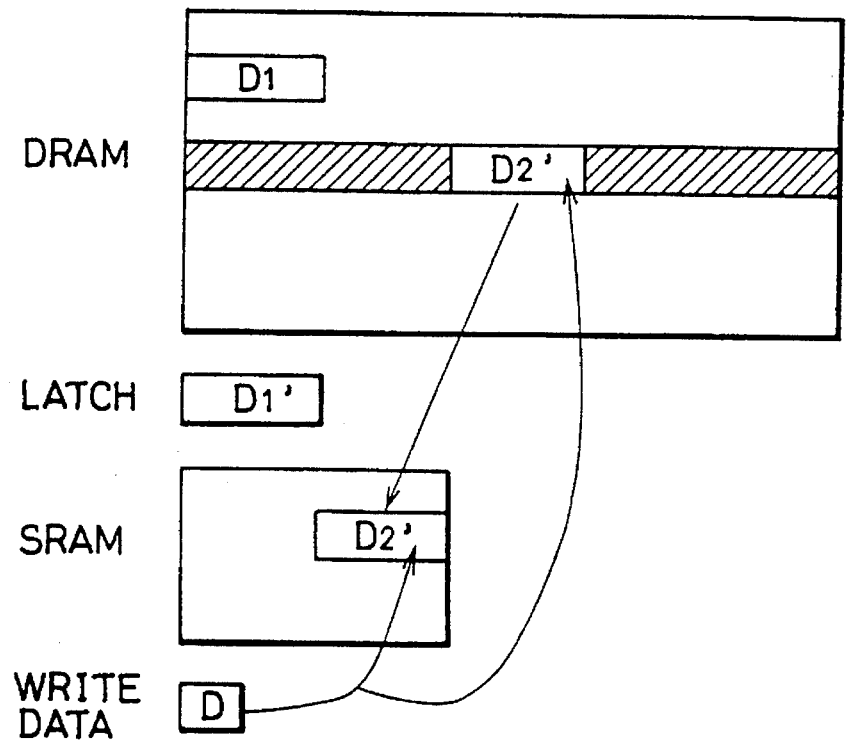
Figure 61B:
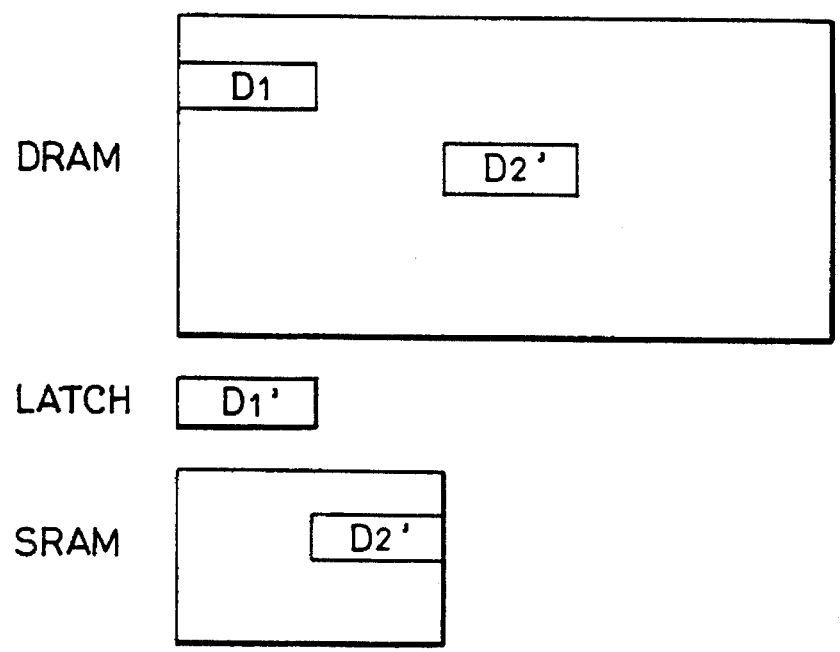

FIGS. 60A and 61B schematically show data transfer operation from the DRAM to the SRAM by the bi-directional transfer gate circuit shown in FIGS. 57 and 58. The data transfer operation will be briefly described with reference to FIGS. 60A and 61B.

Figure 49A:
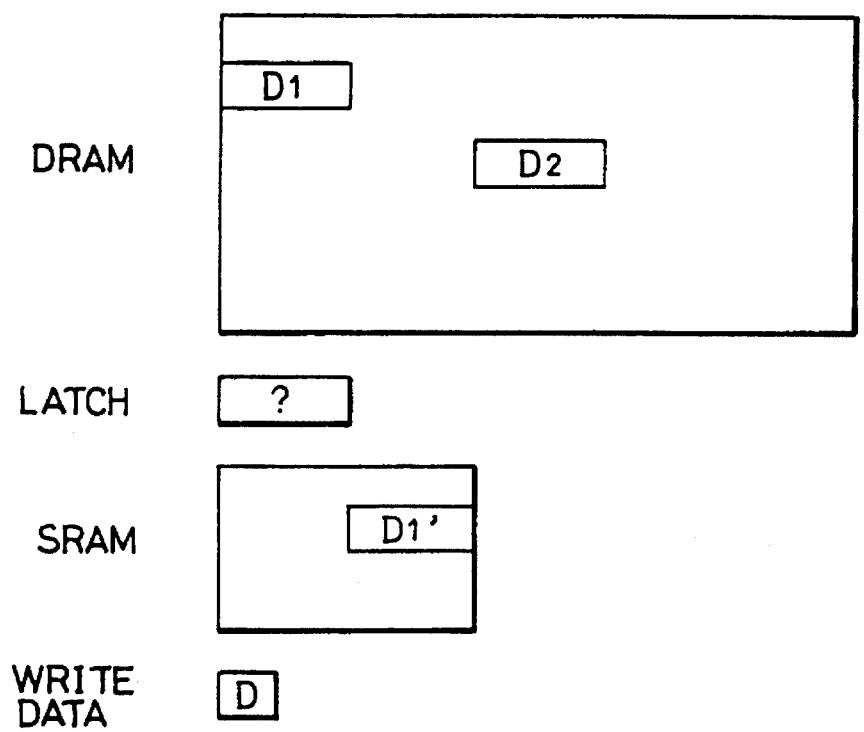
FIGS. 49A, 49B, 50A and 50B schematically show the data transfer operation shown in FIG. 48.
Figure 49B:
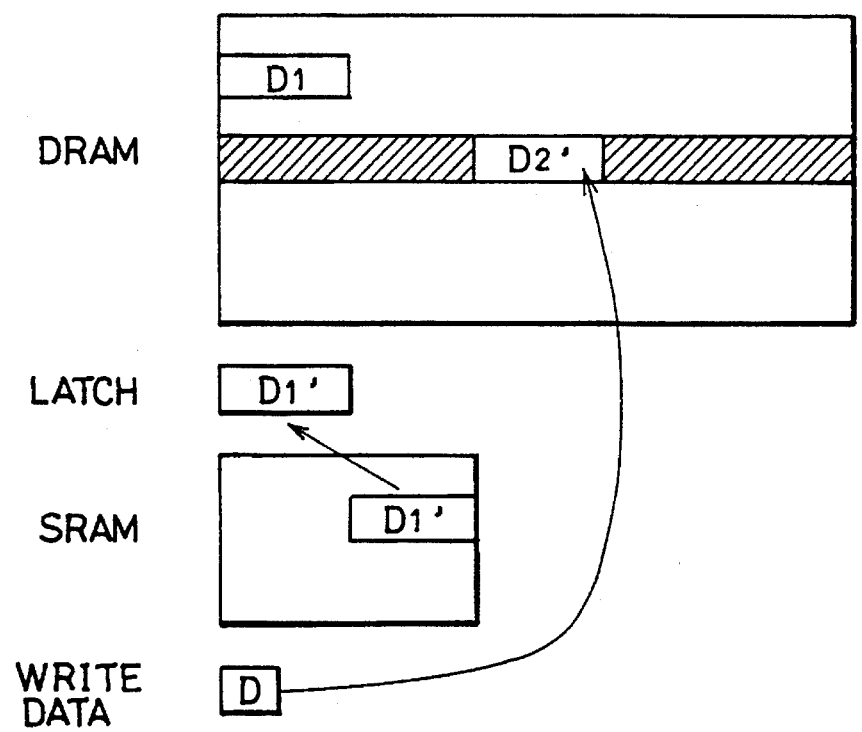
Figure 50A:
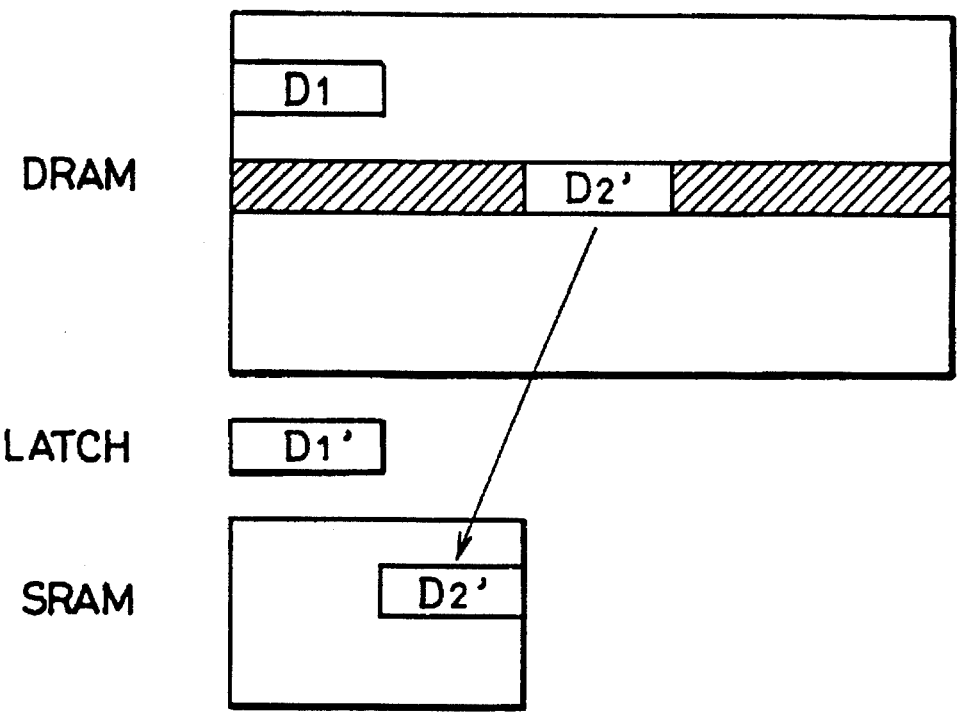
Figure 50B:
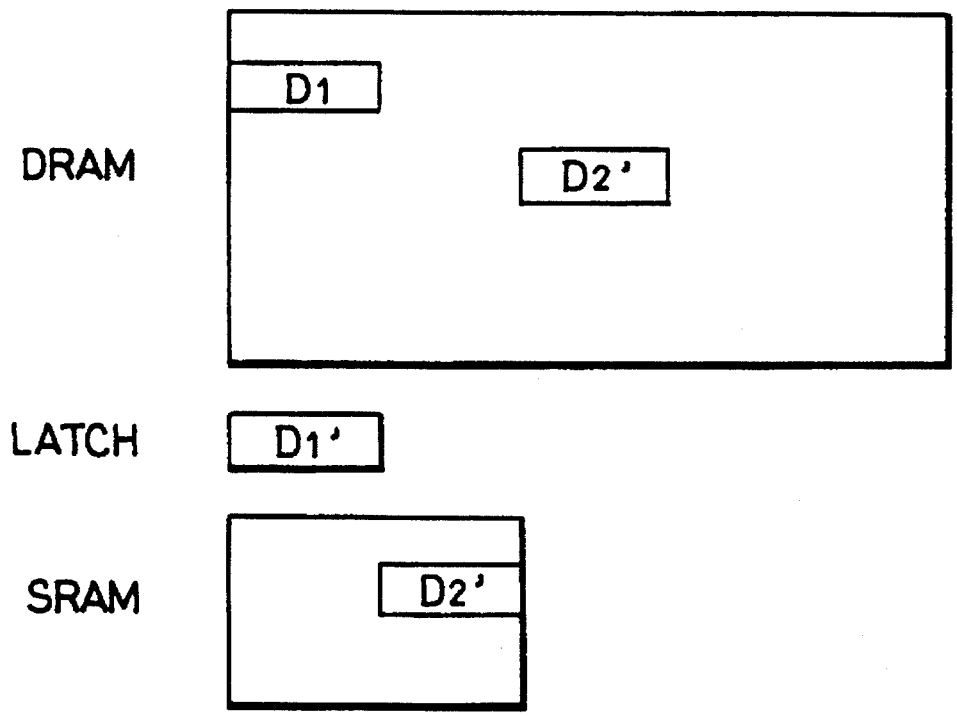

As in FIG. 49(A), let us assume that CPU requests rewriting of data D2. DRAM and SRAM are both at the precharge state (FIG. 60(A)).

Figure 60B:
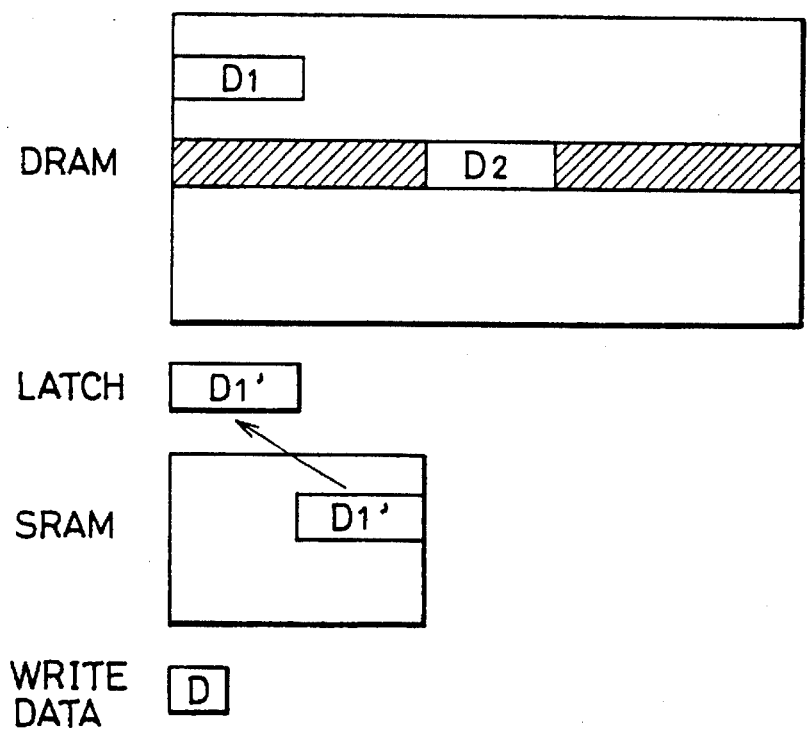

Referring to FIG. 60(B), a word line (hatched portion) including data D2 is selected in the DRAM, while in the SRAM, data of the region including data D1' are transmitted to the latch. The data D1' is not to be rewritten but it should be transferred to that region of the DRAM in which the data D1 is to be stored.

Referring to FIG. 61(A), while data D2 of the DRAM is being transferred to a corresponding memory cell of the SRAM, write data D is transferred to the region of the DRAM to which data D2 is to be stored, and to that region of the SRAM to which data D1 is to be stored. Consequently, data D2 in the DRAM and in the SRAM are changed to data D2' which has been rewritten by the write data D. Namely, in parallel to data transfer from the DRAM to SRAM, write data D is written to SRAM, and data writing is carried out in DRAM.

Referring to FIG. 61(B), the DRAM is returned to a precharge state, so as to transfer the latched data D1' to the region for storing the data D1 in the DRAM. In this state, CPU can access to SRAM.

Transfer operation of the data D1' latched in the latch (latch circuit 2811) to data D1 storing region of the DRAM is the same as that described with reference to FIG. 52. Therefore, it is not repeated.

In the bi-directional data transfer circuit shown in FIGS. 57 and 58, gate circuits 2816 and 2817 are both opened in cache miss writing. Therefore, the same operation as the data transfer operation described with reference to the bi-directional transfer gate circuit shown in FIGS. 46 and 47 is carried out, namely, only the data transfer operation schematically shown in FIGS. 54 to 56 is carried out. Therefore, the description thereof is not repeated.

By providing such a gate circuit 2817 as described above, even if there is not a sufficient time for rewriting data in the DRAM by write data D and for transmitting the same to the SRAM, data in the SRAM can be surely rewritten by the write data D.

A so-called "write through mode" is available in the above described bi-directional data transfer device. In the "write through mode", data written to the SRAM is also written to the corresponding memory cell of the DRAM at that time during cache access. Namely, if the above described cache miss writing operation is executed at a cache hit when data exists in the SRAM, write through is enabled. In cache miss writing operation when data does not exist in the cache, the above described cache miss writing operation may be done as it is for directly writing data to the DRAM array.

When the DRAM is to be directly accessed, data can be directly written to the DRAM by activating only the DRAM write enable signal AWDE. When data is to be written only to the SRAM at a time of a cache hit and it is not necessary to execute write through mode, only the SRAM write enable signal SWDE is set to the active state.

When data transfer is carried out by using the data transfer device shown in FIGS. 46 and 47 or FIGS. 57 and 58, only one precharge period is necessary in the DRAM for receiving the latch data, and therefore data transfer can be carried out at high speed between the SRAM and the DRAM. In the conventional copy back and block transfer mode cycles, the SRAM cannot be accessed before the completion of block transfer. However, by using the high speed copy back mode, data transfer from the DRAM to the SRAM is carried out in the first data transfer cycle, namely, the conventional block transfer is carried out at first, so that after the data transfer to the SRAM, the SRAM can be directly accessed. Therefore, a semiconductor memory device containing a cache having higher speed of operation can be realized.

In the bi-directional data transfer device, rewriting of data to SRAM is carried out in parallel to data transfer. Therefore, operation in cache miss reading and cache miss writing operation can be executed in the same cycle time.

In the foregoing, the high speed copy back mode is applied to data transfer between SRAM array and DRAM array at a cache miss in a semiconductor memory device containing a cache, as an example. However, high speed exchange of data is also made possible when data are transferred between two memory cells such as a normal SRAM array and a DRAM array, and efficiency in data transfer can be significantly improved. Namely, the bi-directional data transfer device can be applied not only to a semiconductor memory device containing a cache such as shown in FIG. 22 but also to a semiconductor memory device having a general high speed memory and a memory of large capacity, as a data transfer device between the high speed memory and large capacity memory.

Peripheral Circuits

[Refresh Circuit]

The DRAM array has dynamic memory cells as components. Therefore, data stored therein must be refreshed periodically, or in a prescribed time period. Refreshing operation of the semiconductor memory device containing a cache will be described in the following.

Referring to FIG. 18, an external refresh designating signal REF# is supplied. Automatic refreshing is carried out in the semiconductor memory device when the external refresh designating signal REF# is set to an active state of "L" at a rise of an internal clock K.

Referring to FIG. 18, circuit structure for refreshing includes an auto refresh mode detecting circuit 291 responsive to an internal refresh designating signal REF from a control clock buffer 250 detecting designation of automatic refresh; and a refresh control circuit 292 responsive to a refresh request from auto refresh mode detecting circuit 291 for generating various control signals and applying these signals to a counter 293 and to a multiplexer circuit 258. Counter circuit 293 applies a count value stored therein to multiplexer circuit 258 as a refresh row address indicating a row to be refreshed, in response to refresh designating signal from refresh control circuit 292. Multiplexer circuit 258 selects refresh row address from counter circuit 293 and applies the same to DRAM row decoder 102, in response to a switch control signal MUX from refresh control circuit 292. The internal refresh designating signal REF is also applied to a DRAM array driving circuit 260. DRAM array driving circuit 260 is rendered active when internal refresh designating signal REF is applied and carries out operations related to row selection in DRAM array 101.

Refresh control circuit 292 increments by one the count value in counter circuit 293 at the completion of refreshing, every time refresh designating signal REF is applied. Refresh control circuit 292 sets switch control signal MUX to inactive state at the completion of refreshing, and in response, multiplexer circuit 258 select an internal address int-Aa for internal DRAM from address buffer circuit 252 and transmits the same to DRAM row decoder 102.

[Transfer Gate Controlling Circuit]

Figure 62:
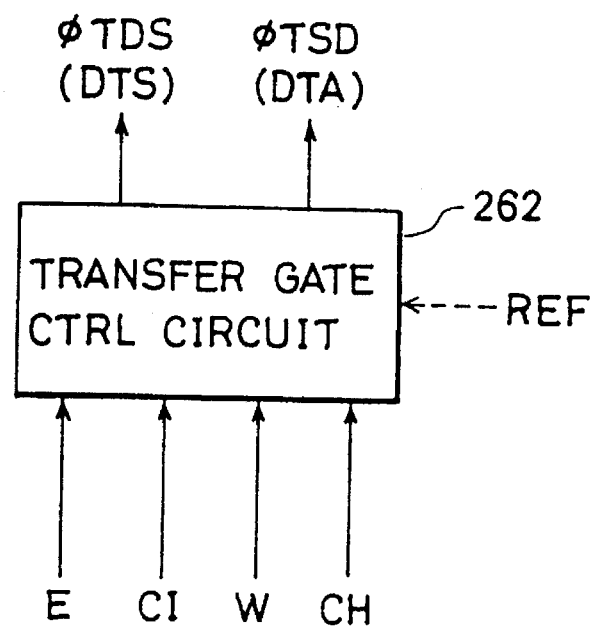
FIG. 62 shows functional structure of the transfer gate control circuit generating a transfer gate controlling signal.

FIG. 62 functionally shows a transfer gate controlling circuit 262. The transfer gate controlling circuit 262 generates signals φTDS and φTSD for controlling transfer operation of the bi-directional transfer gate circuit 210 (3, BTG), in response to internal control signals E, CI, W and CH. When cache hit signal CH is active, transfer gate controlling circuit 262 does not generate transfer control signals φTDS and φTSD. However, if array access designation (cache inhibition) signal CI is set to an active state, it successively generates control signals φTDS and φTSD in accordance with the state of the write enable signal W at that time. Transfer gate controlling circuit 262 also receives an internal refresh designating signal REF. The transfer gate controlling circuit 262 may be adapted to be set to the inactive state when internal refresh designating signal REF is applied. However, since a refresh designating signal REF# is applied externally, it is not necessary for transfer gate controlling circuit 262 to receive especially refresh designating signal REF, when generation of the array access designating signal CI is prevented by external specification. When refreshing is being carried out in the DRAM, SRAM array must be surely separated electrically from the DRAM array. If a structure is provided in which the transfer gate controlling circuit 262 is disabled in response to internal refresh designating signal REF, the SRAM array can be surely separated electrically from the DRAM array during refreshing operation, and external access to SRAM array is made possible.

Transfer gate controlling circuit 262 may have a structure in which transfer gate control circuit 262 is disabled when either cache hit signal CH or refresh signal REF is made active. More preferably, a gate circuit which sets the transfer gate control circuit 262 to a disabled state when either cache hit signal CH or refresh designating signal REF is active should be provided. Except that time, transfer control signals φTDS and φTSD are generated at prescribed timings in accordance with the control signals CI and W.

[DRAM Array Driving Circuit]

Figure 63:
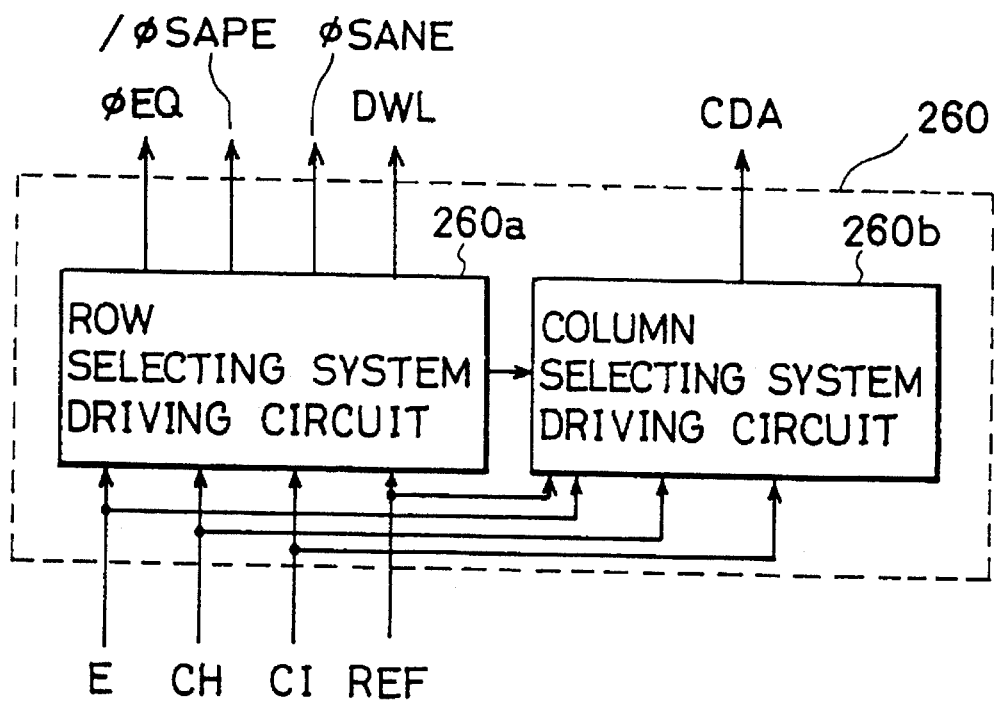
FIG. 63 schematically shows a structure of a DRAM array driving circuit shown in FIG. 18.

FIG. 63 shows functional structure of DRAM array driving circuit 260 shown in FIG. 18. DRAM array driving circuit 260 includes a row selecting system driving circuit 260a for driving circuits related to row selection of DRAM array, and a column selecting system driving circuit 260b for driving circuits related to column selection in DRAM array 1. Row selection system driving circuit 260b generates various control signals φEQ, /φSAPE, φSANE and DWL at prescribed timings, respectively, in response to internal control signals E, CH, CI and REF. Column selecting system driving circuit 260b generates a signal CDA for driving DRAM column decoder 15 at a prescribed timing in response to control signals E, CH, CI and REF. Column selecting system driving circuit 260b generates a column decoder activating signal CDA at a prescribed timing when refresh designating signal REF is inactive and the row selecting system driving circuit 260a is made active. When refresh designating signal REF is made active, column selecting system driving circuit 260b is disabled. Consequently, column selecting operation in the DRAM is prohibited.

By this structure, when refresh designating signal REF is made active, refreshing operation in the DRAM array can be carried out independent from the operation of the SRAM array. Auto refresh mode detecting circuit 291, refresh control circuit 292 and counter circuit 293 shown in FIG. 18 operate in response to refresh designating signal REF, and their operations are independent from the operation of a command register 270. Therefore, refreshing of DRAM array 101 can be carried out in parallel to command mode setting of the command register 270. More specifically, command register 270 simply generates a command data CM and applies the data to a data input/output control circuit 272 and to an input/output buffer+output register block 274. Data maintained therein has no influence to memory cell selecting operation in the DRAM array 101.

Setting of data in command register 270 is completed in 1 cycle of external clock signal K, as will be described in detail later with reference to a timing diagram. Refreshing operation in DRAM array needs n cycles. This is because the speed of operation of the DRAM 100 is lower than that of the clock K. Therefore, in this case, in short, 1 clock cycle is used in effect. However, if the period of external clock K is made slower in accordance with the operation mode and the period is similar to 1 memory cycle of the DRAM 100, setting of data to the command register 270 can be carried out in parallel to the refreshing operation of the DRAM array 101. The change of the period of the external clock K enables reduction in current consumption corresponding to lowering of speed of operation. More specifically, when the DRAM is in the standby state or when low power consumption is desired more rather than higher speed of operation of the memory device, by elongating the period of the clock, the speed of operation of the semiconductor memory device is lowered and the power consumption is reduced. The period of the external clock K may be made longer only when access to the DRAM only is being carried out.

[Command Register]

Operation mode of the CDRAM is set dependent on states of external control signals at a rise of clock signal K. By setting a command in a command register (FIG. 18, 270), a special mode and pin arrangement can be set.

Figure 65:
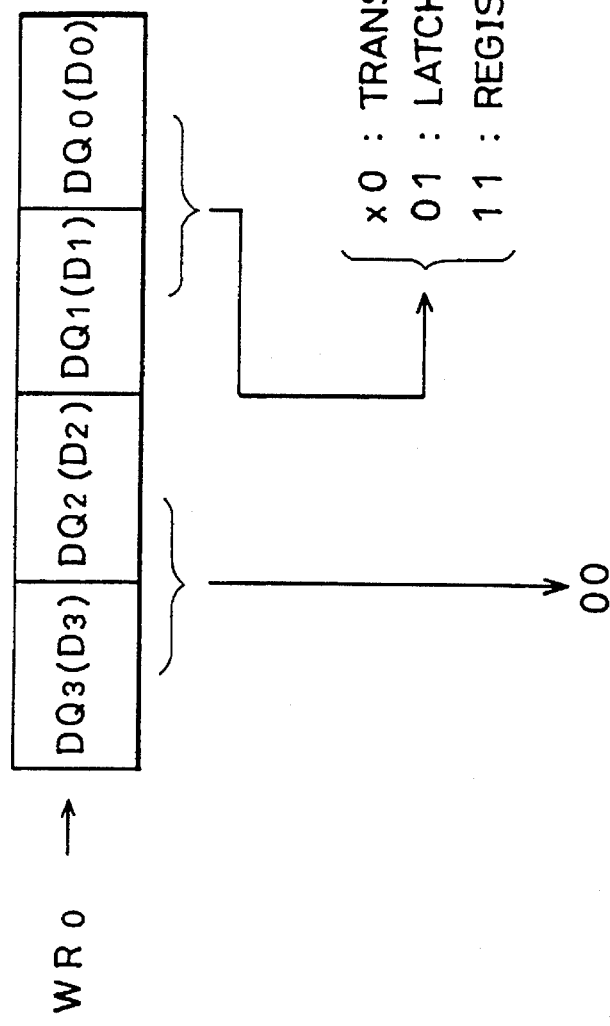
FIG. 65 shows correspondence between a selected command register and a special mode set at that time.

FIGS. 64 and 65 shows the contents in the command register 270 shown in FIG. 18 and a method of selecting the contents. Command register 270 includes 8 registers RR0–RR3 and WR0–WR3. Combination of write enable signal W# and 2 bits of command addresses AR0 and AR1 is used for selecting the register. By setting the external write enable signal W# to "H" at a rising edge of external clock K, any of the registers RR0–RR3 is selected. Register RR0 is selected by setting command addresses Ar0 and Ar1 to "0". Register RR1 is selected by setting command address bit Ar0 to "1" and command address bit Ar1 to "0". Selection of register RR0 means setting of a masked write mode (this masked write mode is also a default). Selection of the register RR1 means setting of D/Q separation mode. When write enable signal W# is set to "L" at a rising edge of external clock K and setting command addresses Ar0 and Ar1 both to "0", then register WR0 is selected. As shown in FIG. 35, this register WR0 sets the output mode to transparent, latched or registered mode, dependent on the combination of data at data input terminals DQ0 (D0) to DQ3 (D3) at that time. Details of the respective output modes will be described later. When register WR0 is selected, input data D2 and D3 (DQ2 and DQ3) are both set to "0". When input data D0 is set to "0" and input data D1 is set to an arbitrary value in this state, transparent output mode is set. When input data D0 is set to "1" and input data D1 is set to "0", latched output mode is selected. When input data D0 and D1 are both set to "1", registered output mode is selected. Other registers are used for arbitrary extended function.

[Input/Output Control Circuit]

Figure 66:
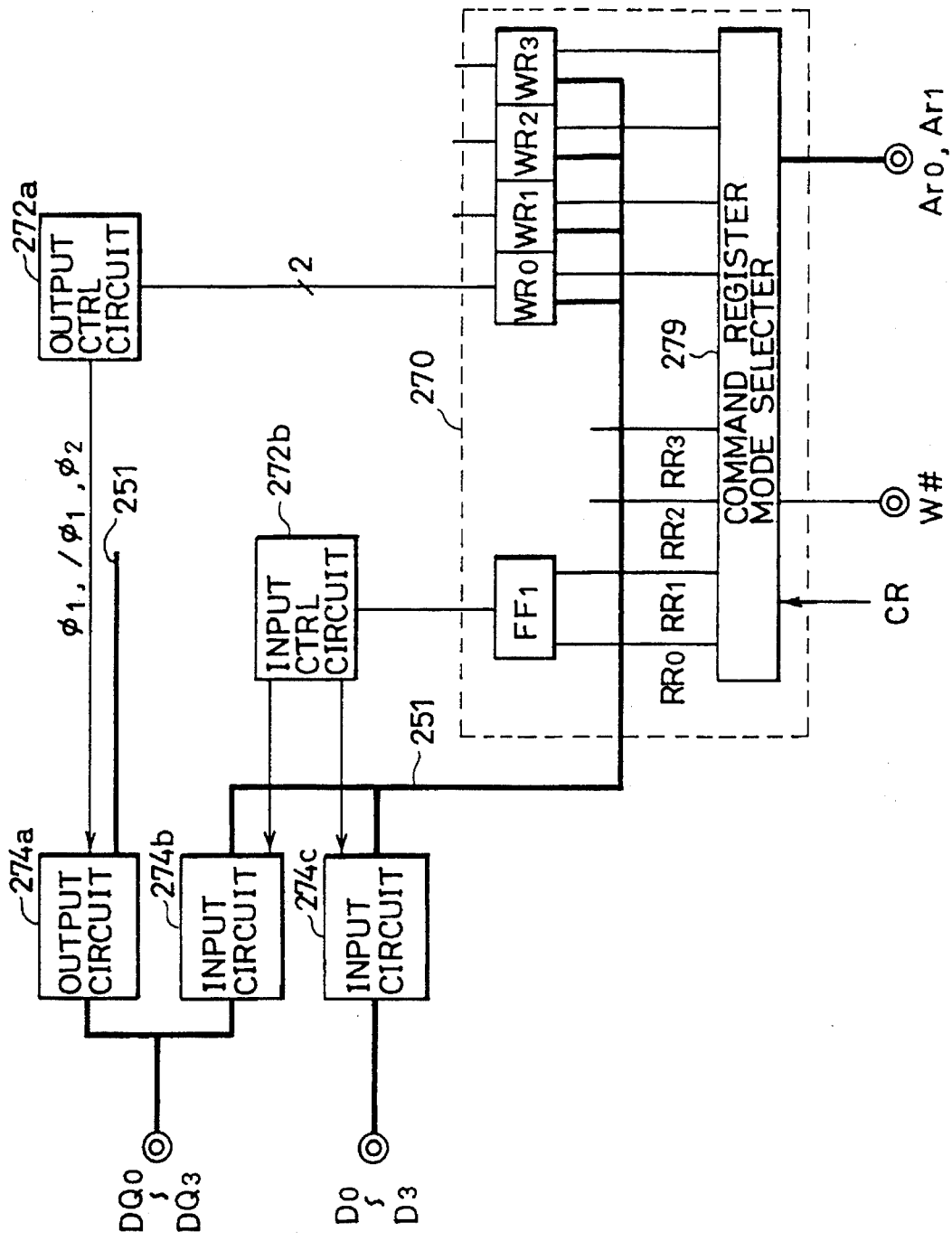
FIG. 66 show a circuit structure for setting an output mode.

Specific structures for setting the data output mode to transparent mode, latched mode and registered mode dependent on the data set in the command register will be described. Transparent output mode means a normal output mode in which memory cell data accessed in that cycle are output. Registered output mode means. a mode in which data of the memory cell whose address has been designated in the previous cycle is output. Latched output mode means a mode in which data of an address designated in the previous cycle is output at a timing at which invalid data were to be output otherwise. FIG. 66 shows a circuit structure related to setting of data output mode. Referring to FIG. 66, command register 270 includes a command register mode selector 279 responsive to a command register mode detecting signal (internal command register signal) CR for decoding write enable signal W# and command data Ar0 and Ar1, registers WR0–WR3, and a flipflop FF1. Command register includes 8 registers RR0–RR3 and WR0–WR3, as shown in FIG. 64. However, in FIG. 66, registers RR2 and RR3 are not shown. Each of the registers WR0–WR3 is a 4-bit register. Registers RR0 and RR1 share one flipflop FF1. When register RR0 is selected, flipflop FF1 is set to masked write mode. When register RR1 is selected, flipflop FF1 is set to D/Q separation mode. An input control circuit 272b selects either an input circuit 274b or 274c dependent on the data set in the flipflop FF1.

By decoding command data Ar0 and Ar1, it is determined to which register WR0–WR3 the data is to be set. When write enable signal W# is active, 4 bits of data D0–D3 (or DQ0–DQ3) are set to a corresponding register, through the input circuit 274b or 274c selected by input control circuit 272b. Since register WR0 is related to data output mode, setting of data output mode will be described. Output control circuit 272b is set in a transparent, latched or registered output mode in accordance with lower 2 bits of data of the register WR0, and it outputs control signals $\phi 1$, $/\phi 1$ and $\phi 2$ for selectively activating output circuit 274a, dependent on the set output mode.

Figure 67:
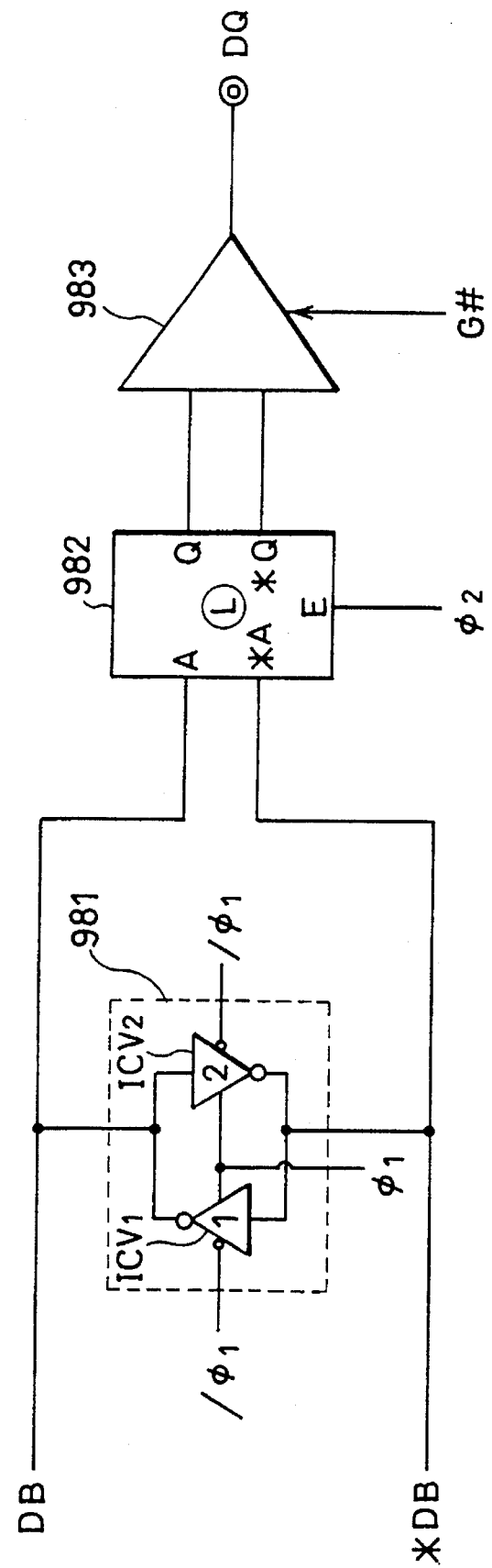
FIG. 67 shows a specific structure of a data output circuit shown in FIG. 66.

FIG. 67 shows an example of a specific structure of the output circuit 274a. Referring to FIG. 67, output circuit 274a includes a first output latch 981 responsive to control signals $\phi 1$ and $/\phi 1$ for latching data on read data buses DB and *DB, a second output latch 982 responsive to a clock signal $\phi 2$ for passing data latched in output latch 981 or data on data buses DB and *DB, and an output buffer 983 receiving data from output latch 982 for transmitting the same as output data to an external pin terminal DQ in response to control signal G#.

First output latch 981 includes clocked inverters ICV1 and ICV2 which are activated in response to clock signals $\phi$ and $/\phi 1$. An input and an output of clocked inverter ICV1 are connected to an output and an input of clocked inverter ICV2, respectively. Output latch 981 is set to a latched state when clock signal $\phi 1$ is "H". Namely, clocked inverters ICV1 and ICV2 are activated when clock signal $\phi 1$ is "H" and serve as an inverter. When clock signal $\phi 1$ is "L", clocked inverters ICV1 and ICV2 are disabled, and latch 981 does not carry out latching operation.

Second output latch 982 latches data applied to inputs A and *A and outputs the data from outputs Q and *Q, when clock signal 62 is at "L". When clock signal $\phi 2$ is "H", output latch 982 outputs data latched when clock signal $\phi 2$ was at "L" from outputs Q and *Q regardless of the signal state at inputs A and *A. Clock signals $\phi 1$, $/\phi 1$ and $\phi 2$ controlling the latching operation are synchronous with external clock K, and timings of generation are made different from each other by output control circuit 272b. Output buffer 983 is activated when output enable signal G# is made active, and transmits output data from output latch 982 to a terminal DQ.

Figure 68:
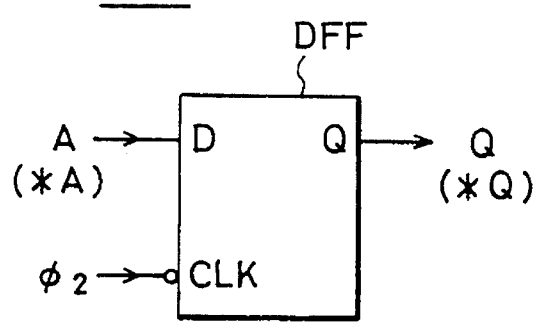
FIG. 68 shows a specific structure of a latch circuit at the output portion shown in FIG. 67.

FIG. 68 shows an example of a specific structure of second output latch 982. Referring to FIG. 68, second output latch 982 includes a D flipflop DFF receiving an input A (*A) at a D input thereof and receiving clock signal $\phi 2$ at its clock input CLK. An output Q (*Q) of output latch 982 is provided from output Q of the flipflop DFF. The D Flipflop DFF is a down edge trigger type. It takes an input A at a timing of a fall of the clock signal $\phi 2$ to L, and outputs input A as it is while clock signal $\phi 2$ is "L". When clock signal $\phi 2$ is at "H", it outputs previously latched data, regardless of the state of the input A applied to input terminal D. Thus, an output latch 982 realizing desired function is provided. D type flipflops DFF are provided for each of the inputs A and *A. The output latch 982 may have other structure. Any circuit structure capable of realizing latch state and through state in response to clock signal $\phi 2$ may be used.

Figure 69:
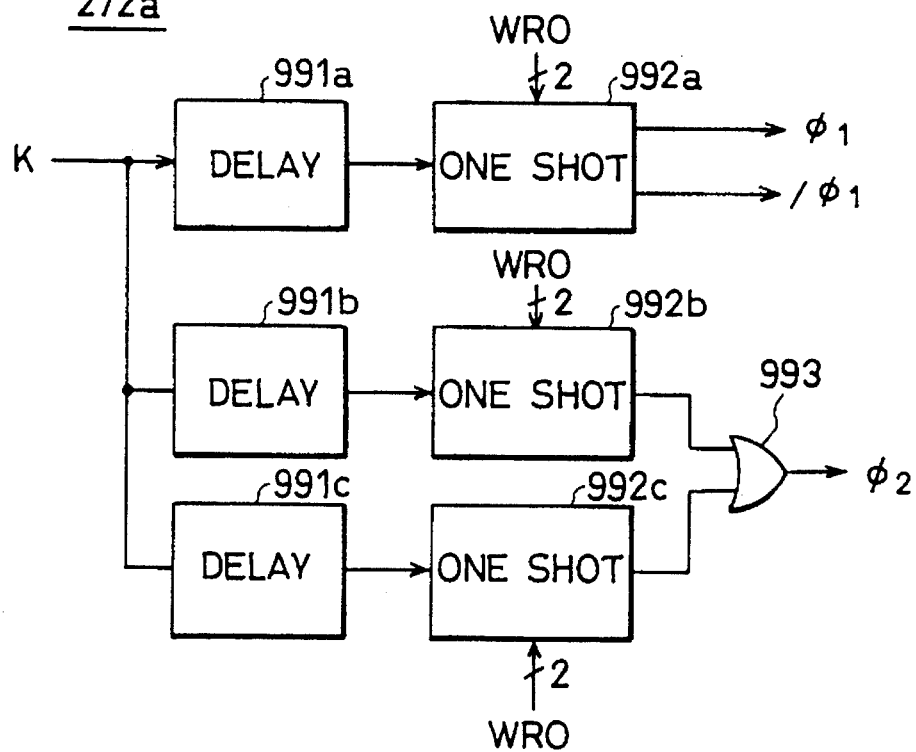
FIG. 69 shows a specific structure of an output control circuit shown in FIG. 66.

FIG. 69 shows an example of a specific structure of the output control circuit 272a. Output control circuit 272a includes relay circuits 991a, 991b and 991c for providing a prescribed time delay to the external clock; a one shot pulse generating circuit 992a for generating a one shot pulse signal having a prescribed pulse width in response to an output from delay circuit 991a; a one shot pulse generating circuit 992b for generating a one shot pulse signal having a prescribed pulse width in response to an output from delay circuit 991b; and a one shot pulse generating circuit 992c for generating a one shot pulse signal having a prescribed pulse width in response to an output from delay circuit 991c. Clock signals $\phi 1$ and $/\phi 1$ are generated from one shot pulse generating circuit 992a. Outputs from one shot pulse generating circuits 992b and 992c are applied to an OR circuit 993. Clocksignal $\phi 2$ is generated from OR circuit 993. Delay time provided by the delay circuit 991b is shorter than the delay time provided by the delay circuit 991c. Enable/disable of one shot pulse generating circuits 992a to 992c is set by 2 bits of command data WR0. When 2 bits of command data WR0 represents latch mode, one shot pulse generating circuits 992a and 992c are enabled, and one shot pulse generating circuit 992b is disabled. Operation of the command register and the data output circuit shown in FIGS. 66 to 69 will be described.

Figure 70:
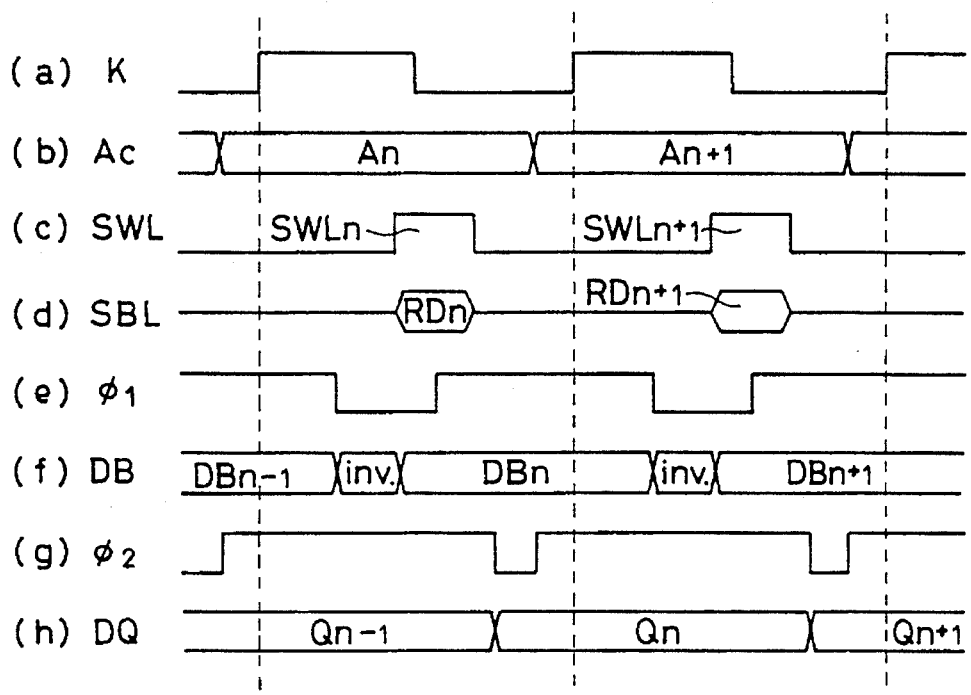
FIG. 70 is a diagram of signal waveforms showing operation at latch output mode of the circuit shown in FIG. 67.

First, latch operation will be described with reference to FIG. 70, which is a diagram of signal waveforms. Latched output mode as the data output mode is set by setting lower 2 bits of command data register WR0 to (01). At this time, one shot pulse generating circuits 992a and 992c are enabled. Let us assume that output enable signal G# is at an active state of "L", indicating data output. At this time, an external address An is taken into an address buffer at a rising edge of the clock K, a corresponding SRAM word line SWLn is selected, and data RDn appears on the SRAM bit line SBL. At this time, one shot pulse generating circuit 992a generates a one shot pulse at a prescribed timing in response to the rise of external clock K, and is kept at "L" for a prescribed time period. When the clocksignal φ1 falls to "L", latch operation of output latch 981 is prohibited. At this time, clocksignal φ2 is at "H" maintaining the latch state, latches and outputs data Qn-1 which has been read in the previous cycle. 4 bits of data selected in accordance with an external address out of 64 bits of data Rdn on the SRAM bit line pair SBL which has been selected by the external address are transmitted to internal output data buses DB and *DB. With the data DBn on data buses DB and *DB are established, the clock signal φ1 rises to "H". Consequently, output latch 981 carries out latching operation to latch the established data Dbn.

Thereafter, a one shot pulse is generated from one shot pulse generating circuit 992c and signal φ2 falls to "L". Consequently, output latch 982 newly takes the latched data Dbn and transmits the same to output terminal DQ through an output buffer 983. The clocksignal φ2 is generated in synchronization with a fall of the clock K, and in response to a fall of the external clock K, data QDBn selected in this cycle is output as output data Qn. Clocksignal φ2 rises to "H" by the time the external clock K rises again. Consequently, output latch 982 continuously output established data DBn regardless of the data on internal output data buses DB and *DB.

Thereafter, clocksignal φ1 is set to "L" and latch state of output latch 981 is released, so as to be ready for the next cycle, that is, latching operation of the next established data. Consequently, in response to a rise of the external clock K, data read in the previous cycle are output successively as established data.

Figure 71:
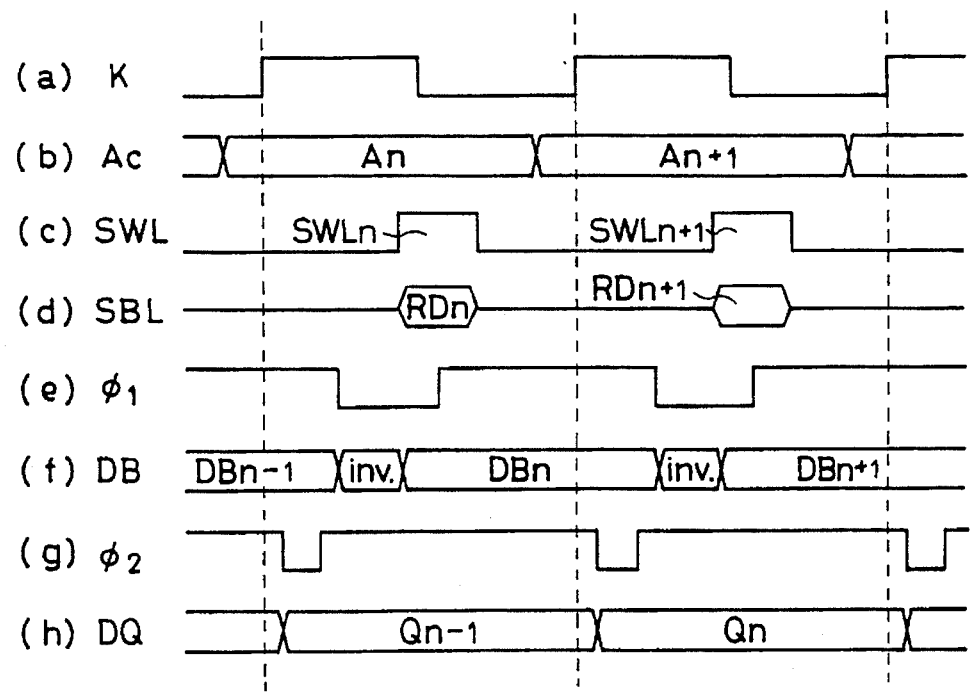
FIG. 71 is a diagram of signal waveforms showing operation in register output mode of the circuit shown in FIG. 67.

Register mode will be described with reference to FIG. 71. Setting of the register mode is done by setting lower 2 bits of command data WR0 to (11). In registered output mode, one shot pulse generating circuit 992b is enabled, and one shot pulse generating circuit 992c is disabled. At this time, in response to a rise of the external clock K, a one shot pulse which falls to "L" is generated from one shot pulse generating circuit 992b. Since clock signal φ1 is at "H" at this time, data DBn-1 which has been read in the previous cycle is latched by output latch 982.

In registered output mode, timing of falling clock signal φ2 to "L" is determined in response to a rise of external clock K. In this case, in response to (n+1) th cycle of the external clock K, data DBn read in nth clock cycle is output as output data Qn at output pin terminal DQ. Namely, only the timing of generation of the clock signal φ2, that is, timing of falling to "L" is different between latched output mode and registered output mode. Consequently, latched output mode in which data of previous cycle is output and data read in the present cycle is output continuously, and registered output mode in which data read in nth cycle is output at n+1th cycle are realized.

Figure 72:
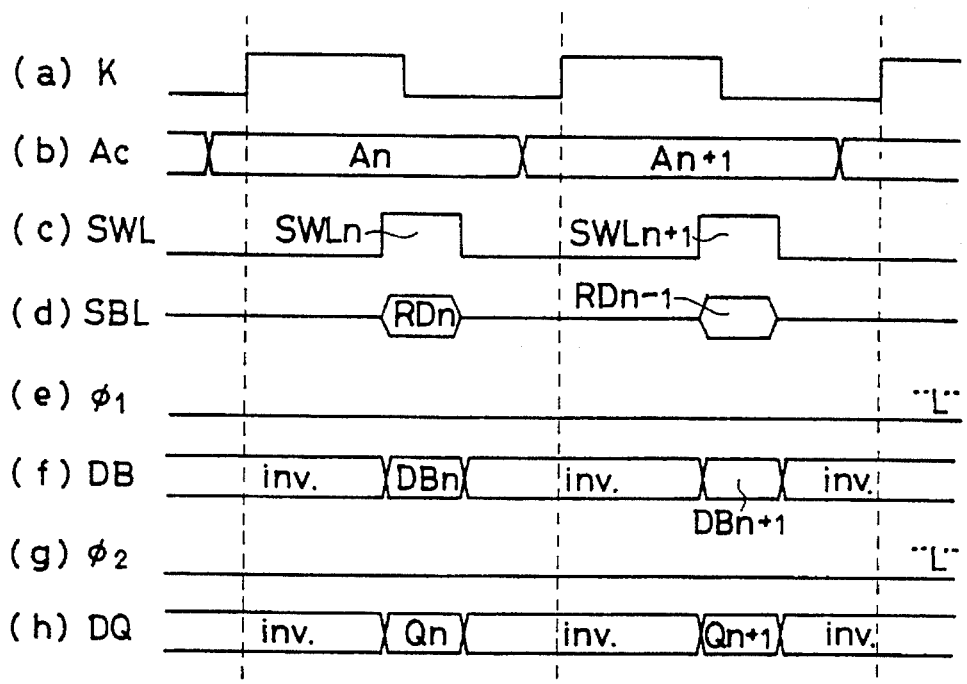
FIG. 72 is a diagram of signal waveforms showing operation in a first transparent output mode of the circuit shown in FIG. 67.

Transparent mode will be described with reference to FIGS. 72 and 73. A first transparent output mode will be described with reference to FIG. 72. As described above, transparent output mode is realized by setting lower 2 bits to X0 (X: arbitrary) of the register WR0. The first transparent output mode or a second transparent output mode is selected by setting the bit value of X to 0 or 1. Either first transparent output mode or second transparent output mode may be selected arbitrarily corresponding to either of the values of X. In first transparent output mode, clock signals φ1 and φ2 are both maintained at "L". At this time, latch operation in output latch 981 is released, and output latch 982 is in a through state. Therefore, in this case, data DBn transmitted to internal data buses DB, *DB are directly output as output data Qn. If data on the SRAM bit line pair SBL or global I/O line pair GIO is invalid data, invalid data INV appears on output pin DQ in response.

Figure 73:
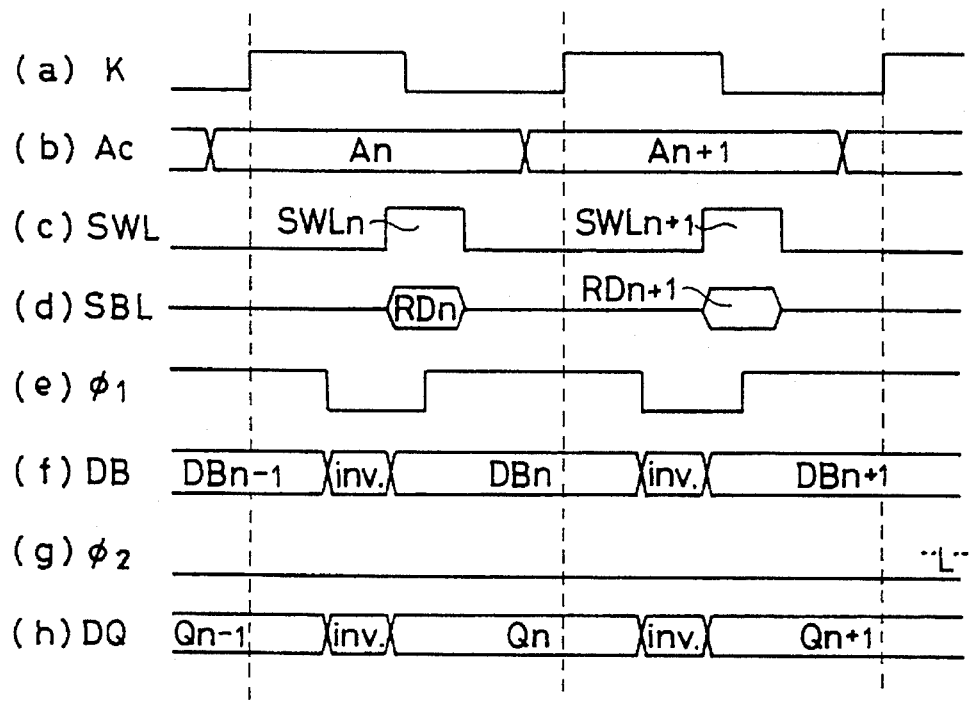
FIG. 73 is a diagram of signal waveforms showing operation in a second transparent output mode of the circuit shown in FIG. 67.

In second transparent output mode shown in FIG. 73, clocksignal φ1 is generated. First output latch 981 carries out latching operation while clock signal φ1 is at "H". Therefore, even if data RDn on SRAM bit line pair SBL is set to an invalid state, data on data buses DB and *DB are latched as valid data by latch circuit 891 and output for a prescribed time period (while the clock signal φ1 is at "H"). Therefore, a period in which invalid data INV is output can be made shorter. In second transparent output mode, clocksignal φ2 is also kept at "L".

Although a D flipflop of a down edge trigger type has been used as second output latch 982 in the above described structure, an up edge trigger type latch circuit may be used to provide the same effect, by changing polarity of the clocksignal φ2. The structure of output latch 981 can also be implemented by other latch circuits.

The characteristics of the output modes set by the common register are as follows.

(1) Transparent output mode: In this mode, data on internal data buses DB, *DB are directly transmitted to an output buffer. In this mode, valid data as output data DQ (Q) appears after a time lapse of tKHA (array access time) from a rising edge of external clock K or after a lapse of a time period tGLA (access time from the signal G# has reached "L" to an output of a valid data) from a falling edge of output enable signal G#, which is later. If output enable signal G# falls before the time tKHA, invalid data (INV) is kept continuously output to tKHA, since valid data has not yet appeared on internal data buses DB and *DB, if output enable signal G# falls at an earlier timing. Therefore, in this mode, a period in which output data is valid is limited to a period in which valid data is appearing on the internal bus.

(2) Latched output mode: In this mode, an output latch circuit is provided between internal data buses DB and *DB and the output buffer. In the latched output mode, data is latched by an output latch circuit while external clock K is at "H". Therefore, when output enable signal G# falls before the time tKHA, data read in the previous cycle is output. Therefore, even if invalid data has appeared on internal data buses DB and *DB, invalid data is not output externally. Namely, this mode provides an advantage that sufficient time period for the CPU to take output data can be provided.

(3) Registered output mode: In this mode, an output register is provided between an internal data bus and an output buffer. In the registered output mode, valid data of the previous cycle is output as output data after a lapse of tKHAR from a rising edge of external clock K or after a lapse of tGLA from a falling edge of output enable signal G# which is later. From the same reason as in the latch mode, invalid data is not output in register mode. When data are to be output continuously in register mode, it seems that data are output at very high speed in view of the rise of the external clock K. Such operation is generally called a pipeline operation, in which seeming access time can be further reduced from the cycle time.

Since the above described output modes can be set by command registers, a user can select an output mode suitable for a system. Remaining command registers may be used for any arbitrary applications.

[Correspondence Between Operation Modes and Control Signals]

FIG. 74 shows, in a table, operation modes of the CDRAM of the present invention and states of control signals for designating respective operation modes. An operation mode of CDRAM is set by a combination of the states of external control signals E#, CH#, CI#, CR#, W# and REF#. Referring to FIG. 74, "H" represents a high level signal potential, "L" represents a low level signal potential, and "X" represents an arbitrary state (don't care D.C). As shown in FIG. 74, operation modes of the CDRAM includes a standby mode in which the CDRAM is set in a standby state; an array refresh for automatically refreshing the DRAM array, data transfer between a CPU (Central Processing Unit) and a cache (SRAM); data transfer between CPU and array; data block transfer between a cache and an array; and setting of special mode in the command register. Timings and combinations of states of signals for setting respective operation modes will be described in detail later with reference to a diagram of signal waveforms. In FIG. 74, write enable signal W# is indicated as "H/L" at data transfer between the CPU and the command register. It means that write enable signal W# is set to "H" or "L" in this operation mode, and either "H" or "L" state is used for designating a certain special mode.

By the above described structure, a CDRAM having the following characteristics can be provided.

(1) The CDRAM in accordance with the present invention has a DRAM memory array serving as a main memory and an SRAM array serving as a cache memory integrated on 1 chip, and these memories are coupled to each other by an internal bus used only for data transfer, which is different from an internal common data bus. Consequently, block transfer between the DRAM array and the SRAM array (cache) can be completed in 1 clock cycle. In the following description, the term "array" refers to the DRAM array. Compared with a conventional cache memory system employing a standard DRAM and a standard SRAM, system performance can be significantly improved.

(2) The DRAM memory array and the SRAM array can be accessed by separate addresses. Therefore, various mapping methods, for example direct mapping method, set associative method and full associative method can be employed.

(3) The CDRAM operates in synchronization with an external clock K. Compared with a method in which internal clock signals are generated by using an address change detecting circuit, delay of a cycle time derived from address skew or the like can be prevented, realizing accurate control.

(4) Externally applied signals (or data) such as array addresses (addresses for the DRAM) Aa0 to Aa9, cache addresses (addresses for SRAM) Ac0 to Ac11, data input/output D0 to D3 or DQ0 DQ3, a write enable signal W#, a cache hit signal CH#, a chip select signal E#, a refresh signal REF#, a cache inhibition signal CI# and a command register signal CR# are all taken at a rising edge of the external clock K.

(5) Since array addresses are taken in accordance with a multiplex method, the number of pins for array addresses can be reduced, increasing packaging density of the CDRAM.

(6) Addresses of the array and the cache are independent from each other. At a time of a cache hit, access to the cache only is carried out, enabling high speed cache hit accessing.

(7) Data can be read at an arbitrary timing by an output enable signal G# regardless of the timing of the external clock K, so that asynchronous bus control can be done in the system.

(8) By using the command register 270, output specification (transparent, latched, registered) and I/O structure (input/output pin separation, masked write) can be arbitrarily designated by a user. When a registered output method is used, output data of an address designated in the previous cycle appears at a rising edge of the external clock K. Such data output mode is suitable for pipeline application. In a latched output method, output data of an address designated in the previous cycle is continuously output at the timing at which invalid data were to be output otherwise. Therefore, invalid data is not output at all, and valid output data only is provided. By this latched output mode, sufficient period of time for the CPU to take output data can be provided.

(9) Data writing operation is started at a rising edge of the external clock K. However, writing is automatically terminated by an internal timer or the like. Therefore, it is not necessary to set completion of writing operation by, for example, an external write enable signal W#, and therefore setting of timings in the system is facilitated.

(10) A refresh designating signal REF# for designating automatic refreshing can be externally applied. Therefore, the DRAM array can be automatically refreshed easily at a desired timing.

(11) As described above, the CDRAM of the present invention can be housed in 300 mil TSOP package, type II having 44 pins. The TSOP package type II is a very thin rectangular package, which realizes a system having high packaging density.

[Connection to External CPU (1): Direct Mapping Cache]

Figure 75:
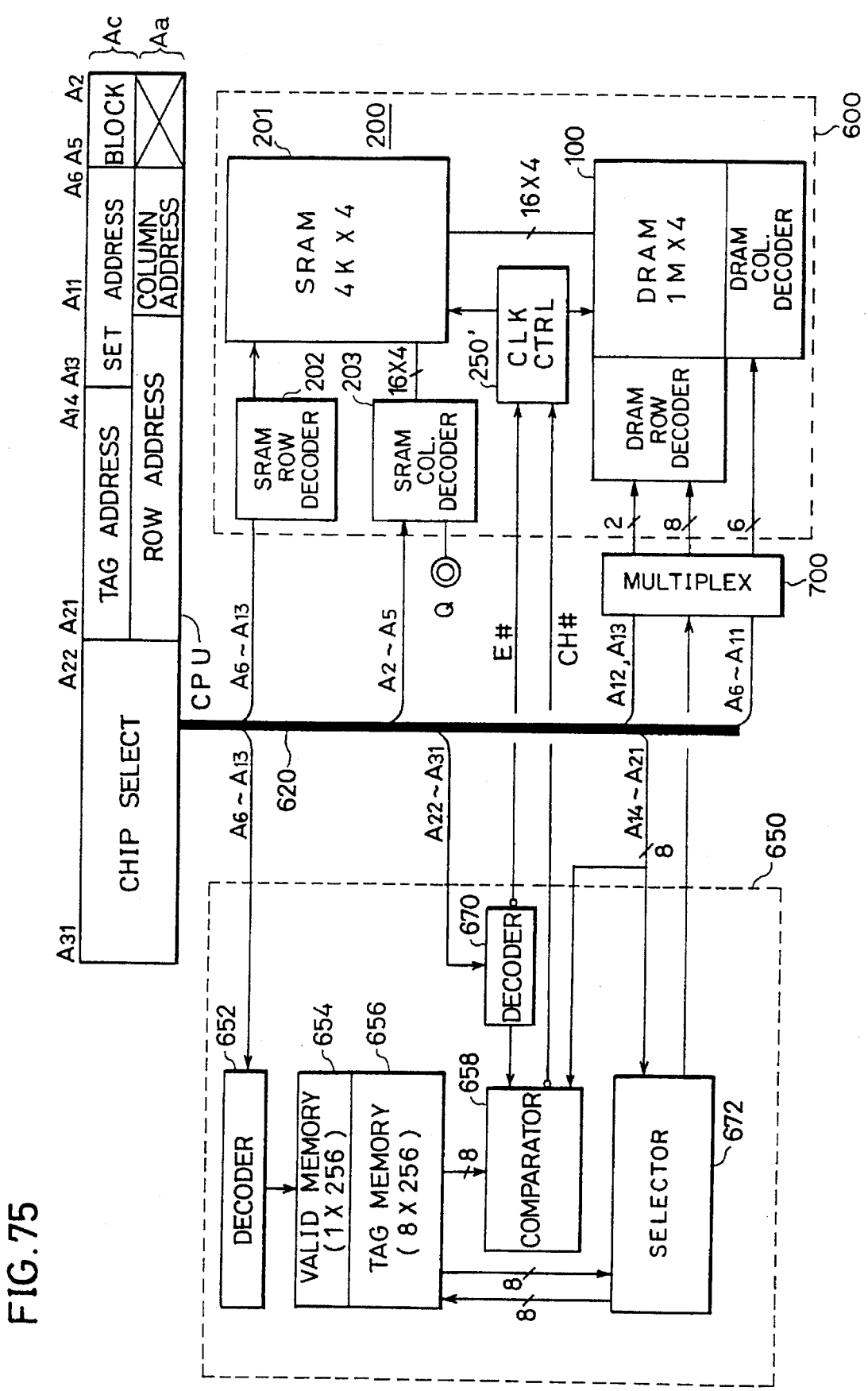
FIG. 75 is a block diagram showing a system structure when a cache system is formed by direct mapping method by using the semiconductor memory device in accordance with the present invention.

FIG. 75 is a block diagram showing a structure of a system when a cache system is formed by a direct mapping method using the CDRAM 600 in accordance with the present invention. Referring to FIG. 75, the cache system comprises, in addition to CDRAM 600, a controller 650 for controlling access to the CDRAM 600, and a CPU for carrying desired data processing by inputting/outputting data to and from the CDRAM 600. FIG. 75 shows only an address structure output from the CPU when cache access is required. The CPU is assumed to have 32 bits. The cache system further includes an address multiplex circuit 700 for multiplexing and applying row and column addresses to the array CDRAM 600. Portions related to cache access only of the CDRAM 600 are shown as representatives. In the direct mapping method, the number of tags is 256, the number of sets is 256, and set size is 16 bits. 1M DRAM has 1024 rows×1024 columns, 4K SRAM has 256 rows×16 bits.

Controller 650 includes a decoder 652 for decoding set addresses A6 to A13 from the CPU, valid bit memory 654 indicating which set is valid in response to an output from decoder 652, and a tag memory 656 for storing tag addresses of data stored in SRAM 200. SRAM 200 has a structure of 4K×4 bits, and there are 256 tags. Therefore, tag memory 656 includes 8 bit×256 structure. Valid bit memory 654 has a structure of 1 bit×256 for indicating which of the 256 set is valid. Decoder 652 decodes set addresses A6 to A13 and makes valid any of the valid bit memory 654.

Controller 650 further includes a decoder 670 receiving addresses A22 to A31 from the CPU as a chip selecting signal for determining whether or not a corresponding CDRAM 600 is designated, a comparator 658 which is activated in response to an output from decoder 670, comparing a tag address from tag memory 656 with tag addresses A14 to A21 from CPU for determining a cache hit/miss, and a selector 672 corresponding to a cache hit/miss for selecting either the tag address from tag memory 656 or tag addresses A14 to A21 from CPU for applying the selected one to the multiplex circuit 700. At a time of a cache miss, selector 672 stores tag address applied from the CPU to a corresponding position of the tag memory 656.

The operation will be briefly described in the following. When access to the CDRAM 600 is requested by the CPU, addresses A2 to A31 are generated on the data bus 620. Addresses A20 to A31 out of 30 bits of addresses on common data bus 620 are used as chip select signals and applied to decoder 670 in controller 650. Decoder 670 decodes addresses A22 to A31 as the chip select signal, and determines whether or not an access to the corresponding CDRAM is requested. If it is determined that an access to the CDRAM 600 is requested, chip select signal E# is generated from decoder 670 and applied to CDRAM 600. A comparator 658 is activated by the chip select signal from decoder 670.

Decoder 652 included in controller 650 takes and decodes addresses A6 to A13 out of addresses transmitted from CPU to address bus 620 as set address. Decoder 652, which has decoded 8 bits of set addresses, sets corresponding bits of the valid bit memory 654 for selecting one set out of 256 sets. An address of 8 bits indicating a tag corresponding to the valid bit of the valid bit memory 654 is read from tag memory 656 and applied to comparator 658. Comparator 658 compares tag address from tag memory 656 with tag addresses A14 to A21 output from CPU. When they match with each other, comparator 658 makes cache hit signal CH# fall to "L" and applies the same to CDRAM 600 so as to indicate a cache hit. If they do not match with each other, comparator 658 generates a cache hit signal CH# of "H" to indicate a cache miss (miss hit).

At a time of a cache hit, the following operation is carried out in the CDRAM 600. The control of operation at this time is carried out by control signals from a control clock buffer 250 and by SRAM array driving circuit 264 (see FIG. 18). SRAM row decoder 202 selects one of 256 sets in response to set addresses A6 to A13 from the CPU. Namely, one row (one in each SRAM array block, 4 rows in total) is selected. Consequently, 16 bits of SRAM cells are selected in each SRAM array block of the SRAM 200. SRAM column decoder SCD 203 decodes block addresses A2 to A5 from CPU, selects 1 bit out of 16 bits of memory cells, and connects the selected one to data input/output terminal. FIG., 73 shows an output data Q at the time of a hit reading.

Operation at a miss hit will be described. At this time, data to which access is requested by the CPU is not stored in the SRAM 200. In controller 650, selector 672 applies a corresponding tag address stored in tag memory 656 to multiplex circuit 700 in response to a miss hit designating signal from comparator 658. At this time, selector 672 has the 8 bits of tag addresses A14 to A21 applied from CPU as new tag addresses stored at corresponding positions in tag memory 656.

In CDRAM 600, a copy back, that is, simultaneous transfer of 16 bits from SRAM 200 to DRAM 100 is carried out in this cycle. Data of 16 bits×4 selected by SRAM row decoder SRD 202 in accordance with set addresses A6 to A13 from the CPU in SRAM 200 are stored at corresponding positions of DRAM cell of 16 bits×4 which have been selected by row and column selecting operation in the DRAM 100 in accordance with 8 bits of tag address output from selector 672 and in accordance with addresses A6 to A13 output from the CPU.

In the next operation cycle, CDRAM 600 selects 16 bits×4 DRAM cells in DRAM 100 in accordance with addresses A6 to A21 output from the CPU, and writes the data of 16 bits×4 to corresponding 16 bits×4 memory cells of SRAM 200 which has been selected by SRAM row decoder SRD in accordance with address A6 to A13 from CPU. This data transfer may be carried out in accordance with the high speed transfer mode.

As described above, for the SRAM, address bits A2 to A5 are used as block addresses, address bits A6 to A13 are used as set addresses, address bits A14 to A21 are used as tag addresses. For the DRAM, address bits A6 to A11 are used as column addresses, and address bits A12 to A21 are used as row addresses. Consequently, a direct mapping method can be realized between DRAM 100 and SRAM 200.

[Connection to CPU II:4 Way Set Associative]

Figure 76:
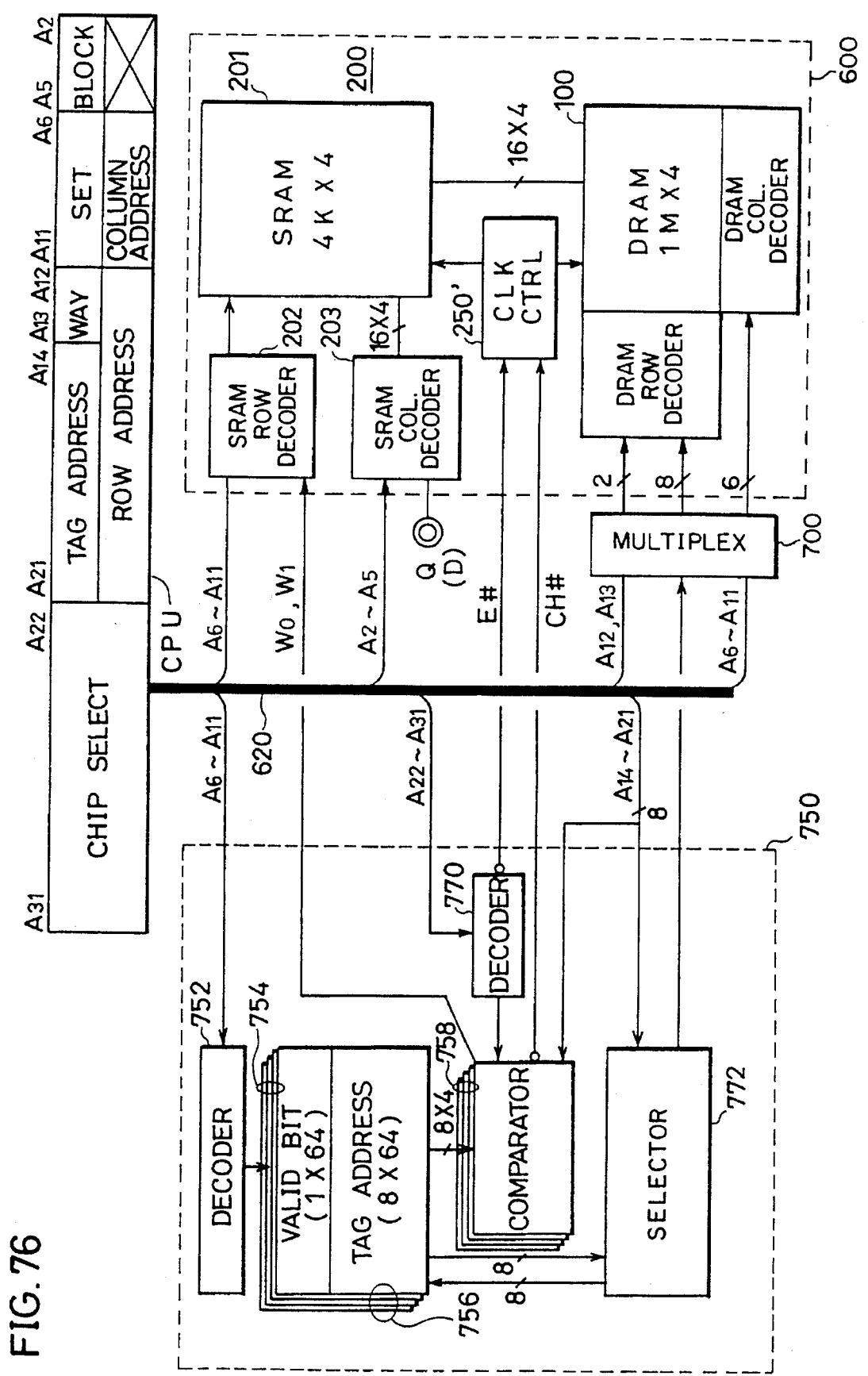
FIG. 76 is a block diagram showing a system structure when the cache system is formed by 4 way set associative mapping method by using the semiconductor memory device in accordance with the present invention.

FIG. 76 is a block diagram showing a system structure of 4 way set associative method using the CDRAM of the present invention. CDRAM 600 has the same structure as that shown in FIG. 75, which includes SRAM 200, DRAM 100 and a clock control circuit 250. Clock control circuit 250 includes control clock buffer 250, SRAM array driving circuit 264 and DRAM array driving circuit 260 shown in FIG. 18. For simplicity, circuit structures for controlling data input/output are omitted.

Controller 750 includes a decoder 752, a valid bit memory 754, a tag address memory 756, a comparator 758, a decoder 770 and a selector 772. For correspondence to 4 ways, valid bit memory 754 includes 4 memory frames each having 1 bit×64 structure. Tag address memory 756 also has 4 memory frames each having 8 bits×64 structure. Similarly, 4 comparators 758 are provided for selecting one of 4 ways, that is, one comparator is provided for each memory frame of the tag address memory 756. In 4 ways set associative method, 256 rows of SRAM 200 are divided into 4 ways, and therefore the number of sets is 64.

Addresses having the following structures are transmitted from CPU to address bus 620. Addresses A22 to A31 are addresses for selecting chips, addresses A14 to A21 are tag address, addresses A12 and A13 are way addresses, addresses A6 to A11 are set addresses, and addresses A2 to A5 are block addresses. Addresses A6 to A11 and addresses A12 to A21 are used as column addresses and row addresses for the DRAM 100, respectively. Multiplex circuit 700 is provided for DRAM 100 of CDRAM 600 for multiplexing the row and column addresses. The operation will be described.

Addresses A6 to A11 from CPU are applied as set addresses to decoder 752. Addresses A22 to A31 are applied as chip select addresses to decoder 770. Decoder 752 decodes the set addresses A6 to A11 and sets valid bits related to corresponding set to valid state, in valid bit memory 754. Consequently, 1 set (4 ways) is selected. Decoder 770 decodes chip select addresses A22 to A31 to determine whether or not there is an access request to CDRAM 600. If an access to CDRAM 600 is requested, decoder 770 set chip select signal E# to an active state, that is, "L", and activates comparator 758. Comparator 758 reads corresponding 4 way tag addresses from tag address memory 756 referring to valid bits in valid bit memory 754, and compares the read tag addresses with addresses A14 to A21 from the CPU. If a matching is found, comparator 758 outputs way addresses W0 and W1 indicating the way in which the matching is found, and makes cache hit signal CH# fall to "L" so as to indicate a cache hit. If there is not a match in comparator 758, cache hit signal CH# is set to "H" to indicate a miss hit.

When a cache hit occurs, way addresses W0 and W1 from controller 750 and addresses A6 to A11 from the CPU are applied as row addresses to SRAM row decoder 202, and 16 bits×4 SRAM cells are selected in SRAM array 201. Block addresses A2 to A5 as column addresses are decoded by SRAM column decoder 203. Out of selected 16 bits×4 SRAM cells, 1 bit×4 are selected to be connected to a data output terminal Q (or data input terminal D).

In case of a miss hit, selector 772 selects one of the 4 way tag addresses to select a region in which tag address is to be rewritten in accordance with LRU (Least-Recently Used) logic. The tag address selected by selector 772 is applied as an array address to DRAM row decoder DRD in DRAM 100 through multiplex circuit 700. Selector 772 replaces the tag address which is to be rewritten are output by address A14 to A21 applied from the CPU.

In CDRAM 600, the first cycle is a copy back mode. In copy back mode, way addresses W0 and W1 indicating ways to be rewritten, under the control of selector 772. In SRAM 200, addresses A6 to A11 from CPU and way addresses W0 and W1 from controller 750 are decoded, and 16 bits×4 SRAM cells are selected. In DRAM 100, 16 bits×4 DRAM cells are selected in accordance with 8 bits of tag addresses output from selector 772 and to addresses A6 to A13 output from the CPU. Thereafter, data are transferred from selected 16 bits×4 SRAM cells to selected 16 bits×4 DRAM cells.

In the next operation cycle, 16 bits×4 DRAM cells are selected in DRAM 100 in accordance with addresses A6 to A21 from the CPU. Data of the newly selected 16 bits×4 DRAM cells are simultaneously transferred to 16 bits×4 SRAM cells which have been selected in accordance with addresses A6 to A11 and to way addresses W0 and W1. The data transfer may be carried out in accordance with the high speed transfer mode.

By the above described structure, either direct mapping method or set associative method can be realized without changing internal structure of CDRAM 600. Although not shown, full associative mapping method is also possible. In that case, in controller 750, a tag address memory for storing SRAM cache address and a corresponding address of the DRAM 100 is necessary. Relation between signal timings in various operation cycles and state transition in CDRAM will be described.

[Correspondence Between External Signals and Operation Cycles]

As described above, control signals except output enable signal G# and addresses Aa and Ac are latched at a rising edge of external clock signal K. The states of respective signals are arbitrarily (D.C) except set up time and hold time are necessary before and after a rising edge of the external clock K. In accordance with the external clock synchronizing method, it is not necessary to take cycle time margin derived from skew of address signals and the like into consideration, and the cycle time can be reduced. Thus, a CDRAM operating at high speed can be provided.

Output enable signal G# controls state of outputs from output buffer and output register included in input/output circuit 274 shown in FIG. 18. When output enable signal G# is at "H", output data is in a high impedance state (Hi-Z). When output enable signal G# attains to active state, that is, "L", data is output. The operation modes of CDRAM are as shown in a table of FIG. 72. The respective operation modes together with the timings thereof will be described.

In the standby state, chip select signal E# and refresh designating signal REF# are both set to "H" at a rising edge of external clock signal K, and remaining control signals CH#, CI#, CR# and W# are at arbitrary states. In the standby state, memory operation is not carried out at all in CDRAM.

No. 1: cache hit write cycle

Figure 77:
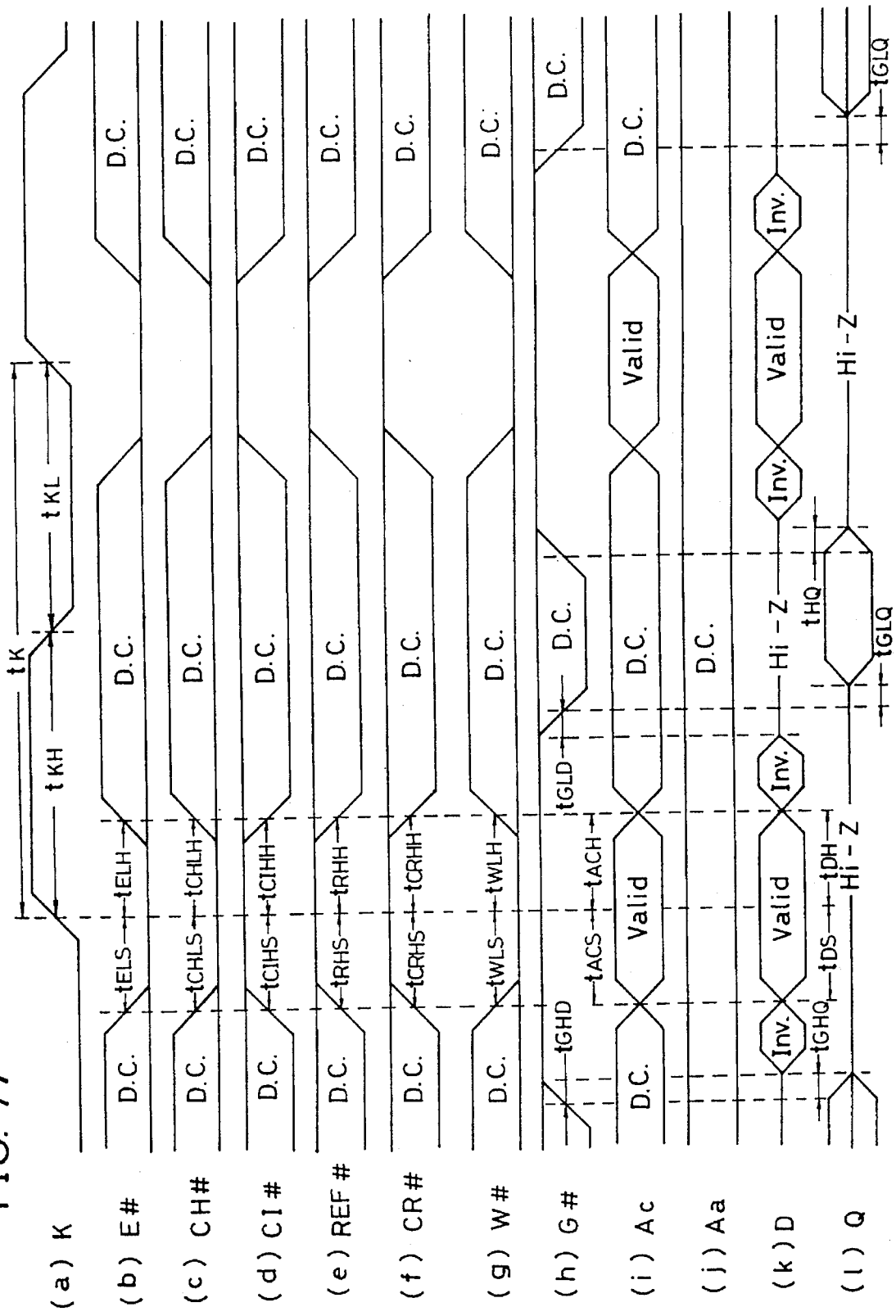
FIG. 77 is a diagram of signal waveforms showing timings of control signals in a cache hit write cycle of the semiconductor memory device in accordance with the present invention.

FIG. 77 shows timings of various signals in cache hit write cycle. External clock signal K has a cycle time tk. Cycle time tk includes an H pulse width tKH at which external clock signal K is at "H", and a L pulse width tKL at which external clock signal K is at "L". A cache hit write cycle is a cycle for writing data to SRAM cache. When this state is selected, chip select signal E# is set to "L", cache hit signal CH# is set to "L", cache hit inhibition signal CI# is set to "H", command register signal CR# is set to "H", write enable signal W# is set to "L" and output enable signal G# is set to "H" at a rising edge of external clock signal K.

At this state, an address for SRAM 200 is latched as valid, and access to SRAM is carried out in accordance with the address Ac for the SRAM. At this time, an address Aa for the DRAM is arbitrary (D.C). At a rising edge of the external clock signal K, input data D is made valid, and valid write data is written to SRAM cell selected by the SRAM address Ac. Since access to the cache memory SRAM is at high speed, writing is completed in 1 clock cycle of external clock signal K as shown in FIG. 77. Namely, time required for cache hit writing is the clock cycle time tK.

Although output data Q changes in response to an arbitrary state of output enable signal G# in FIG. 77, this means that output data appears corresponding to the "H" and "L" levels of the output enable signal G#. FIG. 77 shows set up times and hold times of respective control signals and address signals. The set up time is necessary for setting surely the control signal or addresses at an established state by the time of the rising edge of external clock signal K. The hold time is necessary for ensuring operation by holding the signal for a constant time period from a rising edge of the external clock signal K. The set up time and the hold time will be described briefly.

Chip select signal E# includes a set up time tELS which is necessary when it is set to "L", a set up time tEHS which is necessary when it is set to "H", a hold time tELH necessary when it changes to "L", and a hold time tEHH which is necessary when it changes to "H".

To the cache hit signal CH#, a set up time tCHLS which is necessary when it change to "L", a set up time tCHHS which is necessary when it is changed to "H", a hold time tCHLH which is necessary when it is changed to "L" and a hold time tCHHH which is necessary when it is changed to "H" are set.

Cache inhibition signal CI# includes set up times tCILS and tCIHS which are necessary when it is changed to "L" and to "H", respectively, and hold times tCILH and tCIHH which are necessary when it is changed to "L" and to "H", respectively.

The command register signal CR# includes set up times tCRLS and tCRHS which are necessary when it is changed to "L" and to "H", respectively, and hold times tCRLH and tCRHH which are necessary when it is changed to "L" and "H".

Refresh signal REF# includes set up times tRLS and tRHS which are necessary when it is changed to "L" and to "H", respectively, and hold times tRLH and tRHH which are necessary when it is changed to "L" and to "H", respectively.

Write enable signal W# includes set up times tWLS and tWHS which are necessary when it is changed to "L" and "H", respectively, and hold times tWLH and tWHH which are necessary when it is changed to "L" and "H", respectively. The address Ac for SRAM includes a set up time tACS which is necessary for determining the state thereof as valid, and a hold time tACH which is necessary when it is valid.

The address Aa for DRAM includes a set up time tAAS which is necessary to a rising edge of external clock signal K at which it is determined valid, and a hold time tAAH which is necessary after it is determined to be valid.

As to write data D, a set up time tDS required for valid data, and a hold time tDH required for valid data are necessary.

As to output enable signal G#, time tGHD necessary from the time at which output is disabled to the time when data input pin is activated, a delay time tGLD which is necessary from the time at which data input pin is set to the high impedance state to the time when signal G# is changed to "L", time tGLQ which is necessary from the time when it is changed to "L" to the time when the output pin is activated, and time tGHQ which is necessary from the time when it is changed to "H" to the time when the output pin is set to the high impedance state are set.

As to access time, an access time tGLA from the time when output enable signal G# attains to "L" to an output of valid data, access time tKLA from the time when external clock signal K attains to "L" to an output of valid data, an access time tKHA from the time when external clock signal K attains to "H" to the output of valid data, an access time tKHAR from the time when external clock signal K attains to "H" in registered output mode to the output of valid data, and an array access time tKHAA necessary from the time when external clock signal K attains to "H" to the time when DRAM is accessed and valid data are output are set.

Referring to FIG. 77, after a lapse of tGHD from a rising edge of output enable signal G#, the write data D is regarded as invalid.

The cycle time of the CDRAM of the present invention is set to 10 nS to 20 nS, as an example. Array access time tKHAA is set to 70 to 80 ns. Various set up times and hold times are set to several nano seconds.

No. 2T: Cache hit read cycle (transparent output mode)

Figure 78:
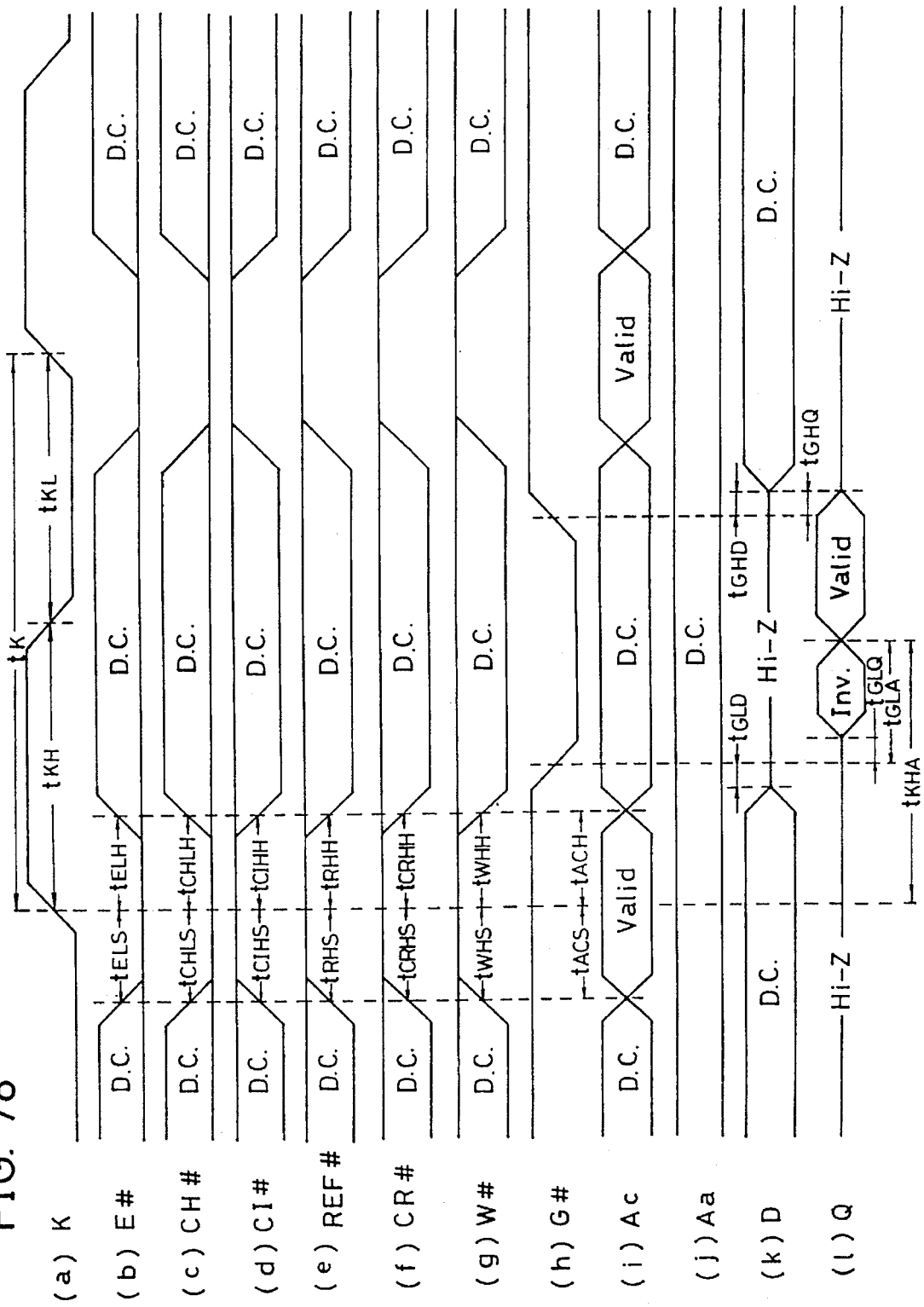
FIG. 78 is a diagram of signal waveforms showing timings of various external signals for effecting a cache hit read cycle in a transparent output mode of the semiconductor memory device in accordance with the present invention.

FIG. 78 shows timings of cache hit read cycle in the transparent output mode. As described above, the output mode includes transparent output mode, latched output mode and registered output mode. Designation of the output mode is carried out by the command register. Referring to FIG. 78, when a cache hit read cycle is set, chip select signal E# and cache designating signal CH# are both set to "L" at a rising edge of the external clock signal K, and cache hit inhibition signal CI#, refresh designating signal REF#, command register signal CR# and write enable signal W# are set to "H".

In this state, an address Ac for the SRAM is made valid at the rising edge of the external clock signal k, and a SRAM cell is selected in accordance with this valid address Ac. In transparent output mode, data of the SRAM cell designated by the valid address Ac is output in this clock cycle. In transparent output mode, valid output data Q is output after a lapse of tKHA from the rising edge of the external clock K or after a lapse of time tGLA from a falling edge of output enable signal G#, which is later.

When output enable signal G# falls to "L" before the time tKHA, invalid data is continuously output until the time tKHA has lapsed. In the cache hit read cycle, write data is set to high impedance state (Hi-Z), and the address Aa from the DRAM may be set to any state, since it is not used.

No. 2L: Cache hit read cycle (latched output mode)

Figure 79:
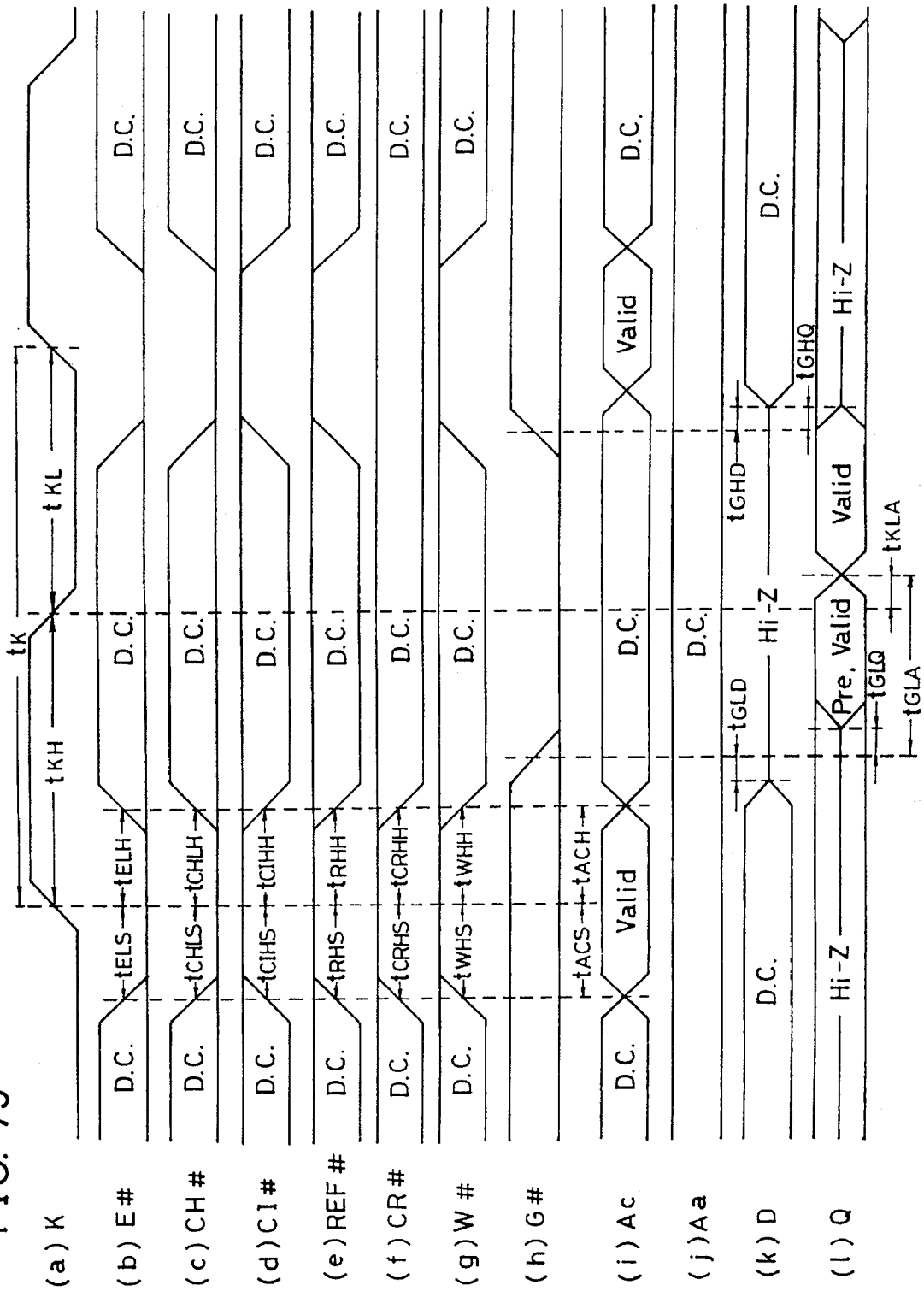
FIG. 79 is a diagram of signal waveforms showing timings of various external signals when the semiconductor memory device in accordance with the present invention is operated in a cache hit read cycle of the latch output mode.

FIG. 79 shows timings in cache hit read cycle of latched output mode. The difference between latched output mode and transparent output mode is that when output enable signal G# falls to "L" before the access time tKHA, data of the SRAM cell which has been selected in the previous cycle (Pre.Valid) is output at first. Other signal timings are the same as those in transparent output mode shown in FIG. 78. In the latched output mode, invalid data (INV) is not output. Valid data only are output.

No. 2R: Cache hit read cycle (registered output mode)

Figure 80:
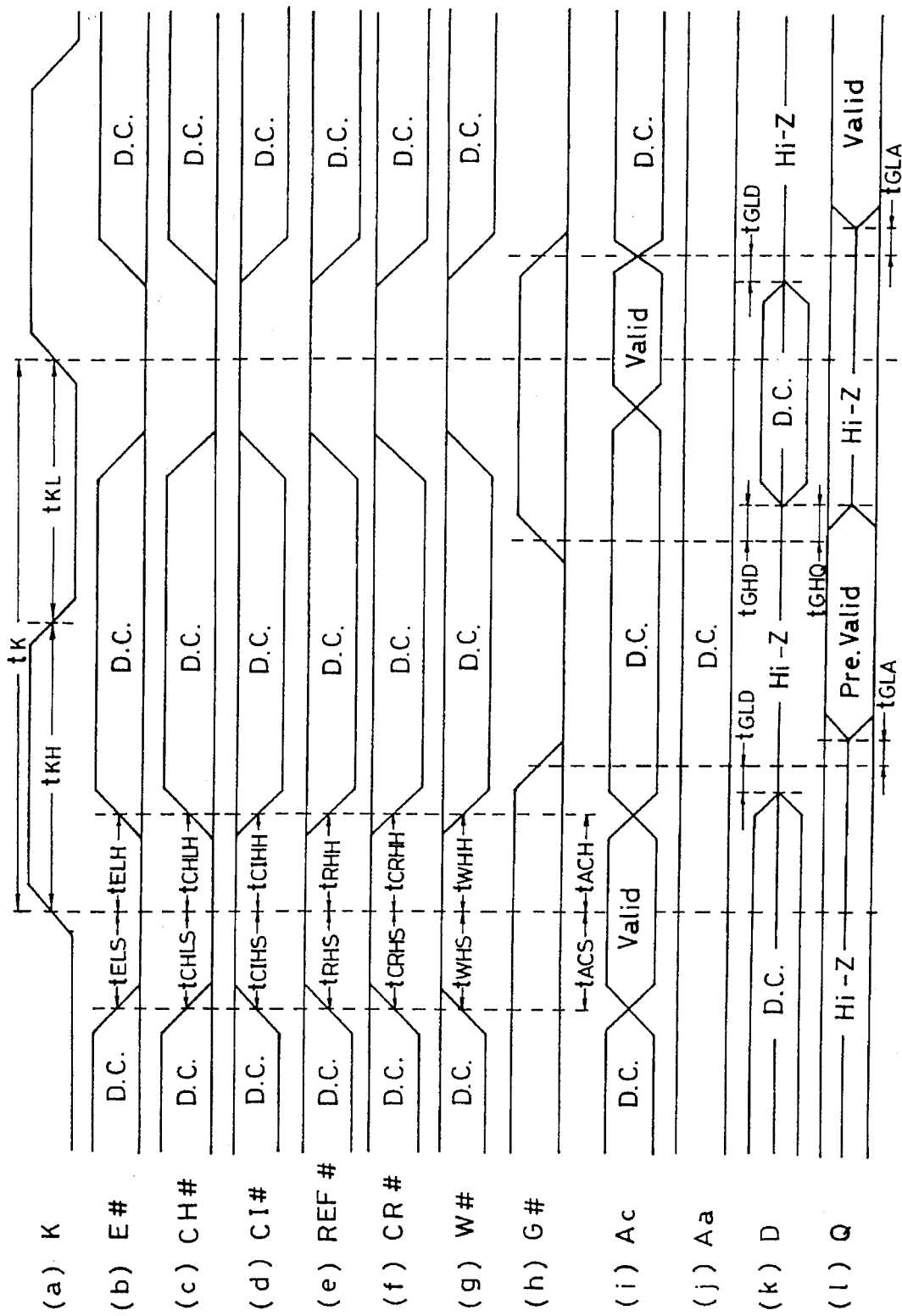
FIG. 80 is a diagram of signal waveforms showing timings of various external signals for operating the semiconductor memory device in accordance with the present invention in a cache hit read cycle in the register output mode.

FIG. 80 is a timing diagram of the cache hit read cycle in register output mode. Timings of external control signals in the cache hit read cycle of the registered output mode are the same as those in the transparent output mode and in the latched output mode shown in FIGS. 78 and 79. In the registered output mode, valid data of the previous cycle (Pre.Valid) is output after the lapse of tKHAR from the rising edge of external clock signal K or after a lapse of time tGLA from a falling edge of output enable signal G#, which is later. In registered output mode, invalid data is not output. Register output mode is suitable for pipeline operation.

Switching of the above described output modes is realized by controlling operation of an output register included in input/output circuit 274 shown in FIGS. 18 and 66 (see FIG. 66).

No. 3: Copy back cycle

Figure 81:
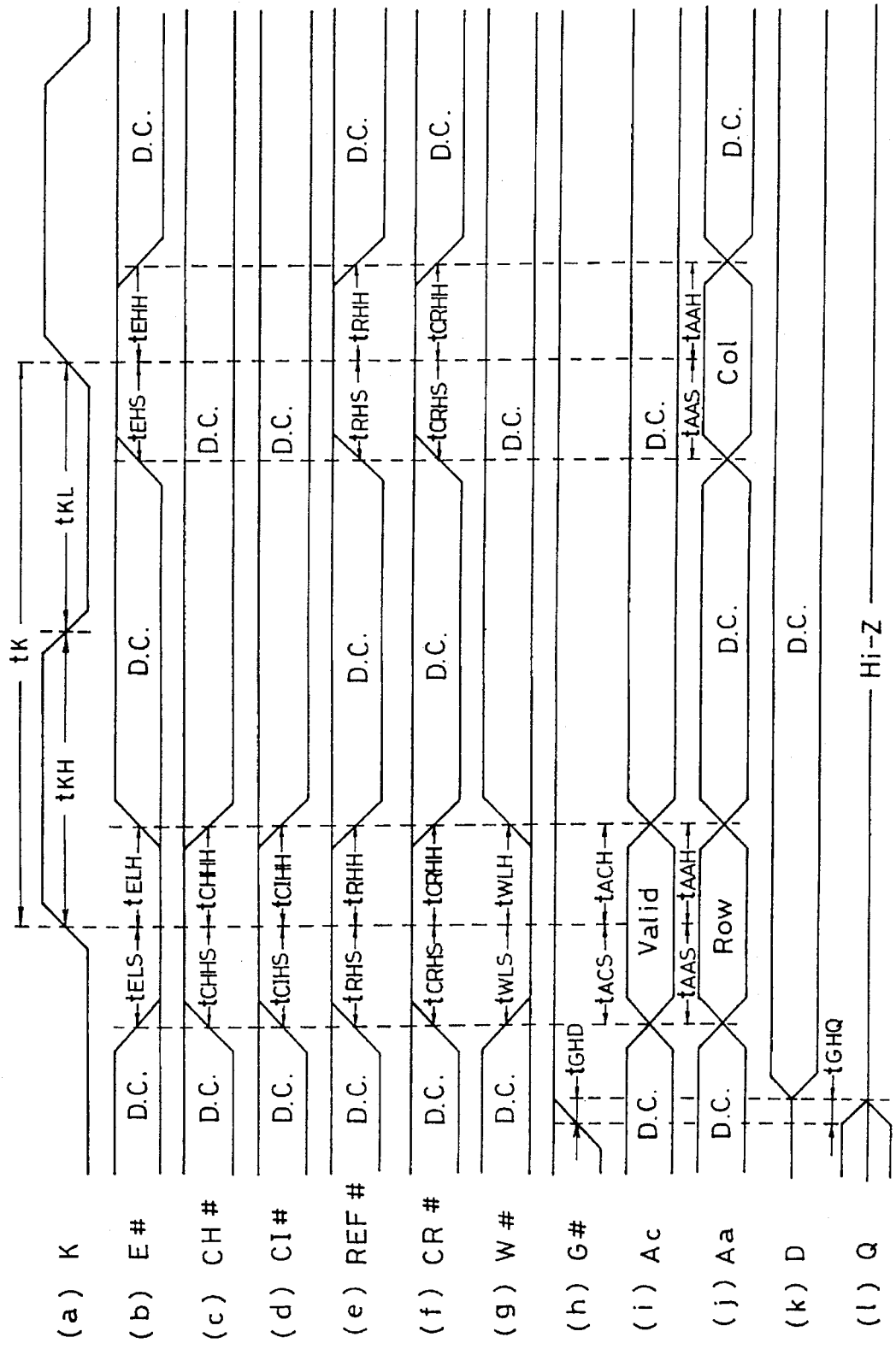
FIG. 81 is a diagram of signal waveforms showing timings of various external signals for operating the semiconductor memory device in accordance with the present invention in a copy back cycle.

FIG. 81 shows timings of various signals in copy back cycle. The copy back cycle is a cycle for transferring data from cache (SRAM) to array (DRAM), and it is carried out as a first cycle at a time of a miss hit. In the copy back cycle, chip select signal E# and write enable signal W# are both set to "L", and cache hit signal CH#, cache inhibition signal CI#, refresh designating signal REF#, command register signal CR# and output enable signal G# are set to "H" at a rising edge of external clock signal K. In the copy back cycle, an array address Aa must be input to DRAM for selecting the memory cell. A row address (Row) and the column address (Col) are multiplexed and applied as the array address Aa. An array row address is latched at a first rising edge of external clock signal K, and an array column address is latched at a second rising edge of external clock signal K. At the second rising edge of external clock signal K, cache hit designating signal CH#, cache inhibition signal CI#, write enable signal W# and cache address (address to SRAM) Ac may be at arbitrary states.

Write enable signal W# has been set to "L" at the first rising edge of external clock signal K, and external input data D changes from high impedance state to an arbitrary state. External output data Q is set to high impedance state, since output enable signal G# is at "H".

No. 4: Block transfer cycle

Figure 82:
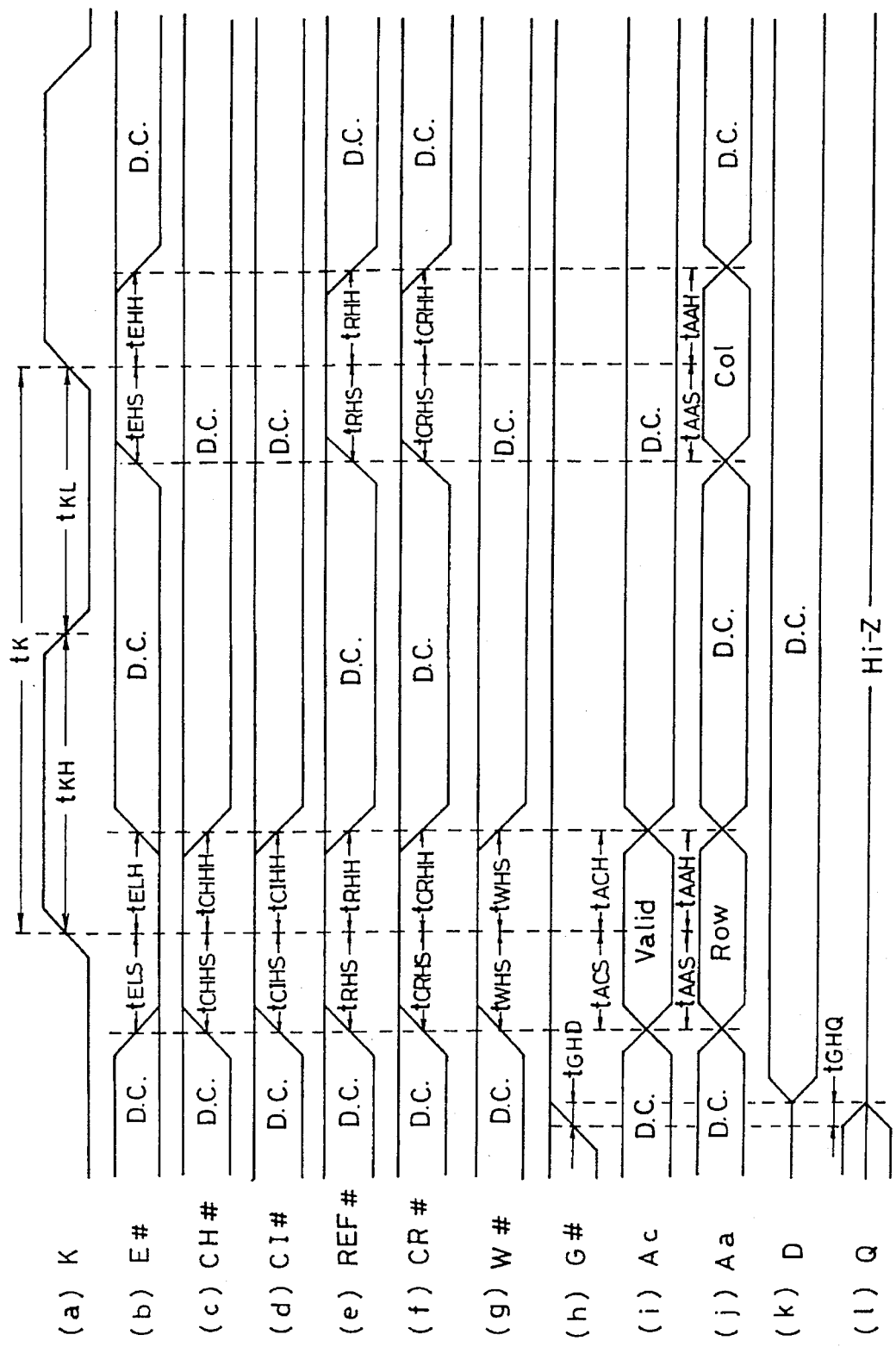
FIG. 82 is a diagram of signal waveforms showing timings of various external signals for operating the semiconductor memory device in accordance with the present invention in a block transfer cycle.

In block transfer cycle shown in FIG. 82, data block are transferred at one time from the array to the cache (SRAM) before, after or simultaneously with copy back operation. Timing conditions which are the same as in the copy back cycle shown in FIG. 81 are satisfied in the block transfer cycle, except that write enable signal W# is set to "H" at a first rising edge of the external clock signal K.

More specifically, when write enable signal W# is set to "L" at the first rising edge of external clock signal K at a cache miss (miss hit), the copy cycle is started. If write enable signal W# is set to "H", block transfer cycle from the array to the cache is set.

No. 5: Array write cycle

Figure 83:
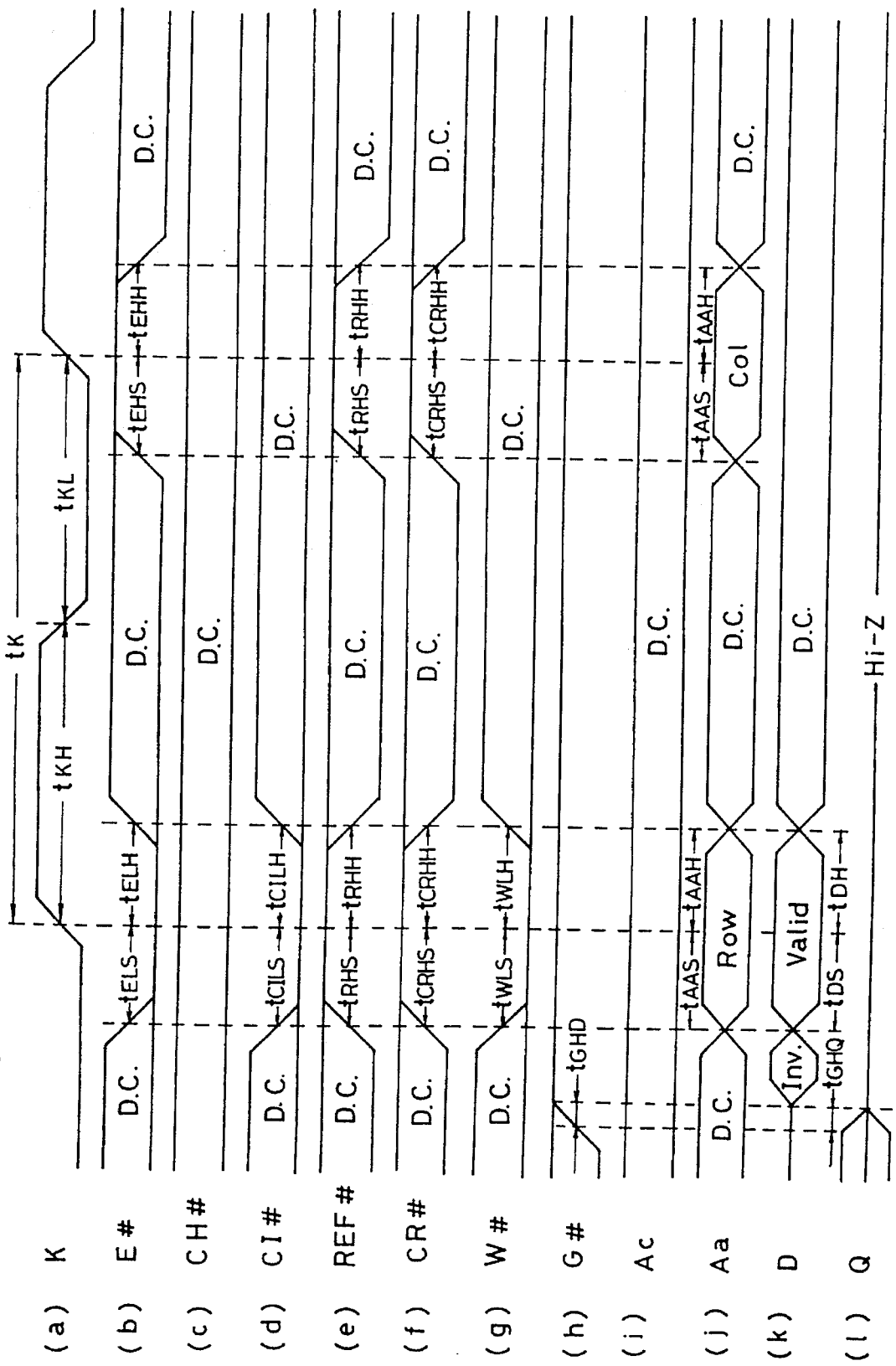
FIG. 83 is a diagram of signal waveforms showing timings of various external signals for setting an array write cycle of the semiconductor memory device in accordance with the present invention.

The array write cycle shown in FIG. 83 is a cycle for setting a mode in which CPU directly accesses to the array for writing data. A DRAM cell in the array is selected by array address Aa. At this time, data may be written through access switching circuit 310 of bi-directional transfer gate circuit 305 as shown in FIG. 20. Alternatively, data may be written through SRAM bit line pair SBL, the bi-directional transfer gate BTG and global I/O line pair GIO as shown in FIGS. 27–28, 31 and 46, without providing access switching circuit 310. If the structure is adapted to write data through SRAM bit line pair SBL in SRAM array, lower bits of array address Aa may be applied to column decoder SCD of SRAM as a block address. A column selecting signal may be applied from DRAM column decoder to SRAM selecting gate.

Array write cycle is designated by setting chip select signal E#, cache inhibition signal CI# and write enable signal W# to "L" and by setting refresh designating signal REF# and output enable signal G# to "H" at the first writing edge of external clock signal K, as shown in FIG. 83. Cache designating signal CH# may be at an arbitrary state. In array write cycle, array address Aa is latched as a row address (row) at the first rising edge of external clock signal K, and array address Aa is latched as a column address (Col) at the second rising edge external clock signal K. Since the cache is not accessed at this time, address Ac for the cache may be at an arbitrary state. External write data D is latched at the first rising edge of external clock signal K. External output data Q is set to high impedance state.

In the cache system shown in FIGS. 75 and 76, only 16 bits of addresses are applied to DRAM 100, and column selecting operation in blocks is carried out in accordance with the block address in SRAM. FIGS. 75 and 76 show a structure at a cache system and the figures do not show the structure of the array access. However, the structure may use 4 bits of block addresses as column selecting addresses for DRAM 100, when cache inhibition signal CI# attains to "L" at array accessing.

No. 6: Array read cycle

Figure 84:
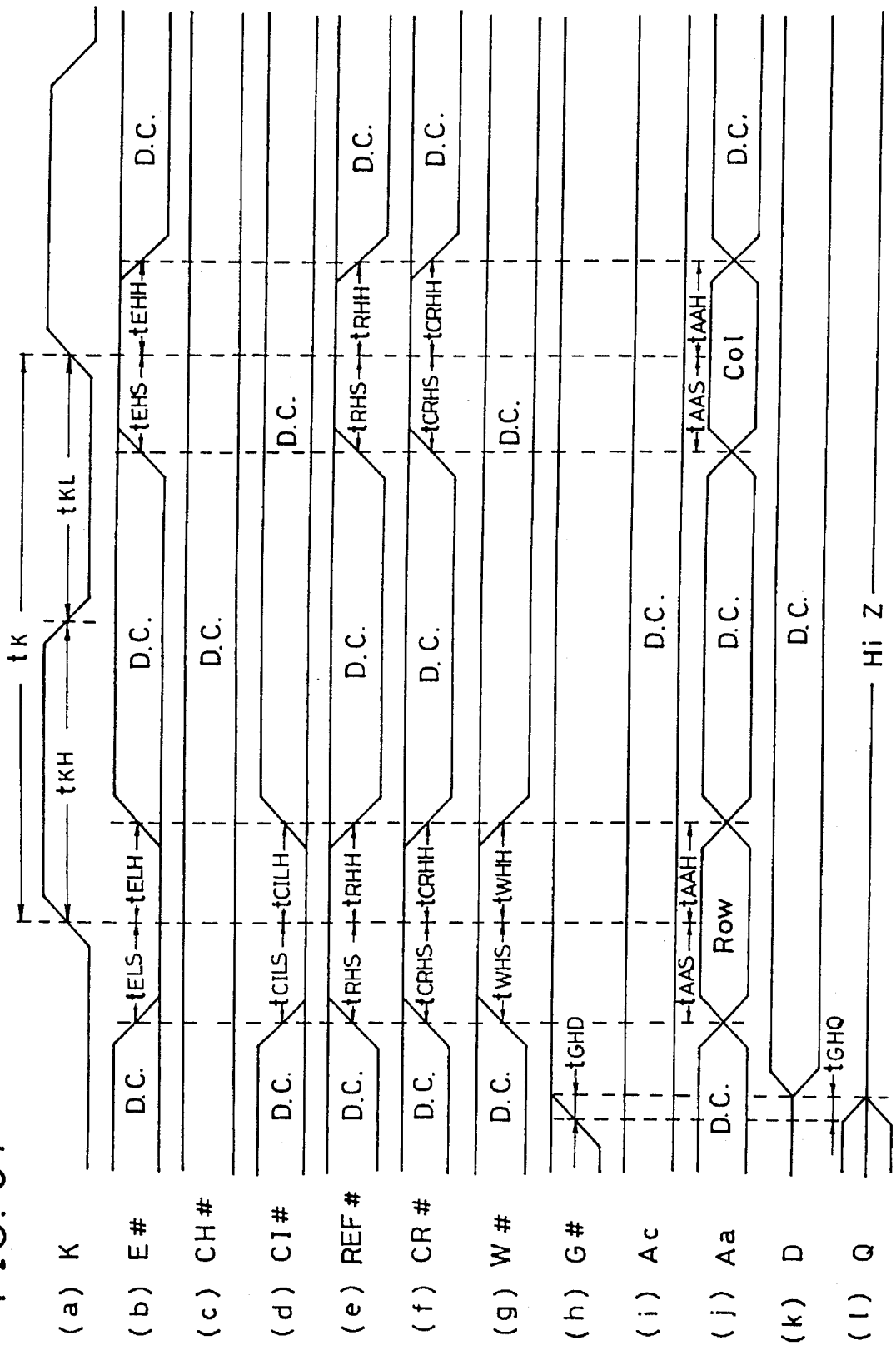
FIG. 84 is a diagram of signal waveforms showing timings of various external control signals when an array read cycle is set in the semiconductor memory device in accordance with the present invention.

Array read cycle shown in FIG. 84 is a cycle for setting a mode in which CPU directly accesses to the array for reading data. Array read cycle is designated by setting chip select signal E# and cache inhibition signal CI# to "L" and by setting refresh designating signal REF#, command register signal CR#, write enable signal W# and output enable signal G# to "H" at the first rising edge of external clock signal K. At the second rising edge of external clock signal K, chip select signal E#, refresh designating signal REF# and command register signal CR# are set to "H", and cache inhibition signal CI# and write enable signal W may be at an arbitrary state. The cache hit designating signal CH# may be at an arbitrary state in array read cycle. Output enable signal G# is maintained at "H". Array address Aa is latched as a row address at the first rising edge of external clock signal K, and array address Aa is latched as a column address at the second rising edge of the external clock signal K. External input data D may be at an arbitrary state, and external output data Q is set to high impedance state. Array access cycles (array write cycle and array read cycle) are set by setting cache signal CI# to "L" at the first rising edge of the external clock signal K. The array access cycles are cycles for setting modes in which CPU directly accesses to the array. Data reading/writing are not actually carried out in the array write cycle and array read cycle.

In operations such as copy back operation, block transfer operation and array access operation which require reading/writing of data in the array, selection of a word line in the DRAM array, detection and amplification of data in the selected cell by sense amplifiers, restore operation of data, and RAS precharge are necessary. Therefore, these operations requiring reading/writing of data in the array takes several clock cycles. When we represent the cycle time of the DRAM by tA and the cycle time of the external clock signal K as tK, external clock cycles of m=ta/tK is necessary for the array access. m cycles correspond to a wait time for the CPU. Timings when the CPU is kept in a waiting state in reading/writing data and in selecting cells in the array will be described.

No. 7: Array active cycle

Figure 85:
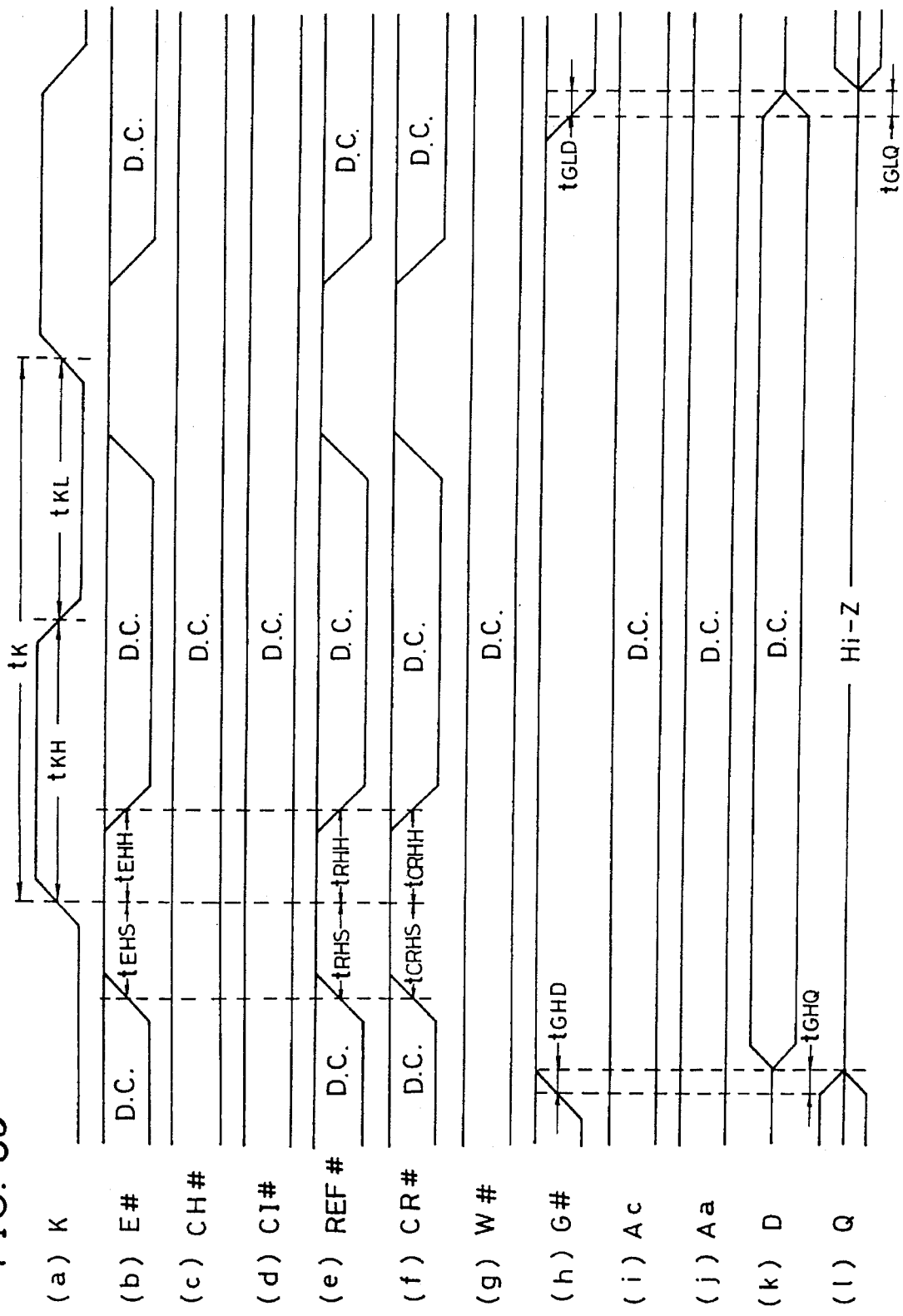
FIG. 85 is a diagram of signal waveforms showing timings of various external control signals for operating the semiconductor memory device in accordance with the present invention in an array active cycle.

In array active cycle shown in FIG. 85, row selecting operation, column selecting operation and data writing/reading are carried out in accordance with the applied array address Aa. In array active cycle, chip select signal E#, refresh designating signal REF# and command register signal CR# are set to "H" at a rising edge of external clocks signal K, and output enable signal G# is fixed at "H" for this cycle. Cache hit signal CH#, cache inhibition signal CI# and write enable signal W# may be at an arbitrary state. External input data D may be at an arbitrary state and external output data Q is set at high impedance state in array active cycle.

No. 7QT: Array active cycle accompanied with transparent output mode

Control signals E#, CH#, CI#, REF#, CR# and W# are set in the same manner as in the array active cycle for designating the array active cycle in the transparent output mode. In the array active cycle in transparent output mode, when the output enable signal G# is set to "L", an output buffer is activated and valid data are output. In array active cycle of the transparent output mode, data of the DRAM cell corresponding to the array address Aa set in array read cycle shown in FIG. 84 is output.

No. 7QL: Array active cycle in latch output mode

Figure 86:
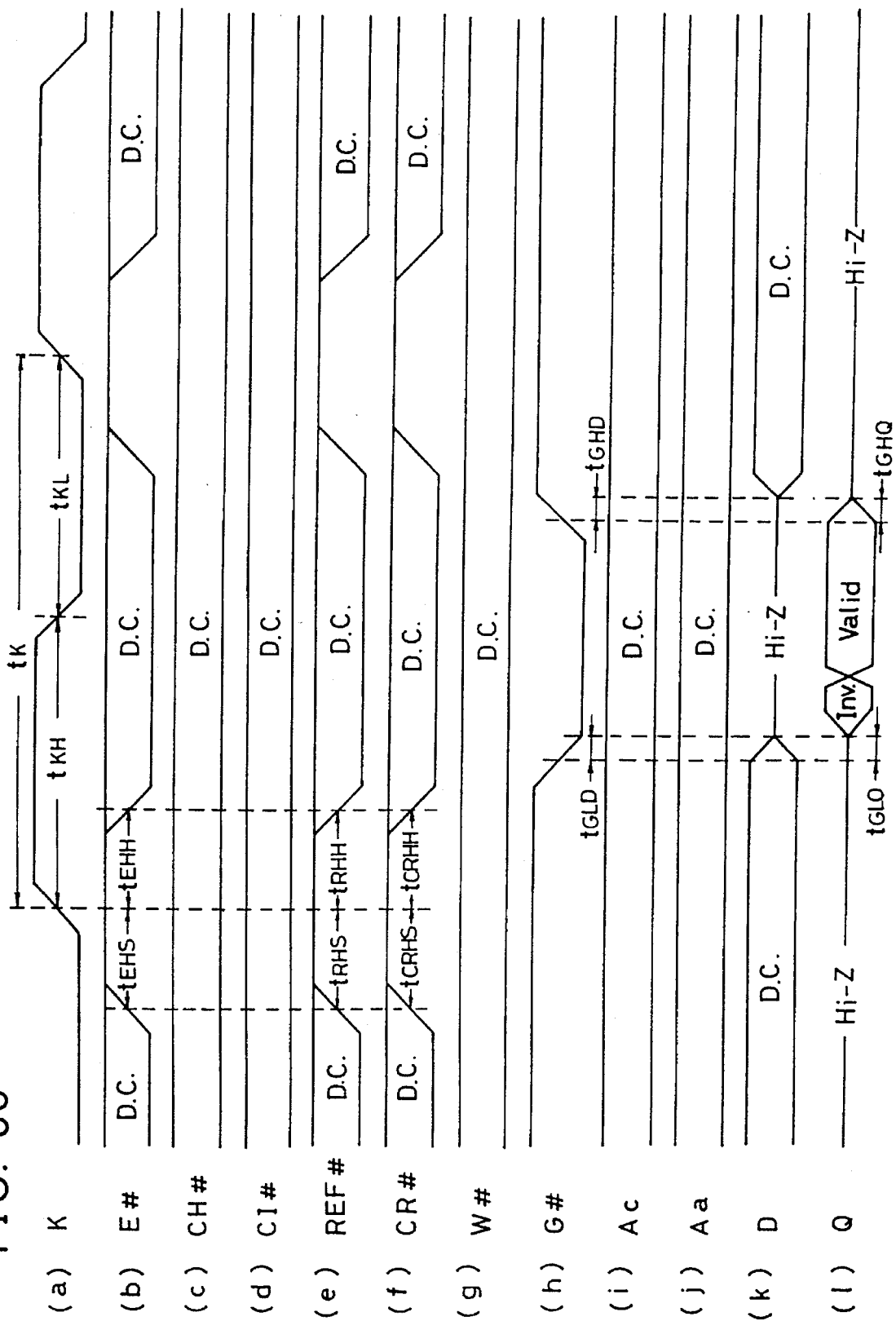
FIG. 86 is a diagram of signal waveforms showing timings of various external signals for operating the semiconductor memory device in accordance with the present invention in the array active cycle of the transparent output mode
Figure 87:
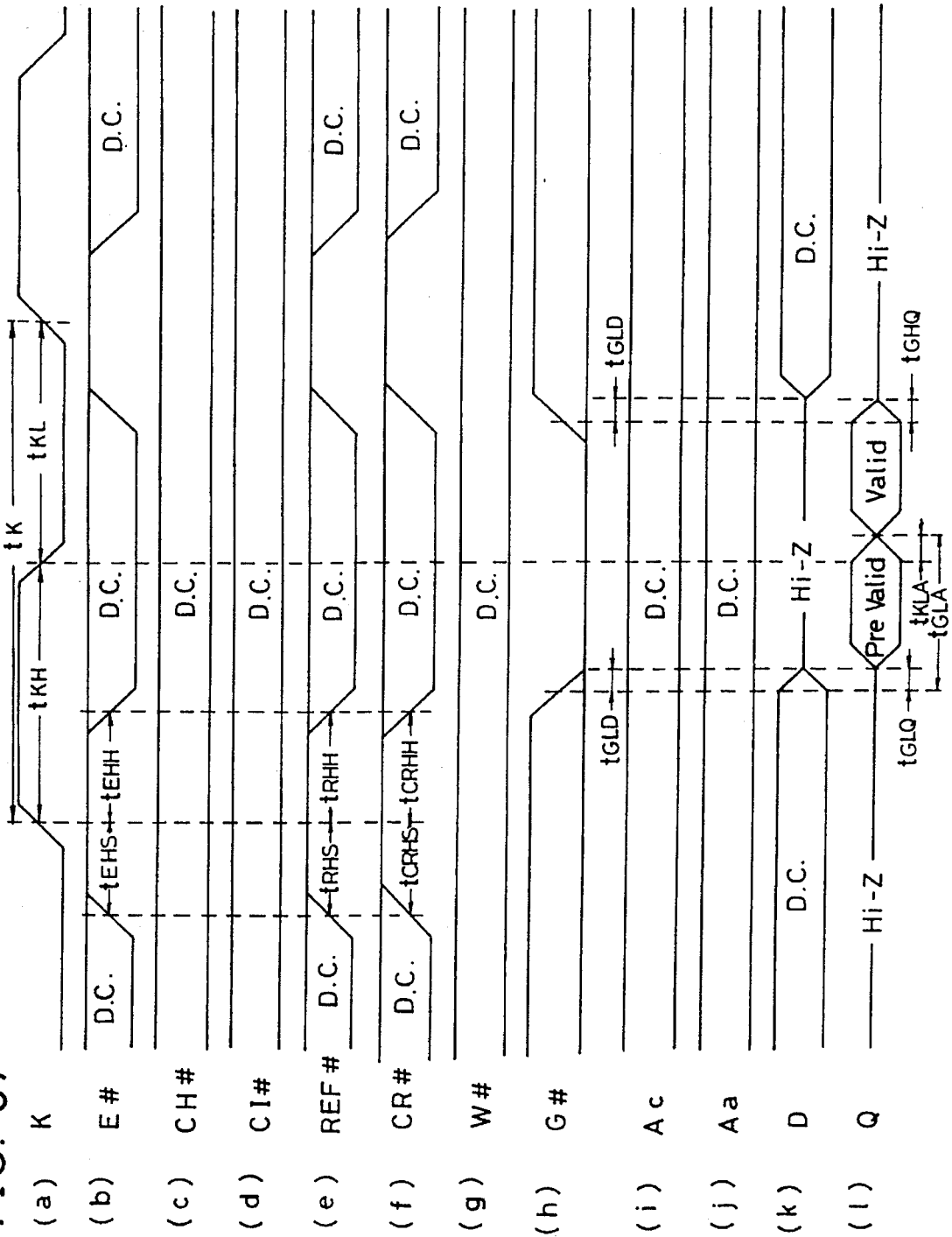
FIG. 87 is a diagram of signal waveforms showing timings of various external signals for operating the semiconductor memory device of the present invention in an array active cycle accompanied with the latch output mode.

Timings of control signals in array active cycle of the latch output mode shown in FIG. 87 are the same as those shown in FIG. 86. Data (latched in an output register) read in the previous access cycle (either a cache access cycle or array access cycle) is output at first, then data read in the present array access cycle is output.

No. 7QR: Array active cycle in register output mode.

Figure 88:
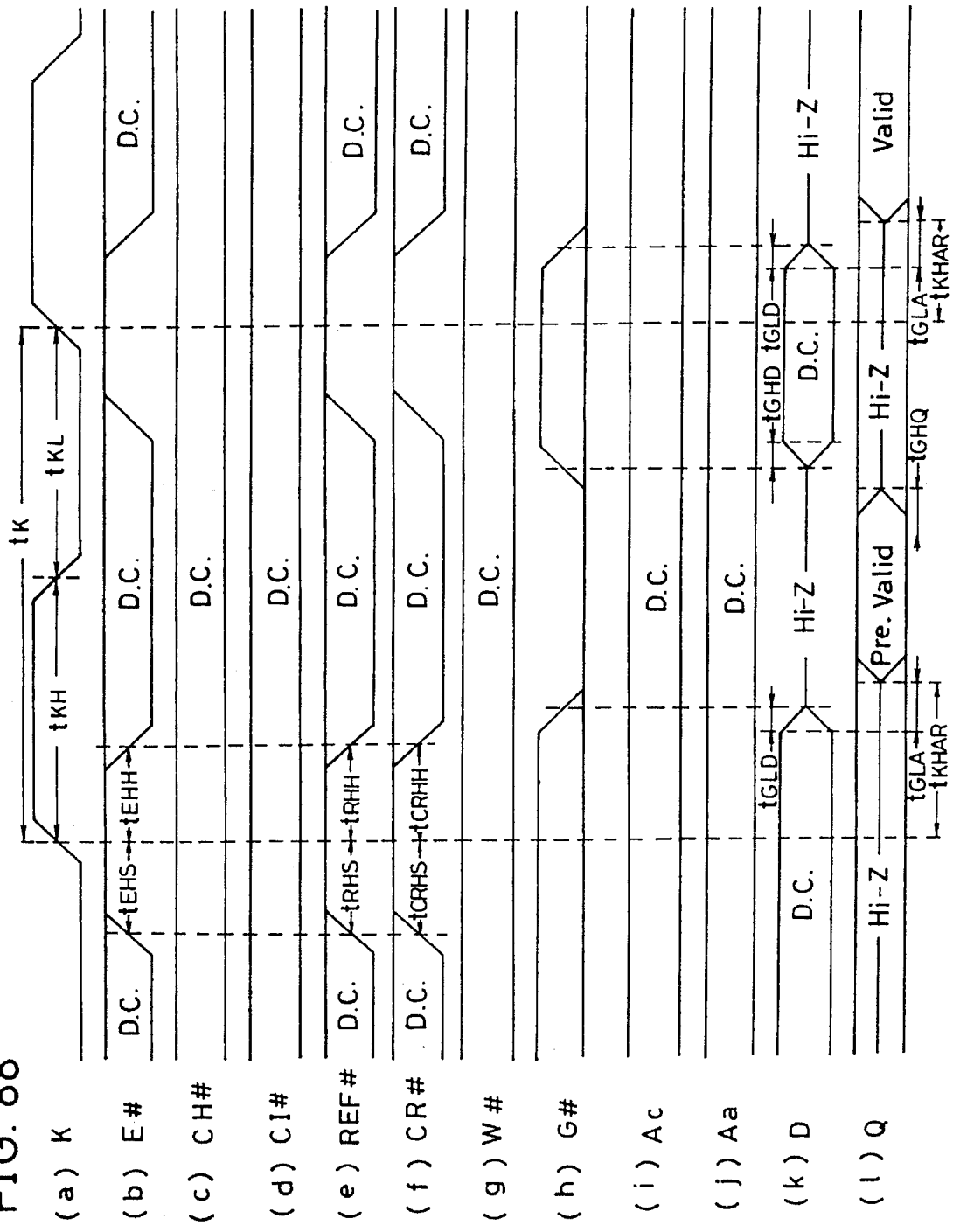
FIG. 88 is a diagram of signal waveforms showing timings of various external signals for operating the semiconductor memory device in accordance with the present invention in the array active cycle accompanied with the register output mode.

States of control signals in the array active cycle in register output mode shown in FIG. 88 are the same as those shown in FIGS. 86 and 87. In the array active cycle of the register output mode, when output enable signal G# which has been maintained at "H" is set to "L", external write data D is set to the high impedance state, and data read in the previous access cycle is output in the present cycle. In the register output mode array access cycle, when output enable signal G# falls from "H" to "L" at the next clock cycle, data read in the present array access cycle is output.

By combining cycles shown in FIGS. 84 to 88, output data Q in accordance with external addresses can be provided from the array.

Figure 89:
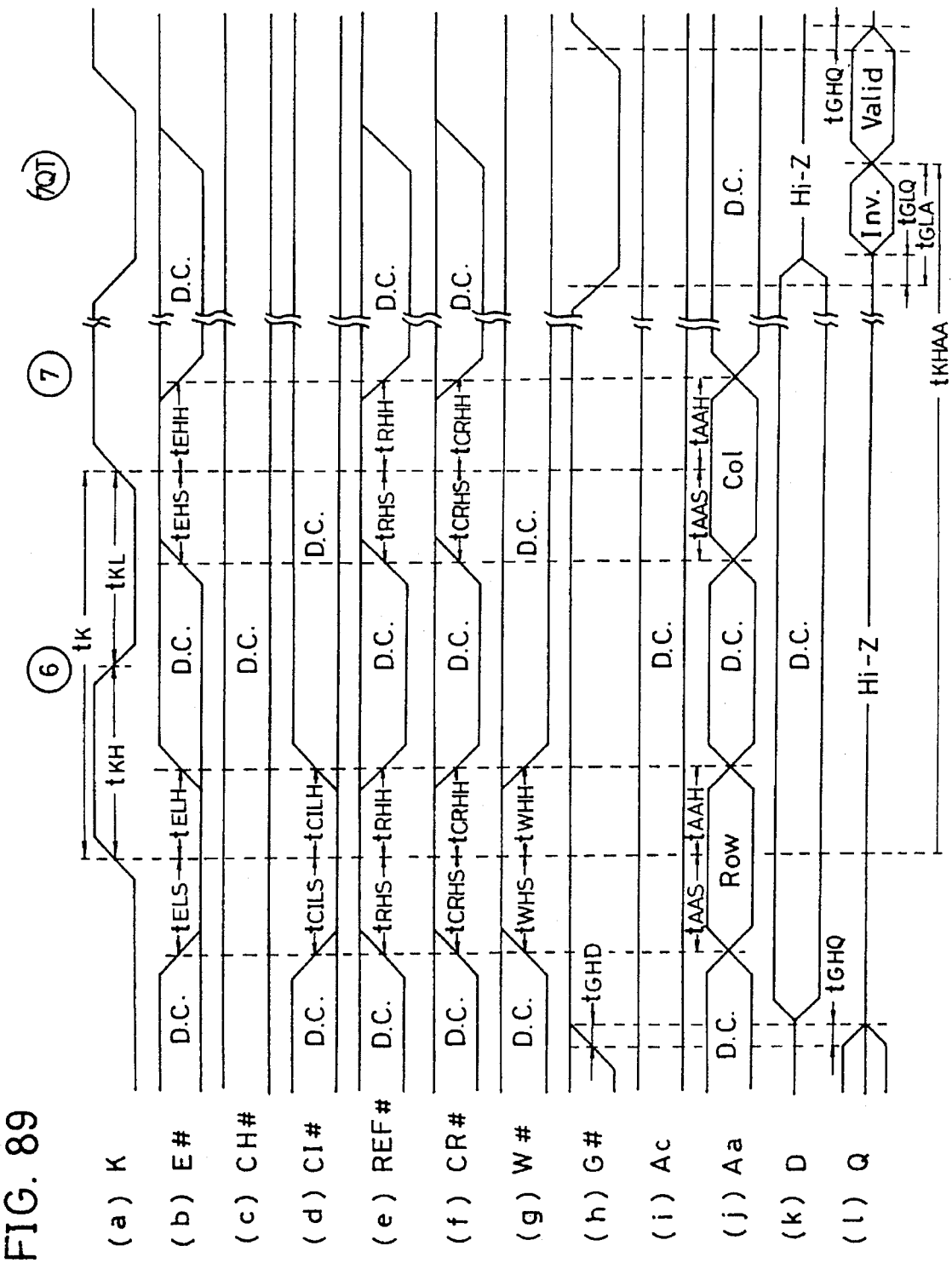
FIG. 89 is a diagram of signal waveforms showing timings of various external signals for operating the semiconductor memory device in accordance with the present invention in the array read cycle of the transparent output mode.

FIG. 89 shows the cycles executed when data are read from the array in transparent output mode. In FIG. 89, numerals in circles at the upper portion of the timing diagram correspond to numbers allotted to the above description of respective cycles.

In array reading operation in the transparent output mode, the array read cycle (No. 6) shown in FIG. 84 is executed. By this cycle No. 6, the array address Aa is successively taken as the row address and the column address at the rising edges of the external clock signal K. Thereafter, the array active cycle shown in FIG. 85 is carried out for a prescribed number of times, for selecting rows and columns in the DRAM array. Finally, the cycle No. 7 shown in FIG. 86 is executed, and by making output enable signal G# fall to "L", invalid data is output, and then valid data is output. In this case, access time tKHAA is approximately the same as the access time in a normal DRAM.

Figure 90:
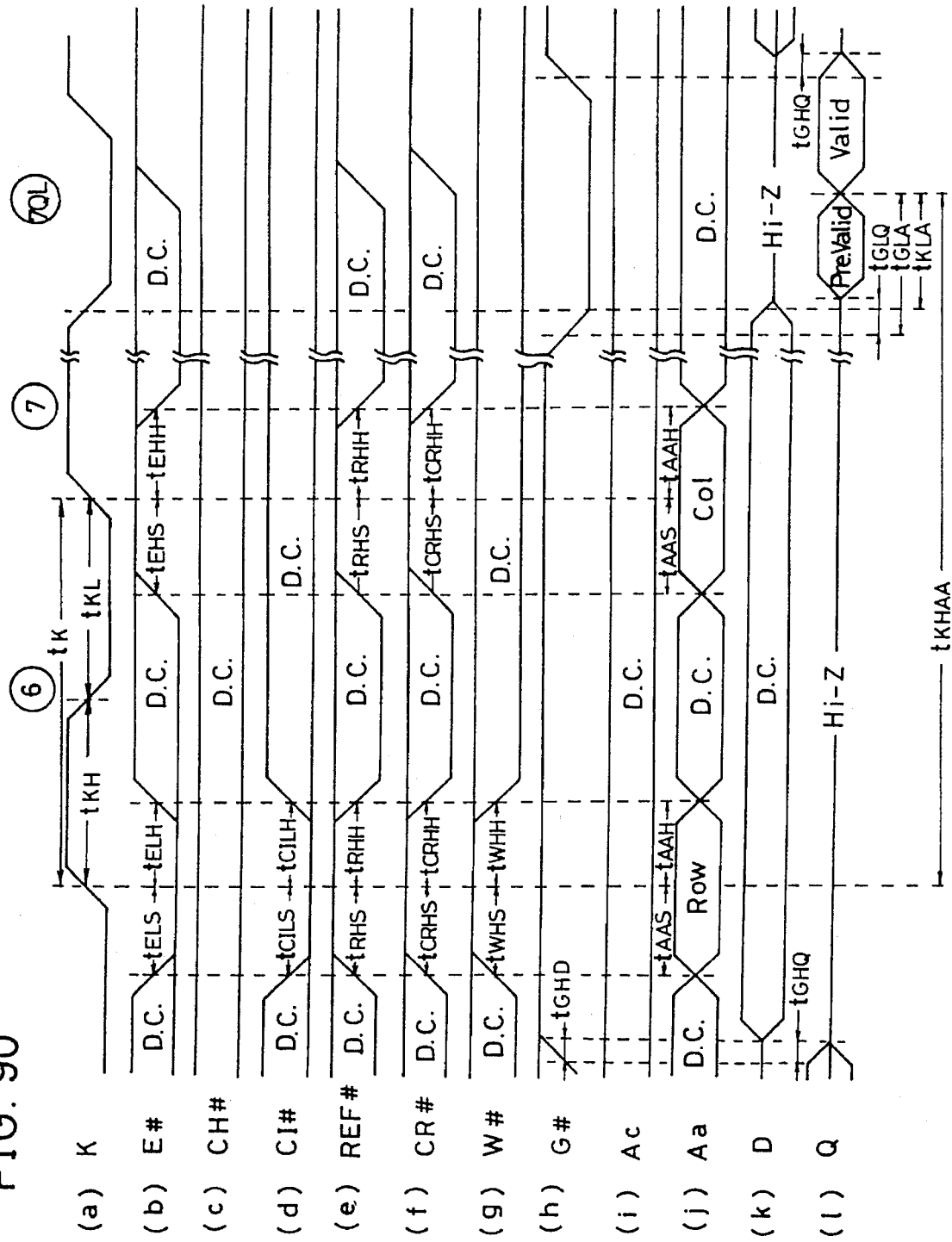
FIG. 90 is a diagram of signal waveforms showing timings of various external signals for operating the semiconductor memory device in accordance with the present invention in the array read cycle of the latch output mode.

FIG. 90 shows the cycles carried out when data are read from the array in the latch output mode. In the array reading operation in the latch output mode also, at first the array read cycle (No. 6) shown in FIG. 84 is executed, as in the array reading operation in the transparent output mode shown in FIG. 89, and mode for reading data from the array is set. After the array address Aa has been latched by this array read cycle (cycle No. 6), array active cycle shown in FIG. 85 (cycle No. 7) is carried out for a prescribed number of times. After the array active cycle (cycle No. 7), an array active cycle in the latch output mode (cycle No. 7QL) shown in FIG. 87 is executed. When output enable signal G# which has been set at "H" falls to "L" in this cycle No. 7QL, data read by the previous access is output, and then data of the memory cell to which access is requested in the present array read cycle is output. The access time tKHAA at this time corresponds to the time required from the first rising edge of the external clock signal K to the output of memory cell data (valid) to which access is requested in the present array access cycle.

Figure 91:
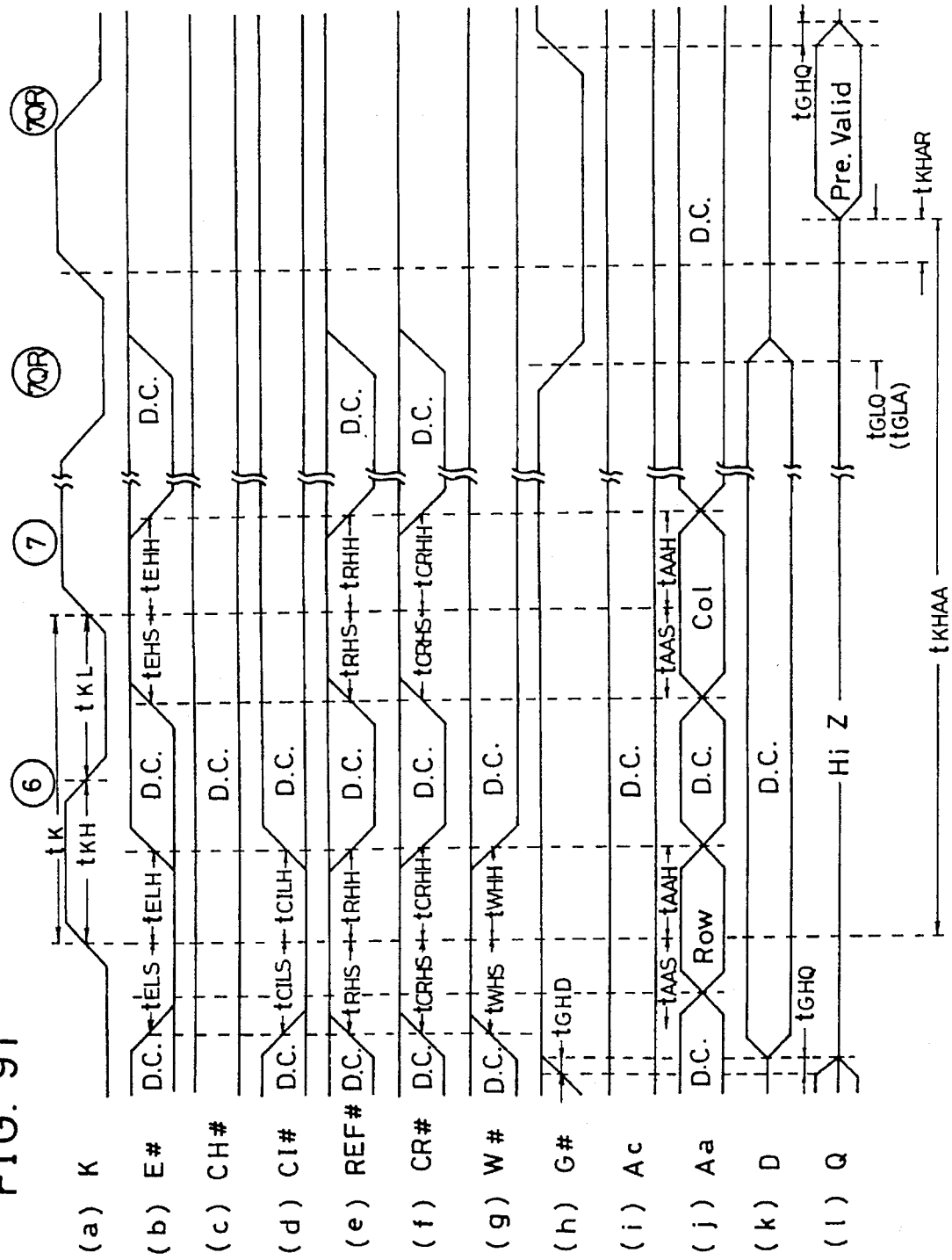
FIG. 91 is a diagram of signal waveforms showing timings of various external signals for operating the semiconductor memory device in accordance with the present invention in the array read cycle of the register output mode.

FIG. 91 shows cycles carried out when data are read from the array in register output mode. Referring to FIG. 91, first the cycle No. 6 is executed and array read mode is set. At a rising edge of external clock signal K, the array address Aa is time divisionally latched as the row address and the column address. Thereafter, the array active cycle of cycle No. 7 is carried out for a prescribed number of times, and then the array active cycle of cycle No. 7QR is executed. In this cycle No. 7QR is executed. In this cycle No. 7QR, after a time lapse of tQHA or tGLA which is later after the rise of the external clock signal K and after the fall of the output enable signal G# to "L", data read in the previous cycle is output as the output data Q. The access time tKHAA is the time from the first rising edge of the external clock signal K to the output of valid data in cycle No. 6.

The DRAM cells must be refreshed periodically. Setting of the refresh operation is done by an external refresh designating signal EF#. In the refreshing operation, a refresh address is generated from a refresh address counter (see counter circuit 293 of FIG. 18) in response to refresh designating signal REF# in the CDRAM, and DRAM cells are automatically refreshed in accordance with the refresh address. DRAMs having such automatic refreshing function have been known in the field of DRAMs. Timings of signals for refreshing will be described.

No. 8: Refresh cycle

Figure 92:
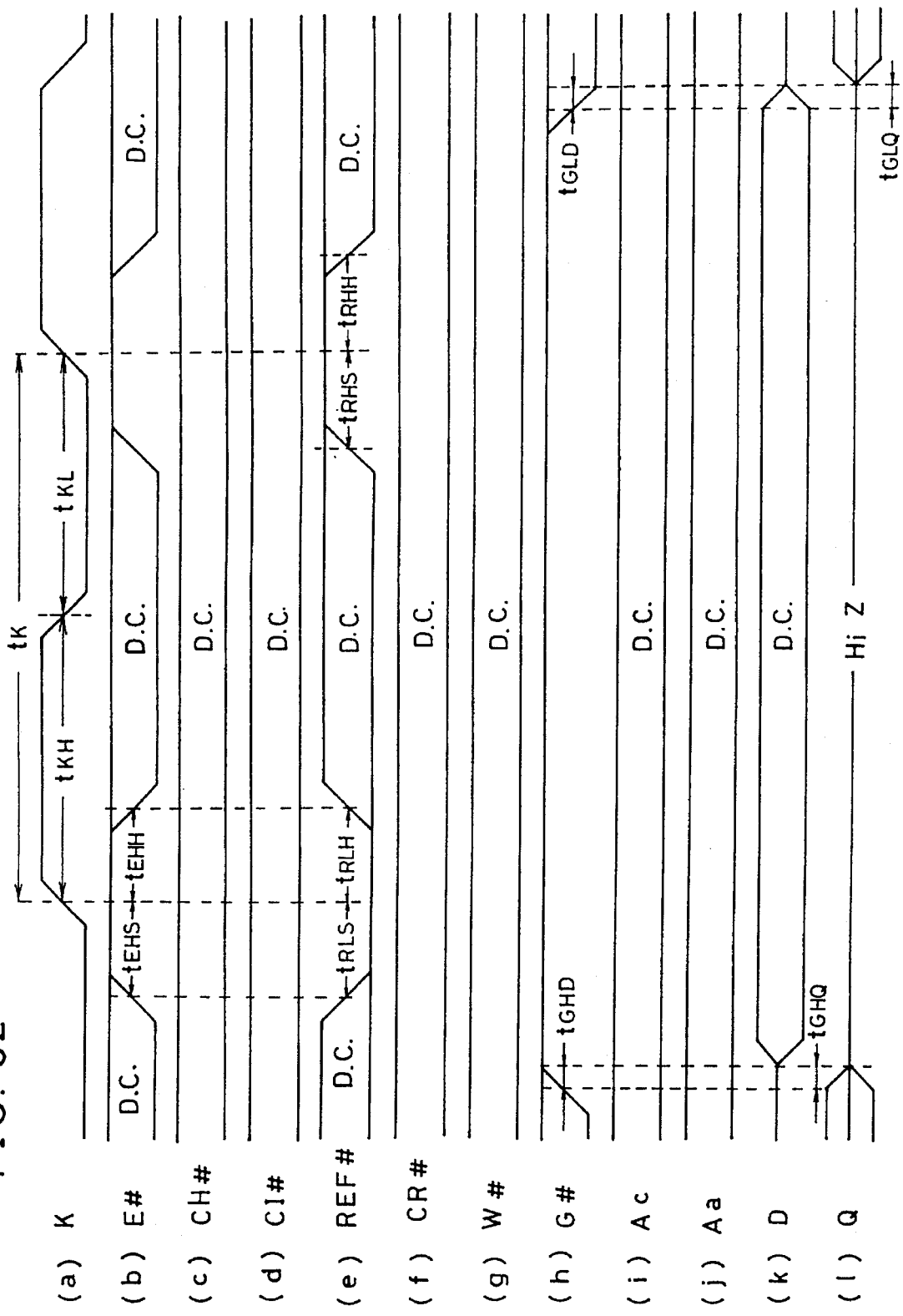
FIG. 92 is a diagram of signal waveforms showing timings of various external signals for effecting a refresh cycle of the semiconductor memory device of the present invention.

FIG. 92 shows signal timings of the refresh cycle. As shown in FIG. 92, refresh mode of the DRAM is set by setting chip select signal E# and refresh designating signal REF# to "H" and "L" at a rising edge of external clock signal K as shown in FIG. 92. When chip select signal E# is set to "H" and refresh designating signal REF# is set to "H" at a rising edge of the external clock signal K, refreshing of the DRAM is stopped. In the refresh cycle, other control signals CH#, CI#, CR# and W# may be at arbitrary states, and an output enable signal G# is set to "H". Therefore, the cache address Ac and array address Aa may be at arbitrary states. External input data D also may be set at an arbitrary state. External output data Q is set to a high impedance state.

Refreshing operation is effected only to the DRAM. Refreshing is not necessary in the SRAM. Therefore, cache can be accessed during the refreshing operation.

Timings when refreshing operation and access to the cache are simultaneously carried out will be described in the following.

No. 8W: Refresh cycle with cache hit writing

Figure 93:
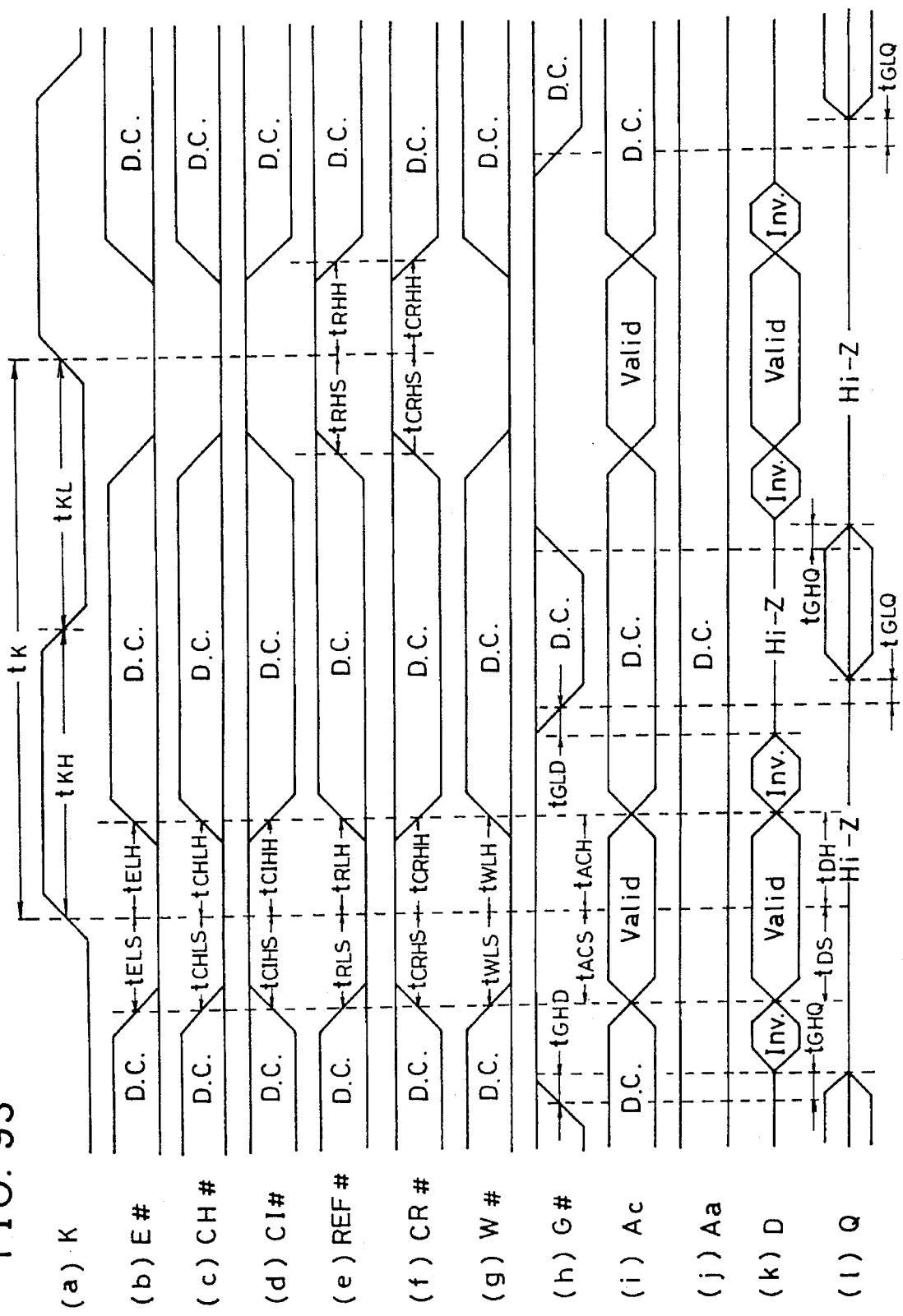
FIG. 93 is a diagram of signal waveforms showing timings of various external signals for effecting the refresh cycle together with the cache hit writing in the semiconductor memory device in accordance with the present invention.

In cycle No. 8W, in parallel to refreshing of the DRAM, writing of data to a corresponding SRAM cell is carried out when a cache hit occurs. Setting of the refresh cycle with the cache hit writing is set by setting chip select signal E#, cache hit signal CH#, refresh designating signal REF# and write enable signal W# to "L" and by setting cache inhibition signal CI# and output enable signal G# to "H" at a rising edge of external clock signal K as shown in FIG. 93. Thus a cache hit write cycle is set and refresh cycle is set. In the cache (SRAM), external write data D is taken and written to a corresponding SRAM cell position at a rising edge of external clock signal K, in response to active states of the cache hit designating signal CH# and write enable signal W#. In the DRAM, an internal refresh address counter is started by the refresh designating signal REF#, and refreshing operation is carried out in accordance with a refresh address from the counter.

When refresh designating signal REF# is set to "H" at a rising edge of external clock signal K, the cache hit write cycle (cycle No. 1) shown in FIG. 77 only is carried out, and refreshing operation of the DRAM is stopped.

No. 8RT: Refresh cycle with cache hit reading in transparent output mode

In cycle No. 8RT, cache hit reading is carried out in accordance with the transparent output mode, and DRAM is automatically refreshed. The cycle No. 8 is set by setting the chip select signal E#, cache hit signal CH# and refresh designating signal REF# to "L" to a rising edge of external clock signal K, and by setting cache inhibition signal CI#, command register signal CR# and write enable signal W# to "H". In SRAM cache, cache address Ac is taken and a corresponding SRAM cell is selected at a rising edge of external clock signal K in response to the designation of cache hit reading. When output enable signal G# falls to "L", valid output data Q is output after a lapse of a prescribed time period.

In the DRAM, automatic refreshing is carried out in response to refresh designating signal REF#. When refresh designating signal REF# is set to "H" at a rising edge of external clock signal K in refresh cycle with cache hit reading, automatic refreshing carried out in response to refresh designating signal REF# is stopped. Therefore, in this case, cache hit read cycle in the transparent output mode which is the same as the cycle No. 2T is carried out.

No. 8RL: Refresh cycle with cache hit read in latched output mode

In cycle No. 8RL shown in FIG. 9, cache hit reading in latch output mode is carried out together with automatic refreshing of the DRAM. Timing conditions of various control signals are the same as those shown in FIGS. 93 and 94. In the latch output mode, when a cache hit occurs, output enable signal G# falls to "L", then data access in the previous cycle is output, and successively data accessed in the present cycle is output.

No. 8RR: Refresh cycle with cache hit read cycle in registered output mode

Figure 95:
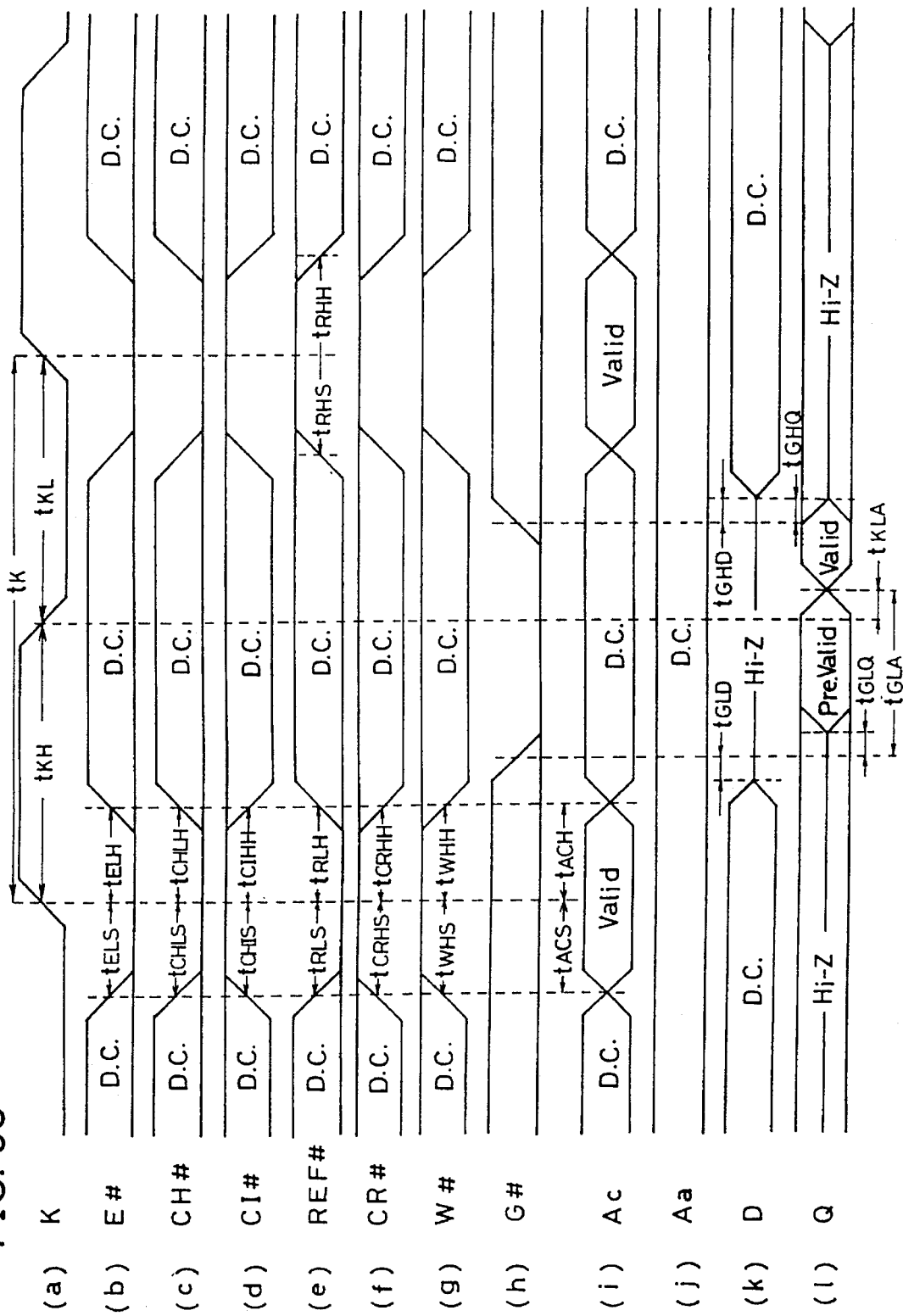
FIG. 95 is a diagram of signal waveforms showing timings of various external signals for effecting the refresh cycle together with the cache hit reading in the latch output mode in the semiconductor memory device in accordance with the present invention.
Figure 96:
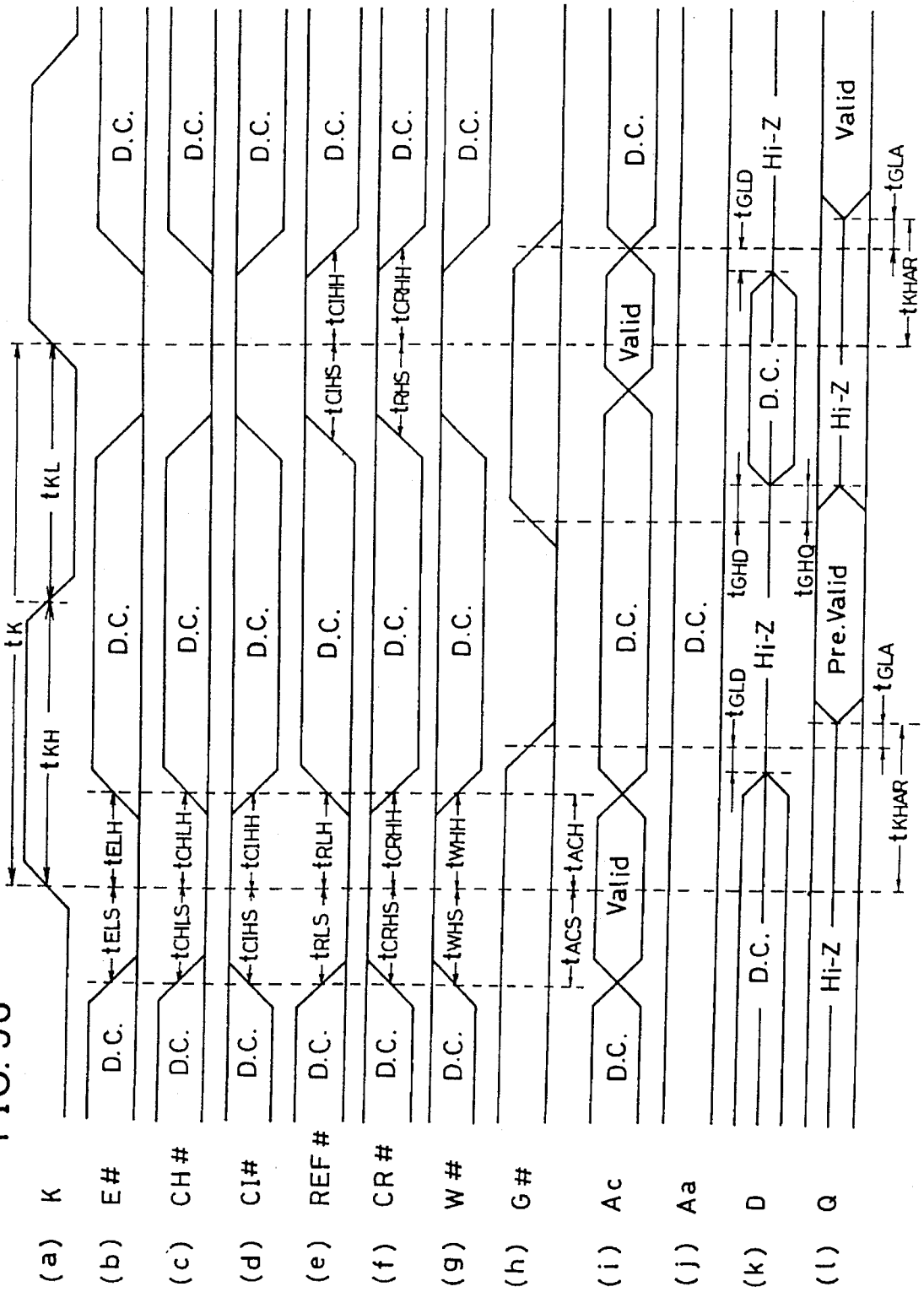
FIG. 96 is a diagram of signal waveforms showing timings of various external signals for effecting the refresh cycle together with the cache hit reading in the register output mode in the semiconductor memory device in accordance with the present invention.

In cycle No. 8RR shown in FIG. 96, data reading is carried out in accordance with the cache hit read cycle in the register output mode, and the DRAM is automatically refreshed. Timing conditions of various control signals are the same as those shown in FIGS. 94 and 95, and hit reading and automatic refreshing are carried out. In this cycle No. 8RR, when output enable signal G# falls to "L", output data selected in the previous cycle is output. Thereafter, output enable signal G# is once raised to "H", and thereafter output enable signal G# is set to "L", in the next clock cycle, when the data of the SRAM cell selected in the present cycle is output.

The transparent output mode, latched output mode, registered output mode, masked write mode and D/Q separation mode of the CDRAM can be realized by setting commands for setting desired special function in the command register. Operation cycle for setting commands in the command register will be described in the following.

No. 9: Command register set cycle

Figure 97:
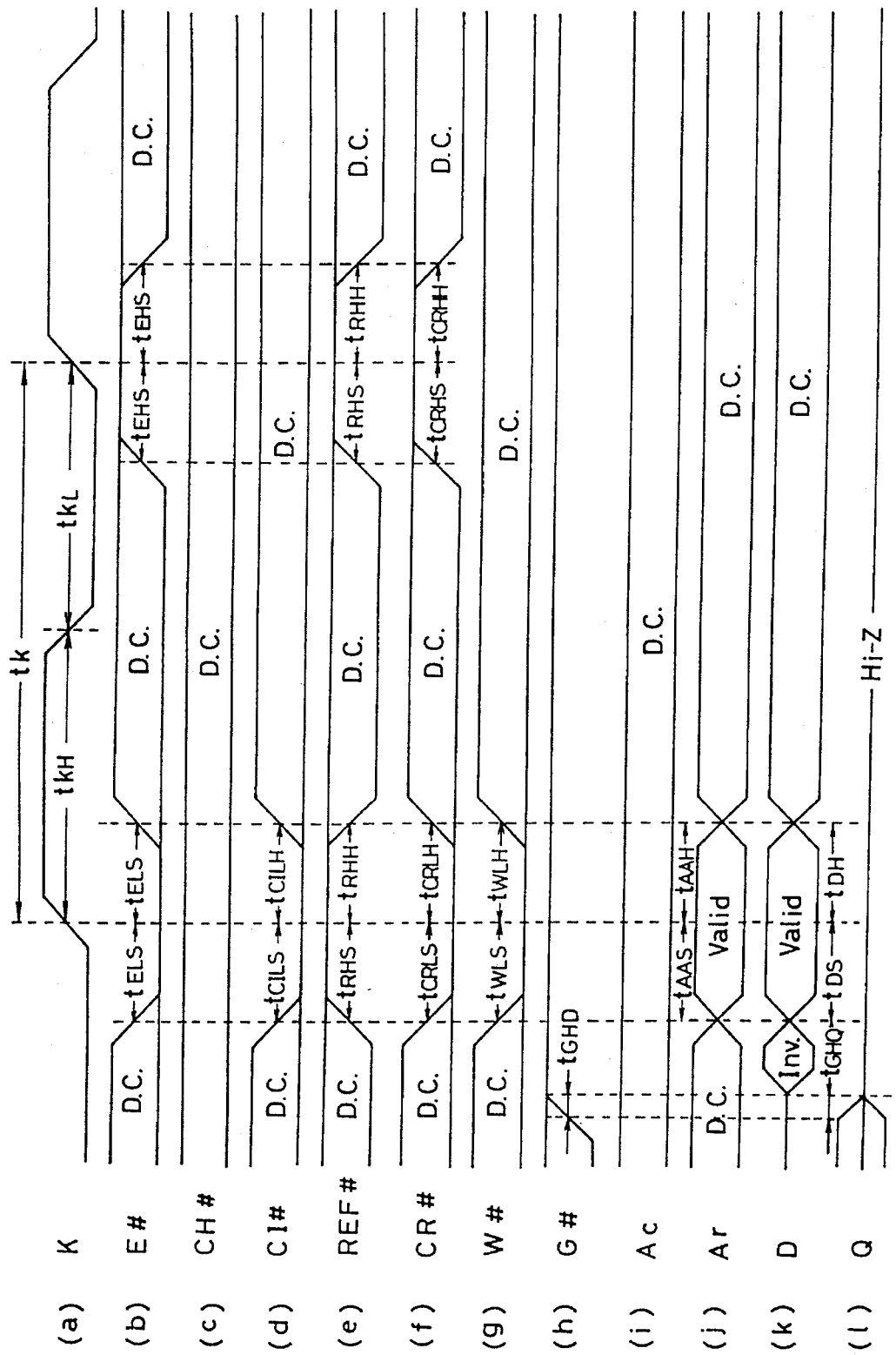
FIG. 97 is a diagram of signal waveforms showing timings of various external signals for setting command registers in the semiconductor memory device of the present invention.

FIG. 97 shows timings of various signals in command register set cycle (cycle No. 9). The command registers set cycle is realized by setting chip select signal E#, cache inhibition signal CI#, command register signal CR# and write enable signal W# to "L" at a rising edge of external clock signal K. At this time, any one of four registers WR0 to WR3 of the command registers is selected as shown in FIG. 64. Command register WR0 is selected in setting the output mode, and content of the output mode is selected dependent on the combination of the input data D at that time. Therefore, at a rising edge of the external clock signal K, a command address Ar and an external write data D are regarded as valid and latched. When 2 bits Ar0 and Ar1 of the command address AR are both 0 ("L"), the command register WR0 is selected. When upper 2 bits D2 (DQ2) and D3 (DQ3) of 4 bits of external write data D are "0" ("L") and the least significant bit D0 (DQ0) is "0" of 4 bits of external write data D, the transparent output mode is set.

The latched output mode is selected by setting external write data D0 and D1 to "1" ("H") and "0", respectively and by setting remaining 2 bits of external write data D2 and D3 to "0" at a rising edge of external clock signal K. The registered output mode is selected by setting command addresses Ar0 and Ar1 to "0", setting external write data D0 and D1 (DQ0 and DQ1) both to "1" and by setting external write data D2 and D3 (DQ2 and DQ3) both "0" at a rising edge of external clock signal K. In the structure of the command registers shown in FIG. 64, 8 registers are provided, enabling setting of 8 different special modes. The command register RR0 for setting the masked write mode, and the register RR1 for setting D/Q separation mode are selected by setting write enable signal W# to "H" at the timing shown in FIG. 97. Dependent on the value of the command address Ar at this time, a desired mode can be selected.

[State Transition]

Figure 98:
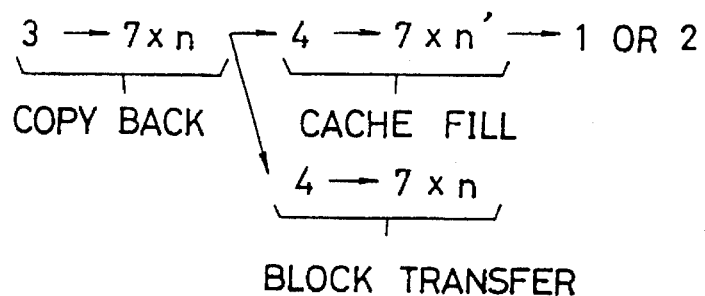
FIGS. 98A and 98B show state transition at a cache miss in the semiconductor memory device in accordance with the present invention.
Figure 98:
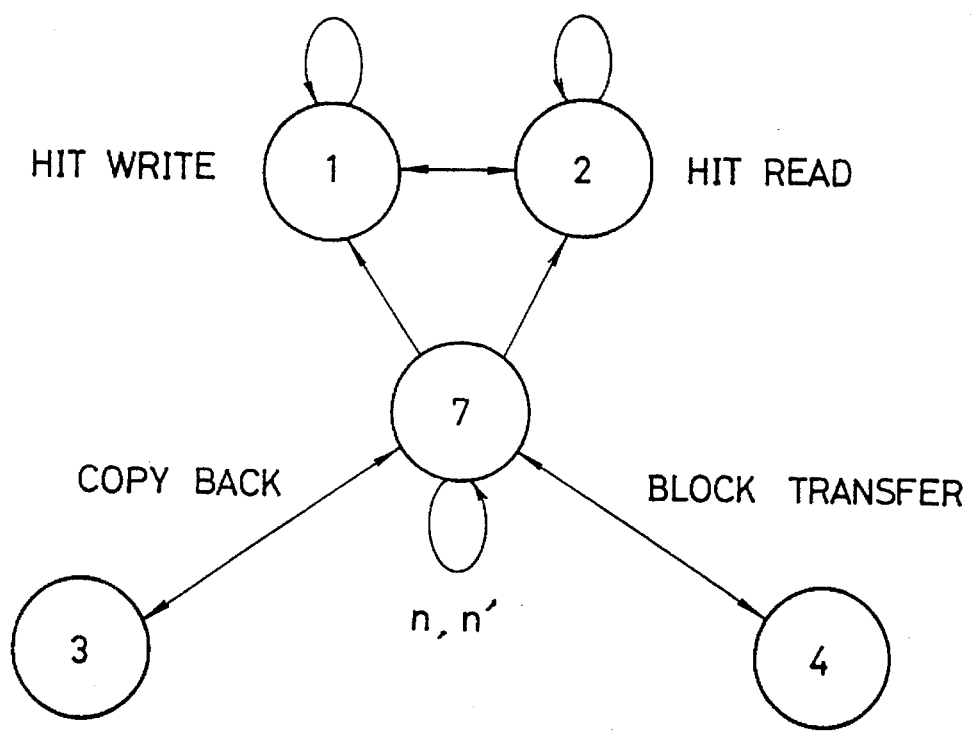

FIG. 98 shows state transition of the CDRAM at a time of a cache miss (miss hit). FIG. 98(A) shows a flow of state transition, and FIG. 98(B) shows state transition between respective cycles.

In FIG. 96, the cycles are denoted by cycle numbers. A case in which "copy back" operation and "block transfer" operation are successively carried out is shown as an example.

Referring to FIG. 98, when a cache miss occurs, a copy back cycle (cycle No. 3) shown in FIG. 81 is carried out at first. Consequently, data transfer mode from the SRAM to DRAM is set. Thereafter, array access cycle (cycle No. 7) shown in FIG. 85 is repeated for n (n=(ta/tk)−1) times. The reference character ta represents cycle time of the DRAM, and tk represents cycle time of the external clock K. By repeating cycle No. 7 for n times, collective transfer of data blocks from SRAM to DRAM is completed. Thereafter, block transfer cycle (cycle No. 4) shown in FIG. 84 is carried out. Consequently, data transfer mode from DRAM to SRAM is set. By repeating cycle No. 7 for n times successive to the cycle No. 4, transfer of data blocks from DRAM to SRAM is carried out. Thereafter, the DRAM is ready for receiving next access. This state is referred to as a block transfer mode. From this time on, the CPU can access to SRAM or DRAM.

When array active cycle (cycle No. 7) is repeated for n' (n'=(ta/2·tK)−1) times successive to the cycle No. 4, restore operation to the memory cell and RS precharging are not yet completed in the DRAM, and therefore it cannot be accessed. However, in the SRAM, block data has been already transferred from the DRAM in this state, restore is not necessary, and data on the SRAM bit line pair has been established. Therefore, the CPU can access to the SRAM at this state. This state is referred to as a cache fill state. In the cache fill state, the CPU can access only to the SRAM. Either the cache hit write cycle (cycle No. 1) shown in FIG. 77 or cache hit read cycle (cycle No. 2) shown in FIG. 80 is carried out after cache fill. The cache hit read cycle (cycle No. 2) may be carried out in transparent output mode, latched output mode or registered output mode. Hit writing can be successively carried out at every clock cycle, and hit read cycle can be successively carried out at every clock cycle. The operation may be switched from the hit read cycle to the hit write cycle. Data transfer may be carried out in accordance with the high speed transfer mode (fast copy back) in which "copy back" and "block transfer" are carried out parallel to each other.

Figures 99A, 99B:
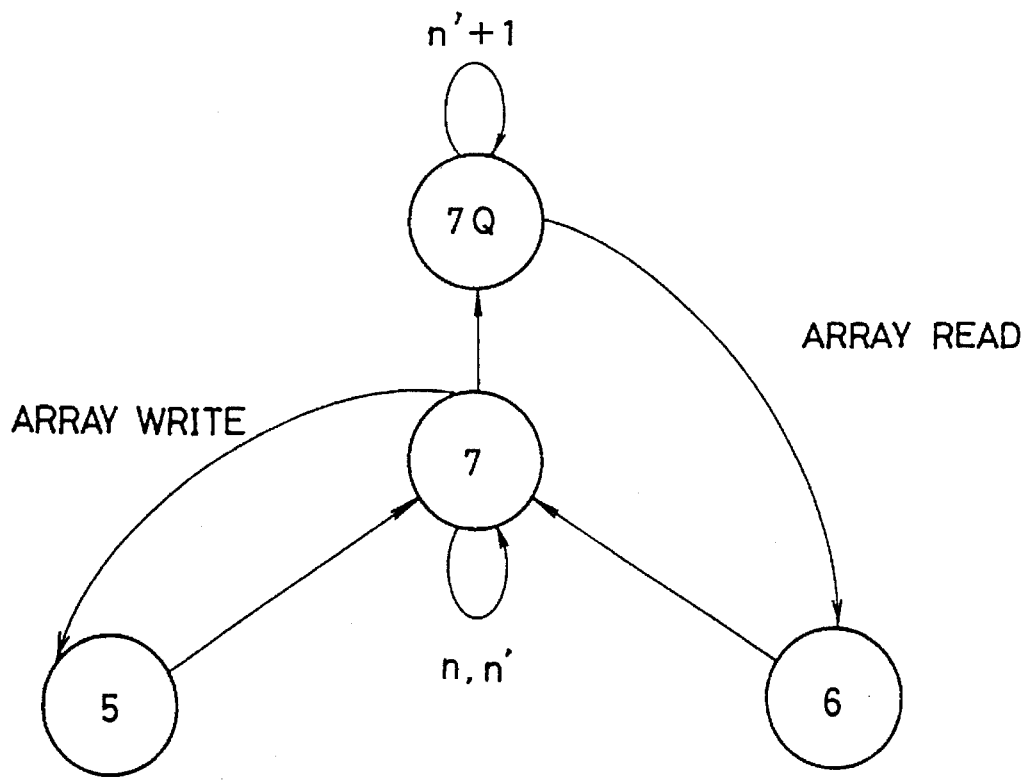
FIGS. 99A and 99B show state transition when the array is active in the semiconductor memory device in accordance with the present invention.

FIG. 99 shows state transition at a time of array accessing. FIG. 99(A) shows a flow of state transition in array access, and FIG. 99(B) shows state transition between respective cycles. Array access includes array writing to write data to the array, and array read for reading data from the array. In array writing, array write cycle (cycle No. 5) shown in FIG. 79 is carried out. Successive to the cycle No. 5, the array active cycle of cycle No. 7 is repeated for n times to write data to the DRAM array.

Figure 100A:
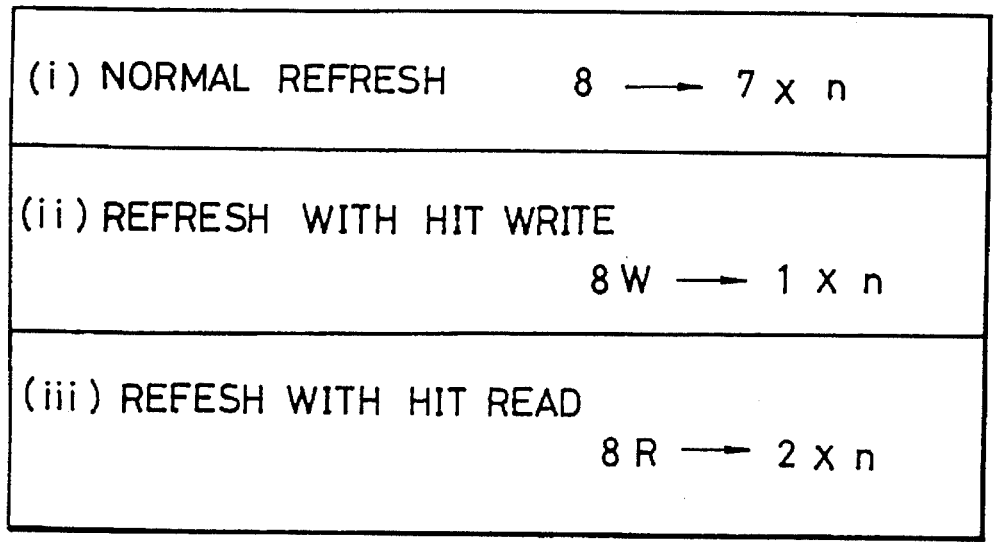
FIGS. 100A and 100B show state transition during refresh operation in the semiconductor memory device in accordance with the present invention.
Figure 100B:
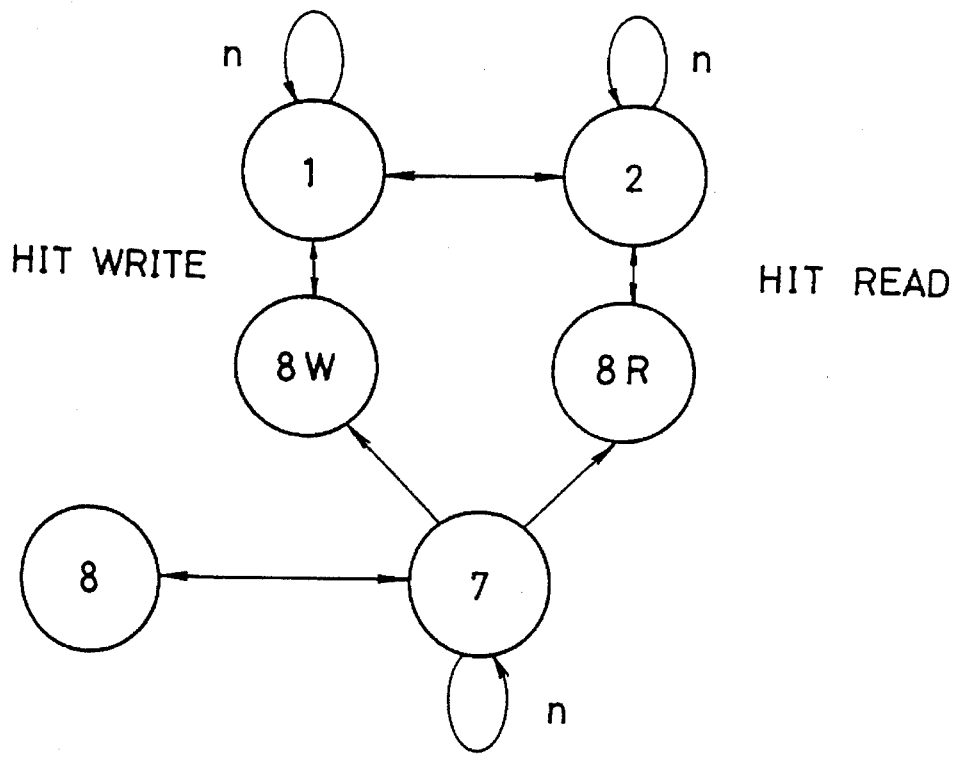

In array reading, the array read cycle (cycle No. 6) shown in FIG. 84 is carried out, and access to the DRAM is enabled. After the array read cycle (cycle No. 6), the array active cycle shown in FIG. 85 (cycle No. 7) is repeated for n' times. As this state, data cannot be read from DRAM. Subsequent to the cycle No. 7, the array active cycle for data output (cycle No. 7Q) shown in FIGS. 86 and 88 is repeated for n'+1 times. The cycle No. 7Q may be the array active cycle for transparent output, array active cycle with latch output, or array active cycle with register output. By setting output enable signal G3 to "L" at the last cycle of the cycle No. 7Q, data can be read from the array. The cycle times of the array writing and array reading seem to be different from each other. However, n=n'+1, and therefore reading/writing of data from and to the array can be carried out in the same clock cycle. After the array writing operation or array reading operation, array writing or array reading can be successively carried out. FIG. 100 shows state transition at a time of refreshing. FIG. 100(A) is a flow of state transition of the refreshing operation, and FIG. 100(B) shows state transition between respective cycles at the time of refreshing.

In normal refreshing in which automatic refreshing of DRAM only is carried out and access to SRAM is not carried out, first the refresh cycle (cycle No. 8) shown in FIG. 92 is carried out. Thereafter, the array active cycle (cycle No. 7) shown in FIG. 85 is repeated for n times. Consequently, one automatic refreshing operation in accordance with the refresh address from the refresh counter contained in the CDRAM is completed.

In refreshing with hit writing, the refresh cycle with cache hit writing shown in FIG. 93 (cycle No. 8W) is carried out at first. Then, automatic refreshing of the DRAM is carried out for the succeeding n clock cycles. During this period, the cache hit write cycle shown in FIG. 72 can be executed by the CPU for n times.

Figure 94:
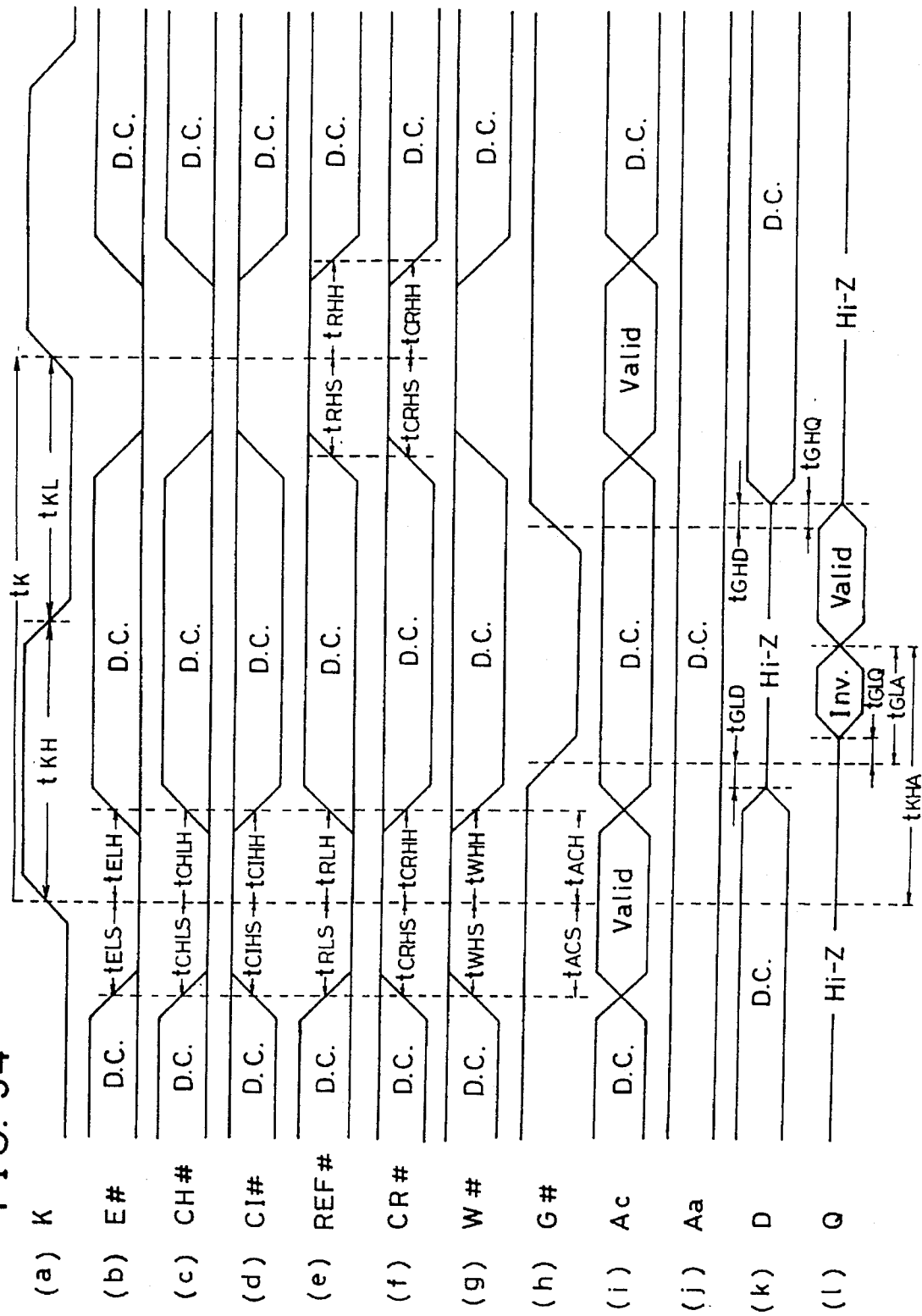
FIG. 94 is a diagram of signal waveforms showing timings of various external signals for effecting the refresh cycle together with the cache hit reading in the transparent output mode in the semiconductor memory device in accordance with the present invention.

In refresh cycle with hit reading, the refresh cycle with cache hit reading shown in FIGS. 94 to 96 (cycle No. 8R) is carried out. Consequently, automatic refreshing of the DRAM is started, and automatic refreshing is carried out for n clock cycles in the DRAM. CPU can execute hit reading during n clock cycles. The output mode of the cycle No. 8R may be transparent output mode, latched output mode or registered output mode Structures and operations of the CDRAM in accordance with the present invention have been described. However, the structures of the CDRAM in accordance with the present invention is not limited to those described in the above described embodiments. The capacity thereof is not limited to the 4M bit CDRAM, that is, 4M bit DRAM and 16K bit SRAM. DRAMs and SRAMs having arbitrary storage capacity may be used. As to array layout thereof, the same effect as in the above described embodiments can be provided when the layout is modified corresponding the shapes of packages.

Technical Advantages of the Present Invention

Technical advantages of the CDRAM in accordance with the present invention will be described in the following.

(1) The present invention allows independent setting of addresses to SRAM and DRAM formed on the same chip, and the present invention is adapted to carry out data transfer between SRAM and the DRAM through an internal data bus which is different from an internal common data line for data input/output from and to the outside of the device. Therefore, a high speed cache memory which can cope with arbitrary mapping method without changing the array architecture can be provided. Since the DRAM array and the SRAM array are provided in separate regions, a semiconductor memory device containing a cache having a proper block size with small area of occupation can be provided.

(2) Since the DRAM array and SRAM array are structured to be electrically separated in response to a refresh designating signal or to an SRAM array access designating signal, the DRAM array can be refreshed without any influence to the access to the SRAM array. Since refreshing of the DRAM array can be designated in accordance with an external refresh designating signal, the DRAM array can be refreshed at an arbitrary timing, and therefore a semiconductor memory device containing a cache realizing a cache system of high performance can be provided.

(3) Since data output mode can be selected and timing of data output can be changed dependent on the data output mode, a semiconductor memory device applicable to various purposes which provides desired data output dependent on use can be provided.

(4) Since two paths independent from each other are used as data transfer paths between a first memory cell array (for example DRAM array) and a second memory cell array (for example, SRAM array), in which one path is used for transferring data from the first memory cell array to the second memory cell array and the other path is used for transferring data from the second memory cell array to the first memory cell array, and the data transfer paths can be operated independent from each other, data transfer between the first and second memory cell arrays can be carried out at high speed.

(5) At a cache miss, data of a memory cell selected in a high speed memory is latched, data transfer from a large capacity memory to the high speed memory is carried out in parallel to the latching operation, and data transfer from the latch to DRAM array is carried out, and therefore access to the SRAM array can be carried out at high speed.

(6) After data transfer from the large capacity memory to the high speed memory, access to the high speed memory is allowed at earlier timing than the transition of the large capacity memory to the standby state, and therefore access time to the high speed memory can be significantly reduced.

(7) At a time of a cache miss, corresponding data in the SRAM is latched, write data is written to the large capacity memory and then rewritten data is transferred to the high speed memory, when there is a data write request. Therefore, a semiconductor memory device capable of transferring data from the large capacity memory to the high speed memory at high speed and capable of writing/reading data to the high speed memory at high speed even at a cache miss can be provided.

(8) Further, since a path for transferring write data directly to the high speed memory is provided additionally, access time of the large capacity memory is reduced, and even if the time margin for rewriting data of the large capacity is small, data which has been rewritten by the write data can be surely transferred to the high speed memory. Therefore, a semiconductor memory device capable of writing and reading data at high speed at a time of cache miss can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising: a first memory cell array including a plurality of memory cells; a second memory cell array including a plurality of memory cells provided separate from said first memory cell array;

data transfer means, provided between said first memory cell array and said second memory cell array, for transferring data between a selected memory cell of said first memory cell array and a selected memory cell of said second memory cell array, said data transfer means including:
(a) first circuitry for transferring data received from said first memory cell array to said second memory cell array, and
(b) second circuitry for transferring data received from said second memory cell array to said first memory cell array, said first and second circuitry provided in parallel with each other between said first and second memory cell arrays and having no common circuit elements; and control means for generating a data transfer control signal activating said first circuitry and said second circuitry in response to a transfer instruction signal.

2. The semiconductor device according to claim 1, wherein said first means includes latch means for latching data received from said first memory cell array.

3. The semiconductor device according to claim 1, wherein said second means includes an amplifier means for amplifying data received from said second memory cell array.

4. The semiconductor device according to claim 1, wherein said first memory cell array comprises a static random access memory (SRAM) array and said second memory cell array comprises a dynamic random access memory (DRAM) array.

5. The semiconductor device according to claim 1, wherein said first and second circuitry each include a driver for unidirectionally transferring received data.

6. The semiconductor memory device according to claim 1,
   wherein said second memory cell array comprises a plurality of memory blocks arranged in rows and columns, each of said memory blocks including a plurality of dynamic memory cells arranged in rows and columns, said memory blocks further arranged in a plurality of groups each comprising a row or a column of memory blocks;
   said second memory cell array further comprising:
   a plurality of first data transmitting means each coupled to a respective one of said memory blocks for transferring data to and from a selected memory cell of a corresponding memory block, and
   a second data transmitting means provided common to each of said plurality of groups of memory blocks for coupling a selected one of said plurality of first data transmitting means to said data transfer means in response to a group selection signal.

7. The semiconductor memory device according to claim 6, wherein
   each of said plurality of first data transmitting means comprises two first transmitting lines provided for each of said memory blocks,
   said second data transmitting means comprises two transmitting lines provided for each group, and wherein said semiconductor memory device further comprises
   first selecting means comprising:
   column selecting means for selecting two columns from a selected one of said memory blocks in accordance with an applied address, and
   means responsive to a block selecting signal generated in accordance with said applied address for connecting the two first transmitting lines provided for the selected one of said memory blocks to the two second transmitting lines of a corresponding group.

8. A semiconductor device, comprising:
   a first memory cell array including a plurality of memory cells;
   a second memory cell array including a plurality of memory cells provided separate from said first memory cell array;
   data transfer means provided between said first memory cell array and said second memory cell array for transferring data between a selected memory cell of said first memory cell array and a selected memory cell of said second memory cell array,
   said data transfer means including:
   (a) first circuitry for transferring data received from said first memory cell array to said second memory cell array, said first circuitry including a first storage means for temporarily retaining applied data,
   (b) second circuitry for transferring data received from said second memory cell array to said first memory cell array, said second circuitry including second storage means for retaining applied data temporarily,
   a data transfer path of said first circuitry being different from and in parallel with a data transfer path of said second circuitry, said first and second circuitry provided between said first and said second memory cell arrays and having no common component; and
   control means for generating a data transfer control signal activating said first circuitry and said second circuitry in response to a transfer instruction signal.

* * * * *